US008901630B2

(12) United States Patent
Huh et al.

(10) Patent No.: US 8,901,630 B2
(45) Date of Patent: Dec. 2, 2014

(54) TRANSISTOR, SEMICONDUCTOR DEVICE, AND SEMICONDUCTOR MODULE INCLUDING THE SAME

(71) Applicants: Ki-Jae Huh, Seoul (KR); Satoru Yamada, Seoul (KR); Jun-Hee Lim, Seoul (KR); Sung-Ho Jang, Hwaseong-si (KR)

(72) Inventors: Ki-Jae Huh, Seoul (KR); Satoru Yamada, Seoul (KR); Jun-Hee Lim, Seoul (KR); Sung-Ho Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 13/779,179

(22) Filed: Feb. 27, 2013

(65) Prior Publication Data
US 2013/0256770 A1 Oct. 3, 2013

(30) Foreign Application Priority Data

Mar. 29, 2012 (KR) .................. 10-2012-0032685

(51) Int. Cl.
*H01L 27/04* (2006.01)
*H01L 29/423* (2006.01)
*H01L 29/417* (2006.01)
*H01L 29/78* (2006.01)

(52) U.S. Cl.
CPC ........ *H01L 29/7827* (2013.01); *H01L 29/4236* (2013.01); *H01L 29/41766* (2013.01); *H01L 29/78* (2013.01); *H01L 27/04* (2013.01)
USPC ........... 257/296; 257/329; 257/330; 257/334; 257/E29.262

(58) Field of Classification Search
CPC . H01L 21/763; H01L 27/04; H01L 27/10876; H01L 29/78; H01L 29/4236; H01L 29/7827; H01L 292/41766
See application file for complete search history.

(56) References Cited

U.S. PATENT DOCUMENTS

| 6,518,106 | B2 | 2/2003 | Ngai et al. | |
|---|---|---|---|---|
| 7,723,768 | B2 | 5/2010 | Suh | |
| 8,008,144 | B2 | 8/2011 | Ananthan et al. | |
| 8,012,828 | B2 | 9/2011 | Min et al. | |
| 2001/0025973 | A1* | 10/2001 | Yamada et al. | ............... 257/296 |
| 2006/0141691 | A1 | 6/2006 | Kim | |
| 2007/0262395 | A1 | 11/2007 | Gibbons et al. | |
| 2007/0262415 | A1 | 11/2007 | Smith et al. | |
| 2008/0150023 | A1 | 6/2008 | Nishisaka | |

(Continued)

FOREIGN PATENT DOCUMENTS

| JP | 2007-227615 | 9/2007 |
|---|---|---|
| KR | 20070002590 A | 1/2007 |
| KR | 1020100001815 A | 1/2010 |
| KR | 101061296 B1 | 8/2011 |

Primary Examiner — Minh-Loan Tran
Assistant Examiner — Fazli Erdem
(74) Attorney, Agent, or Firm — Myers Bigel Sibley & Sajovec, P.A.

(57) ABSTRACT

A semiconductor device including a buried cell array transistor and an electronic device including the same are provided. The device includes a field region in a substrate and the filed region defines an active region. A first source/drain region and a second source/drain region are in the active region. A gate trench is between the first and second source/drain regions, and in the active region and the field region. A gate structure is within the gate trench. The gate structure includes a gate electrode, an insulating gate capping pattern on the gate electrode, a gate dielectric between the gate electrode and the active region, and an insulating metal-containing material layer between the insulating gate capping pattern and the active region.

30 Claims, 111 Drawing Sheets

(56) References Cited

U.S. PATENT DOCUMENTS

| | | | |
|---|---|---|---|
| 2009/0127609 A1* | 5/2009 | Han et al. | 257/311 |
| 2009/0236656 A1* | 9/2009 | Sung et al. | 257/329 |
| 2011/0003459 A1 | 1/2011 | Shin et al. | |
| 2011/0156107 A1* | 6/2011 | Bohr et al. | 257/288 |
| 2012/0001258 A1 | 1/2012 | Kim | |
| 2012/0009746 A1* | 1/2012 | Park et al. | 438/268 |
| 2012/0032257 A1 | 2/2012 | Ananthan et al. | |
| 2012/0061751 A1 | 3/2012 | Gibbons et al. | |
| 2014/0077305 A1* | 3/2014 | Pethe et al. | 257/368 |
| 2014/0159145 A1* | 6/2014 | Park et al. | 257/330 |

* cited by examiner

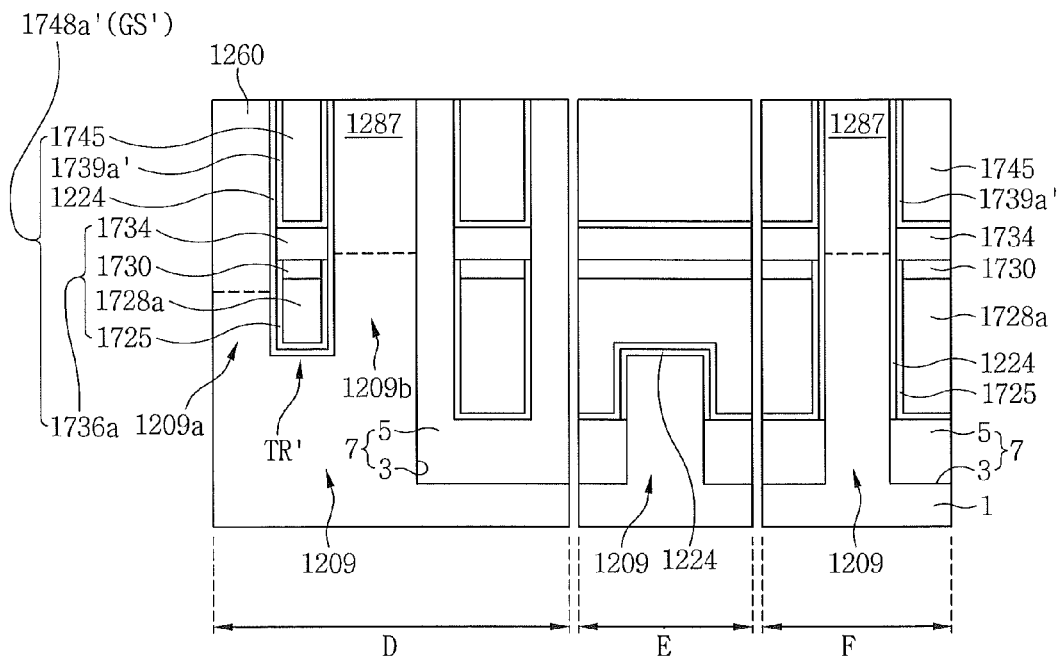
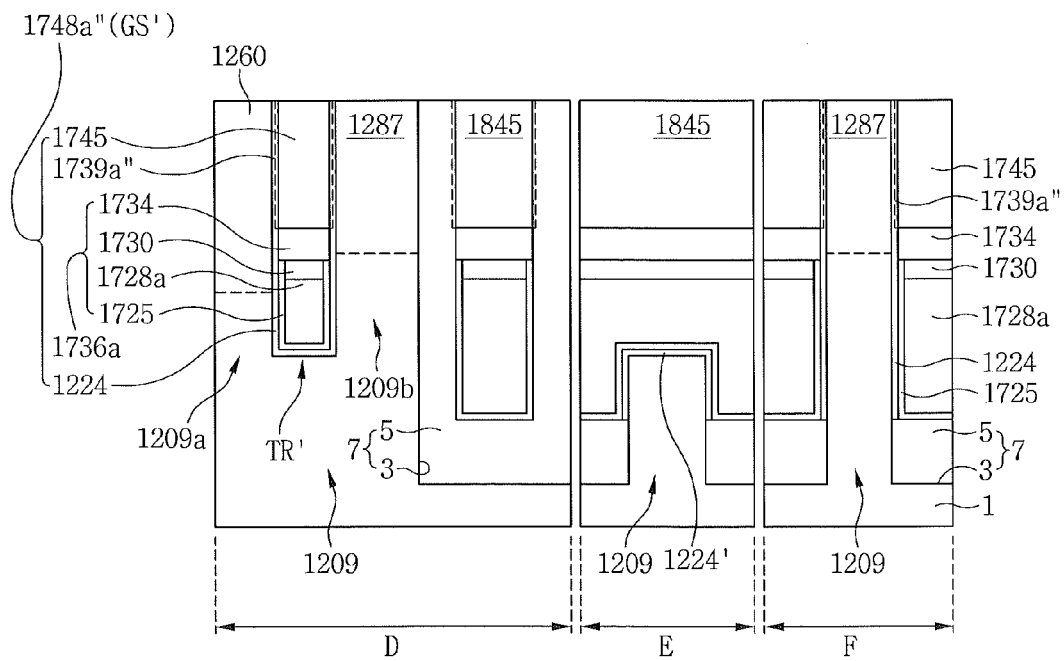

TRANSISTOR, SEMICONDUCTOR DEVICE, AND SEMICONDUCTOR MODULE INCLUDING THE SAME

CROSS-REFERENCE TO RELATED APPLICATION

This U.S. non-provisional patent application claims priority under 35 U.S.C. §119 to Korean Patent Application No. 10-2012-0032685 filed on Mar. 29, 2012, in the Korean Intellectual Property Office, the disclosure of which is hereby incorporated by reference in its entirety.

FIELD

The present disclosure generally relates to the field of electronics, and more particular to a semiconductor device.

BACKGROUND

With an increase in the integration density of semiconductor devices, 3-dimensional transistors are exhibiting electrical properties not associated with planar transistors having a long channel length. In particular, a leakage current in source/drain regions leads to deterioration in characteristics of the semiconductor devices including 3-dimensional transistors as a switching device.

SUMMARY

A semiconductor device according to various embodiments may include an active region in a substrate and a field region that defines the active region. The semiconductor device may also include a first source/drain region and a second source/drain region in the active region. The semiconductor device may additionally include a gate trench in the active region and the field region, and the gate trench may be between the first and second source/drain regions in the active region. The semiconductor device may further include a gate structure within the gate trench. According to various embodiments, the gate structure may include a gate electrode, a gate dielectric between the gate electrode and the active region, an insulating gate capping pattern on the gate electrode, and an insulating metal-containing material layer between the insulating gate capping pattern and the active region. Additionally, the insulating metal-containing material layer may be at least partially within the gate trench.

In various embodiments, the first source/drain region and the second source/drain region may have an N conductivity type, and the insulating metal-containing material layer may include a metal that may have a Fermi energy closer to a conduction band of an energy band diagram of the active region than to a valance band of the energy band diagram of the active region.

According to various embodiments, the first source/drain region and the second source/drain region may have a P conductivity type, and the insulating metal-containing material layer may include a metal that may have a Fermi energy closer to the valance band of an energy band diagram of the active region than to the conduction band of the energy band diagram of the active region.

In various embodiments, the second source/drain region may have a shallower junction structure than the first source/drain region.

According to various embodiments, the semiconductor device may further include a bit line structure electrically connected to the first source/drain region and a capacitor structure electrically connected to the second source/drain region.

A semiconductor device according to various embodiments may include an active region in a substrate, a first source/drain region and a second source/drain region in the active region. The semiconductor device may also include a gate trench in the active region between the first source/drain region and the second source/drain region. The semiconductor device may additionally include a gate structure within the gate trench. The gate structure may include a gate electrode that may at least partially overlap with the first and second source/drain regions, an insulating metal-containing material layer on the gate electrode and within the gate trench. The insulating metal-containing material layer may at least partially overlap with the first and second source/drain regions, and a gate dielectric between the gate electrode and the active region. Additionally, the gate electrode may include a conductive material having a Fermi energy closer to a mid-gap energy of the active region than to a valance band or conduction band of an energy band diagram of the active region, and may have a first work function. The insulating metal-containing material layer may include a metal that may have a second work function less than the first work function.

According to various embodiments, the insulating metal-containing material layer may include a dielectric material containing a material different from the gate dielectric. Additionally, in various embodiments, the insulating metal-containing material layer may include a dipole layer.

A semiconductor device according to various embodiments may include a field region in a substrate and the field region defines a cell active region and a peripheral active region. The semiconductor device may additionally include a first cell source/drain region and a second cell source/drain region in the cell active region. The semiconductor device may further include a cell gate trench in the cell active region between the first cell source/drain region and the second cell source/drain region and a cell gate structure within the cell gate trench. Moreover, the semiconductor device may include a first peripheral source/drain region and a second peripheral source/drain region in the peripheral active region and a peripheral gate structure on the peripheral active region. According to various embodiments, the peripheral gate structure may include a peripheral gate dielectric and a peripheral gate electrode. In various embodiments, the cell gate structure may include a cell gate electrode and an insulating cell gate capping pattern stacked sequentially, a cell gate dielectric between the cell gate electrode and the cell active region, and an insulating metal-containing material layer on the cell gate electrode and within the cell gate trench. The insulating metal-containing material layer may overlap at least partially with the first and second source/drain regions and including a metal different from the cell gate dielectric.

According to various embodiments, the cell gate electrode may include a conductive material having a Fermi energy closer to a mid-gap energy of the cell active region than to a valance band or conduction band of an energy band diagram of the cell active region, and the metal in the insulating metal-containing material layer may have a Fermi energy closer to the valance band or conduction band of the cell active region than to the mid-gap energy of the cell active region.

A transistor according to various embodiments may include an active region in a semiconductor substrate. The transistor may also include a gate structure in the active region and source/drain regions on both sides of the gate structure in the active region. Additionally, the gate structure may include a gate dielectric on the active region, a gate electrode on the gate dielectric, an insulating capping pattern on the gate electrode and insulating dipole layer between the insulating capping pattern and the source/drain regions.

In various embodiments, the insulating dipole layer may at least partially overlap with the source/drain regions.

According to various embodiments, the insulating dipole layer may include a metal different from the gate dielectric, and the metal included in the insulating dipole layer may have a Fermi energy closer to a band edge of an energy band diagram of the active region than to a mid-gap energy of the energy band diagram of the active region.

A transistor according to various embodiments may include a gate structure. In various embodiments, the gate structure may include a gate dielectric and a gate electrode sequentially stacked in an active region of a semiconductor substrate. The transistor may also include source/drain regions on both sides of the gate electrode in the active region. The transistor may additionally include an insulating dipole layer on the source/drain regions on both sides of the gate electrode. Moreover, the insulating dipole layer may at least partially overlap with the source/drain regions and the insulating dipole layer may include a metal different from the gate dielectric.

In various embodiments, the metal in the dipole layer may have a Fermi energy closer to an energy band edge of the active region than to a mid-gap energy of the active region.

A semiconductor device according to various embodiments may include a field region defining an active region in a substrate. The semiconductor device may also include a first source/drain region and a second source/drain region in the active region. The semiconductor device may additionally include a gate trench in the active region and the field region, and the gate trench may be between the first and second source/drain regions. The semiconductor device may further include a gate structure within the gate trench. The gate structure may include a gate electrode including a first conductive pattern and a second conductive pattern within the gate trench, an insulating gate capping pattern on the gate electrode and a gate dielectric between the gate electrode and the active region. According to various embodiments, the first conductive pattern may have a Fermi energy closer to a mid-gap energy of an energy band diagram of the active region than that of the second conductive pattern. The first conductive pattern may include a portion having a greater horizontal width than that of the second conductive pattern. Additionally, the second conductive pattern may have a smaller vertical thickness than that of the first conductive pattern and may be at a higher level than a bottom surface of the first conductive pattern.

In various embodiments, the second conductive pattern may have a Fermi energy closer to a conduction band or a valance band of the active region than to the mid-gap energy of the active region, and the first conductive pattern may have a Fermi energy closer to the mid-gap energy of the active region than to the conduction band or the valance band of the active region.

According to various embodiments, the second conductive pattern may be between an upper side surface of the first conductive pattern and the active region.

A semiconductor device according to various embodiments may include a field region in a semiconductor substrate and defining an active region. The semiconductor device may also include a first source/drain region and a second source/drain region in the active region and spaced apart from each other. The semiconductor device may additionally include a gate trench in the active region between the first source/drain region and the second source/drain region and configured to extend into the field region. The semiconductor device may further include a gate structure within the gate trench. The gate structure may include a gate electrode including a lower barrier conductive pattern, a first conductive pattern, an upper barrier conductive pattern, and a second conductive pattern. The gate electrode may be at a lower level than a top surface of the active region. The semiconductor device may also include an insulating gate capping pattern on the gate electrode and a gate dielectric between the gate electrode and the active region. In various embodiments, the lower barrier conductive pattern may cover a bottom surface of the first conductive pattern and extend onto a side of the first conductive pattern. According to various embodiments, the second conductive pattern may include a portion on the lower barrier conductive pattern and on an upper side surface of the first conductive pattern, and the upper barrier conductive pattern may cover bottom and sides of the second conductive pattern.

In various embodiments, the first conductive pattern may have a Fermi energy closer to a mid-gap energy of an energy band diagram of the active region than that of the second conductive pattern.

A semiconductor device according to various embodiments may include a module substrate and a semiconductor device on the module substrate. According to various embodiments, the semiconductor device may include a field region defining an active region in a substrate. The semiconductor device may also include a first source/drain region and a second source/drain region in the active region. The semiconductor device may additionally include a gate trench in the active region and the field region between the first and second source/drain regions. The semiconductor device may further include a gate structure within the gate trench. The gate structure may include a gate electrode, an insulating gate capping pattern on the gate electrode, a gate dielectric between the gate electrode and the active region and an insulating metal-containing material layer between the insulating gate capping pattern and the active region. In various embodiments, the insulating metal-containing material layer may be at least partially within the gate trench and including a metal different from the gate dielectric.

A semiconductor device according to various embodiments may include an active region in a substrate and a first source/drain region, a second source/drain region and a channel region therebetween in the active region. The semiconductor device may also include a gate trench between the first and second source/drain regions, the gate trench having sides defining a trench opening. The semiconductor device may additionally include a gate structure within the gate trench. Additionally, the gate structure may include a gate electrode having a first gate electrode portion overlapping with the first and second source/drain regions and a second gate electrode portion overlapping with the channel region. The gate structure may also include a gate dielectric between the gate electrode and the active region. The gate structure may additionally include an insulating gate capping pattern on the gate electrode, the insulating gate capping pattern being between the trench opening and the gate electrode. The gate structure may further include a supplemental gate electrode pattern at least partially overlapping with the first and second source/drain regions, and being configured to provide a difference between work functions of the first gate electrode portion and the first and second source/drain regions that is less than a difference between work functions of the second gate electrode portion and the first and second source/drain regions In various embodiments, the second gate electrode portion may have a Fermi energy closer to a mid-gap energy of an energy band diagram of the active region than to a conduction band or valance band of the active region.

According to various embodiments, the second gate electrode portion may have a Fermi energy closer to a mid-gap energy of an energy band diagram of the active region than to a conduction band or valance band of the active region.

In various embodiments, the supplemental gate electrode pattern may include an insulating metal-containing material layer. According to various embodiments, the insulating metal-containing material layer may include a dipole layer.

According to various embodiments, the first gate electrode portion may include a conductive pattern overlapping with the first and second source/drain regions and, the conductive pattern may have a work function different from that of the second gate electrode portion.

In various embodiments, the first and second source/drain regions may comprise an N conductivity type, and the conductive pattern may have a Fermi energy closer to a conduction band of an energy band diagram of the active region than to a mid-gap energy of the energy band diagram of the active region.

According to various embodiments, the first and second source/drain regions may comprise a P conductivity type, and the conductive pattern may have a Fermi energy closer to a valence band of an energy band diagram of the active region than to a mid-gap energy of the energy band diagram of the active region.

In various embodiments, the supplemental gate electrode pattern may comprise a conductive pattern within the first gate electrode portion and the conductive pattern may have a work function different from that of the second gate electrode portion.

According to various embodiments, wherein the first and second source/drain regions may comprise an N conductivity type, and the conductive pattern may have a Fermi energy closer to a conduction band of an energy band diagram of the active region than to a mid-gap energy of the energy band diagram of the active region.

In various embodiments, the first and second source/drain regions may comprise a P conductivity type, and the conductive pattern may have a Fermi energy closer to a valence band of an energy band diagram of the active region than to a mid-gap energy of the energy band diagram of the active region.

According to various embodiments, the second gate electrode portion may have a Fermi energy closer to a mid-gap energy of an energy band diagram of the active region than to a conduction band or valance band of the active region.

A semiconductor device according to various embodiments may include an active region in a substrate, a first source/drain region, a second source/drain region and a channel region therebetween in the active region. The semiconductor device may also include a gate trench between the first and second source/drain regions. The gate trench may have sides defining a trench opening. The semiconductor device may additionally include a gate structure within the gate trench. The gate structure may include a gate electrode that may include a first conductive pattern having a portion overlapping with the first and second source/drain regions and a second conductive pattern having a portion overlapping with the channel region. The first conductive pattern may be between the trench opening and the second conductive pattern. The gate structure may also include a gate dielectric between the gate electrode and the active region. The gate structure may additionally include an insulating gate capping pattern on the gate electrode and the insulating gate capping pattern may be between the trench opening and the gate electrode. According to various embodiments, a difference between work functions of the first conductive pattern and the first and second source/drain regions may be less than a difference between work functions of the second conductive pattern and the first and second source/drain regions.

In various embodiments, the second conductivity pattern may have a Fermi energy closer to a mid-gap energy of an energy band diagram of the active region than to a conduction band or valance band of the active region.

According to various embodiments, the first and second source/drain regions may comprise an N conductivity type, and the first conductive pattern may have a Fermi energy closer to a conduction band of an energy band diagram of the active region than to a mid-gap energy of the energy band diagram of the active region.

In various embodiments, the first and second source/drain regions may comprise a P conductivity type, and the first conductive pattern may have a Fermi energy closer to a valence band of an energy band diagram of the active region than to a mid-gap energy of the energy band diagram of the active region.

According to various embodiments, the semiconductor device may include an insulating metal-containing material layer between the gate electrode and the insulating gate capping pattern. The insulating metal-containing material layer may overlap with the first and second source/drain regions and may comprise a metal having a conductivity type identical to that of the first and second source/drain regions.

In various embodiments, the insulating metal-containing material layer may include a dipole layer.

According to various embodiments, the insulating metal-containing material layer may be in a portion of the gate dielectric between the insulating gate capping pattern and the first and second source/drain regions.

Particulars of other embodiments are included in the detailed description and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 41 through 62B are cross-sectional views of semiconductor devices according to an embodiment of the inventive concept;

DETAILED DESCRIPTION OF THE EMBODIMENTS

Figure 1:
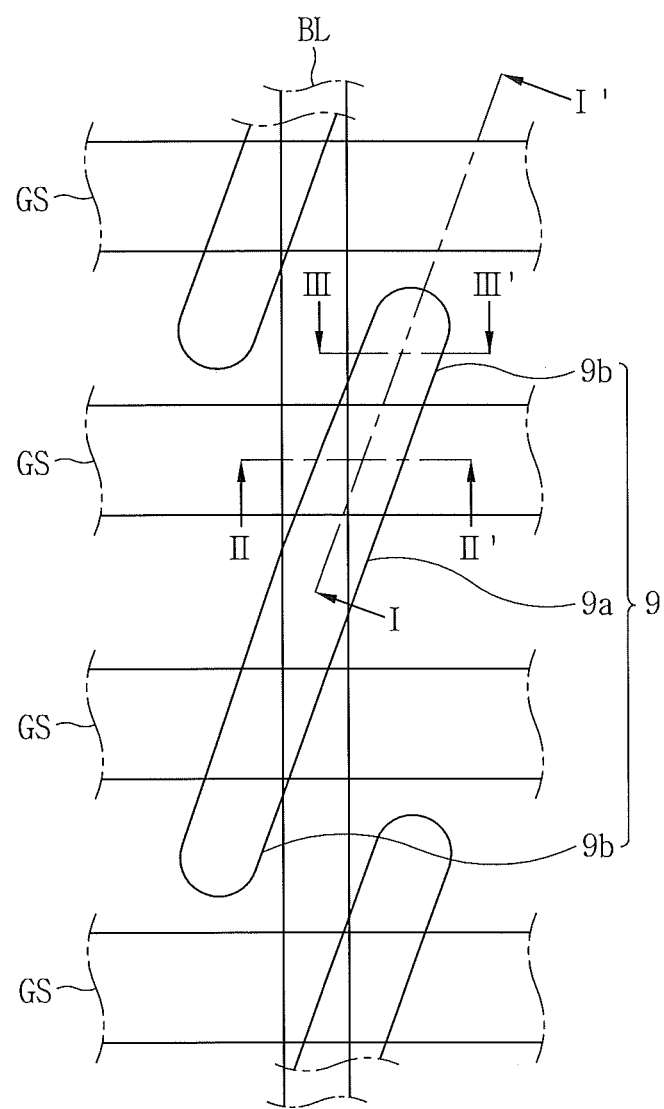
FIG. 1 is a plan view of a semiconductor device according to an embodiment of the inventive concept.

Example embodiments are described below with reference to the accompanying drawings. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions are exaggerated for clarity. Like numbers refer to like element throughout.

Embodiments of the inventive concept are described herein with reference to cross-section, plan, and block illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

In the drawings, the thicknesses of layers and regions are exaggerated for clarity. It will also be understood that when a layer is referred to as being "on" another layer or substrate, it can be directly on the other layer or substrate or intervening layers may also be present. Portions denoted by the same reference numerals refer to the same components throughout.

Spatially relative terms, such as "top end", "bottom end", "top surface", "bottom surface", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

In addition, terms, such as "upper", "middle", "lower" and the like, are used to distinguish between relative positions of components, but the inventive concept is not limited by these terms. Accordingly, the terms, such as "upper", "middle", "lower" and the like, could be termed "first", "second", "third" and the like, and used to describe components of the specification.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
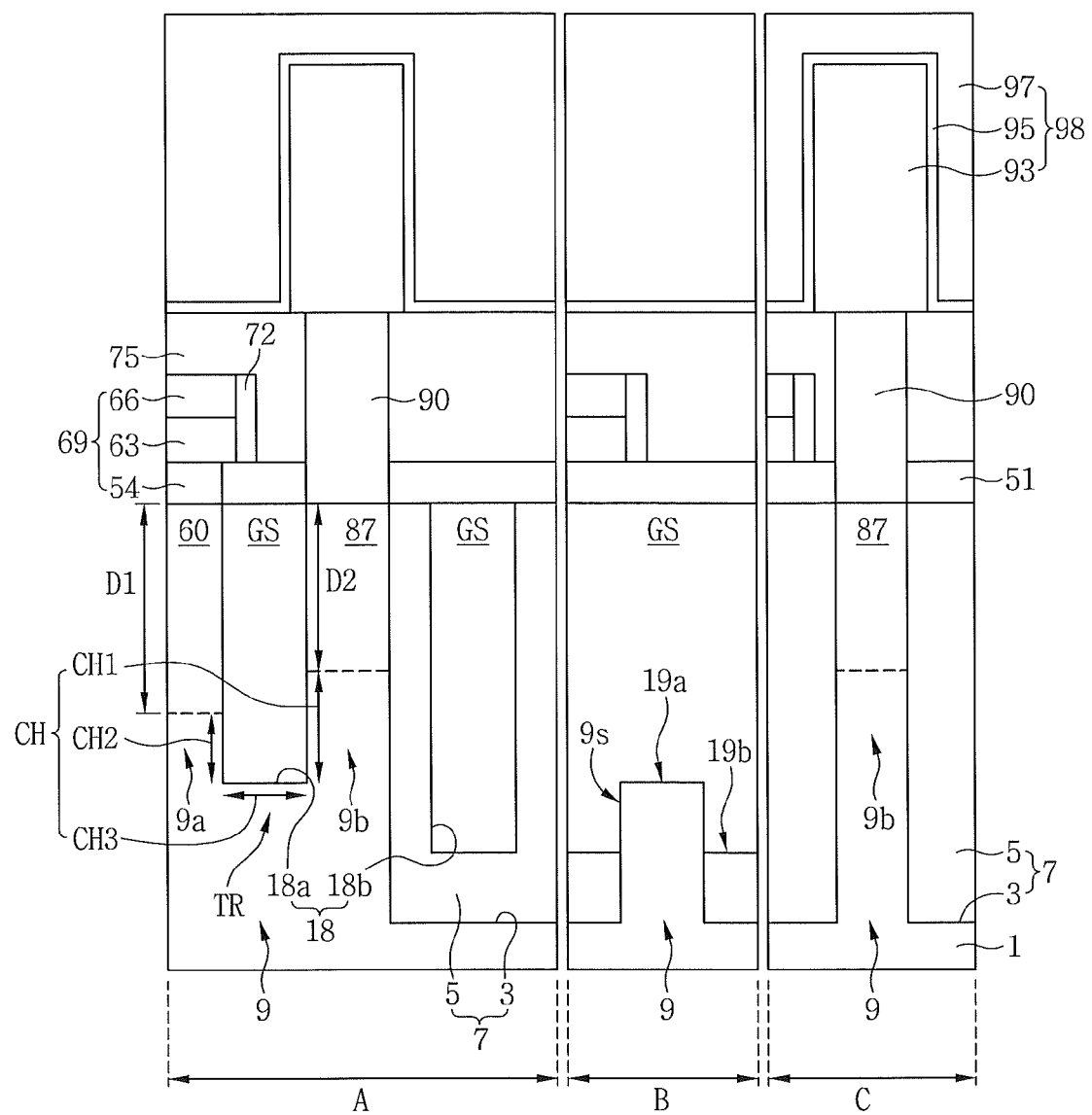
FIG. 2 is a cross-sectional view of a semiconductor device according to an embodiment of the inventive concept.

FIG. 1 is a plan view of a semiconductor device according to an embodiment of the inventive concept, and FIG. 2 is a cross-sectional view of a semiconductor device according to an embodiment of the inventive concept. In FIG. 2, portion "A" denotes a section taken along line I-I' of FIG. 1, portion "B" denotes a section taken along line II-II' of FIG. 1, and portion "C" denotes a section taken along line III-III' of FIG. 1.

A semiconductor device according to an embodiment of the inventive concept will now be described with reference to FIGS. 1 and 2.

Referring to FIGS. 1 and 2, a substrate 1 may be prepared. The substrate 1 may be a semiconductor substrate. The substrate 1 may be a silicon substrate. A field region 7 defining an active region 9 may be formed in the substrate 1. The field region 7 may be a shallow trench isolation (STI) region. For example, the field region 7 may include a field trench 3 formed in the substrate 1 and an insulating material pattern 5 filling the field trench 3. The insulating material pattern 5 may include silicon oxide. The active region 9 may have a first conductivity type. The first conductivity type may be a P or N conductivity type.

A gate trench 18 may be formed in the substrate 1. The gate trench 18 may include a first portion 18a formed across the active region 9, and a second portion 18b formed in the field region 7. The gate trench 18 may continuously extend from the first portion 18a formed across the active region 9 into the second portion 18b of the field region 7. In the gate trench 18, the first and second portions 18a and 18b may have bottom regions disposed at different levels. For example, in the gate trench 18, a bottom region 19a of the first portion 18a disposed in the active region 9 may be disposed at a higher level than a bottom region 19b of the second portion 18b disposed in the field region 7. A portion 9s of a side surface of the active region 9 may be exposed by the gate trench 18. For instance, due to a step difference between the first and second portions 18a and 18b of the gate trench 18, the side portion 9s of the active region 9 interposed between the first and second portions 18a and 18b of the gate trench 18 may be exposed.

A gate structure GS may be formed within the gate trench 18. One active region 9 may include three pillars divided by a pair of gate structures GS disposed adjacent to each other. For example, one active region 9 may include a first active pillar 9a and two active pillars 9b disposed opposite each other across the first active pillar 9a. The first and second active pillars 9a and 9b may be disposed in an upper region of the active region 9. The first and second active pillars 9a and 9b may be disposed near the gate structure GS. The first and second active pillars 9a and 9b may be electrically connected to each other through a lower region of the active region 9. The portion 9s of the side surface of the active region 9 exposed by the gate trench 18 may be covered with the gate structure GS. A first source/drain region 60 may be formed in the first active pillar 9a of the active region 9. A second source/drain region 87 may be formed in the second active pillar 9b of the active region 9. The first and second source/drain regions 60 and 87 may have the same conductivity type and a different conductivity type from the active region 9. For instance, when the active region 9 has a first conductivity type, the first and second source/drain regions 60 and 87 may have a second conductivity type different from the first conductivity type. For example, when the first conductivity type is a P conductivity type, the second conductivity type may be an N conductivity type. In another case, when the first conductivity type is an N conductivity type, the second conductivity type may be a P conductivity type.

The first source/drain region 60 and the second source/drain region 87 may have an asymmetric structure. For example, the first source/drain region 60 may form a deeper junction than the second source/drain region 87, and the second source/drain region 87 may form a shallower junction than the first source/drain region 60.

The first and second source/drain regions 60 and 87 may form a PN junction in the first and second active pillars 9a and 9b. For example, the first source/drain region 60 may form a PN junction in the first active pillar 9a having a first depth D1, and the second source/drain region 87 in the second active pillar 9b having a second depth D2 less than the first depth D1.

The first and second source/drain regions 60 and 87 and the gate structure GS disposed in the active region 9 may constitute a transistor TR. A channel region CH of the transistor TR may include a first channel region CH1, a second channel region CH2, and a third channel region CH3. The first channel region CH1 may be formed in the first active pillar 9a disposed under the first source/drain region 60. The second channel region CH2 may be formed in the second active pillar 9b under the second source/drain region 87. The third channel region CH3 may be formed in the active region 9 between the first and second active pillars 9a and 9b. The third channel region CH3 may be formed in the active region 9 under a bottom region of the gate structure GS.

The gate structure GS may have a portion that overlaps with the first and second source/drain regions 60 and 87 with the first depth D1 and the second depth D2 if the gate structure GS has a portion disposed at the same level of the first and second source/drain regions 60 and 87. The gate structure GS also may have a portion that overlaps with the channel region CH of the transistor TR if the gate structure GS has a portion disposed at the same level of the channel region CH.

A bit line structure 69 may be formed on the first source/drain region 60 and electrically connected to the first source/drain region 60. The bit line structure 69 may include a bit line 63 and a bit line capping pattern 66, which are stacked sequentially, and a bit line contact structure 54 interposed between the bit line 63 and the first source/drain region 60.

A capacitor structure 98 may be formed on the second source/drain region 87 and electrically connected to the second source/drain region 87. A capacitor contact structure 90 may be formed between the capacitor structure 98 and the second source/drain region 87.

The capacitor structure 98 may include a first electrode 93 disposed on the capacitor contact structure 90, a storage dielectric material 95 disposed on the first electrode 93, and a second electrode 97 disposed on the storage dielectric material 95.

The gate structure GS may include a component capable of inhibiting the amount of charge stored in the capacitor structure 98 from being lost due to a leakage current in the second source/drain region 87 when the transistor TR is turned off with the charge stored in the capacitor structure 98.

Hereinafter, a semiconductor device including the gate structure GS will be described with reference to FIGS. 3 through 28B. FIGS. 3 through 28B are diagrams illustrating the gate structure GS of FIGS. 1 and 2. In FIGS. 3, 5, 7, 9, 11, 12, 13A, 13B, 16 through 32, and 35A to 37B, portion "A" corresponds to portion "A" of FIG. 2, portion "B" corresponds to portion "B" of FIG. 2, and portion "C" corresponds to portion "C" of FIG. 2.

To begin with, a semiconductor device according to an embodiment of the inventive concept will be described with reference to FIGS. 1 through 3.

Figure 3:
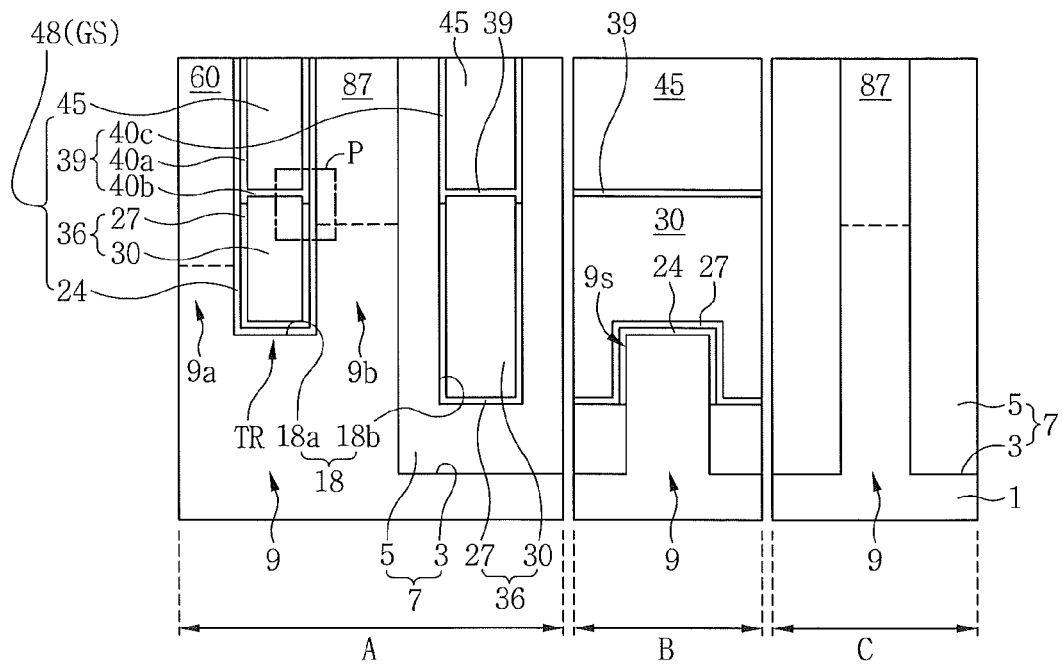
FIG. 3 is a cross-sectional view of a semiconductor device according to an embodiment of the inventive concept.

Referring to FIGS. 1 through 3, the gate structure GS of FIG. 2 may include a gate structure 48 (GS) including a gate dielectric 24, a gate electrode 36, an insulating metal-containing material layer (or metal-containing material layer 39), and an insulating gate capping pattern 45. The gate structure 48 (GS) may be formed within the gate trench 18. The gate electrode 36 may be formed to partially fill the gate trench 18. The gate electrode 36 may include a portion disposed at the same level as portions of the first and second source/drain regions 60 and 87. The gate electrode 36 may partially overlap with first and second source/drain regions 60 and 87 in which the gate electrode 36 is disposed at the same level as portions of the first and second source/drain regions 60 and 87. The gate electrode 36 may be a word line of a memory device, such as a dynamic random access memory (DRAM).

As appreciated in this disclosure, if the gate electrode 36 does not overlap with first and second source/drain regions 60 and 87, a leakage current in first and second source/drain regions 60 and 87, particularly a gate-induced drain leakage (GIDL), may be reduced. However, the gate electrode that does not overlap with first and second source/drain regions 60 and 87 may reduce a cell on-current (Ion), thereby degrading device electrical properties, such as a last data into row precharge time (Trdl).

The gate electrode 36 may include a first gate conductive pattern 27 and a second gate conductive pattern 30. The first gate conductive pattern 27 may be conformally formed within the gate trench 18, and the second gate conductive pattern 30 may be formed on the first gate conductive pattern 27 to partially fill the gate trench 18. The second gate conductive pattern 30 may include a conductive material having a lower resistivity than the first gate conductive pattern 27. For instance, the first gate conductive pattern 27 may be formed of a metal nitride (e.g., titanium nitride (TiN) or tungsten nitride (WN)), and the second gate conductive pattern 30 may be formed of a conductive material (e.g., W or titanium aluminum (TiAl)) having a lower resistivity than a metal nitride.

The gate capping pattern 45 may be formed on the gate electrode 36. The gate capping pattern 45 may be disposed on the gate electrode 36 and also disposed within the gate trench 18. The gate capping pattern 45 may be formed of an insulating material. For instance, the gate capping pattern 45 may be formed of silicon nitride or silicon oxynitride (SiON). The gate capping pattern 45 may be disposed at the same level as the portions of the first and second source/drain regions 60 and 87.

A portion of any one region 87 of the first and second source/drain regions 60 and 87, which may be disposed at the same level as the gate capping pattern 45, may be larger than a portion of the region 87, which may be disposed at the same level as the gate electrode 36.

A gate dielectric 24 may be formed between the gate electrode 36 and the active region 9. The gate dielectric 24 may include silicon oxide or a silicon oxide-based material. For example, the gate dielectric 24 may include silicon oxide or a nitrogen (N)-doped silicon oxide.

The gate dielectric 24 may include a portion interposed between the gate capping pattern 45 and the active region 9. For example, the gate dielectric 24 may be interposed between the gate electrode 36 and the active region 9 and extend between the gate capping pattern 45 and the active region 9. The gate dielectric 24 may cover bottom and side surfaces of the gate electrode 36 and extend between the gate capping pattern 45 and the active region 9.

The metal-containing material layer 39 may include a dipole layer. The metal-containing material layer 39 may cover bottom and side surfaces of the gate capping pattern 45. The metal-containing material layer 39 may be formed of a different material from the gate capping pattern 45 and cover bottom and side surfaces of the gate capping pattern 45. The metal-containing material layer 39 may include a first portion 40a interposed between the gate capping pattern 45 and the active region 9, a second portion 40b interposed between the gate capping pattern 45 and the gate electrode 36, and a third portion 40c interposed between the gate capping pattern 45 and the insulating material pattern 5 of the field region 7. The first portion 40a of the metal-containing material layer 39 may include a portion interposed between the gate capping pattern 45 and the gate dielectric 24.

The first through third portions 40a, 40b, and 40c of the metal-containing material layer 39 may be formed of the same material and continuously connected to one another.

The metal-containing material layer 39 may be a supplemental gate electrode pattern since the metal-containing material layer 39 may be configured to provide a difference between work functions of a portion of the gate electrode 36 overlapping with the first and second source/drain regions 60 and 87 and the first and second source/drain regions 60 and 87 that is less than a difference between work functions of a portion of the gate electrode 36 overlapping with the channel region and the first and second source/drain regions 60 and 87.

A portion of any one region 87 of the first and second source/drain regions 60 and 87, which may be disposed at the same level as the metal-containing material layer 39, may be larger than a portion of the region 87, which may be disposed at the same level as the gate electrode 36. A portion of any one (e.g., the second source/drain region 87) of the first and second source/drain regions 60 and 87, which may be disposed opposite the metal-containing material layer 39 may be larger than a portion of the second source/drain region 87, which may be disposed opposite the gate electrode 36. A portion of the second source/drain region 87, which may be disposed opposite the gate electrode 36, may include a lightly doped region, and a portion of the second source/drain region 87 disposed opposite the metal-containing material layer 39 may include a heavily doped region.

The transistor TR may include the gate structure 48 (GS) and the first and second source/drain regions 60 and 87.

The gate electrode 36 may include a conductive material having a Fermi energy closer to a mid-gap energy of the active region 9 than to a valance band or conduction band of an energy band diagram of the active region 9 and a first work function. The metal-containing material layer 39 may include a different metal from the gate dielectric 24. The metal contained in the metal-containing material layer 39 may have a Fermi energy closer to a band edge (e.g., conduction band or valance band) of the energy band diagram of the active region 9 than to the mid-gap energy of the energy band diagram of the active region 9.

The transistor TR may be an NMOS transistor. When the transistor TR is the NMOS transistor, the metal-containing material layer 39 may be formed of a dielectric material containing an N-type metal having a second work function smaller than the first work function of the gate electrode 36. Here, the "N-type metal" may refer to a metal having Fermi energy closer to a conduction band than to a valance band in an energy band diagram of the active region 9. For instance, the metal-containing material layer 39 may be formed of an N-type metal, such as lanthanum (La) or magnesium (Mg). The metal-containing material layer 39 may include a metal, such as La or Mg, and be formed of a dielectric material capable of forming a dipole. For example, the metal-containing material layer 39 may include a dipole layer containing at least one of lanthanum oxide (LaO), magnesium oxide (MgO), lanthanum oxynitride (LaON), and magnesium oxynitride (MgON).

Although the transistor TR may be an NMOS transistor, the inventive concept is not limited to a semiconductor device having an NMOS transistor. For instance, the inventive concept may be applied to a semiconductor device having a PMOS transistor. For example, when the transistor TR is a PMOS transistor, the metal-containing material layer 39 may be formed of a dielectric material containing a P-type metal having a second work function larger than the first work function of the gate electrode 36. Here, the "P-type" may refer to a metal having a Fermi energy closer to a valance band than to a conduction band in the energy band diagram of the active region 9. The metal-containing material layer 39 may be formed of a dielectric material containing a P-type metal, such as aluminum (Al), tantalum (Ta), or iridium (Ir). In the PMOS transistor, the metal-containing material layer 39 may include a P-type metal, such as Al, Ta, or Ir, and be formed of a dielectric material capable of forming a dipole. For example, the metal-containing material layer 39 may include a dipole layer containing one of aluminum oxide (AlO), aluminum oxynitride (AlON), tantalum oxide (TaO), tantalum oxynitride (TaON), iridium oxide (IrO), and iridium oxynitride (IrON).

The transistor TR may be used as a cell transistor of a DRAM device. The capacitor structure 98 may be electrically connected to the second source/drain region 87 of transistor TR. The capacitor structure 98 may be in a charged state. In this case, due to the charged capacitor structure 98, the second source/drain region 87 may be in substantially the same state as when a positive voltage is applied to the second source/drain region 87. To maintain the transistor TR having the second source/drain region 87 in an off state, a positive voltage may be applied to the first source/drain region 60, and a negative voltage may be applied to the gate electrode 36. Here, due to the second source/drain region 87 put in the same state as when the positive voltage is applied thereto, a dipole may be formed in the first portion 40a of the metal-containing material layer 39 disposed opposite to the second source/drain region 87. The dipole formed in the first portion 40a of the metal-containing material layer 39 may inhibit a leakage current in the second source/drain region 87. Also, due to a metal having the same polarity as the second source/drain region 87 contained in the metal-containing material layer 39, the leakage current in the second source/drain region 87 may be reduced or inhibited. For instance, when the second source/drain region 87 having an N-polarity and a Fermi energy close to a conduction band, the metal also may have N-polarity and a Fermi energy closer to the conduction band of the second source/drain region 87. For instance, the first portion 40a of the metal-containing material layer 39 disposed opposite to the second source/drain region 87 may shift an energy band edge of the N-type second source/drain region 87, and a leakage current caused by band-to-band tunneling, which occurs in the second source/drain region 87 due to a band edge shift in the second source/drain region 87, may be inhibited. Accordingly, since the first portion 40a of the metal-containing material layer 39 may reduce or inhibit the leakage current in the second source/drain region 87, when the transistor TR is turned off, loss of charge stored in the capacitor structure 98 due to the leakage current in the second source/drain region 87 may be reduced or inhibited.

Meanwhile, the second portion 40b of the metal-containing material layer 39 may be in contact with the gate electrode 36. For example, the metal-containing material layer 39 may be in contact with a top surface and upper edge of the gate electrode 36. To maintain the transistor TR in an off state, when a negative voltage is applied to the gate electrode 36, a dipole may be formed in the second portion 40b of the metal-containing material layer 39. The dipole formed in the second portion 40b of the metal-containing material layer 39 may change a work function of the top surface and upper edge of the gate electrode 36. Due to the change in the work function of the top surface and upper edge of the gate electrode 36, a leakage current in the second source/drain region 87 close to the upper edge of the gate electrode 36 may be reduced or inhibited.

Figure 4A:
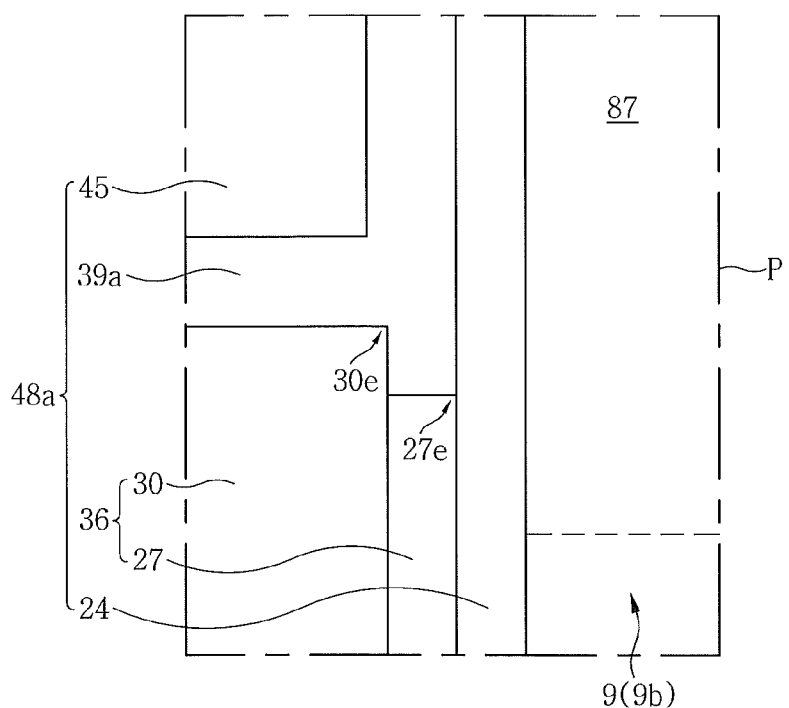
FIGS. 4A through 4C are partial enlarged views of a portion of FIG. 3.

FIG. 4A is a partial enlarged view of portion "P" of FIG. 3. A semiconductor device according to an embodiment of the inventive concept will now be described with reference to FIG. 4A.

Referring to FIG. 4A, the gate electrode 36 may include a first edge portion edge portion 27e and a second edge portion 30e. In the gate electrode 36, the first edge portion 27e and the second edge portion 30e may be disposed at the same level as a portion of the second source/drain region 87. In the gate electrode 36, the first edge portion 27e and the second edge portion 30e may horizontally overlap the second source/drain region 87.

In embodiments, the expression "components may be horizontally overlap one another" may be interpreted as meaning "components may be disposed on the same planar surface" or "components may be disposed at the same level."

The first edge portion 27e of the gate electrode 36 may be an edge portion of the first gate conductive pattern 27 close to the second source/drain region 87, and the second edge portion 30e may be an edge portion of the second gate conductive pattern 30 close to the second source/drain region 87. For example, the first edge portion 27e may be an edge portion where a side surface of the first gate conductive pattern 27 close to the active region 9 meets a top surface of the first gate conductive pattern 27, and the second edge portion 30e may be an edge portion where a side surface of the second gate conductive pattern 30 close to the active region 9 meets a top surface of the second gate conductive pattern 30.

The second edge portion 30e may be a round edge. For example, the edge portion of the second edge portion 30e, where the side surface of the second gate conductive pattern 30 close to the active region 9 meets the top surface of the second gate conductive pattern 30, may have a round shape or a curved shape.

In some embodiments, the top surface of the second gate conductive pattern 30 may be disposed at a higher level than the top surface of the first gate conductive pattern 27. A metal-containing material layer 39a may be interposed between the gate electrode 36 and the gate capping pattern 45 and extend between the gate capping pattern 45 and the active region 9. The metal-containing material layer 39a may fill a space between a side surface of an upper region of the second gate conductive pattern 30 and the gate dielectric 24.

A dipole may be formed in a portion of the metal-containing material layer 39a adjacent to the second source/drain region 87. Also, the metal-containing material layer 39a may fill the space between the side surface of the upper region of the second gate conductive pattern 30 and the gate dielectric 24. Accordingly, the metal-containing material layer 39a may be formed to surround the edge portion 30e of the second gate conductive pattern 30. Due to the metal-containing material layer 39a formed to surround the edge portion 30e of the second gate conductive pattern 30, a gate-induced drain leakage current (GIDL) in the second source/drain region 87 may be reduced.

Figure 4B:
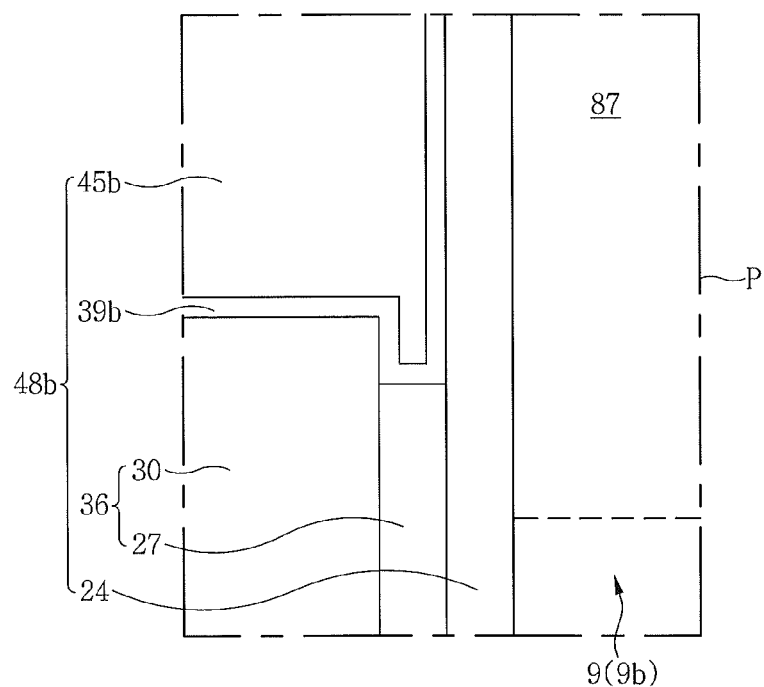

The metal-containing material layer 39a may be thicker than the gate dielectric 24, but the inventive concept is not limited thereto. For instance, the metal-containing material layer 39a may have substantially the same thickness as the gate dielectric 24 or a smaller thickness than the first gate dielectric 24. For example, as shown in FIG. 4B, a metal-containing material layer 39b may be formed to a smaller thickness than the gate dielectric 24. The metal-containing material layer 39b of FIG. 4B may be formed to a smaller thickness than the first gate conductive pattern 27. The gate capping pattern 45 may be modified into a gate gapping pattern 45b having a portion extending between the side surface of the upper region of the second gate conductive pattern 30 close to the second source/drain region 87 and the second source/drain region 87.

A semiconductor device according to an embodiment of the inventive concept will now be described with reference to FIG. 4C, which is a partial enlarged view of portion "P" of FIG. 3.

Figure 4C:
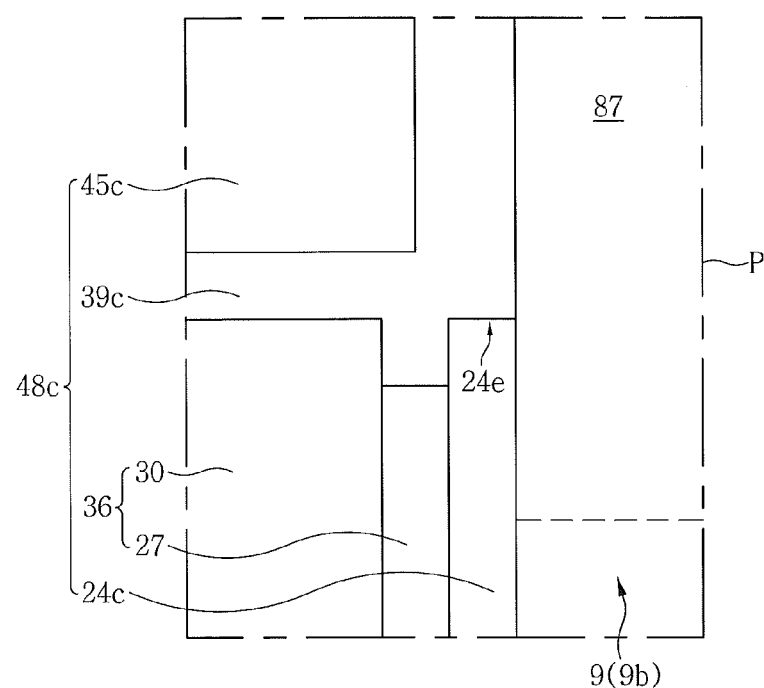

Referring to FIG. 4C, a gate structure 48c including the gate electrode 36, a gate capping pattern 45c, a metal-containing material layer 39c, and a gate dielectric 24c may be provided. The gate electrode 36 and the gate capping pattern 45c may be stacked sequentially. The metal-containing material layer 39c may be interposed between the gate capping pattern 45c and the second source/drain region 87. The gate dielectric 24c may be interposed between the gate electrode 36 and the active region 9.

In some embodiments, the gate dielectric 24c may be interposed between the first gate conductive pattern 27 and the active region 9 and extend upward.

The gate dielectric 24c may have a portion interposed between the first gate conductive pattern 27 and the active region 9, and a portion interposed between the metal-containing material layer 39c and the second source/drain region 87. For instance, the gate dielectric 24c may be interposed between the first gate conductive pattern 27 and the active region 9 and extend between the metal-containing material layer 39c and the second source/drain region 87 so that the gate dielectric 24c can have an end portion 24e interposed between the metal-containing material layer 39c and the second source/drain region 87.

Next, a semiconductor device according to an embodiment of the inventive concept will be described with reference to FIGS. 1, 2, 5, and 6. FIG. 6 is a partial enlarged view of portion "P" of FIG. 5.

Referring to FIGS. 1, 2, 5, and 6, the gate structure GS of FIG. 2 may be a gate structure 148 (GS) including a gate dielectric 24', a gate electrode 36, an insulating metal-containing material layer 139, and an insulating gate capping pattern 145.

The gate electrode 136 and the gate capping pattern 145 may be sequentially stacked within the gate trench 18. The gate dielectric 24' may be interposed between the gate electrode 36 and the active region 9. The gate dielectric 24' may include a first portion 124a interposed between the gate electrode 36 and the active region 9, and a second portion 124b interposed between the gate capping pattern 145 and the active region 9. The metal-containing material layer 139 may be formed between the gate capping pattern 145 and the active region 9. The metal-containing material layer 139 may be formed on a side surface of the gate capping pattern 145. The metal-containing material layer 139 may include a first portion 140a formed by implanting a metal into the second portion 124b of the gate dielectric 24' disposed adjacent to the side surface of the gate capping pattern 145, and a second portion 140b formed by implanting the metal into the insulating material pattern 5 of the field region 7 disposed adjacent to the side surface of the gate capping pattern 145. For example, the first portion 140a of the metal-containing material layer 139 may be a region formed by diffusing a different metal from the first portion 124a of the gate dielectric 24' into the second portion 124b of the gate dielectric 24'. The second portion 140b of the metal-containing material layer 139 may be a region formed by diffusing a different metal from the gate dielectric 24' into the insulating material pattern 5.

The first portion 140a of the metal-containing material layer 139 may include the same materials as the first portion 124a of the gate dielectric 24' but a different metal from the first portion 124a of the gate dielectric 24'. For example, when the first portion 124a of the gate dielectric 24' is formed of an oxide containing silicon and oxygen, the metal-containing material layer 140a may be formed of an oxide containing not only silicon and oxygen but also a metal that is not included in the gate dielectric 24'. In another case, when the first portion 124a of the gate dielectric 24 is formed of an oxide containing silicon, nitrogen, and oxygen, the metal-containing material layer 139 may be formed of an oxide containing not only silicon, nitrogen, and oxygen but also a metal that is not included in the first portion 124a of the gate dielectric 24.

The transistor TR may include the gate structure 148 (GS).

When the transistor TR is an NMOS transistor, the metal-containing material layer 140a included in the gate structure 148 (GS) may be formed of a dielectric material including an N-type metal as described with reference to FIG. 3. For instance, when the transistor TR is the NMOS transistor, the metal-containing material layer 140a may include a metal, such as La or Mg, and be formed of a dielectric material capable of forming a dipole. For example, the metal-containing material layer 140a may include a dipole layer containing at least one of LaO, MgO, LaON, and MgON. When the transistor TR is the NMOS transistor, the metal-containing material layer 140a may be formed of silicon oxide doped with either one of La and Mg, or silicon oxynitride doped with either one of La and Mg.

When the transistor TR is a PMOS transistor, the metal-containing material layer 140a included in the gate structure 148 (GS) may be formed of a dielectric material containing a P-type metal as described with reference to FIG. 3. For example, when the transistor TR is the PMOS transistor, the metal-containing material layer 140a may include a P-type metal, such as Al, Ta, or Ir, and be formed of a dielectric material capable of forming a dipole. For instance, the metal-containing material layer 140a may include a dipole layer containing one of AlO, AlON, TaO, TaON, IA), and IrON.

When the transistor TR is the PMOS transistor, the metal-containing material layer 139a may be formed of silicon oxide doped with any one of Al, Ta, and Ir, or silicon oxynitride doped with any one of Al, Ta, and Ir.

The metal-containing material layer 140a of the gate structure 148 (GS) may inhibit a leakage current in the turned-off transistor TR. Since the metal-containing material layer 140a may inhibit leakage current in the second source/drain region 87, when the transistor TR is turned off, loss of charge stored in the capacitor structure 98 due to the leakage current in the second source/drain region 87 may be inhibited.

In some embodiments, the metal-containing material layer 140a may extend between the first gate conductive pattern 27 of the gate electrode 36 and the active region 9. A portion of the metal-containing material layer 140a may be interposed between an end portion 27e of the first gate conductive pattern 27 of the gate electrode 36 and the second source/drain region 87. The portion of the metal-containing material layer 139a interposed between the end portion 27e of the first gate conductive pattern 27 and the second source/drain region 87 may reduce or inhibit a GIDL in the second source/drain region 87 due to an electric field formed in the end portion 27e of the first gate conductive pattern 27.

Meanwhile, a region 140b doped with a metal may be formed in the insulating material pattern 5 of the field region 7 that may be in contact with or adjacent to the gate capping pattern 145. The doped region 140b formed in the insulating material pattern 5 of the field region 7 may include the same metal as the metal-containing material layer 140b.

Next, a semiconductor device according to an embodiment of the inventive concept will now be described with reference to FIGS. 1, 2, 7, and 8. FIG. 8 is a partial enlarged view of portion "P" of FIG. 7.

Referring to FIGS. 1, 2, 7, and 8, the gate structure GS of FIG. 2 may be a gate structure 248 (GS) including a gate dielectric 24, a gate electrode 236, an insulating metal-containing material layer 239, and an insulating gate capping pattern 245.

The gate electrode 236 may include at least one of poly-silicon (poly-Si), a metal nitride, and a metal. For example, the gate electrode 236 may include at least one of poly-Si, titanium nitride (TiN), tungsten (W), a titanium-aluminum (Ti—Al) alloy, and tungsten nitride.

The metal-containing material layer 239 may include a first portion interposed between the gate capping pattern 245 and the active region 9, a second portion interposed between the gate capping pattern 245 and the gate electrode 236, and a third portion interposed between the gate capping pattern 245 and the insulating material pattern 5.

In some embodiments, the gate electrode 236 may have a top surface with a downward concave shape. For example, as shown in FIG. 8, the gate electrode 236 may have a top surface 236s having a middle portion disposed at a higher level than an edge portion thereof. An upper edge 236e of the gate electrode 236, which may be adjacent or close to the second source/drain region 87 and in contact with the gate dielectric 24, may have a relatively upward protruding shape. The metal-containing material layer 239 may be in contact with the top surface of the gate electrode 236 and interposed between the gate capping pattern 245 and the second source/drain region 87.

The metal-containing material layer 239 capable of forming a dipole may be in contact with the upper edge 236e of the gate electrode 236 and vary a work function of the upper edge 236e of the gate electrode 236. Accordingly, the metal-containing material layer 239 may reduce or inhibit a leakage current in the second source/drain region 87 due to the upper edge 236e of the gate electrode 236.

Figure 10:
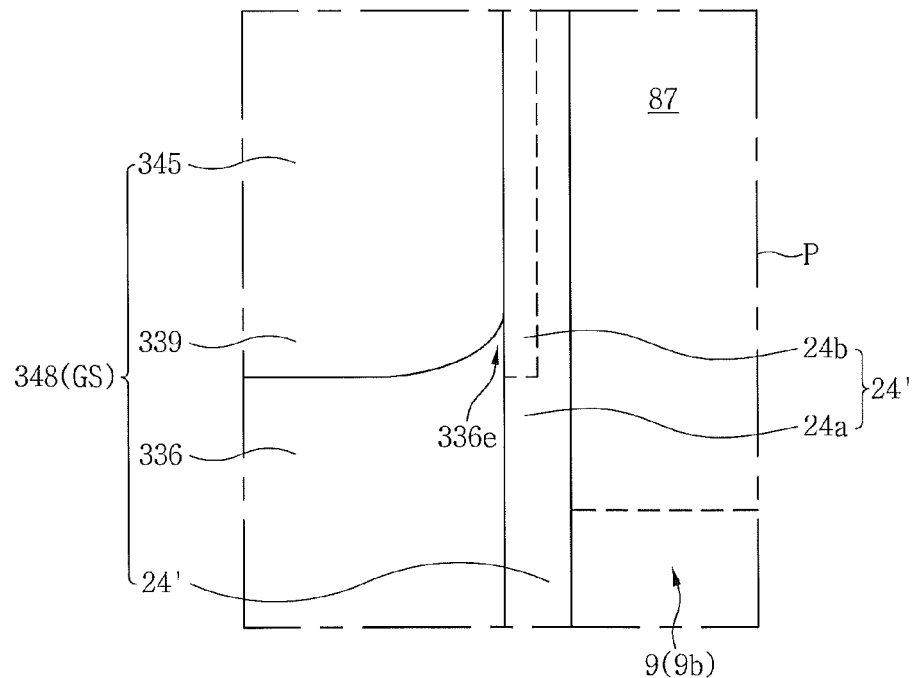
FIG. 10 is a partial enlarged view of a portion of FIG. 9.

Next, a semiconductor device according to an embodiment of the inventive concept will be described with reference to FIGS. 1, 2, 9, and 10. FIG. 10 is a partial enlarged view of portion "P" of FIG. 9.

Referring to FIGS. 1, 2, 9, and 10, the gate structure GS of FIG. 2 may be a gate structure 348 (GS) including a gate dielectric 24', a gate electrode 336, a metal-containing material layer 339, and a gate capping pattern 345.

The gate electrode 336 and the gate capping pattern 345 may be sequentially stacked within the gate trench 18. As described with reference to FIG. 6, the gate dielectric 24' may include a first portion 24a interposed between the gate electrode 36 and the active region 9, and a second portion 24b interposed between the gate capping pattern 145 and the active region 9. As described with reference to FIG. 6, the metal-containing material layer 339 may include a first portion 340a formed by implanting a metal into the second portion 24b of the gate dielectric 24' disposed on a side surface of the gate capping pattern 345, and a second portion 340b formed by implanting the metal into the insulating material pattern 5 contacting the gate capping pattern 345.

As described with reference to FIG. 8, the gate electrode 336 may have a top surface with an upwardly protruding edge portion 336e. The metal-containing material layer 339 may include a portion interposed between the edge portion 336e of the gate electrode 336 and the second source/drain region 87. A portion of the metal-containing material layer 339 interposed between the edge portion 336e of the gate electrode 336 and the second source/drain region 87 may reduce or inhibit a leakage current in the second source/drain region 87 due to the edge portion 336e of the gate electrode 336.

Next, a semiconductor device according to an embodiment of the inventive concept will be described with reference to FIGS. 1, 2, and 11.

Figure 11:
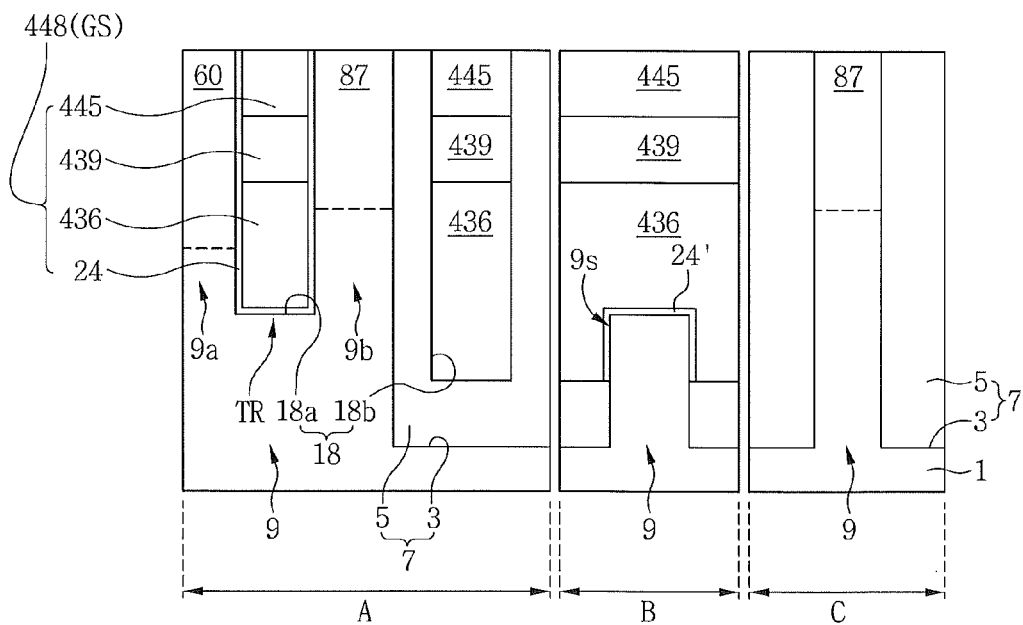
FIG. 11 is a cross-sectional view of a semiconductor device according to an embodiment of the inventive concept.

Referring to FIGS. 1, 2, and 11, the gate structure GS of FIG. 2 may be a gate structure 448 (GS) including a gate dielectric 24, a gate electrode 436, an insulating metal-containing material layer 439, and an insulating gate capping pattern 445.

Within the gate trench 18, the gate electrode 436, the metal-containing material layer 439, and the gate capping pattern 445 may be sequentially stacked. The metal-containing material layer 439 may be interposed between the gate capping pattern 445 and the gate electrode 436. The gate dielectric 24 may include a first portion interposed between the gate electrode 436 and the active region 9, a second portion interposed between the metal-containing material layer 439 and the active region 9, and a third portion interposed between the gate capping pattern 445 and the active region 9. In the active region 9, a PN junction formed by the first and second source/drain regions 60 and 87 may be disposed at a lower level than the metal-containing material layer 439. The metal-containing material layer 439 may horizontally overlap the first and second source/drain regions 60 and 87.

The metal-containing material layer 439 may be formed of a material capable of forming a dipole. The metal-containing material layer 439 may be formed of a different material from the gate capping pattern 445. The transistor TR may include the gate structure 448 (GS).

The transistor TR may be an NMOS transistor. When the transistor TR is an NMOS transistor, the metal-containing material layer 439 may include an N-type metal, such as La or Mg, and be formed of a dielectric material capable of forming a dipole as described with reference to FIG. 3. For instance, the metal-containing material layer 439 may include at least one of LaO, MgO, LaON, and MgON.

When the transistor TR is a PMOS transistor, the metal-containing material layer 439 may include a P-type metal, such as Al, Ta, or Ir, and be formed of a dielectric material capable of forming a dipole as described with reference to FIG. 3. For instance, the metal-containing material layer 439 may include one of AlO, AlON, TaO, TaON, IrO, and IrON.

Next, a semiconductor device according to an embodiment of the inventive concept will be described with reference to FIGS. 1, 2, and 12.

Figure 12:
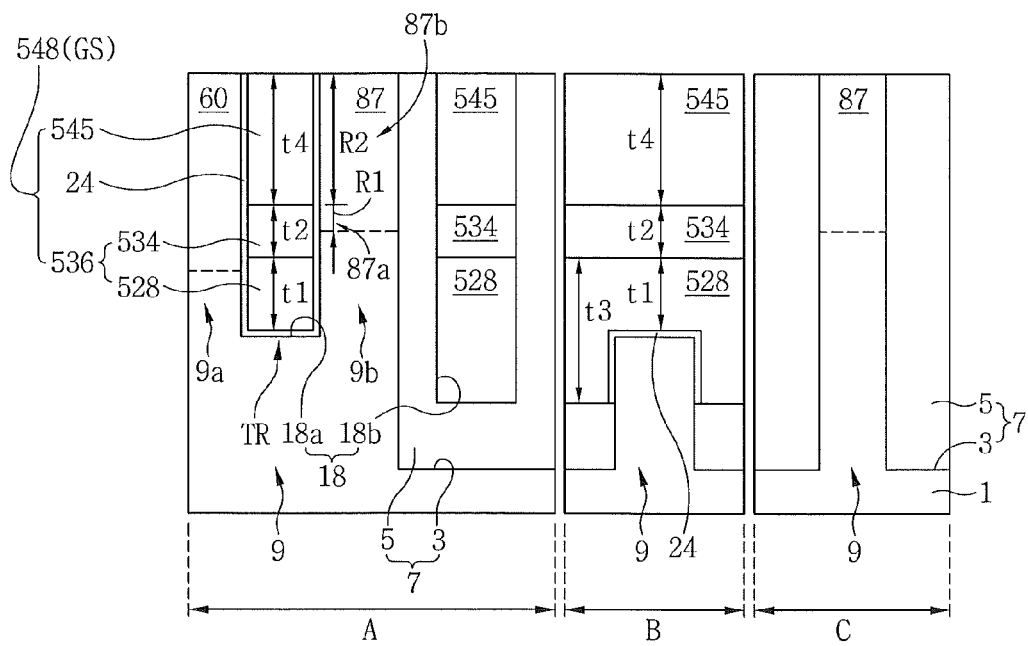
FIGS. 12, 13A, and 13B are cross-sectional views of semiconductor devices according to an embodiment of the inventive concept.

Referring to FIGS. 1, 2, and 12, the gate structure GS of FIG. 2 may be a gate structure 548 (GS) including a gate dielectric 24, a gate electrode 536, and a gate capping pattern 545.

The gate electrode 536 and the gate capping pattern 545 may be stacked sequentially. The gate dielectric 24 may include a portion interposed between the gate electrode 536 and the active region 9, and a portion interposed between the gate capping pattern 545 and the active region 9. The gate electrode 536 may include a first conductive pattern 528 and a second conductive pattern 534.

In the specification, it will be understood that, although the terms first, second, etc. may be used herein to describe conductive patterns constituting the gate electrode 536, the conductive patterns constituting the gate electrode 536 should not be limited by these terms. These terms are only used to distinguish one element, component, region, layer or section from another region, layer or section. For instance, to distinguish each of a plurality of components constituting the gate electrode 536, the second conductive pattern 534 could be termed a first conductive pattern, and the first conductive pattern 528 could be termed a second conductive pattern. Meanwhile, to distinguish each of a plurality of components constituting the gate electrode 536, the second gate conductive pattern 534 could be termed an upper gate conductive pattern, and the first gate conductive pattern 528 could be termed a lower gate conductive pattern.

The first conductive pattern 528 may be formed of a conductive material having a lower resistivity than the second conductive pattern 534.

The first conductive pattern 528 may be formed of a conductive material having a lower resistivity than the second conductive pattern 534 and a different work function from the second conductive pattern 534. The second conductive pattern 534 may be formed on the first conductive pattern 528. The first conductive pattern 528 and the second conductive pattern 534 may be stacked sequentially. The gate trench 18 may include a first portion 18a disposed in the active region 9, and a second portion 18b disposed in the field region 7. Within the first portion 18a of the gate trench 18, the first conductive pattern 528 may have a vertical thickness t1 greater than a vertical thickness t2 of the second conductive pattern 534. Within the second portion 18b of the gate trench 18, the first conductive pattern 528 may have a vertical thickness t3 greater than the vertical thickness t2 of the second conductive pattern 534. The gate capping pattern 545 may have a vertical thickness t4 greater than the vertical thickness t2 of the second conductive pattern 534.

The second conductive pattern 534 may be a supplemental gate electrode pattern since the second conductive pattern 534 may be configured to provide a difference between work functions of a portion of the gate electrode 536 overlapping with the first and second source/drain regions 60 and 87 and the first and second source/drain regions 60 and 87 that is less than a difference between work functions of a portion of the gate electrode 536 overlapping with the channel region and the first and second source/drain regions 60 and 87.

In embodiments, the term "vertical" may refer to a direction normal to the surface of the substrate 1, and the term "horizontal" may refer to a direction parallel to the surface of the substrate 1. For example, the term "vertical thickness" may refer to a thickness obtained in the direction normal to the surface of the substrate. Accordingly, the vertical thickness t2 of the first conductive pattern 528 may refer to a distance between top and bottom surfaces of the first conductive pattern 528, and the vertical thickness t2 of the second conductive pattern 534 may refer to a distance between top and bottom surfaces of the second conductive pattern 534. Here, the surface of the substrate 1 may be interpreted as a top surface of the active region 9.

As described with reference to FIG. 2, the transistor TR including the gate structure 536 (GS) may be a cell transistor of a memory device, such as a DRAM, and the capacitor structure 98 may be electrically connected to the second source/drain region 87.

The second source/drain region 87 may include a first portion R1 configured to horizontally overlap the second conductive pattern 534 and a second portion R2 configured to horizontally overlap the gate capping pattern 545. The first portion R1 of the second source/drain region 87 may be disposed opposite the gate electrode 536, while the second portion R2 of the second source/drain region 87 may be disposed opposite the gate capping pattern 545. The second portion R2 of the second source/drain region 87 may have a greater vertical thickness than the first portion R1 thereof. Any one region 87a of the first portion R1 of the second source/drain region 87 may have a lower dopant concentration than any one region 87b of the second portion R2 thereof.

The first portion R1 of the second source/drain region 87, which may horizontally overlap the second conductive pattern 534, may be a lightly doped region, while the second portion R2 of the second source/drain region 87, which may horizontally overlap the gate capping pattern 545, may be a heavily doped region having a higher concentration than the first portion R1.

In some embodiments, the gate structure 548 (GS) may include an insulating metal-containing material layer. A gate structure including the insulating metal-containing material layer will be described with reference to FIGS. 13A and 13B.

Figure 13A:
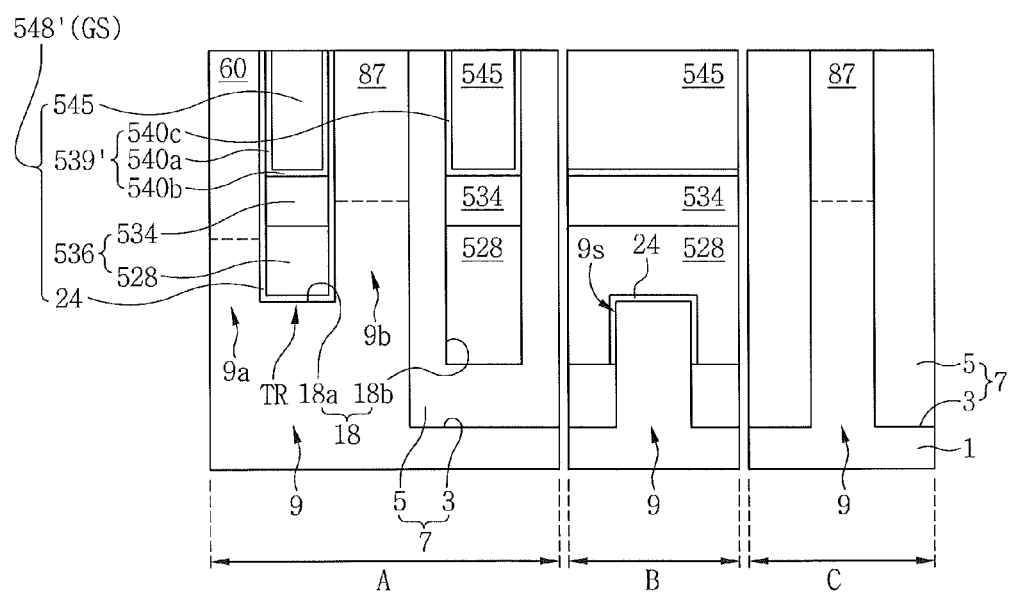

To begin with, referring to FIG. 13A, a gate structure 548' (GS) including a metal-containing material layer 539' covering bottom and side surfaces of the gate capping pattern 545 may be provided. The metal-containing material layer 539' may include a first portion 540a interposed between the gate capping pattern 545 and the active region 9, a second portion 540b interposed between the gate capping pattern 545 and the gate electrode 536, and a third portion 540c interposed between the gate capping pattern 545 and the insulating material pattern 5 of the field region 7. The metal-containing material layer 539' may include a continuous material layer. The metal-containing material layer 539' may be formed of substantially the same material as the metal-containing material layer 39 described with reference to FIG. 3.

Figure 13B:
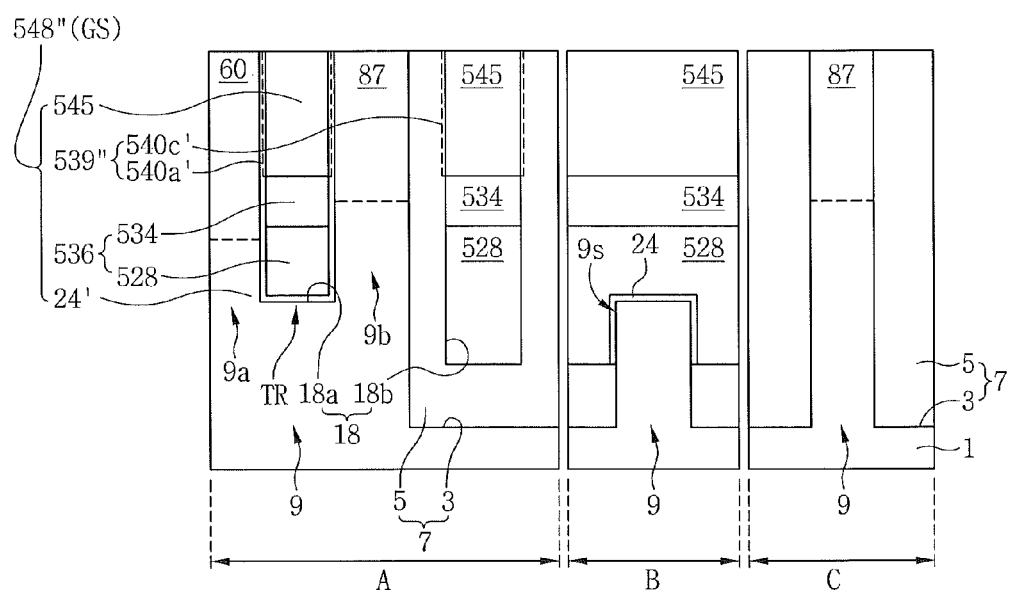

Next, referring to FIG. 13B, a gate structure 548" (GS) including a metal-containing material layer 539" formed on a side surface of the gate capping pattern 545 may be provided. The metal-containing material layer 539" may include a first portion 539a' formed in the gate dielectric 24' interposed between the gate capping pattern 545 and the active region 9, and a second portion 539c' formed in the insulating material pattern 5 disposed adjacent to or in contact with the gate capping pattern 545. The metal-containing material layer 539" may be formed of substantially the same material as the metal-containing material layer 139a described with reference to FIG. 5.

In the gate electrode 536, the first conductive pattern 528 may be defined as a lower gate electrode, while the second conductive pattern 534 may be defined as an upper gate electrode.

The first conductive pattern 528 that may be defined as the lower gate electrode may be formed of a mid-gap conductive material, while the second conductive pattern 534 that may be defined as the upper gate electrode may be formed of a band edge conductive material. Materials that may form the gate electrode 536 will now be described with reference to FIGS. 14, 15A, and 15B.

Figure 14:
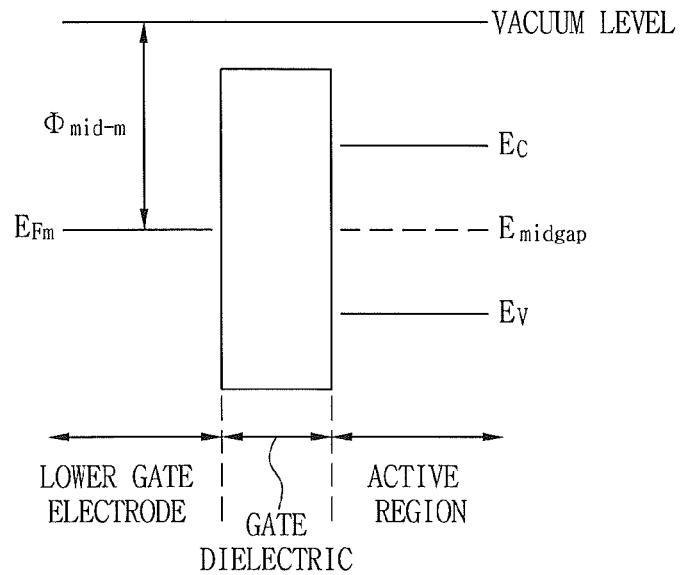
FIG. 14 is an energy band diagram of a lower gate electrode and an active region.

FIG. 14 is a schematic energy band diagram of the first conductive pattern (i.e., the lower gate electrode 528) of the gate electrode 536 and the active region 9 disposed adjacent to the lower gate electrode 528.

The first conductive pattern (i.e., the lower gate electrode) 528 of the gate electrode 536 will now be described with reference to FIG. 14.

Referring to FIG. 14, a Fermi energy level $E_{Fm}$ of the first conductive pattern (i.e., the lower gate electrode) 528 may be closer to a mid-gap energy $E_{midgap}$ of the active region 9 than to the conduction band Ec or valance band Ev of the energy band diagram of the active region 9. The Fermi energy level $E_{Fm}$ of the first conductive pattern 528 may be equal to or close to the mid-gap energy $E_{midgap}$ of the active region 9. In the energy band diagram, the mid-gap energy $E_{midgap}$ of the active region 9 may be defined as a middle energy between the conduction band EC and valance band EV of the active region 9.

The first conductive pattern 528 may be formed of a conductive material having a Fermi energy $E_{Fm}$ close to the mid-gap energy $E_{midgap}$ of the active region 9. The first conductive pattern 528 may include the conductive material having the Fermi energy $E_{Fm}$ close to the mid-gap energy $E_{midgap}$ of the active region 9, for example, at least one of TiN, W, a Ti—Al alloy, and WN.

The transistor TR including the gate electrode 536 may be an NMOS transistor. However, the inventive concept is not limited to a semiconductor device having the NMOS transistor. For example, the inventive concept may be applied to a semiconductor device having a PMOS transistor.

A case where the transistor TR is an NMOS transistor will be described with reference to FIG. 15A, and a case where the transistor TR is a PMOS transistor will be described with reference to FIG. 15B.

Initially, the case where the transistor TR is the NMOS transistor will be described with reference to FIG. 15A. FIG. 15A is a schematic energy band diagram illustrating the upper gate electrode 534 and a source/drain region 87 horizontally overlapping the upper gate electrode 534 in a case where the transistor TR is the NMOS transistor.

Figure 15A:
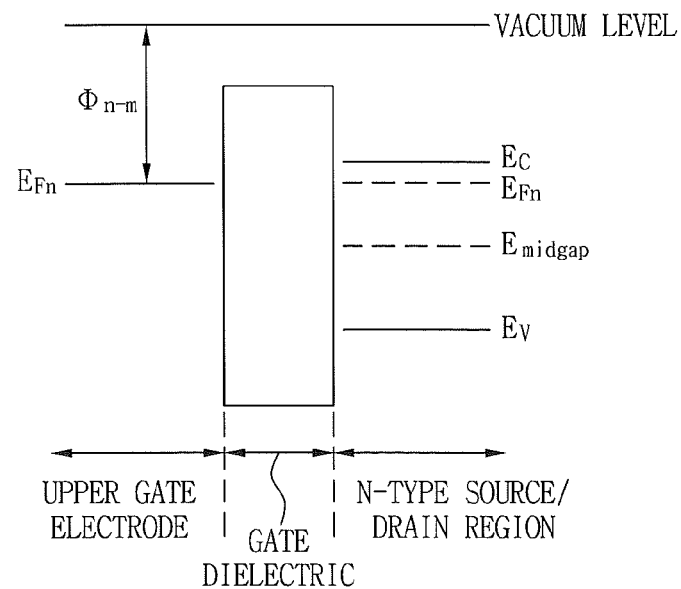
FIG. 15A is an energy band diagram of an upper gate electrode and an N-type source/drain region.

Referring to FIG. 15A, when the transistor TR is the NMOS transistor, the first portion R1 of the source/drain region 87 disposed opposite the upper gate electrode 534 may have a Fermi energy close to the conduction band Ec of the active region 9. The upper gate electrode 534 may be formed of a conductive material having a Fermi energy $E_{Fm}$ close to the conduction band Ec of the first portion R1 of the source/drain region 87. The upper gate electrode 534 may be formed of a band edge conductive material close to the conduction band Ec of the first portion R1 of the N-type source/drain region 87. For instance, the upper gate electrode 534 may be formed of a La-containing conductive material layer (e.g., a La layer) or an N-type poly-Si layer. For example, the upper gate electrode 534 may be formed of poly-Si doped with phosphorus (P) and/or arsenic (As).

The first conductive pattern 528 may be formed of a mid-gap conductive material having a Fermi energy $E_{Fm}$ close to the mid-gap energy $E_{midgap}$ of the active region 9, and the second conductive pattern 534 may be formed of a band edge conductive material having a Fermi energy $E_{Fm}$ close to the conduction band Ec of the active region 9.

The second conductive pattern 534 may be formed of a conductive material having a work function $\Phi_{n-m}$ smaller than a work function $\Phi_{mid-m}$ of the first conductive pattern 528. For example, the lower gate electrode (i.e., the first conductive pattern) 528 may be formed of a conductive material, such as TiN, W, a Ti—Al alloy, or WN, and the upper gate electrode (i.e., the second conductive pattern) 534 may be formed of a La-containing conductive material or N-type poly-Si.

Next, a case where the transistor TR is a PMOS transistor will be described with reference to FIG. 15B. FIG. 15B is a schematic energy band diagram illustrating the upper gate electrode 534 and a source/drain region 87 horizontally overlapping the upper gate electrode 534 in a case where the transistor TR is a PMOS transistor.

Figure 15B:
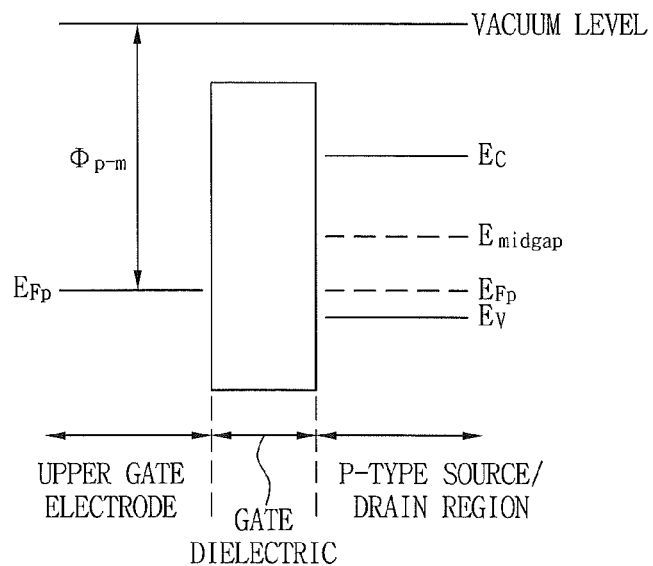
FIG. 15B is an energy band diagram of an upper gate electrode and a P-type source/drain region.

Referring to FIG. 15B, when the transistor TR is the PMOS transistor, the first portion R1 of the P-type source/drain region 87 horizontally overlapping the upper gate electrode 534 may have a Fermi energy $E_F$ close to the valance band Ev.

The upper gate electrode 534 may be formed of a conductive material having a Fermi energy $E_{Fp}$ close to the valance band Ev of the first portion R1 of the source/drain region 87.

The upper gate electrode 534 may be formed of a band edge conductive material close to the valance band Ev of the first portion R1 of the P-type source/drain region 87. For instance, the upper gate electrode 534 may be formed of a conductive material containing aluminum, tantalum or iridium, or P-type poly-Si. For example, the upper gate electrode 534 may be formed of B-doped poly-Si.

The first conductive pattern electrode 528 may be formed of a conductive material having a Fermi energy $E_{Fm}$ close to the mid-gap energy $E_{midgap}$ of the active region 9, and the second gate electrode 534 may be formed of a conductive material having a Fermi energy $E_{Fp}$ close to the valance band Ev of the active region 9.

The second conductive pattern electrode 534 may be formed of a conductive material having a work function $\Phi_{p-m}$ larger than a work function $\Phi_{mid-m}$ of the first conductive pattern electrode 528. For instance, the lower gate electrode (i.e., the first conductive pattern) 528 may be formed of a conductive material, such as TiN, W, a Ti—Al alloy, or WN, and the upper gate electrode (i.e., the second conductive pattern) 534 may be formed of aluminum (Al), tantalum (Ta), iridium (Ir), or P-type poly-Si. Next, a semiconductor device according to an embodiment of the inventive concept will be described with reference to FIGS. 1, 2, and 16.

Figure 16:
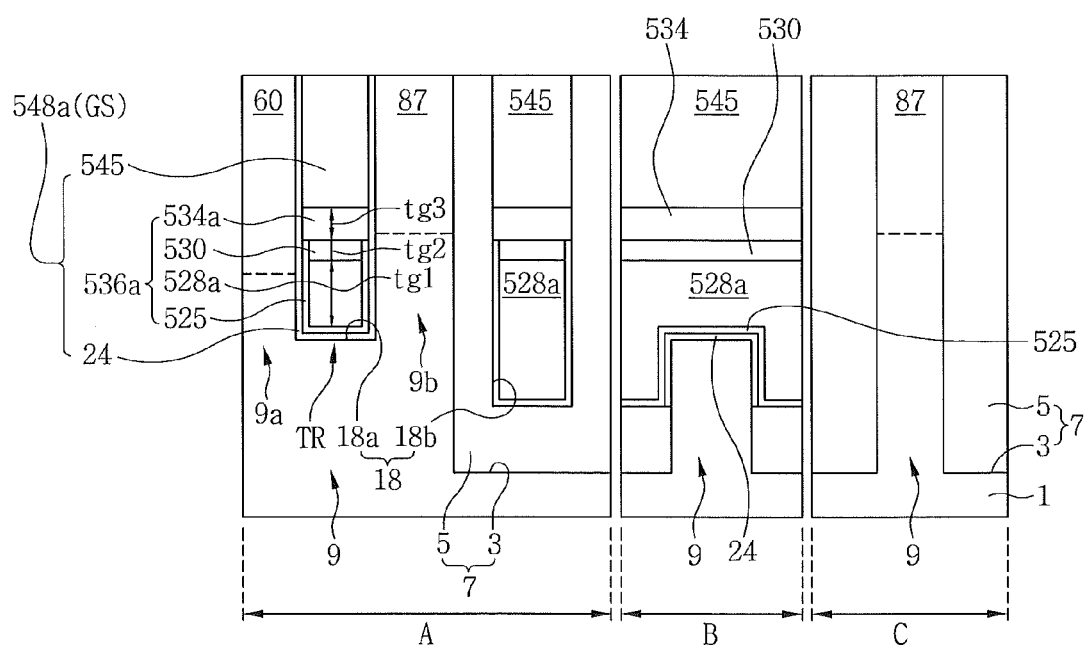
FIGS. 16 through 32 are cross-sectional views of semiconductor devices according to an embodiment of the inventive concept.

Referring to FIGS. 1, 2, and 16, the gate structure GS of FIG. 2 may be a gate structure 548a (GS) including a gate dielectric 24, a gate electrode 536a, and an insulating gate capping pattern 545. The gate electrode 536a and the gate capping pattern 545 may be stacked sequentially. The gate dielectric 24 may include a portion interposed between the gate electrode 536a and the active region 9, and a portion interposed between the gate capping pattern 545 and the active region 9.

The gate electrode 536a may include a lower barrier conductive pattern 525, a first conductive pattern 528a, a buffer conductive pattern 530, and a second conductive pattern 534a.

The first conductive pattern 528a, the buffer conductive pattern 530, and the second conductive pattern 534a may be stacked sequentially. The lower barrier conductive pattern 525 may cover bottom and side surfaces of the first conductive pattern 528a and extend onto a side surface of the buffer conductive pattern 530. The lower barrier conductive pattern 525 may be disposed at a lower level than the second conductive pattern 534a.

The first conductive pattern 528a may have a vertical thickness tg1 greater than a vertical thickness tg3 of the second conductive pattern 534a and a vertical thickness tg2 of the buffer conductive pattern 530. The second conductive pattern 534a may have a vertical thickness tg3 greater than the vertical thickness tg2 of the buffer conductive pattern 530.

The buffer conductive pattern 530 may be formed of a conductive material having a lower resistivity than the second conductive pattern 534a and a higher resistivity than the first conductive pattern 528a. The first conductive pattern 528a may be formed of a conductive material having a lower resistivity than the second conductive pattern 534a. The lower barrier conductive pattern 525' may be formed of a conductive material having a higher resistivity than the first conductive pattern 528a. For example, the second conductive pattern 534a may be formed of poly-Si having the same conductivity type as the first and second source/drain regions 60 and 87, and the first conductive pattern 528a may be formed of a conductive material having a low resistivity, such as tungsten (W). The buffer conductive pattern 530 may be formed of a metal nitride, such as tungsten nitride or titanium nitride. Also, the lower barrier conductive pattern 525' may be formed of a metal nitride, such as tungsten nitride or titanium nitride.

The buffer conductive pattern 530 may be interposed between the second conductive pattern 534a and the first conductive pattern 528a and prevent the second conductive pattern 534a and the first conductive pattern 528a from being in direct contact with each other, thereby preventing a reaction between the second conductive pattern 534a and the first conductive pattern 528a from occurring due to a subsequent annealing process.

When the transistor TR is an NMOS transistor, the second conductive pattern 534a may be formed of a conductive material (e.g., a La-containing conductive material or N-type poly-Si) having a Fermi energy $E_{Fn}$ close to the conduction band Ec of the active region 9 as described with reference to FIG. 15A.

When the transistor TR is a PMOS transistor, the second conductive pattern 534a may be formed of a conductive material (e.g., a conductive material containing aluminum, tantalum or iridium, or P-type poly-Si) having a Fermi energy $E_{Fp}$ close to the valance band Ev of the active region 9 as described with reference to FIG. 15B.

As described with reference to FIG. 14, the first conductive pattern 528a may be formed of a conductive material having a Fermi energy $E_{Fm}$ close to a mid-gap energy $E_{midgap}$ of the active region 9, for example, at least one of TiN, W, a Ti—Al alloy, and WN.

In some embodiments, the gate structure 548a (GS) may include an insulating metal-containing material layer. The gate structure 548a (GS) including the insulating metal-containing material layer will be described with reference to FIGS. 17A and 17B.

Figure 17A:
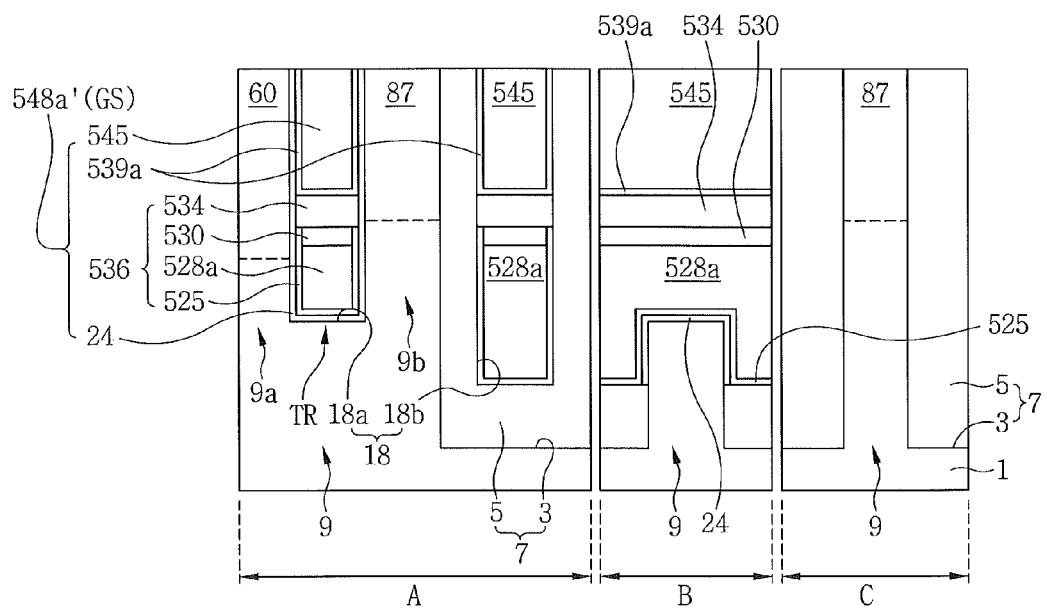

To begin with, referring to FIG. 17A, a gate structure 548a' including an insulating metal-containing material layer 539a' covering bottom and side surfaces of the gate capping pattern 545 may be provided. The metal-containing material layer 539a' may include a portion interposed between the gate capping pattern 545 and the gate electrode 536a. Also, the metal-containing material layer 539a' may include a portion interposed between the gate capping pattern 545 and the active region 9, and a portion interposed between the gate capping pattern 545 and the insulating material pattern 5 of the field region 7. The metal-containing material layer 539a' may be formed of substantially the same material as the metal-containing material layer 39 described with reference to FIG. 3.

Figure 17B:
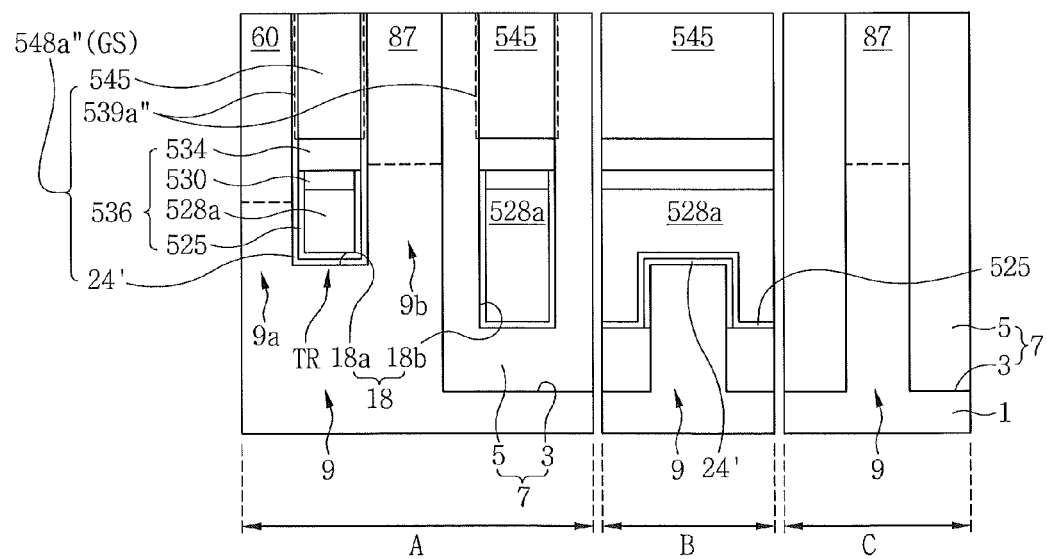

Next, referring to FIG. 17B, a gate structure 548a" including a metal-containing material layer 539a" formed on a side surface of the gate capping pattern 545 may be provided. The gate structure 5458a" may include a portion formed in the gate dielectric 24' interposed between the gate capping pattern 545 and the active region 9, and a portion formed in the insulating material pattern 5 disposed adjacent to the side surface of the gate capping pattern 545. The metal-containing material layer 539a" may include substantially the same material as the metal-containing material layer 139a described with reference to FIG. 5. Next, a semiconductor device according to an embodiment of the inventive concept will be described with reference to FIGS. 1, 2, and 18.

Figure 18:
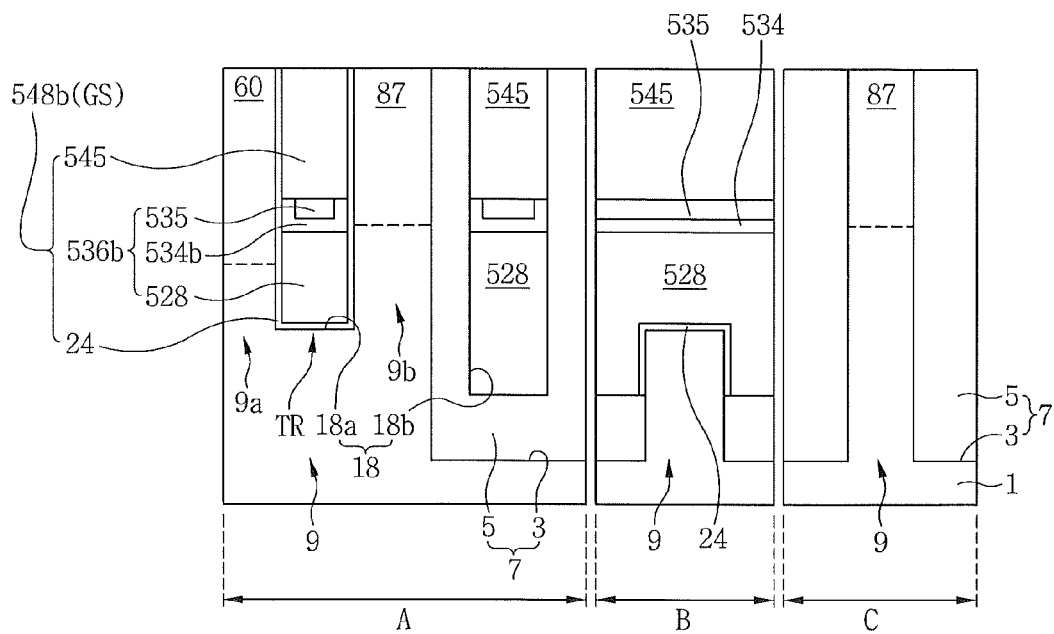

Referring to FIGS. 1, 2, and 18, the gate structure GS of FIG. 2 may include a gate structure 548b (GS) including a gate dielectric 24, a gate electrode 536b, and a gate capping pattern 545. The gate electrode 536b and the gate capping pattern 545 may be stacked sequentially. The gate dielectric 24 may include a portion interposed between the gate electrode 536b and the active region 9, and a portion interposed between the gate capping pattern 545 and the active region 9.

The gate electrode 536b may include a first conductive pattern 528, a second conductive pattern 534b, and an upper subsidiary conductive pattern 535 stacked sequentially. The second conductive pattern 534b may have a smaller vertical thickness than the first conductive pattern 528. The second conductive pattern 534b may be formed to cover bottom and side surfaces of the upper subsidiary conductive pattern 535.

As described with reference to FIG. 14, the first conductive pattern 528 may be formed of a conductive material having a Fermi energy $E_{Fm}$ close to a mid-gap energy $E_{midgap}$ of the active region 9, for example, at least one of TiN, W, a Ti—Al alloy, and WN. The first conductive pattern 528 may be a single layer or a double layer. For example, the first conductive pattern 528 may be a single layer formed of one of TiN, W, a Ti—Al alloy, and WM. The first conductive pattern 528 may be a multiple layer including a first conductive layer including either one of titanium nitride and tungsten nitride, and a second conductive layer including either one of W and a Ti—Al alloy. When the transistor TR is an NMOS transistor, the second conductive pattern 534b may be formed of a conductive material (e.g., a La-containing conductive material or N-type poly-Si) having a Fermi energy $E_{Fn}$ close to a conduction band Ec of the active region 9 as described with reference to FIG. 15A.

When the transistor TR is a PMOS transistor, the second conductive pattern 534b may be formed of a conductive material (e.g., a conductive material containing aluminum, tantalum or iridium, or P-type poly-Si) having a Fermi energy $E_{Fp}$ close to the valance band Ev of the active region 9 as described with reference to FIG. 15B.

The upper subsidiary conductive pattern 535 may be formed of a conductive material having a lower resistivity than the second conductive pattern 534b. For instance, the second conductive pattern 534b may include doped poly-Si, and the upper subsidiary conductive pattern 535 may include at least one of TiN, W, a Ti—Al alloy, and WN. The first conductive pattern 528 and the upper subsidiary conductive pattern 535 may function to improve a resistance characteristic of the gate electrode 536b and increase a signal transmission rate, and the second conductive pattern 534b may prevent or reduce a leakage current in the turned-off transistor TR. In some embodiments, the gate structure 548b (GS) may include an insulating metal-containing material layer. The gate structure 548b including the insulating metal-containing material layer will be described with reference to FIGS. 19A and 19B.

Figure 19A:
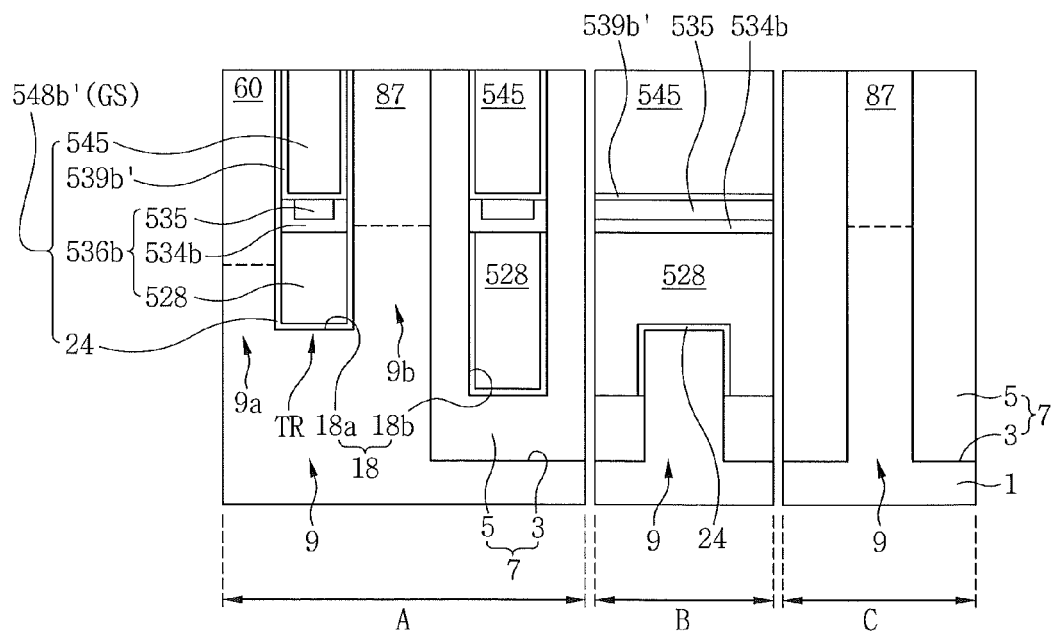

To begin with, referring to FIG. 19A, a gate structure 548b' (GS) including the gate capping pattern 545 an insulating metal-containing material layer 539b' covering side and bottom surfaces of the gate capping pattern 545 may be provided. The metal-containing material layer 539b' may include a portion interposed between the gate capping pattern 545 and the gate electrode 536b. Furthermore, the metal-containing material layer 539b' may include a portion interposed between the gate capping pattern 545 and the active region 9, and a portion interposed between the gate capping pattern 545 and the insulating material pattern 5 of the field region 7. The metal-containing material layer 539b' may be formed of substantially the same material as the metal-containing material layer 39 described with reference to FIG. 3.

Figure 19B:
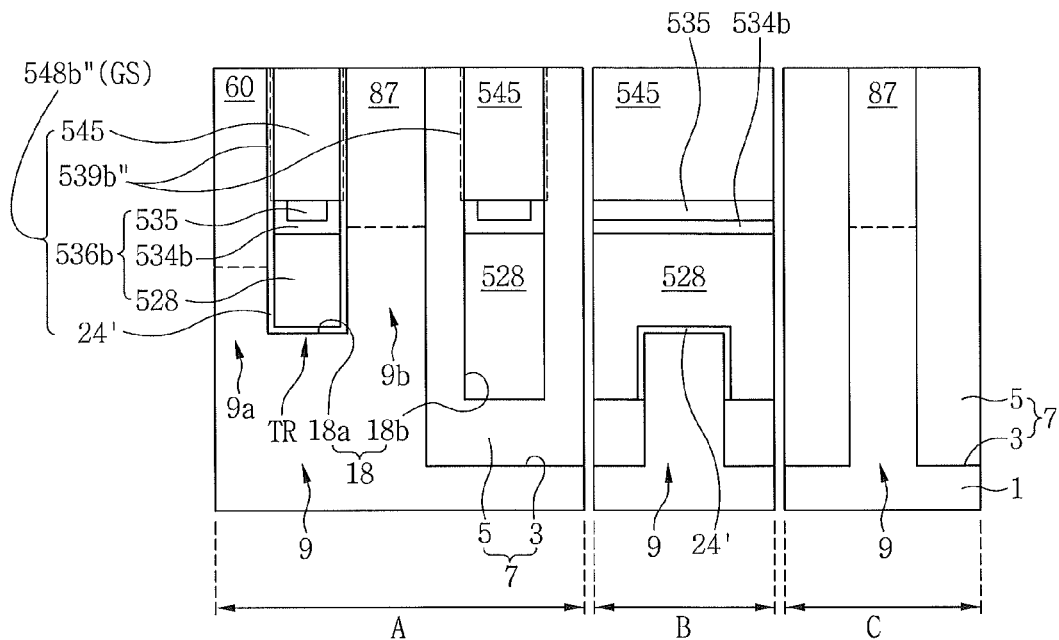

Next, referring to FIG. 19B, a gate structure 548b" including the insulating metal-containing material layer 539b" formed on a side surface of the gate capping pattern 545 may be provided.

The metal-containing material layer 539b" may include a portion formed in the gate dielectric 24' interposed between the gate capping pattern 545 and the active region 9, and a portion formed in the insulating material pattern 5 disposed adjacent to or in contact with a side surface of the gate pattern 545. The metal-containing material layer 539b" may include substantially the same material as the metal-containing material layer 139a described with reference to FIG. 5.

Next, a semiconductor device according to an embodiment of the inventive concept will be described with reference to FIGS. 1, 2, and 20.

Figure 20:
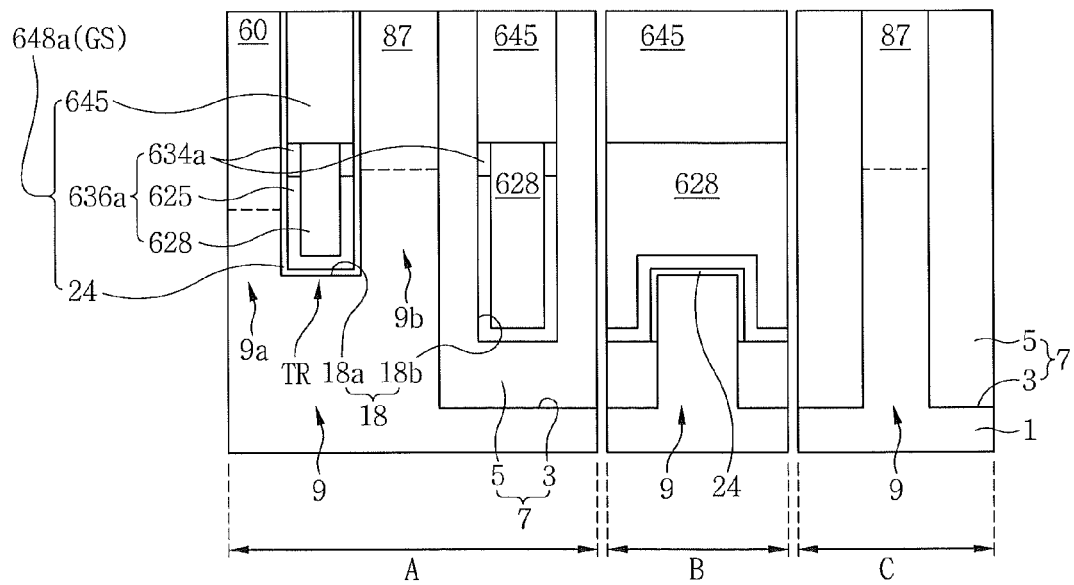

Referring to FIGS. 1, 2, and 20, the gate structure GS of FIG. 2 may be a gate structure 648a (GS) including a gate dielectric 24, a gate electrode 636a, and an insulating gate capping pattern 645. The gate electrode 636a and the gate capping pattern 645 may be stacked sequentially. The gate electrode 636a may be disposed at a lower level than a top surface of the active region 9. The gate dielectric 24 may include a portion interposed between the gate electrode 636a and the active region 9. The gate dielectric 24 may include a first portion interposed between the gate electrode 636a and the active region 9, and a second portion interposed between the gate capping pattern 645 and the active region 9.

The gate electrode 636a may include a first conductive pattern 628, a second conductive pattern 634a, and a lower barrier conductive pattern 625.

The second conductive pattern 634a may include a portion interposed between an upper side surface of the first conductive pattern 628 and the active region 9, and a portion interposed between the upper side surface of the first conductive pattern 628 and the insulating pattern 5 of the field region 7.

The second conductive pattern 634a may include a portion disposed at the same level as the first and second source/drain regions 60 and 87. The second conductive pattern 634a may have a smaller vertical thickness than the first conductive pattern 628 and be disposed at a higher level than a bottom surface of the first conductive pattern 628.

The lower barrier conductive pattern 625 may cover the bottom surface of the first conductive pattern 628, extend onto a side surface of the first conductive pattern 628, and be disposed at a lower level than the second conductive pattern 634a.

As described with reference to FIG. 14, the first conductive pattern 628 may be formed of a conductive material having a Fermi energy $E_{Fm}$ closer to a mid-gap energy $E_{midgap}$ than to a conduction band or valence band of the active region 9, for example, at least one of TiN, W, a Ti—Al alloy, and WN.

The second conductive pattern 634a may include a material having a Fermi energy close to an energy band edge of the active region 9. For example, when the transistor TR is an NMOS transistor, the second conductive pattern 634a may be formed of a conductive material (e.g., a La-containing conductive material or N-type poly-Si) having a Fermi energy $E_{Fn}$ close to a conduction band Ec of the active region 9 as described with reference to FIG. 15A. When the transistor TR is a PMOS transistor, the second conductive pattern 634a may be formed of a conductive material (e.g., a conductive material containing aluminum, tantalum or iridium, or P-type poly-Si) having a Fermi energy $E_{Fp}$ close to the valance band Ev of the active region 9 as described with reference to FIG. 15B.

The first conductive pattern 628 may be formed of a conductive material having a lower resistivity than the second conductive pattern 634a. For example, the first conductive pattern 628 may be formed of poly-Si, and the second conductive pattern 634b may be formed of, for example, at least one of TiN, W, a Ti—Al alloy, and WN.

In some embodiments, the gate structure 648a (GS) may include an insulating metal-containing material layer. The gate structure 648a including the insulating metal-containing material layer will be described with reference to FIGS. 21A and 21B.

Figure 21A:
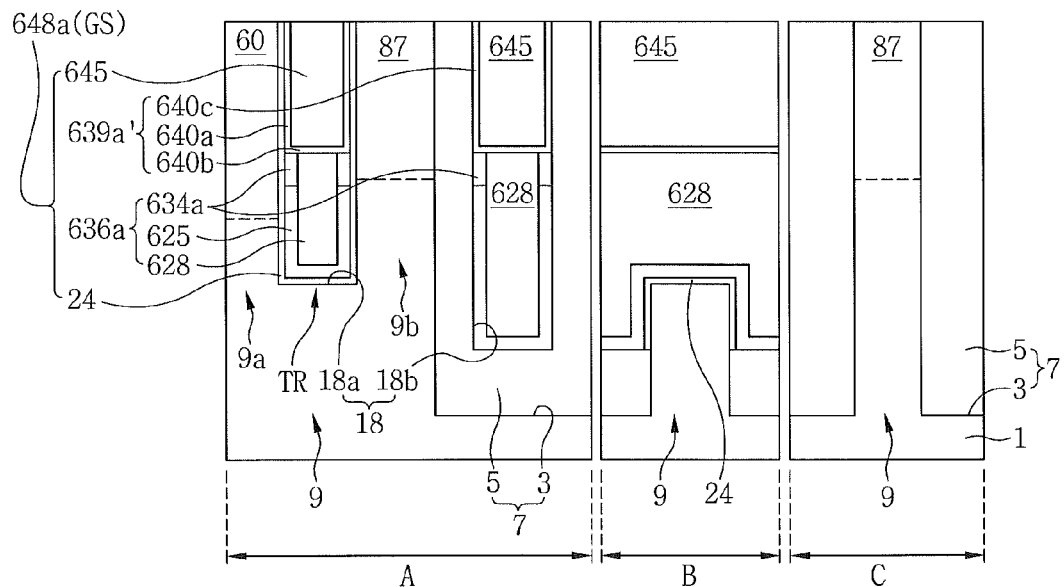

To begin with, referring to FIG. 21A, a gate structure 648a (GS) including a metal-containing material layer 639a' covering bottom and side surfaces of the gate capping pattern 645 may be provided.

The metal-containing material layer 639a' may include a first portion 640' interposed between the gate capping pattern 645 and the active region 9, a second portion 640b' interposed between the gate capping pattern 645 and the gate electrode 636a, and a third portion 640c' interposed between the gate capping pattern 645 and the insulating material pattern 5. The metal-containing material layer 639a' may be formed of substantially the same material as the metal-containing material layer 39 described with reference to FIG. 3.

Figure 21B:
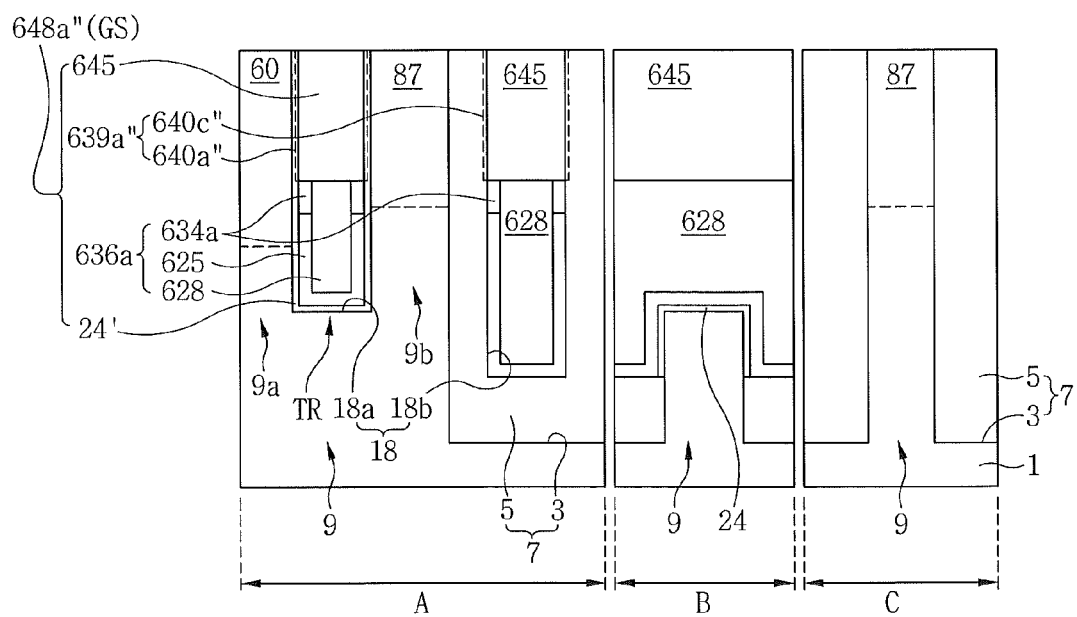

Next, referring to FIG. 21B, a gate structure 648a" (GS) including a metal-containing material layer 639a" formed on a side surface of the gate capping pattern 645 may be provided. The metal-containing material layer 639a" may include a first portion 640a" formed in the gate dielectric 24' disposed between the gate capping pattern 645 and the active region 9, and a second portion 640c" formed in the insulating material pattern 5 disposed adjacent to or in contact with the side surface of the gate capping pattern 645. The metal-containing material layer 639a" may include substantially the same material as the metal-containing material layer 139a described with reference to FIG. 5. Next, a semiconductor device according to an embodiment of the inventive concept will be described with reference to FIGS. 1, 2, and 22.

Figure 22:
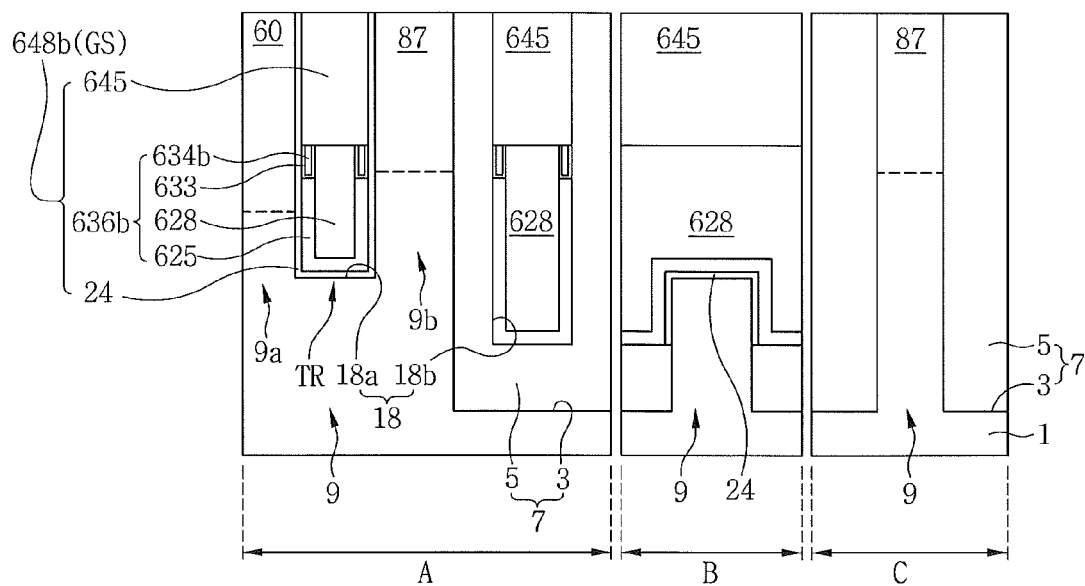

Referring to FIGS. 1, 2, and 22, the gate structure GS of FIG. 2 may be a gate structure 648b (GS) including a gate dielectric 24, a gate electrode 636b, and an insulating gate capping pattern 645. The gate electrode 636b and the gate capping pattern 645 may be stacked sequentially. The gate dielectric 24 may include a first portion interposed between the gate electrode 636b and the active region 9, and a second portion interposed between the gate capping pattern 645 and the active region 9.

The gate electrode 636b may include a first conductive pattern 628, a second conductive pattern 634b, a lower barrier conductive pattern 625, and an upper barrier conductive pattern 633.

The second conductive pattern 634b may be interposed between an upper side surface of the first conductive pattern 628 and the active region 9 and interposed between the upper side surface of the first conductive pattern 628 and the insulating material pattern 5. The first conductive pattern 628 may have a horizontal width H1 greater than a horizontal width H2 of the second conductive pattern 634b.

The second conductive pattern 634b may have a portion disposed at the same level as the first and second source/drain regions 60 and 87. The second conductive pattern 634b may have a smaller vertical thickness than the first conductive pattern 628 and be disposed at a higher level than a bottom surface of the first conductive pattern 628.

The lower barrier conductive pattern 625 may cover a bottom surface of the first conductive pattern 628, extend onto a side surface of the first conductive pattern 628, and be disposed at a lower level than the second conductive pattern 634b.

The upper barrier conductive pattern 633 may be formed to cover bottom and side surfaces of the second conductive pattern 634b. The upper barrier conductive pattern 633 may include a portion interposed between the first conductive pattern 628 and the second conductive pattern 634b. The upper barrier conductive pattern 633 may include a first portion interposed between the first conductive pattern 628 and the second conductive pattern 634b, a second portion interposed between the lower barrier conductive pattern 625 and the second conductive pattern 634b, and a third portion interposed between the active region 9 and the second conductive pattern 634b. Also, the upper barrier conductive pattern 633 may include a portion interposed between the insulating pattern 5 of the field region 7 and the second conductive pattern 634b.

In some embodiments, the gate structure 648b (GS) may include an insulating metal-containing material layer. The gate structure GS including the insulating metal-containing material layer will now be described with reference to FIGS. 23A and 23B.

Figure 23A:
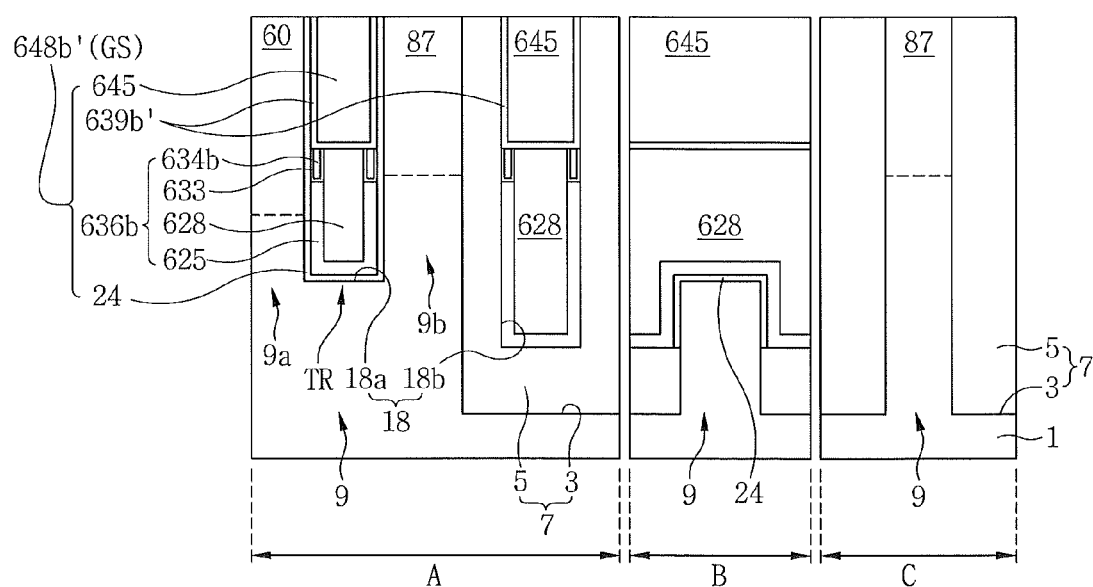

To begin with, referring to FIG. 23A, a gate structure 648b' (GS) including a metal-containing material layer 639b' covering bottom and side surfaces of the gate capping pattern 645 may be provided. The metal-containing material layer 639b' may include a portion interposed between the gate capping pattern 645 and the gate electrode 636b. Also, the metal-containing material layer 639b' may include a portion interposed between the gate capping pattern 645 and the active region 9, and a portion interposed between the gate capping pattern 645 and the insulating material pattern 5 of the field region 7. The metal-containing material layer 639b' may be formed of substantially the same material as the metal-containing material layer 39 described with reference to FIG. 3.

Figure 23B:
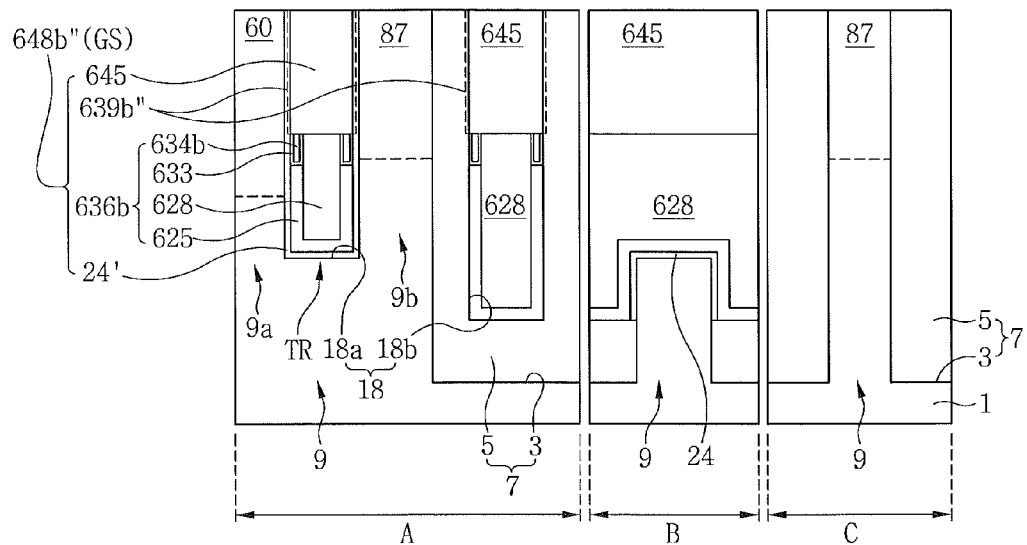

Thereafter, referring to FIG. 23B, a gate structure 648b" (GS) including a metal-containing material layer 639b" formed on a side surface of the gate capping pattern 645 may be provided. The metal-containing material layer 639b" may include a first portion formed in the gate dielectric 24' disposed between the gate capping pattern 645 and the active region 9, and a second portion formed in the insulating pattern 5 disposed adjacent to or in contact with the gate capping pattern 645. The metal-containing material layer 639b" may include substantially the same material as the metal-containing material layer 139a described with reference to FIG. 5.

Next, a semiconductor device according to an embodiment of the inventive concept will be described with reference to FIGS. 1, 2, and 24.

Figure 24:
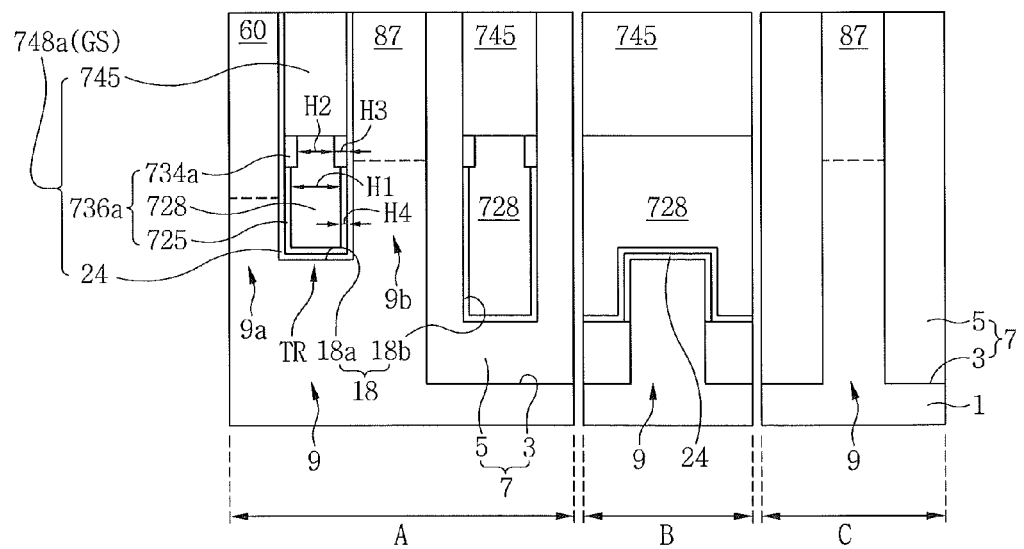

Referring to FIGS. 1, 2, and 24, the gate structure GS of FIG. 2 may be a gate structure 748a (GS) including a gate dielectric 24, a gate electrode 736a, and an insulating gate capping pattern 745. The gate electrode 736a and the gate capping pattern 745 may be stacked sequentially. The gate dielectric 24 may include a first portion interposed between the gate electrode 736a and the active region 9, and a second portion interposed between the gate capping pattern 745 and the active region 9.

The gate electrode 736a may include a first conductive pattern 728, a second conductive pattern 734a, and a lower barrier conductive pattern 725.

The second conductive pattern 734a may include a portion interposed between an upper side surface of the first conductive pattern 728 the active region 9, and a portion interposed between the upper side surface of the first conductive pattern 728 and the insulating pattern 5 formed in the field region 7.

The first conductive pattern 728 may include a first portion having a first horizontal width H1 and a second portion having a second horizontal width H2 smaller than the first horizontal width H1. The second portion of the first conductive pattern 728 having the second horizontal width H2 may be disposed at a higher level than the first portion of the first conductive pattern 728 having the first horizontal width H1. In the first conductive pattern 728, the second portion having the second horizontal width H2 may be materially continuous with the first portion having the first horizontal width H1. The first conductive pattern 728 having the first portion having the first horizontal width H1 and the second portion having the second horizontal width H2 may be formed of a continuous material layer.

The first conductive pattern 728 may include a portion having a greater horizontal width than the second conductive pattern 734a. For instance, the first portion of the first conductive pattern 728 may have a horizontal width H1 greater than a horizontal width H3 of the second conductive pattern 734a.

The second conductive pattern 734a may include a portion disposed at the same level as the first and second source/drain regions 60 and 87. The second conductive pattern 734a may have a smaller vertical thickness than the first conductive pattern 728 and be disposed at a higher level than a bottom surface of the first conductive pattern 728.

The lower barrier conductive pattern 725 may cover the bottom surface of the first conductive pattern 728 and extend onto a side surface of the first conductive pattern 728. The lower barrier conductive pattern 725 may be disposed at a lower level than the second conductive pattern 734a. The lower barrier conductive pattern 725 may have a horizontal width H4 smaller than the horizontal width H3 of the second conductive pattern 734a.

In some embodiments, the gate structure 748a (GS) may include an insulating metal-containing material layer. The gate structure 748 (GS) including the insulating metal-containing material layer will be described with reference to FIGS. 25A and 25B.

Figure 25A:
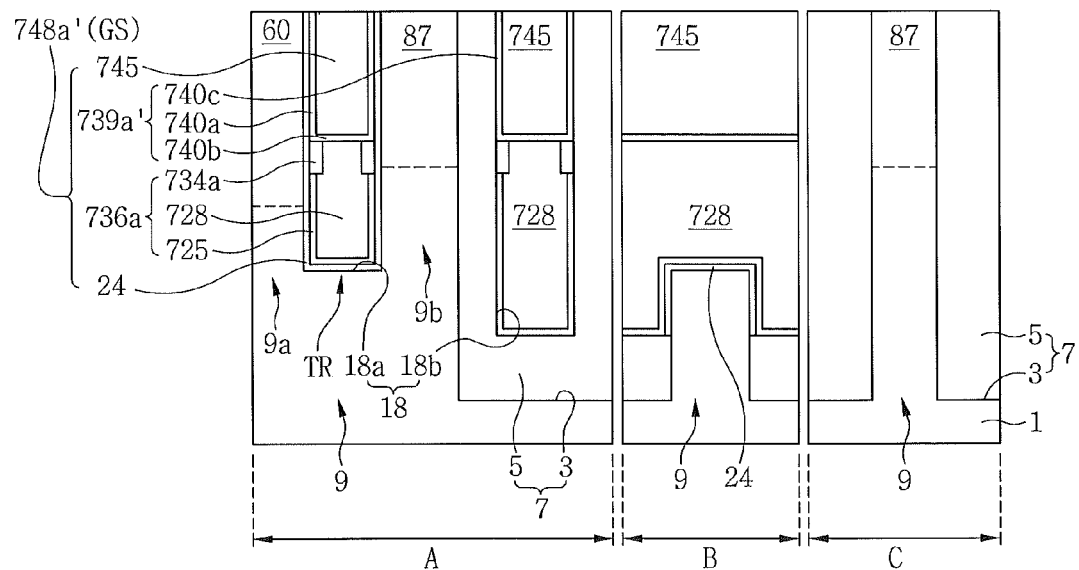

To begin with, referring to FIG. 25A, a gate structure 748a' (GS) including an insulating metal-containing material layer 739a' covering bottom and side surfaces of the gate capping pattern 745 may be provided. The metal-containing material layer 739a' may include a first portion 740a interposed between the gate capping pattern 745 and the active region 9, a second portion 740b interposed between the gate capping pattern 745 and the gate electrode 736a, and a third portion 740c interposed between the gate capping pattern 745 and the insulating material pattern 5. The first through third portions 470a, 470b, and 470c of the metal-containing material layer 739a' may be materially continuous with one another.

Figure 25B:
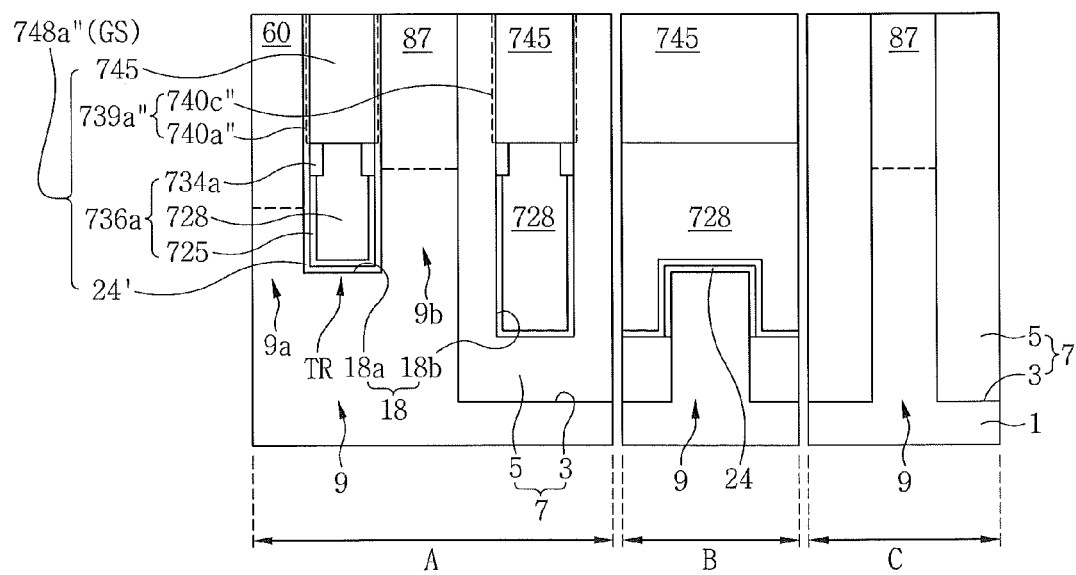

Subsequently, referring to FIG. 25B, a gate structure 748a" (GS) including a metal-containing material layer 739a" formed on a side surface of the gate capping pattern 745 may be provided. The metal-containing material layer 739a" may include a first portion 740a" formed in the gate dielectric 24' disposed between the gate capping pattern 745 and the active region 9, and a second portion 740c" formed in the insulating material pattern 5 disposed adjacent to or in contact with a side surface of the gate capping pattern 745.

Next, a semiconductor device according to an embodiment of the inventive concept will be described with reference to FIGS. 1, 2, and 26.

Figure 26:
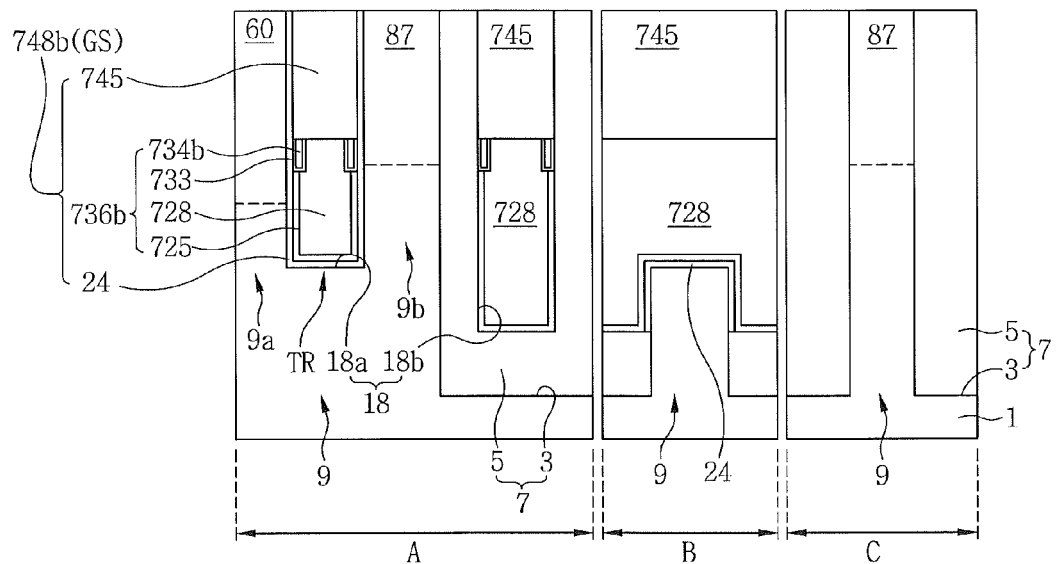

Referring to FIGS. 1, 2, and 26, the gate structure GS of FIG. 2 may be a gate structure 748b (GS) including a gate dielectric 24, a gate electrode 736b, and an insulating gate capping pattern 745. The gate electrode 736b and the gate capping pattern 745 may be stacked sequentially. The gate dielectric 24 may include a first portion interposed between the gate electrode 736b and the active region 9, and a second portion interposed between the gate capping pattern 745 and the active region 9.

The gate electrode 736b may include a first conductive pattern 728, a second conductive pattern 734b, a lower barrier conductive pattern 725, and an upper barrier conductive pattern 733.

Within the active region 9, the second conductive pattern 734b may be interposed between an upper side surface of the first conductive pattern 728 and the active region 9. Within the field region 7, the second conductive pattern 734b may be interposed between the upper side surface of the first conductive pattern 728 and the insulating pattern 5 formed in the field region 7.

As described with reference to FIG. 24, the first conductive pattern 728 may include a first portion having a first horizontal width H1 and a second portion having a second horizontal width H2 smaller than the first horizontal width H1. The second portion of the first conductive pattern 728 having the second horizontal width H2 may be disposed at a higher level than the first portion of the first conductive pattern 728 having the first horizontal width H1. The first conductive pattern 728 may include a portion having a greater horizontal width than the second conductive pattern 734b. For example, the first portion of the first conductive pattern 728 may have a horizontal width H1 greater than the horizontal width H3 of the second conductive pattern 734b. The second conductive pattern 734b may include a portion disposed at the same level as the first and second source/drain regions 60 and 87. The second conductive pattern 734b may have a smaller vertical thickness than the first conductive pattern 728 and be disposed at a higher level than a bottom surface of the first conductive pattern 728.

The lower barrier conductive pattern 725 may cover the bottom surface of the first conductive pattern 728 and extend onto a side surface of the first conductive pattern 728. The lower barrier conductive pattern 725 may be disposed at a lower level than the second conductive pattern 734b. The lower barrier conductive pattern 725 may have a horizontal width H4 smaller than the horizontal width H3 of the second conductive pattern 734b.

The upper barrier conductive pattern 733 may be formed to cover bottom and side surfaces of the second conductive pattern 734b. The upper barrier conductive pattern 733 may include a portion interposed between the first conductive pattern 728 and the second conductive pattern 734b. The upper barrier conductive pattern 733 may include a first portion interposed between the first conductive pattern 728 and the second conductive pattern 734b, a second portion interposed between the lower barrier conductive pattern 725 and the second conductive pattern 734b, and a third portion interposed between the active region 9 and the second conductive pattern 734b. Also, the upper barrier conductive pattern 733 may include a portion interposed between the insulating pattern 5 of the field region 7 and the second conductive pattern 734b.

In some embodiments, the gate structure 748b (GS) may include an insulating metal-containing material layer. The gate structure 748b (GS) including the insulating metal-containing material layer will be described with reference to FIGS. 27A and 27B.

Figure 27A:
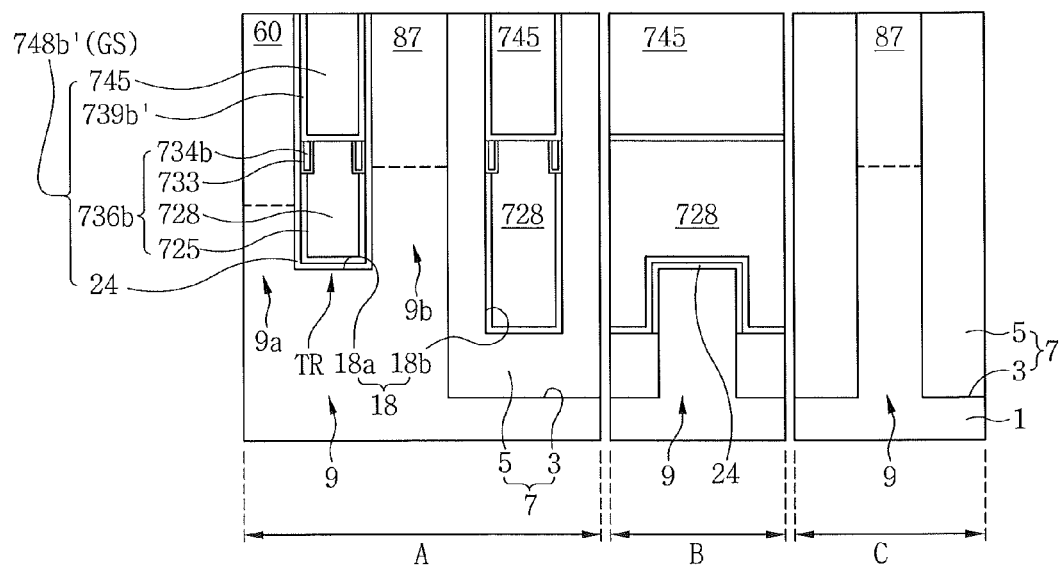

To begin with, referring to FIG. 27A, a gate structure 748b' (GS) including a metal-containing material layer 739b' covering side and bottom surfaces of the gate capping pattern 745 may be provided. The metal-containing material layer 739b' may include a first portion interposed between the gate capping pattern 745 and the active region 9, a second portion interposed between the gate capping pattern 745 and the gate electrode 736b, and a third portion interposed between the gate capping pattern 745 and the insulating material pattern 5.

Figure 27B:
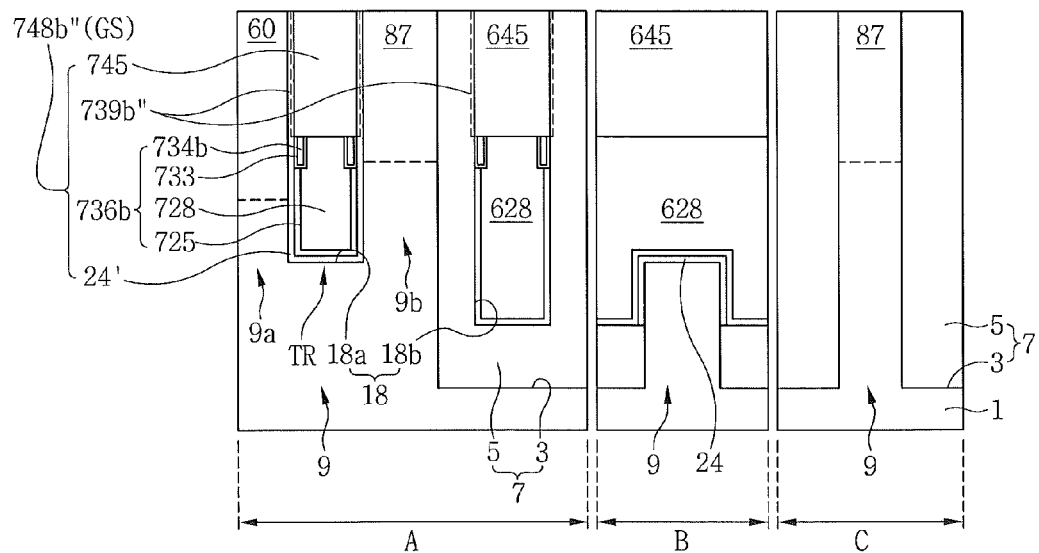

Thereafter, referring to FIG. 27B, a gate structure 748b" (GS) including a metal-containing material layer 739b" formed on a side surface of the gate capping pattern 745 may be provided. The metal-containing material layer 739b" may include a first portion formed in the gate dielectric 24' disposed between the gate capping pattern 745 and the active region 9, and a second portion formed in the insulating material pattern 5 disposed adjacent to or in contact with the side surface of the gate capping pattern 745.

Next, a semiconductor device according to an embodiment of the inventive concept will be described with reference to FIGS. 1, 2, and 28.

Figure 28:
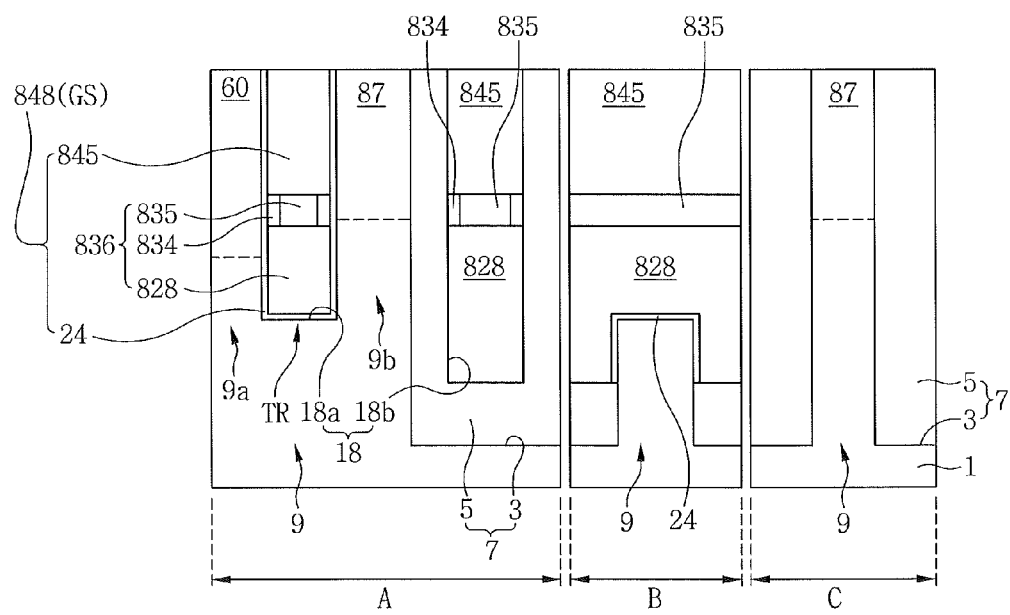

Referring to FIGS. 1, 2, and 28, the gate structure GS of FIG. 2 may be a gate structure 848 (GS) including a gate dielectric 24, a gate electrode 836, and an insulating gate capping pattern 845.

The gate electrode 836 and the gate capping pattern 845 may be stacked sequentially. The gate electrode 836 may include a first conductive pattern 828, a second conductive pattern 834, and an upper subsidiary conductive pattern 835. As described with reference to FIG. 14, the first conductive pattern 828 may be formed of a conductive material having a Fermi energy $E_{Fm}$ close to a mid-gap energy $E_{midgap}$ of the active region 9, for example, at least one of TiN, W, a Ti—Al alloy, and WN.

The second conductive pattern 834 may be formed on the first conductive pattern 828.

When the transistor TR is an NMOS transistor, the second conductive pattern 834 may be formed of a conductive material (e.g., a La-containing conductive material or N-type poly-Si) having a Fermi energy $E_{Fn}$ close to a conduction band Ec of the active region 9 as described with reference to FIG. 15A.

When the transistor TR is a PMOS transistor, the second conductive pattern 834 may be formed of a conductive material (e.g., a conductive material containing aluminum, tantalum or iridium, or P-type poly-Si) having a Fermi energy $E_{Fp}$ close to the valance band fly of the active region 9.

The upper subsidiary conductive pattern 835 may be formed on the first conductive pattern 828. The upper subsidiary conductive pattern 835 may be formed on a side surface of the second conductive pattern 834. The second conductive pattern 834 may be disposed between the upper subsidiary conductive pattern 835 and the gate dielectric 24. The upper subsidiary conductive pattern 835 may be formed of a conductive material having a lower resistivity than the first conductive pattern 834. For instance, the second conductive pattern 834 may be formed of poly-Si, and the upper subsidiary conductive pattern 835 may be formed of at least one of TiN, W, a Ti—Al alloy, and WN.

The upper subsidiary conductive pattern 835 and the first conductive pattern 834 may be formed to a smaller width than the first conductive pattern 828. The upper subsidiary conductive pattern 835 may be formed on the conductive pattern 828 and in contact with the lower conductive pattern 828.

In some embodiments, the gate structure 848 (GS) may include an insulating metal-containing material layer. The gate structure 848 (GS) including the insulating metal-containing material layer will be described with reference to FIGS. 29A and 29B.

Figure 29A:
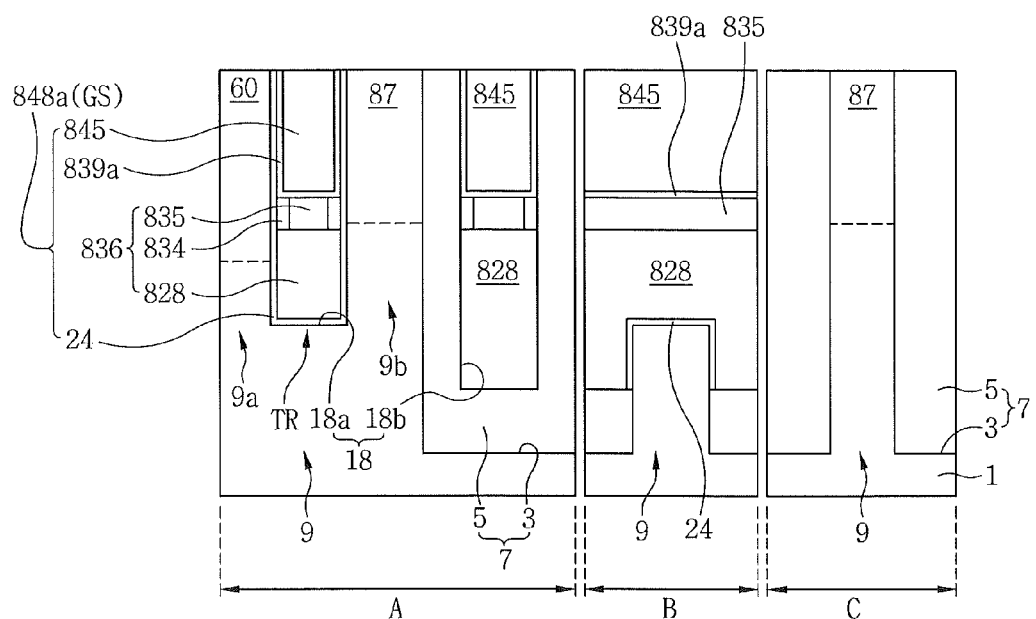
Figure 29B:
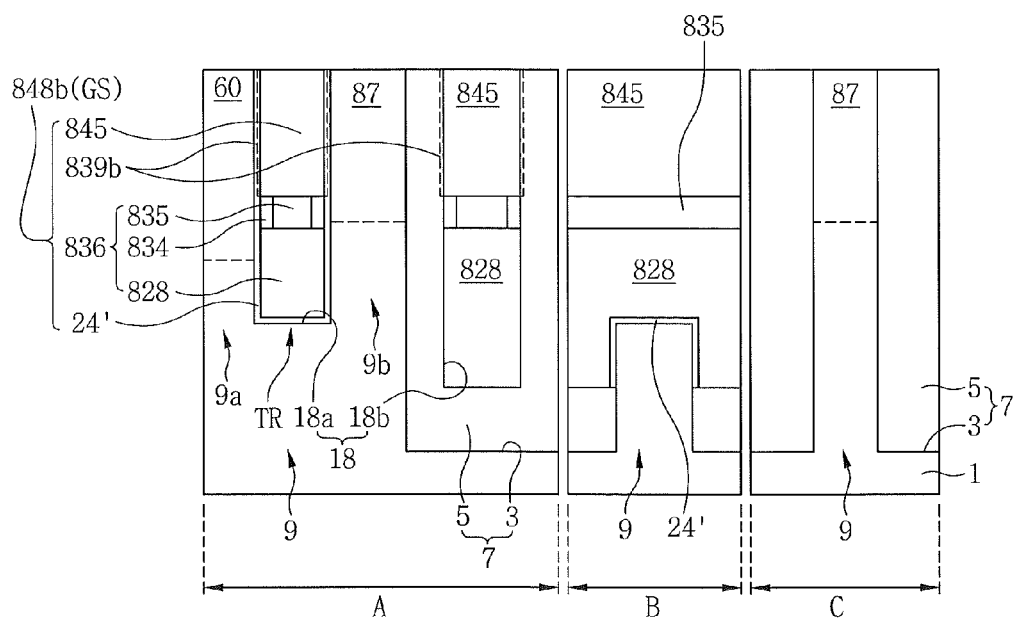

Referring to FIG. 29A, a gate structure 848a (GS) including a metal-containing material layer 839a covering bottom and side surfaces of the gate capping pattern 845' may be provided. The metal-containing material layer 839a may include a first portion interposed between the gate capping pattern 845' and the active region 9, a second portion interposed between the gate electrode 836 and the gate capping pattern 845', and a third portion interposed between the gate capping pattern 845' and the insulating material pattern 5. The metal-containing material layer 839a may be formed of substantially the same material as the metal-containing material layer 39 described with reference to FIG. 3. Next, referring to FIG. 26B, a gate structure 848b (GS) including a metal-containing material layer 839b formed on a side surface of the gate capping pattern 845 may be provided.

The metal-containing material layer 939b may include a first portion formed in the gate dielectric 24' interposed between the gate capping pattern 845 and the active region 9, and a second portion formed in the insulating material pattern 5 of the field region 7 disposed adjacent to or in contact with the gate capping pattern 945. The metal-containing material layer 939b may include substantially the same material as the metal-containing material layer 139a described with reference to FIG. 5.

Next, a semiconductor device according to an embodiment of the inventive concept will be described with reference to FIGS. 1, 2, and 30.

Figure 30:
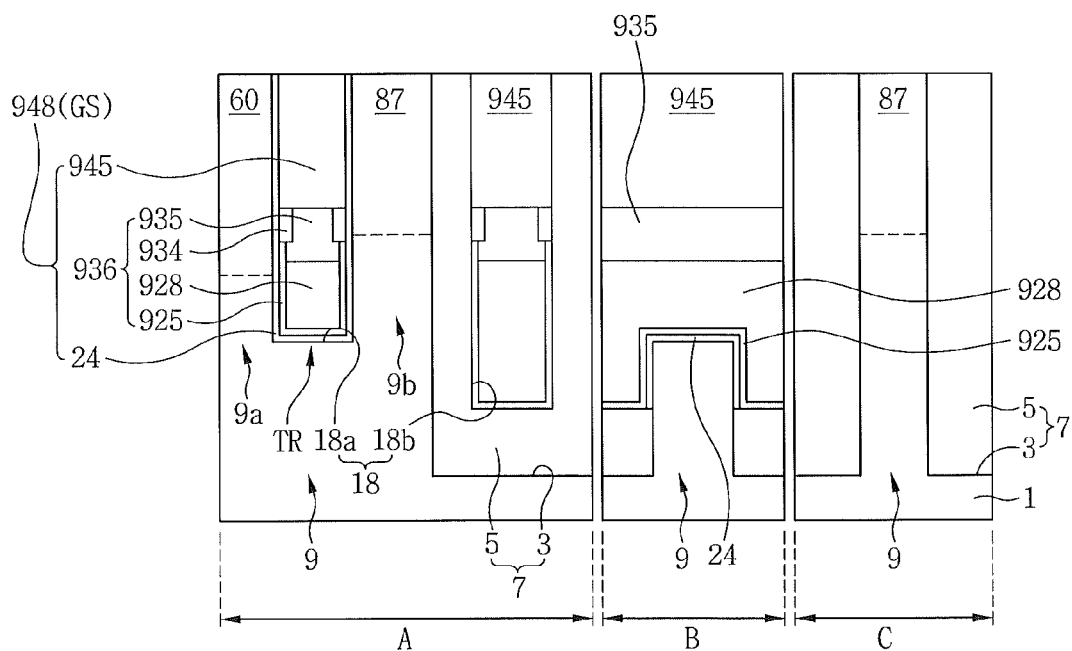

Referring to FIGS. 1, 2, and 30, the gate structure GS of FIG. 2 may be a gate structure 948 (GS) including a gate dielectric 24, a gate electrode 936, and a gate capping pattern 945. The gate electrode 936 and the gate capping pattern 945 may be sequentially stacked within the gate trench 18.

The gate electrode 936 may include a lower barrier conductive pattern 925, a first conductive pattern 928, a second conductive pattern 934, and an upper subsidiary conductive pattern 935.

The lower barrier conductive pattern 925 may be conformally formed on the gate dielectric 24, and the first conductive pattern 928 may be formed on the lower barrier conductive pattern 925 and partially fill the gate trench 18. The upper subsidiary conductive pattern 935 may be formed on the first conductive pattern 928. The upper subsidiary conductive pattern 935 may be formed on the first conductive pattern 928 and in contact with the first conductive pattern 928.

The second conductive pattern 934 may be formed on a partial side surface of the upper subsidiary conductive pattern 935. The second conductive pattern 934 may be disposed at a higher level than the first conductive pattern 928 and spaced apart from the first conductive pattern 928. The second conductive pattern 934 may be disposed at a higher level than the lower barrier conductive pattern 925.

A portion of the upper subsidiary conductive pattern 935 disposed at a lower level than the second conductive pattern 934 may have a greater width than a portion of the upper subsidiary conductive pattern 935 disposed at the same level as the second conductive pattern 934.

The lower barrier conductive pattern 925 may be formed of a metal nitride, such as titanium nitride or tungsten nitride, and the first conductive pattern 928 may be formed of a metal having a lower resistivity than the lower barrier conductive pattern 925. As described with reference to FIG. 14, the first conductive pattern 928 may be formed of a metal having a Fermi energy $E_{Fm}$ close to a mid-gap energy $E_{midgap}$ of the active region 9 and a lower resistivity than the lower barrier conductive pattern 925. For example, the lower barrier conductive pattern 925 may include either one of titanium nitride and tungsten nitride, and the first conductive pattern 928 may include either one of W and a Ti—Al alloy.

The second conductive pattern 934 may be formed of a material having a different work function from the first conductive pattern 928. When the transistor TR is an NMOS transistor, the second conductive pattern 934 may be formed of a conductive material (e.g., a La-containing conductive material or N-type poly-Si) having a Fermi energy $E_{Fn}$ close to a conduction band Ec of the active region 9 as described with reference to FIG. 15A. When the transistor TR is a PMOS transistor, the second conductive pattern 934 may be formed of a conductive material (e.g., a conductive material containing aluminum, tantalum or iridium, or P-type poly-Si) having a Fermi energy $E_{Fp}$ close to the valance band Ev of the active region 9.

The upper subsidiary conductive pattern 935 may be formed of a metal having a lower resistivity than the second conductive pattern 934 to improve current drivability of the transistor TR. For example, when the second conductive pattern 934 is formed of poly-Si, the upper subsidiary conductive pattern 935 may be formed of a metal having a lower resistivity than poly-Si. For example, the upper subsidiary conductive pattern 935 may include at least one of TiN, W, a Ti—Al alloy, and WN.

In some embodiments, the gate structure 948 (GS) may include an insulating metal-containing material layer. The gate structure 948 (GS) including the insulating metal-containing material layer will be described with reference to FIGS. 31A and 31B.

Figure 31A:
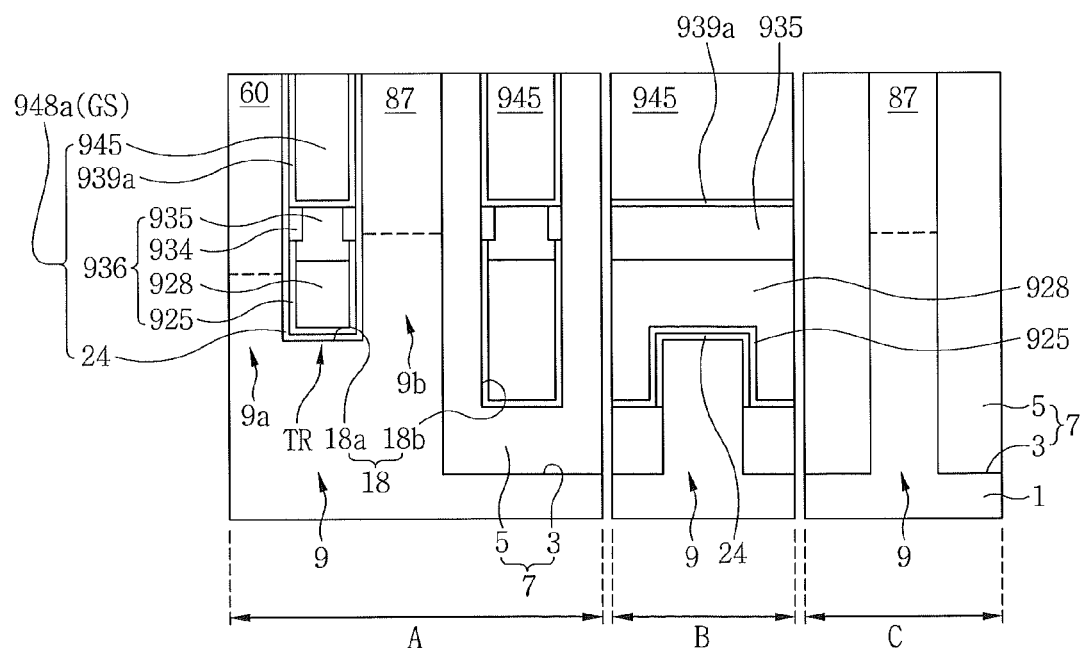

To begin with, referring to FIG. 31A, a gate structure 948*a* (GS) including a metal-containing material layer 939*a* covering side and bottom surfaces of the gate capping pattern 945 may be provided. The metal-containing material layer 939*a* may include a first portion interposed between the gate capping pattern 945 and the active region 9, a second portion interposed between the gate capping pattern 945 and the gate electrode 936, and a third portion interposed between the gate capping pattern 945 and the insulating material pattern 5.

Figure 31B:
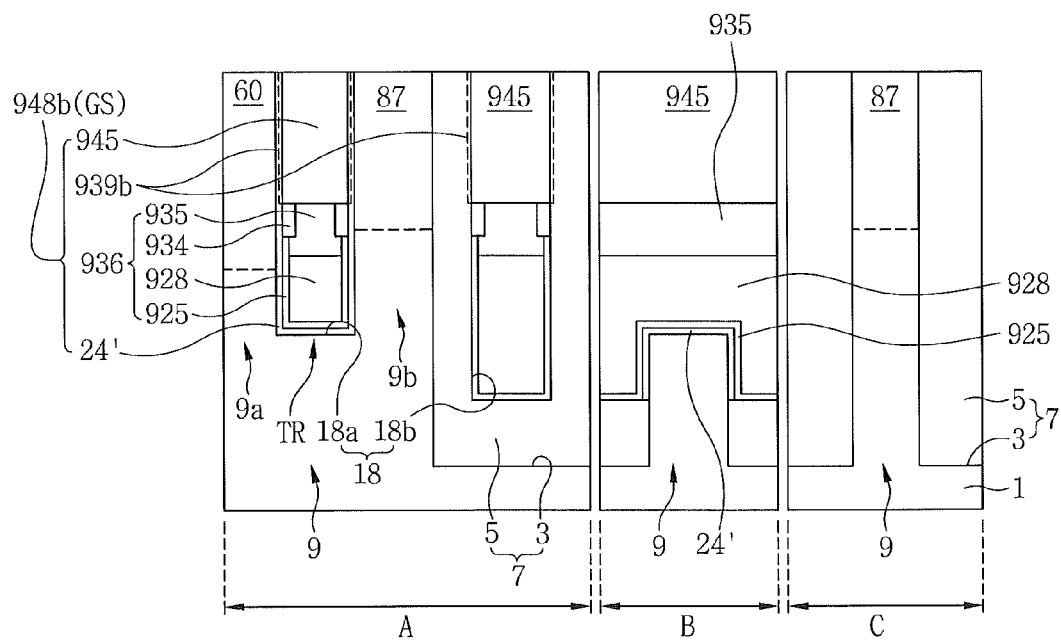

Next, referring to FIG. 31B, a gate structure 948*b* (GS) including a metal-containing material layer 939*b* formed on a side surface of the gate capping pattern 945 may be provided. The metal-containing material layer 939*b* may include a first portion formed in the gate dielectric 24' disposed between the gate capping pattern 945 and the active region 9, and a second portion formed in the insulating material pattern 5 disposed adjacent to or in contact with the side surface of the gate capping pattern 945.

Next, a semiconductor device according to an embodiment of the inventive concept will be described with reference to FIGS. 1, 2, and 32.

Figure 32:
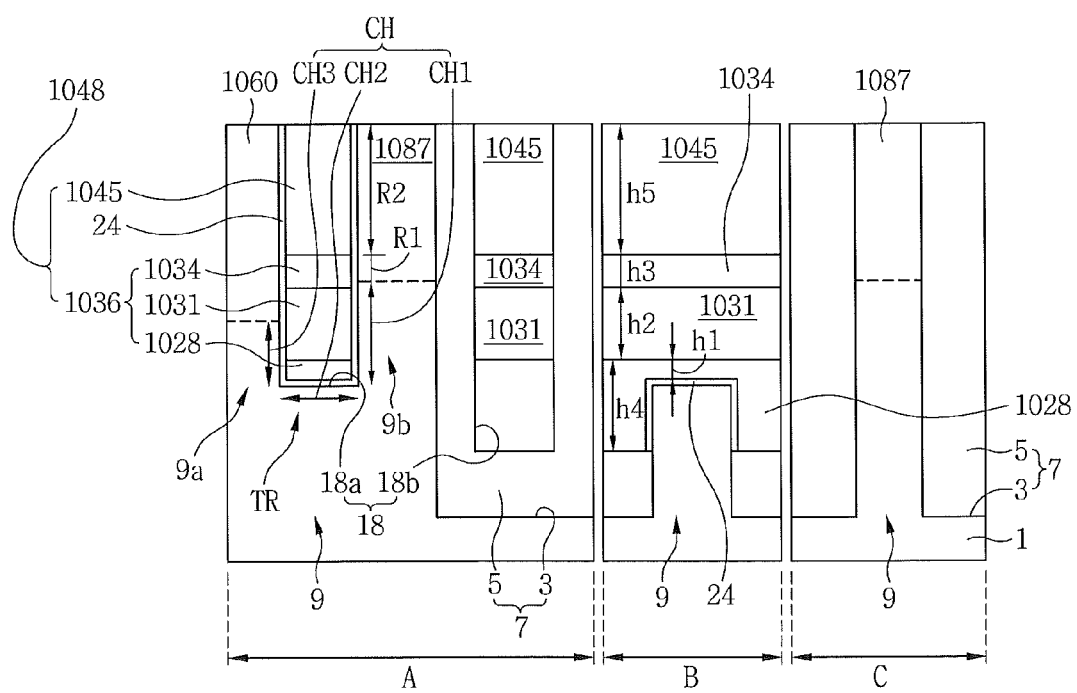

Referring to FIGS. 1, 2, and 32, the gate structure GS of FIG. 2 may be a gate structure 1048 (GS) including a gate dielectric 24, a gate electrode 1036, and a gate capping pattern 1045.

The gate electrode 1036 and the gate capping pattern 1045 may be stacked sequentially. The gate dielectric 24 may include a portion interposed between the gate electrode 1036 and the active region 9, and a portion interposed between the gate capping pattern 1045 and the active region 9.

The gate electrode 1036 may include a lower conductive pattern 1028, a first conductive pattern 1031, and a second conductive pattern 1034 stacked sequentially.

Within the first portion 18*a* of the gate trench 18 formed across the active region 9, the first conductive pattern 1031 may have a vertical thickness h2 greater than a vertical thickness h1 of the lower conductive pattern 1028, and the second conductive pattern 1034 may have a vertical thickness h3 smaller than the vertical thickness h2 of the first conductive pattern 1031.

Within the first portion 18*a* of the gate trench 18, the gate capping pattern 1045 may have a vertical thickness h5 greater than the vertical thickness h1 of the lower conductive pattern 1028. The gate capping pattern 1045 may have a vertical thickness h5 greater than the vertical thickness h2 of the first conductive pattern 1031. The gate capping pattern 1045 may have the vertical thickness h5 greater than the vertical thickness h3 of the second conductive pattern 1034.

The vertical thickness h4 of the lower conductive pattern 1028 obtained in the second portion 18*b* of the gate trench 18 may be greater than the vertical thickness h1 of the lower conductive pattern 1028 obtained in the first portion 18*a* of the gate trench 18.

A second portion R2 of the second source/drain region 87 horizontally overlapping the gate capping pattern 1045 may have a greater vertical thickness than a first portion R1 of the second source/drain region 87 horizontally overlapping the second conductive pattern 1034.

In the gate electrode 1036, the lower conductive pattern 1028 may be formed of a conductive material, which may be dominant over a threshold voltage of the transistor TR, the first conductive pattern 1031 may be formed of a conductive material having a low resistivity to reduce a resistance of a gate electrode of the turned-on transistor TR, and the second conductive pattern 1034 may be formed of a conductive material for reducing or suppressing a leakage current in the turned-off transistor TR.

The transistor TR may be an NMOS transistor or a PMOS transistor.

In the gate electrode 1036 of the transistor TR, the lower conductive pattern 1028 may be defined as a lower gate electrode, the first conductive pattern 1031 may be defined as a middle gate electrode, and the second conductive pattern 1034 may be defined as an upper gate electrode.

Assuming that the transistor TR is an NMOS transistor, components (i.e., the lower gate electrode 1028, the middle gate electrode 1031, and the upper gate electrode 1034) of the gate electrode 1036 will now be described with reference to FIGS. 33A, 33B, and 33C.

Figure 33A:
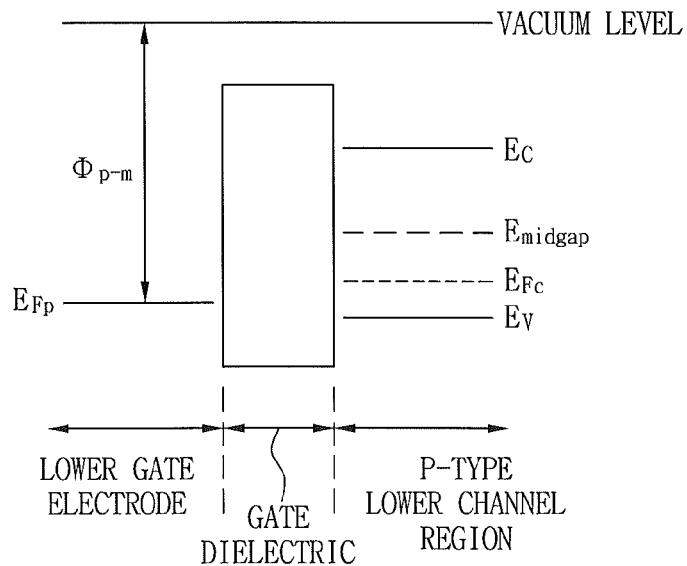
FIGS. 33A through 33C are conceptual energy band diagrams of a gate electrode of an NMOS transistor.
Figure 33B:
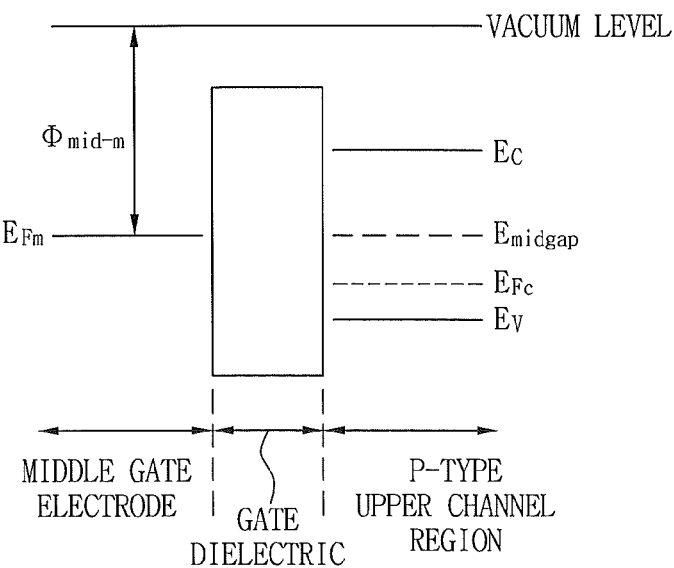
Figure 33C:
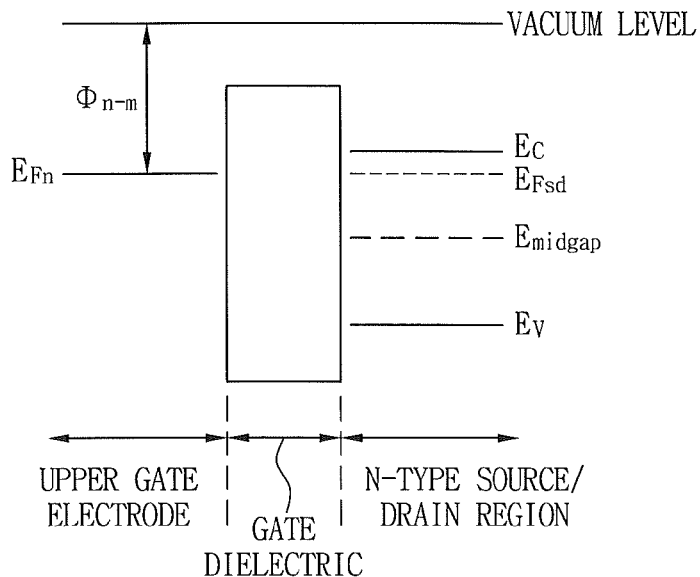

FIGS. 33A through 33C are schematic energy band diagrams illustrating work functions of the components of the gate electrode 1036 in a case where the transistor TR is the NMOS transistor.

Referring to FIG. 33A, when the transistor TR is an NMOS transistor, the lower conductive pattern (i.e., lower gate electrode) 1028 may be formed of a conductive material having a Fermi energy $E_{Fp}$ close to the valance band Ev of a lower channel region of the active region 9. "The lower channel region disposed in the active region 9" may be defined as a region of the active region 9 that may be adjacent to the lower conductive pattern 1028 (i.e., the lower gate electrode) and used as a channel of the transistor TR. When the transistor TR is the NMOS transistor, the first and second source/drain regions 60 and 87 may have an N type, while the channel regions CH1, CH2, and CH3 of the active region 9 may have a P type.

Referring to FIG. 33B, when the transistor TR is an NMOS transistor, the first conductive pattern (i.e, middle gate electrode) 1031 may be formed of a conductive material having a Fermi energy $E_{Fm}$ close to the mid-gap energy $E_{midgap}$ of an upper channel region of the active region 9.

Referring to FIG. 33C, when the transistor TR is an NMOS transistor, the second conductive pattern (i.e., upper gate electrode) 1024 may be formed of a conductive material having a Fermi energy $E_{Fm}$ close to the conduction band Ec of the source/drain regions 60 and 87 formed in the active region 9. Referring back to FIGS. 32, 33A, 33B, and 33C, when the transistor TR is an NMOS transistor, the lower conductive pattern 1028 may have a work function $\Phi_{p-m}$ larger than a work function $\Phi_{mid-m}$ of the first conductive pattern 1031, and the second conductive pattern 1034 may have a work function $\Phi_{n-m}$ smaller than the work function $\Phi_{mid-m}$ of the first conductive pattern 1031 and the work function $\Phi_{p-m}$ of the lower conductive pattern 1028.

When the transistor TR is an NMOS transistor, the lower conductive pattern 1028 may be formed of a conductive material (e.g., P-type poly-Si), which may be dominant over a threshold voltage of the transistor TR, the first conductive pattern 1031 may be formed of a conductive material having a low resistivity, for example, a conductive material such as TiN, W, a Ti—Al alloy, or WN, and the second conductive pattern 1034 may be formed of a conductive material for reducing or suppressing a leakage current in the turned-off transistor TR, for example, a metal (e.g., La) or N-type poly-Si having a Fermi energy close to the conduction band Ec of the active region 9.

When the transistor TR is the NMOS transistor, the lower conductive pattern 1028 may be formed of poly-Si doped with a Group III element (e.g., boron (B)), the first conductive pattern 1031 may be formed of a metal having a lower resistivity than the lower conductive pattern 1028, for example, a metal, such as W, a Ti—Al alloy, WN, or TiN, and the second conductive pattern 1034 may be formed of poly-Si doped with a Group V element, such as phosphorus (P) or arsenic (As).

Figure 34A:
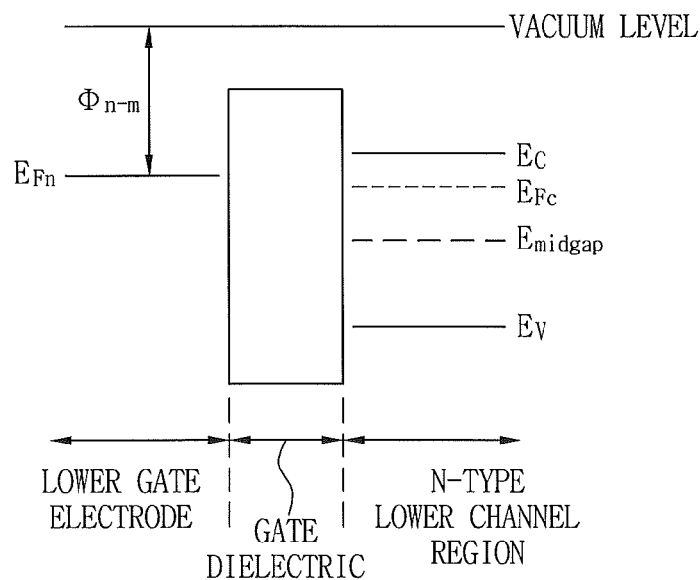
FIGS. 34A through 34C are conceptual energy band diagrams of a gate electrode of a PMOS transistor.
Figure 34B:
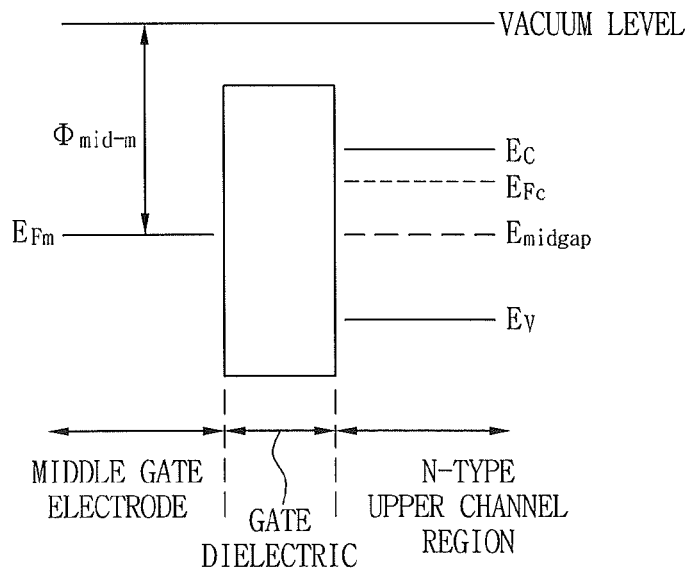
Figure 34C:
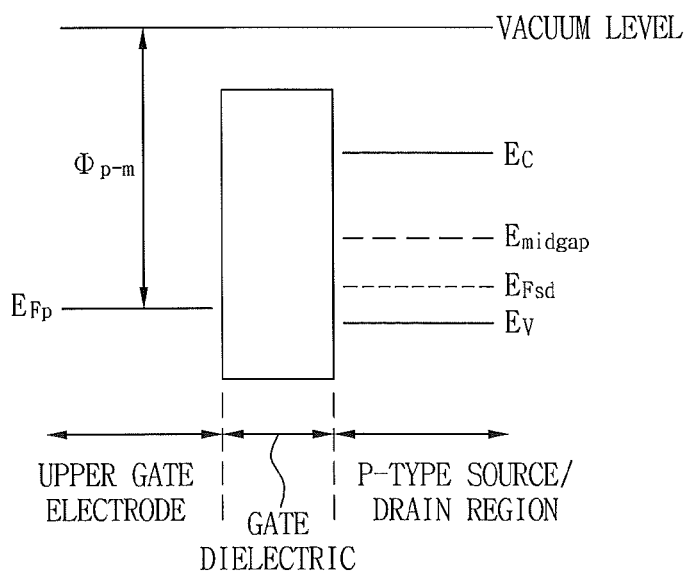

Assuming that the transistor TR is a PMOS transistor, components of the gate electrode 1036 will be described with reference to FIGS. 34A, 34b, and 34C. FIGS. 34A through 34C are schematic energy band diagrams illustrating work functions of components of the gate electrode 1036 in a case where the transistor TR is the PMOS transistor.

Referring to FIG. 34A, when the transistor TR is the PMOS transistor, the lower conductive pattern (i.e., lower gate electrode) 1028 may be formed of a conductive material having a Fermi energy $E_{Fn}$ close to the conduction band Ec of a lower channel region of the active region 9. When the transistor TR is the PMOS transistor, the first and second source/drain regions 60 and 87 may have a P conductivity type, and channel regions CH1, CH2, and CH3 of the active region 9 may have an N conductivity type.

Referring to FIG. 34B, when the transistor TR is the PMOS transistor, the first conductive pattern (i.e., middle gate electrode) 1031 may be formed of a conductive material having a Fermi energy $E_{Fm}$ close to the mid-gap energy $E_{midgap}$ of an upper channel region of the active region 9.

Referring to FIG. 34C, when the transistor TR is the PMOS transistor, the second conductive pattern 1024 may be formed of a conductive material having a Fermi energy $E_{Fp}$ close to the valance band Ev of the source/drain regions 60 and 87 of the active region 9.

Referring back to FIGS. 32, 34A, 34B, and 34C, when the transistor TR is the PMOS transistor, the lower conductive pattern 1028 may be formed of a conductive material having a Fermi energy $E_{Fn}$ close to the conduction band Ec of the active region 9, the first conductive pattern 1031 may be formed of a conductive material having a lower resistivity than the lower and second conductive patterns 1028 and 1034, and the second conductive pattern 1031 may be formed of a conductive material having a Fermi energy $E_{Fp}$ close to the valance band Ev of the active region 9. When the transistor TR is the PMOS transistor, the lower conductive pattern 1028 may have a work function $\Phi_{n-m}$ smaller than a work function $\Phi_{mid-m}$ of the first conductive pattern 1031, and the second conductive pattern 1034 may have a work function $\Phi_{p-m}$ larger than the work function $\Phi$mid-m of the first conductive pattern 1031 and the work function $\Phi_{n-m}$ of the lower conductive pattern 1028.

When the transistor TR is the PMOS transistor, the lower conductive pattern 1028 may be formed of poly-Si doped with a Group V element, such as phosphorus or arsenic, the first conductive pattern 1031 may be formed of a conductive material having a lower resistivity than the lower conductive pattern 1028, for example, W, a Ti—Al alloy, WN, or TiN, and the second conductive pattern 1034 may be formed of poly-Si doped with a Group III element, such as boron.

In some embodiments, the gate structure 1048 (GS) may include an insulating metal-containing material layer. The gate structure 1048 (GS) including the insulating metal-containing material layer will be described with reference to FIGS. 35A and 35B.

Figure 35A:
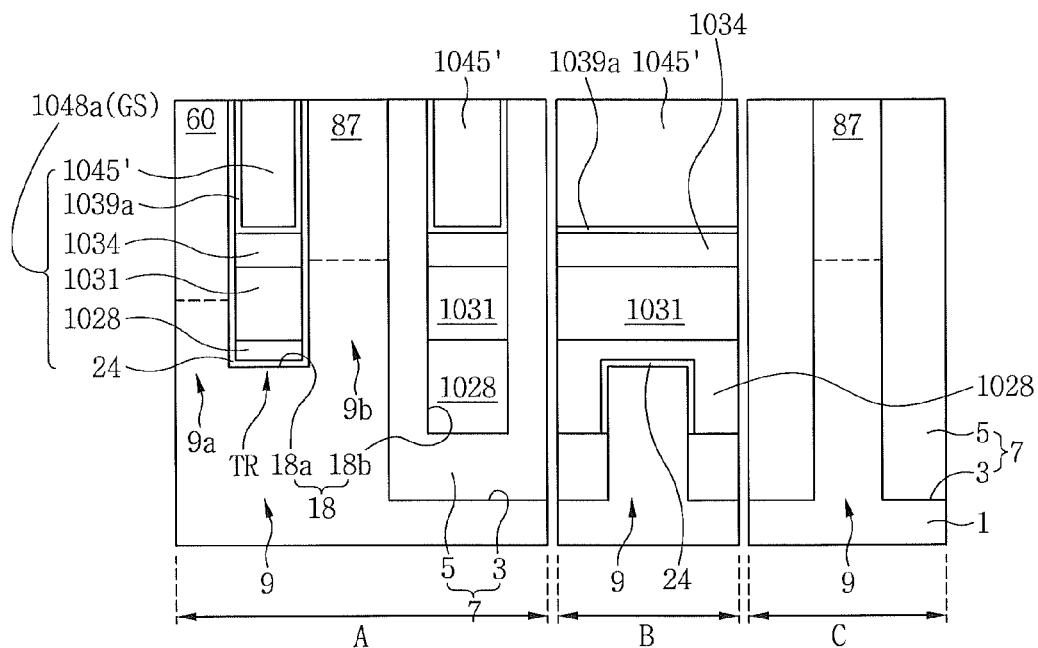
FIGS. 35A through 37B are cross-sectional views of semiconductor devices according to an embodiment of the inventive concept.

Referring to FIG. 35A, a gate structure 1048a (GS) including a metal-containing material layer 1039a covering bottom and side surfaces of the insulating gate capping pattern 1045' may be provided.

The metal-containing material layer 1039a may include a first portion interposed between the gate capping pattern 1045 and the active region 9, a second portion interposed between the gate capping pattern 1045 and the gate electrode 1036, and a third portion interposed between the gate capping pattern 1045 and the insulating material pattern 5 of the field region 7. The metal-containing material layer 1039a may be formed of substantially the same material as the metal-containing material layer 39 described with reference to FIG. 3.

Figure 35B:
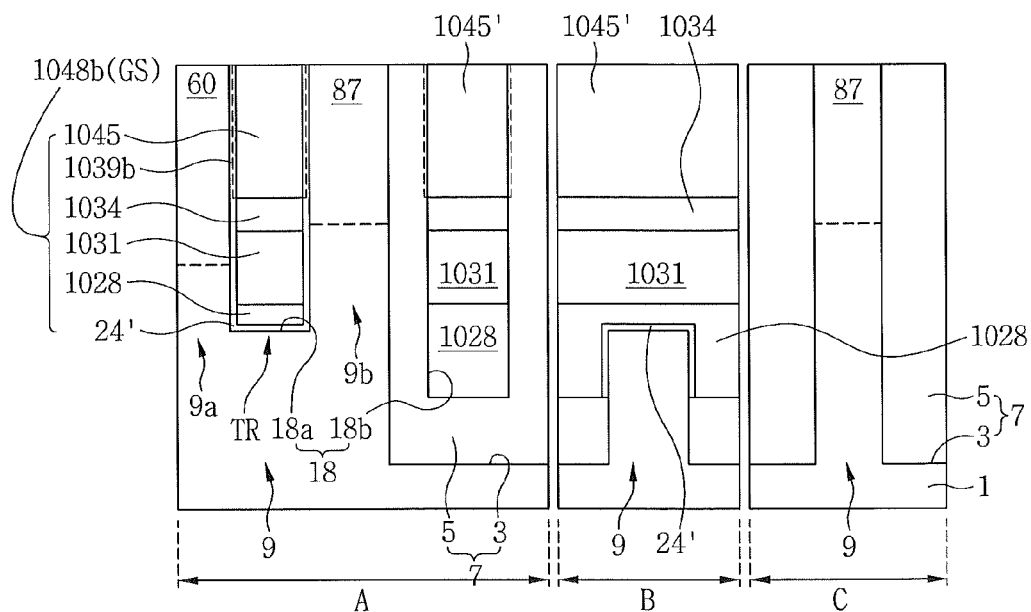

Next, referring to FIG. 35B, a gate structure 1048b (GS) including a metal-containing material layer 1039b formed on a side surface of the insulating gate capping pattern 1045 may be provided.

The metal-containing material layer 1039b may include a first portion formed in the gate dielectric 24' between the gate capping pattern 1045 and the active region 9, and a second portion formed in the insulating pattern 5 adjacent to the gate capping pattern 1045. The metal-containing material layer 1039b may include substantially the same material as the metal-containing material layer 139a described with reference to FIG. 5.

Next, a semiconductor device according to an embodiment of the inventive concept will be described with reference to FIGS. 1, 2, and 36.

Figure 36:
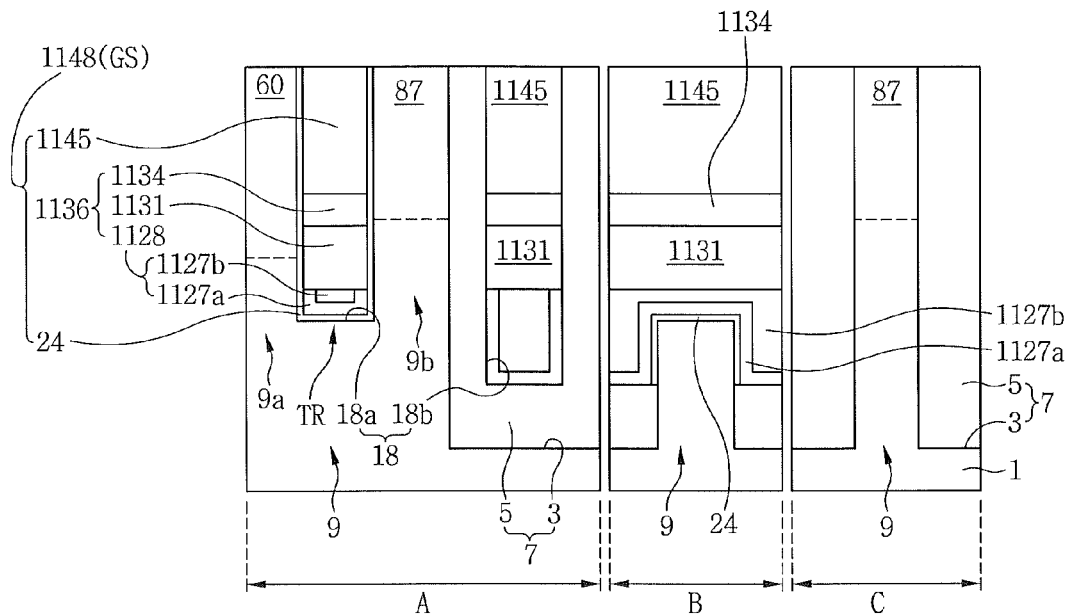

Referring to FIGS. 1, 2, and 36, the gate structure GS of FIG. 2 may be a gate structure 1148 (GS) including a gate dielectric 24, a gate electrode 1136, and a gate capping pattern 1145.

The gate electrode 1136 and the gate capping pattern 1145 may be stacked sequentially. The gate dielectric 24 may include a portion interposed between the gate electrode 1136 and the active region 9, and a portion interposed between the gate capping pattern 1145 and the active region 9.

The gate electrode 1136 may include a lower conductive pattern 1128, a first conductive pattern 1131, and a second conductive pattern 1134 stacked sequentially.

In the gate electrode 1136, the lower conductive pattern 1128 may include a conductive material, which may be dominant over a threshold voltage of the transistor TR, the first conductive pattern 1131 may be formed of a conductive material having a low resistivity to reduce a resistance of a gate electrode of the turned-on transistor TR, and the second conductive pattern 1134 may be formed of a conductive material for reducing or suppressing a leakage current in the turned-off transistor TR.

The lower conductive pattern 1128 may include a first lower conductive pattern 1127a and a second lower conductive pattern 1127b. The first lower conductive pattern 1127a may be conformally formed on the gate dielectric 1224, and the second lower conductive pattern 1127b may be formed on the first lower conductive pattern 1127a. The first lower conductive pattern 1127a may be formed to cover bottom and side surfaces of the second lower conductive pattern 1127b.

The first lower conductive pattern 1127a may be formed of a conductive material having a different work function from the second lower conductive pattern 1127b, and the second lower conductive pattern 1127b may be formed of a conductive material having a lower resistivity than the first lower conductive pattern 1127a.

When the transistor TR is an NMOS transistor, the first lower conductive pattern 1127a may be formed of P-type poly-Si capable of increasing a threshold voltage of the NMOS transistor. In another case, when the transistor TR is a PMOS transistor, the first lower conductive pattern 1127a may be formed of N-type poly-Si.

The second lower conductive pattern 1127a may be formed of a conductive material having a lower resistivity than the first lower conductive pattern 1127a, for example, TiN, WN, W, or a Ti—Al alloy.

The first conductive pattern 1131 may be formed of a conductive material having a lower resistivity than the first lower conductive pattern 1127a, for example, TiN, WN, W, or a Ti—Al alloy.

When the transistor TR is the NMOS transistor, the second conductive pattern 1134 may be formed of a conductive material having a Fermi energy EFn close to the conduction band Ec of the active region 9 to reduce or suppress a leakage current in the turned-off NMOS transistor. In another case, when the transistor TR is the PMOS transistor, the second conductive pattern 1134 may be formed of a conductive material having a Fermi energy $E_{Fp}$ close to the valance band Ev of the active region 9. That is, the second conductive pattern 1134 may be formed of the same material as the conductive pattern 1034 described with reference to FIG. 32.

In some embodiments, the gate structure 1148a (GS) may include an insulating metal-containing material layer. The gate structure 1148a (GS) including the insulating metal-containing material layer will be described with reference to FIGS. 37A and 37B.

Figure 37A:
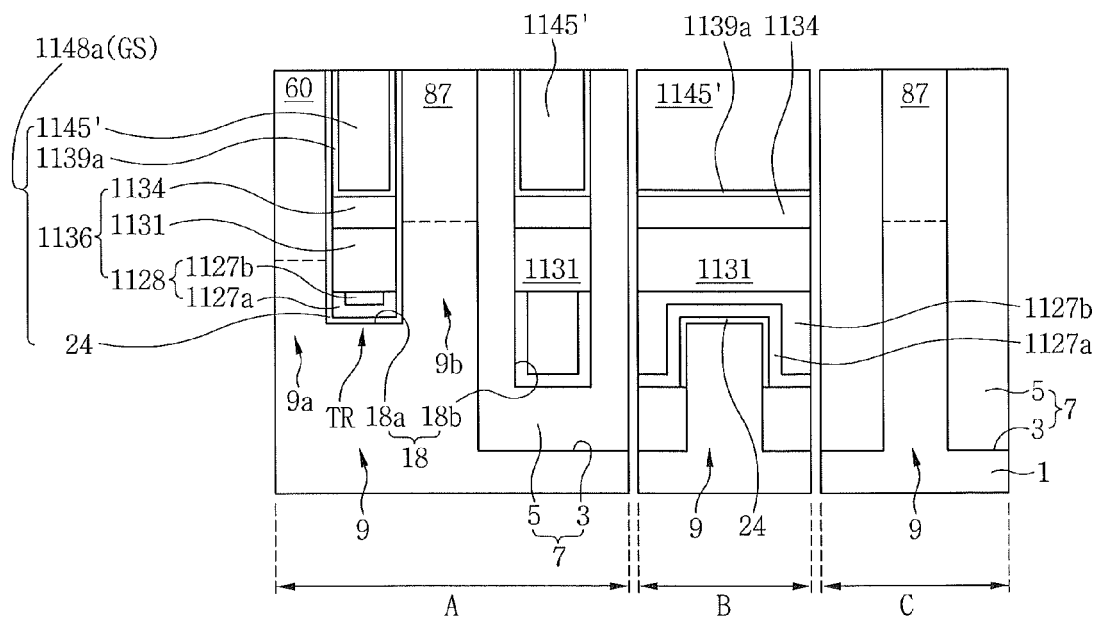

To begin with, referring to FIG. 37A, a gate structure 1148a (GS) including a metal-containing material layer 1139a covering bottom and side surfaces of the gate capping pattern 1145 may be provided. The metal-containing material layer 1139a may include a portion interposed between the gate capping pattern 1145' and the active region 9, a portion interposed between the gate electrode 1136 and the gate capping pattern 1145', and a portion interposed between the gate electrode 1136 and the insulating pattern 5. The metal-containing material layer 1139a may be formed of substantially the same material as the metal-containing material layer 39 described with reference to FIG. 3.

Figure 37B:
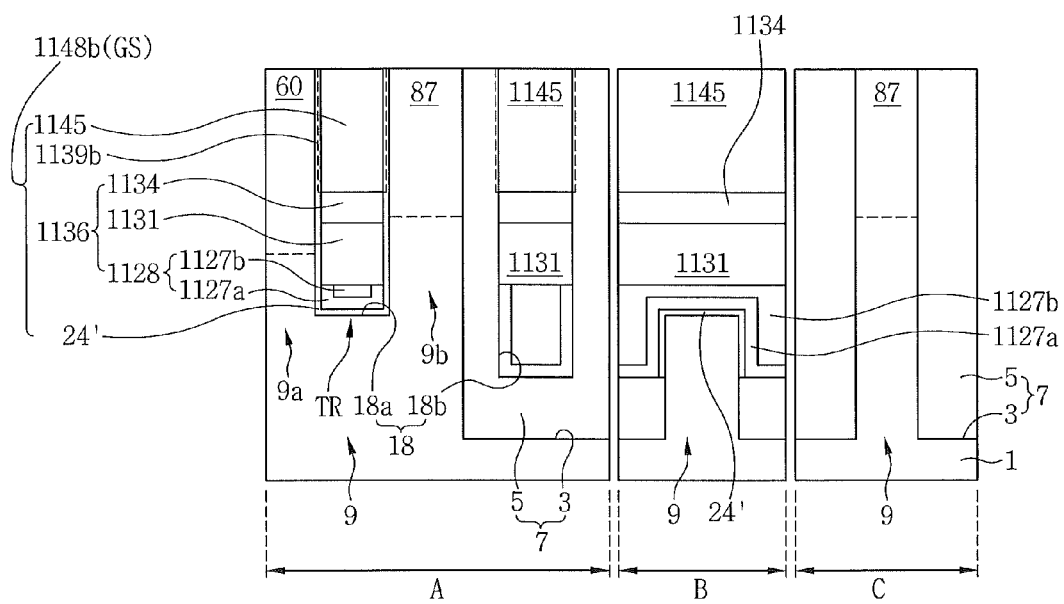

Next, referring to FIG. 37B, a gate structure 1148b (GS) including a metal-containing material layer 1139b formed on a side surface of the gate capping pattern 1145 may be provided.

The metal-containing material layer 1139b may include a first portion formed in the gate dielectric 24' disposed between the gate capping pattern 1145 and the active region 9, and a second portion formed in the insulating pattern 5 disposed adjacent to the side surface of the gate capping pattern 1145. The metal-containing material layer 1139b may include substantially the same material as the metal-containing material layer 139a described with reference to FIG. 5.

Next, a semiconductor device according to an embodiment of the inventive concept will be described with reference to FIGS. 38 and 39.

Figure 38:
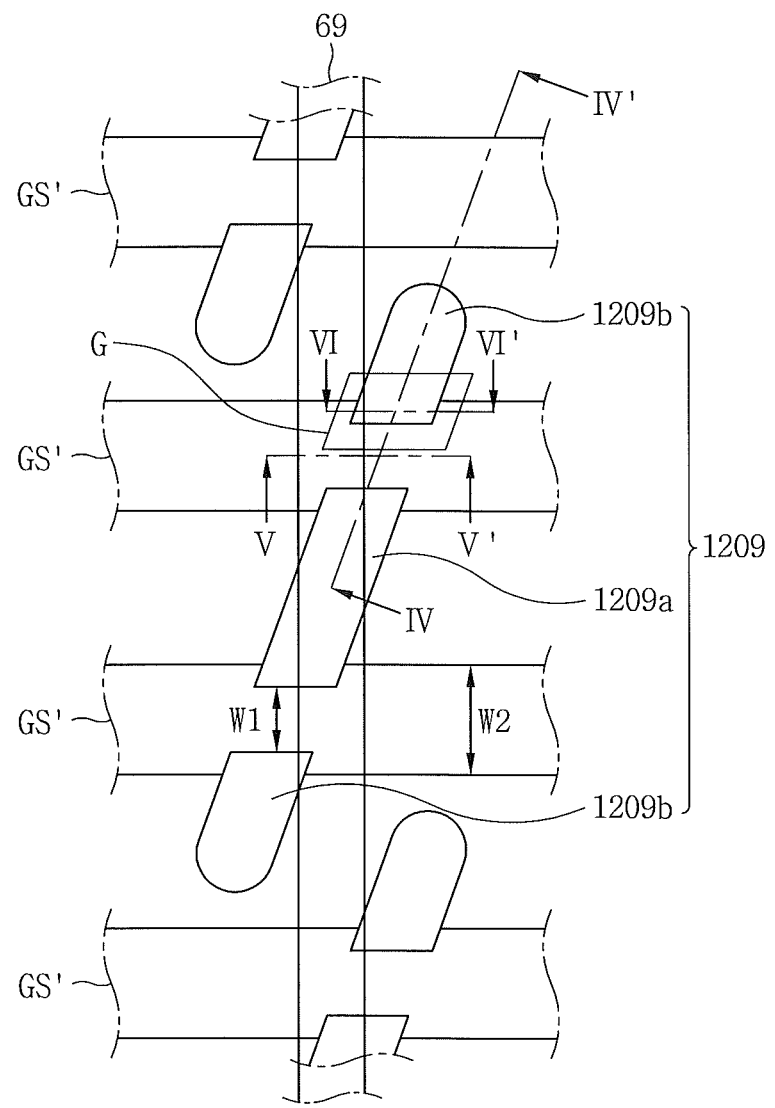
FIG. 38 is a plan view of a semiconductor device according to an embodiment of the inventive concept.
Figure 39:
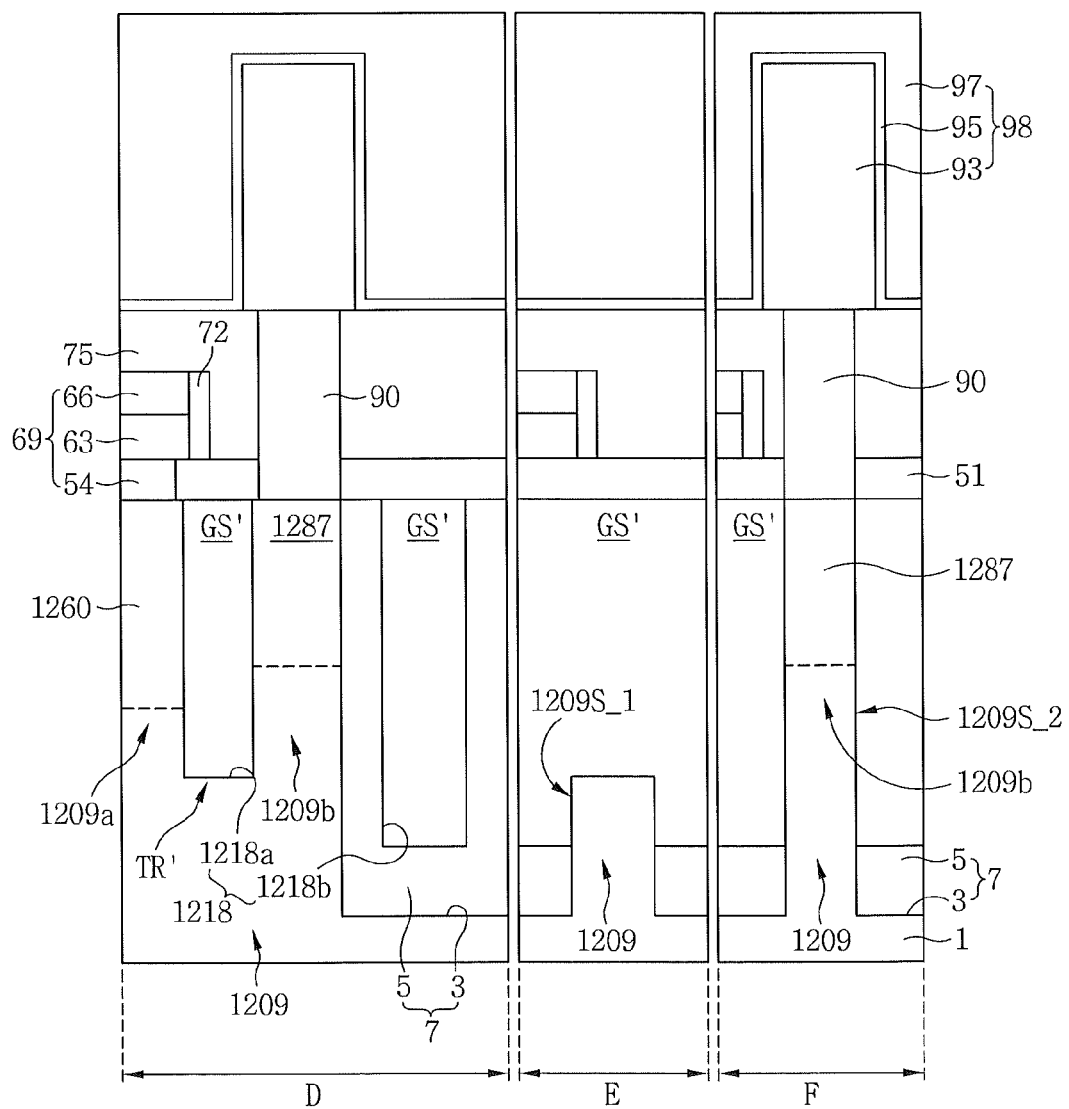
FIG. 39 is a cross-sectional view of a semiconductor device according to an embodiment of the inventive concept.

FIG. 38 is a plan view of a semiconductor device according to an embodiment of the inventive concept, and FIG. 39 is a cross-sectional view of a semiconductor device according to an embodiment of the inventive concept. In FIG. 39, portion "D" denotes a section taken along line IV-IV' of FIG. 38, portion "E" denotes a section taken along line V-V' of FIG. 38, and portion "F" denotes a section taken along line VI-VI' of FIG. 38.

Referring to FIGS. 38 and 39, a substrate 1 described with reference to FIGS. 1 and 2 may be prepared. A field region 1207 defining an active region 1209 may be formed in the substrate 1. The field region 1207 may include a field trench 1203 formed in the substrate 1 and an insulating material pattern 1205 filling the field trench 1203. The insulating material pattern 1205 may include silicon oxide.

A gate trench 1218 may be formed in the substrate 1. The gate trench 1218 may include a first portion 1218a formed across the active region 1209, and a second portion 1218b disposed in the field region 1207. The first and second portions 1218a and 1218b of the gate trench 1218 may have a different width from bottom regions disposed at different levels. For example, within the gate trench 1218, a bottom region 1219a of the first portion 1218a disposed in the active region 1209 may be disposed at a higher level than a bottom region 1219b of the second portion 1218b disposed in the field region 1207. In the gate trench 1218, the first portion 1218a may have a first width W1, and the second portion 1218b may have a second width W2 greater than the first width W1.

A first side portion 1209s_1 of the active region 1209 may be exposed due to a height difference between the bottom regions 1219a and 1219b of the first and second portions 1218a and 1218b of the gate trench 1218.

A second side portion 1209s_2 of the active region 1209 may be exposed due to a difference between the widths W1 and W2 of the first and second portions 1218a and 1218b of the gate trench 1218.

A gate structure GS' may be formed within the gate trench 1218. For instance, as described with reference to FIGS. 1 and 2, one active region 1209 may include three pillars divided by a pair of gate structures GS' disposed adjacent to each other. For example, the one active region 1209 may include a first active pillar 1209a and second active pillars 1209b disposed opposite each other across the first active pillar 1209a.

The first and second active pillars 1209a and 1209b may be disposed in an upper region of the active region 1209. The first and second active pillars 1209a and 1209b may be disposed beside the gate structure GS'. The first and second active pillars 1209a and 1209b may be electrically connected to each other through a lower region of the active region 1209.

The first and second side portions 1209s_1 and 120s_2 of the active region 1209 exposed by the gate trench 1218 may be covered with the gate structure GS'.

A first source/drain region 1260 may be formed in the first active pillar 1209a of the active region 1209. A second source/drain region 1287 may be formed in the second active pillar 1209b of the active region 1209.

The first source/drain region 1260, the second source/drain region 1287, and the gate structure GS' disposed between the first source/drain region 1260 and the second source/drain region 1287 may constitute a transistor TR'. A portion of the active region 1209 disposed under the first and second source/drain regions 1260 and 1287 and adjacent to the gate structure GS' may be defined as a channel region of the transistor TR'.

A bit line structure 69 may be formed on the first source/drain region 1260 as shown in FIG. 2. The bit line structure 69 may include a bit line 63 and a bit line capping pattern 66, which are stacked sequentially, and a first contact plug 54 disposed between the bit line 63 and the first source/drain region 1260. A capacitor structure 98 may be formed on the second source/drain region 1287 as shown in FIG. 2. A second contact plug 90 may be formed between the capacitor structure 98 and the second source/drain region 1287.

In the transistor TR', the gate structure GS' may be formed to cover the first side portion 1209s_1 of the active region 1209 disposed between the first active pillar 1209a and the second active pillar 1209b. Accordingly, the transistor TR' may include a fin field effect transistor (FinFET) structure.

In addition, the gate structure GS' may cover the second side portion 1209s_2 of the active region 1209. The gate structure GS' may cover side surfaces 1209s_2 of the first and second active pillars 1209a and 1209b.

In the first portion 1218a of the gate trench 1218, the gate structure GS' may have substantially the same structure as the gate structure GS described with reference to FIG. 2.

The gate structure GS' disposed in the first portion 1218a of the gate trench 1218 may have substantially the same structure as the gate structure GS disposed in the first portion 18a of the gate structure 18 described with reference to FIG. 2. Accordingly, the gate structure GS' disposed in the first portion 1218a of the gate trench 1218 may have substantially the same structure as the gate structure GS disposed in the first portion 18a of the gate structure 18 described with reference to FIGS. 2 through 37B.

A semiconductor device including the gate structure GS' will be described with reference to FIGS. 40A through 62B.

Since the gate structure GS' has substantially the same structure as the gate structure GS disposed in the first portion 18a of the gate structure 18 described with reference to FIGS. 2 through 37B, a repeat description thereof will be omitted.

To begin with, a semiconductor device according to an embodiment of the inventive concept will be described with reference to FIGS. 38, 39, and 40A.

Figure 40A:
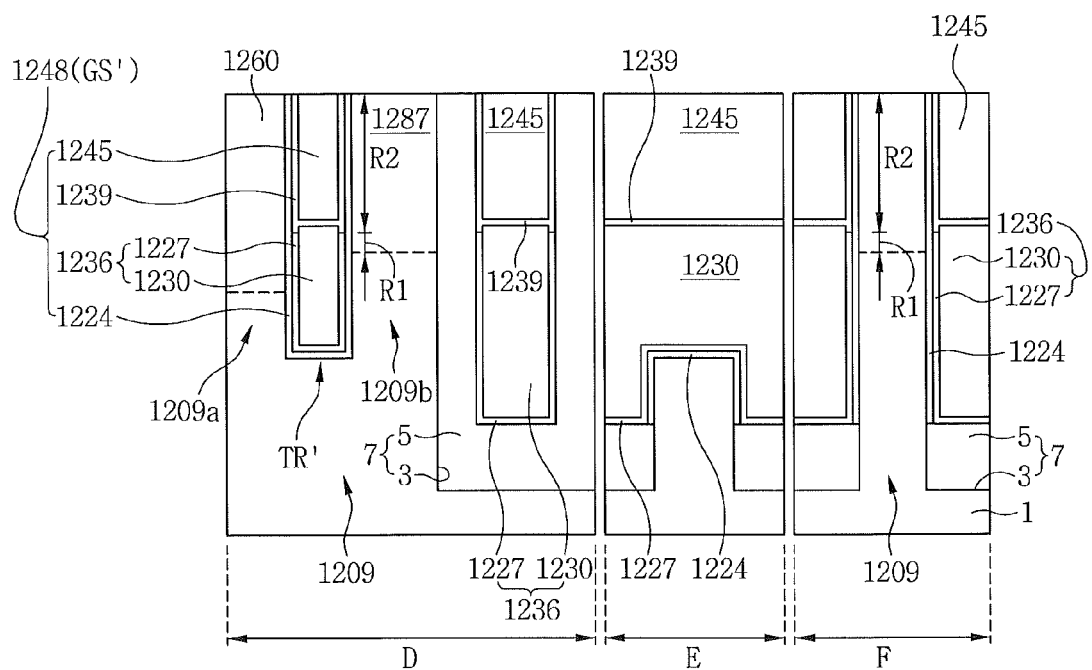
FIGS. 40A and 40B are diagrams of a semiconductor device according to an embodiment of the inventive concept.

Referring to FIGS. 38, 39, and 40A, the gate structure GS' of FIG. 39 may be a gate structure 1248 (GS') including a gate dielectric 1224, a gate electrode 1236, an insulating metal-containing material layer 1239, and an gate capping pattern 1245. The gate structure 1248 may be formed within the gate trench 1218.

The gate structure 1248 (GS') may cover the first and second side portions 1209s_1 and 1209s_2 of the active region 1209.

The gate electrode 1236 may be formed to partially fill the gate trench 1218. The gate electrode 1236 may include a first gate conductive pattern 1227 and a second gate conductive pattern 1230. The first gate conductive pattern 1227 may be conformally formed within the gate trench 1218, and the second gate conductive pattern 1230 may be formed on the first gate conductive pattern 1227 to partially fill the gate trench 1218. The gate electrode 1236 may be formed of the same material as the gate electrode 36 described with reference to FIG. 3.

The gate capping pattern 1245 may be formed on the gate electrode 1236. The gate dielectric 1224 may be interposed between the gate electrode 1236 and the active region 1209. Furthermore, the gate dielectric 1224 may extend from a portion interposed between the gate electrode 1236 and the active region 1209 to a portion between the gate capping pattern 1245 and the active region 1209.

The metal-containing material layer 1239 may include a portion interposed between the gate capping pattern 1245 and the active region 1209, and a portion interposed between the gate electrode 1236 and the gate capping pattern 1245. The metal-containing material layer 1239 may be formed of the same material as the metal-containing material layer 39 described with reference to FIG. 3.

In the second source/drain region 1287, a first portion R1 horizontally overlapping the first gate conductive pattern 1227 may have a greater vertical thickness than a second portion R2 horizontally overlapping the metal-containing material layer 1239.

The metal-containing material layer 1239 may cover the second source/drain region 1287 exposed by the first portion 1218a disposed across the active region 1209 and cover the second side portion 1209s_2 of the second portion 1209b of the active region 1209.

A transistor TR' including the gate structure 1248 and the first and second source/drain regions 1260 and 1287 may be formed. Similarly to the transistor TR' described with reference to FIG. 3, the transistor TR' may suppress a leakage current in an off state.

Figure 40B:
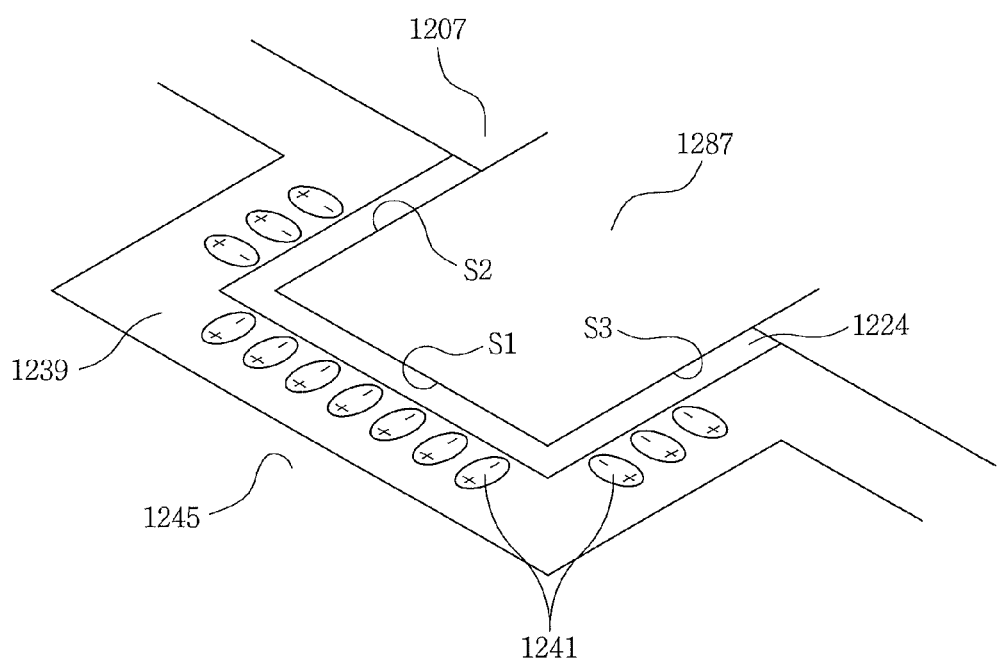

The second source/drain region 1287 and the metal-containing material layer 1239 will be described with reference to FIG. 40B. FIG. 40B is an enlarged plan view of region "G" of FIG. 38, illustrating the second source/drain region 1287 and the metal-containing material layer 1239.

Referring to FIGS. 38, 39, 40A, and 40B, the second source/drain region 1287 formed in the second active pillar 1209b of the active region 1209 may have a first side S1 disposed opposite the metal-containing material layer 1239, a second side S2, and a third side S3. The second and third sides S2 and S3 of the second source/drain region 1287 may be disposed opposite and parallel to each other.

The first side S1 of the second source/drain region 1287 may be a portion of a sidewall of the first portion 1218a of the gate trench 1218 formed across the active region 1209.

The second and third side sides S2 and S3 of the second source/drain region 1287 may be a portion of the second side portion 1209s_2 of the active region 1209.

The metal-containing material layer 1239 may include a material capable of forming a dipole as described with reference to FIG. 3.

As described with reference to FIG. 3, when the transistor TR' is turned off, a first positive voltage may be applied to the first source/drain region 1260, and a second positive voltage may be applied to the second source/drain region 1287. In this case, the metal-containing material layer 1239 disposed opposite the second source/drain region 1287 may reduce or suppress a leakage current in the second source/drain region 1287 of the transistor TR'. For example, a dipole 1241 may be formed in the metal-containing material layer 1239 and reduce or suppress leakage of charge in the second source/drain region 1287.

Meanwhile, the metal-containing material layer 1239 may be formed opposite the first through third sides S1, S2, and S3 of the second source/drain region 1287. Accordingly, the metal-containing material layer 1239 may 3-dimensionally cover the second source/drain region 1287 and reduce or suppress a leakage current in the second source/drain region 1287.

Next, a semiconductor device according to an embodiment of the inventive concept will be described with reference to FIGS. 38, 39, and 41.

Figure 41:
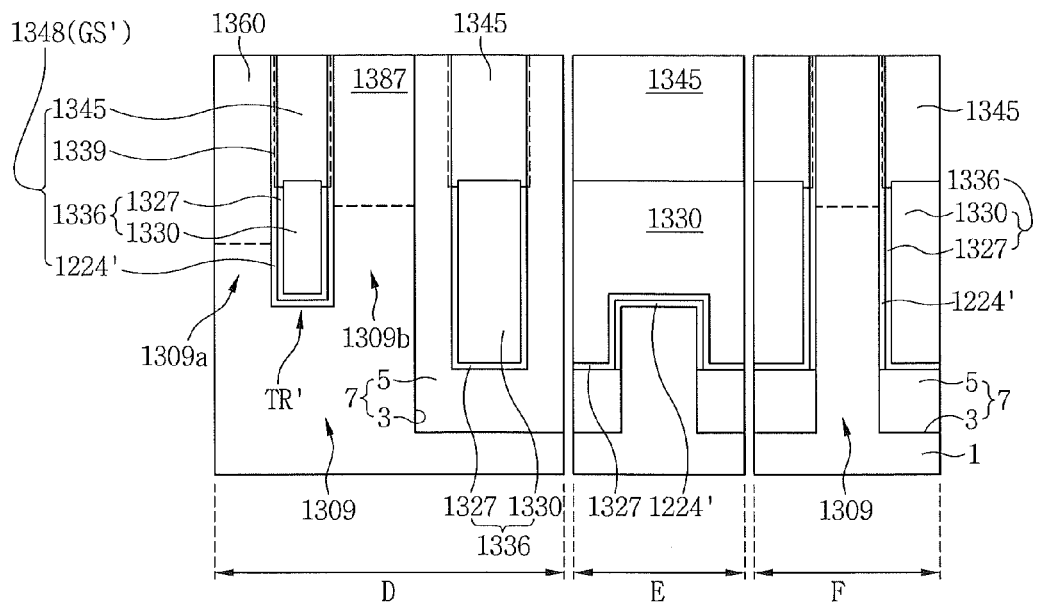

Referring to FIGS. 38, 39, and 41, the gate structure GS' of FIG. 39 may be a gate structure 1348 (GS') including a gate dielectric 1224', a gate electrode 1336, an insulating metal-containing material layer 1339, and an insulating gate capping pattern 1345.

The gate structure 1348 may be formed within the gate trench 1218. A gate capping pattern 1345 may be formed on the gate electrode 1236.

The gate electrode 1336 may be formed of substantially the same material as and have the same structure as the gate electrode 1236 described with reference to FIG. 40A.

Figure 5:
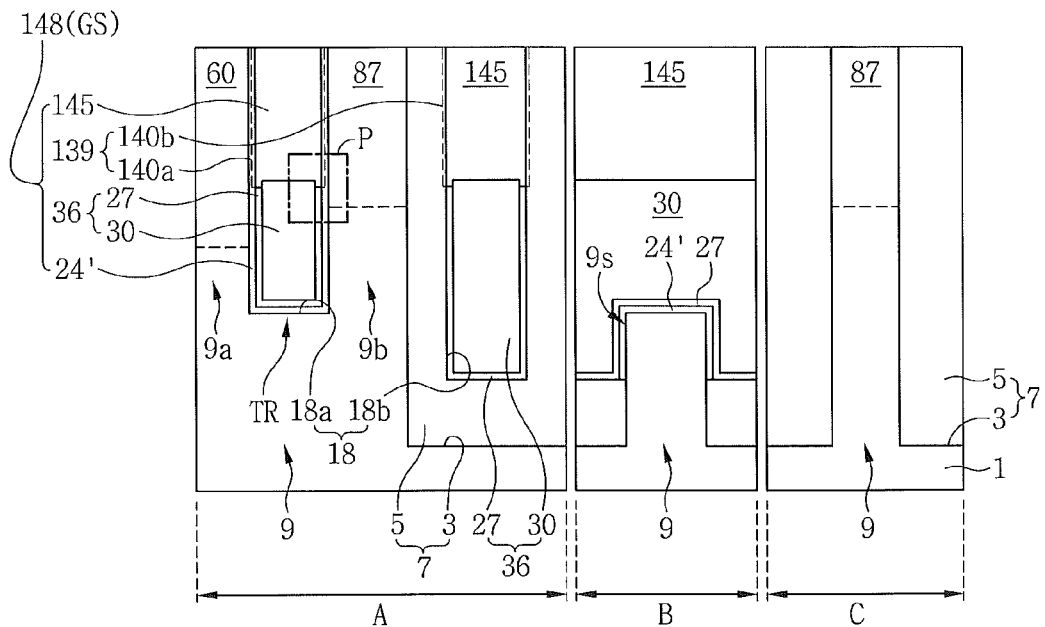
FIG. 5 is a cross-sectional view of a semiconductor device according to an embodiment of the inventive concept.
Figure 6:
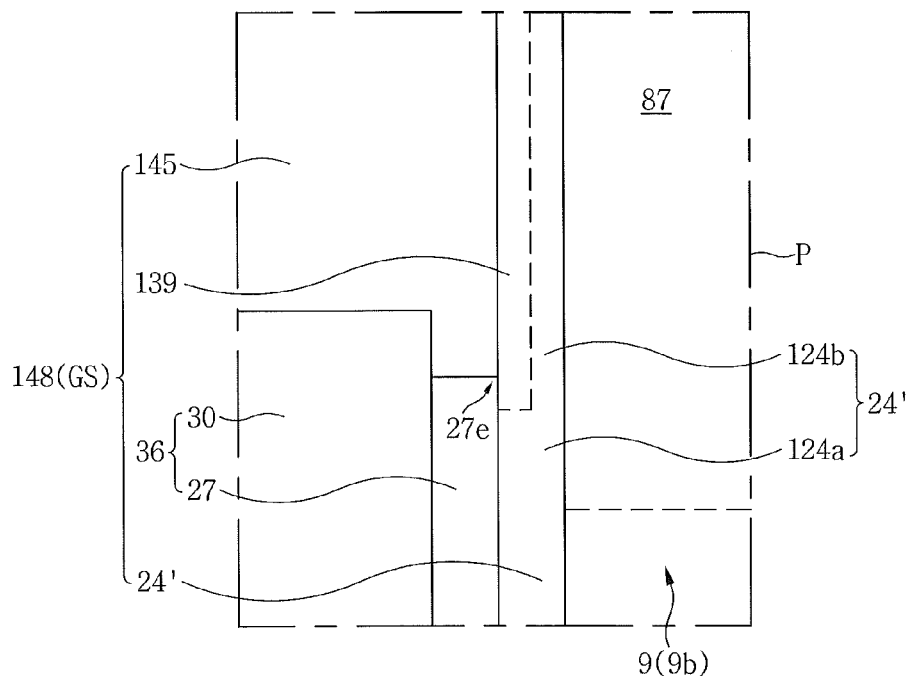
FIG. 6 is a partial enlarged view of a portion of FIG. 5.

Similarly to the gate dielectric 24' of FIG. 5, the gate dielectric 1224' may include a first portion interposed between the gate electrode 1336 and the active region 1209, and a second portion interposed between the gate capping pattern 1345 and the active region 1209.

The gate structure 1348 (GS') may cover the first side portion 1209s_1 and the second side portion 1209s_2 of the active region 1209.

The metal-containing material layer 1339 may be interposed between the gate capping pattern 1345 and the active region 1209. As described with reference to FIG. 5, the metal-containing material layer 1339 may be a region formed by diffusing a metal into the second portion of the gate dielectric 1224' disposed between the gate capping pattern 1345 and the active region 1209.

Similarly to the metal-containing material layer 1239 of FIG. 40B, the metal-containing material layer 1339 may cover the first side S1, the second side S2, and the third side S3 of the second source/drain region 1287. Similarly to the metal-containing material layer 1239 of FIG. 31B, the metal-containing material layer 1339 may 3-dimensionally cover the second source/drain region 1287 and reduce or suppress a leakage current in the transistor TR.

Meanwhile, a metal-doped region 1340 may be formed in the insulating material pattern 1205 of the field region 1207 disposed adjacent to or in contact with the gate capping pattern 1345. The metal-doped region 1340 formed in the insulating material pattern 1205 of the field region 1207 may include the same metal as the metal-containing material layer 1339.

Next, a semiconductor device according to an embodiment of the inventive concept will be described with reference to FIGS. 38, 39, and 42.

Figure 42:
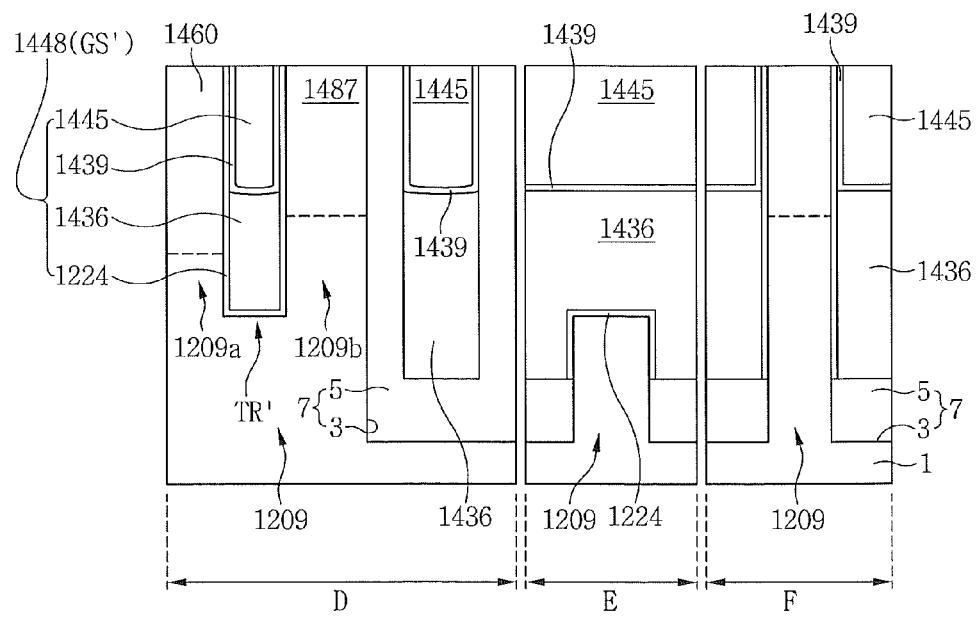

Referring to FIGS. 38, 39, and 42, the gate structure GS' of FIG. 39 may be a gate structure 1448 (GS') including a gate dielectric 1224, a gate electrode 1436, a metal-containing material layer 1439, and a gate capping pattern 1445.

In some embodiments, the gate electrode 1436 may have a top surface having an edge portion protruding upward from a middle portion thereof.

The gate dielectric 1224 may be interposed between the gate electrode 1436 and the active region 1209 and interposed between the gate capping pattern 1445 and the active region 1209.

The metal-containing material layer 1439 may be interposed between the gate capping pattern 1445 and the active region 1209. Similarly to that described with reference to FIG. 5, the metal-containing material layer 1439 may be a region formed by diffusing a metal into the second portion of the gate dielectric 1224' disposed between the gate capping pattern 1545 and the active region 1209.

Similarly to the metal-containing material layer 1239 of FIG. 40B, the metal-containing material layer 1439 may cover the first side S1, the second side S2, and the third side S3 of the second source/drain region 1287. Similarly to the metal-containing material layer 1239 of FIG. 40B, the metal-containing material layer 1439 may 3-dimensionally cover the second source/drain region 1287 and reduce or suppress a leakage current in the transistor TR.

Next, a semiconductor device according to an embodiment of the inventive concept will be described with reference to FIGS. 38, 39, and 43.

Figure 43:
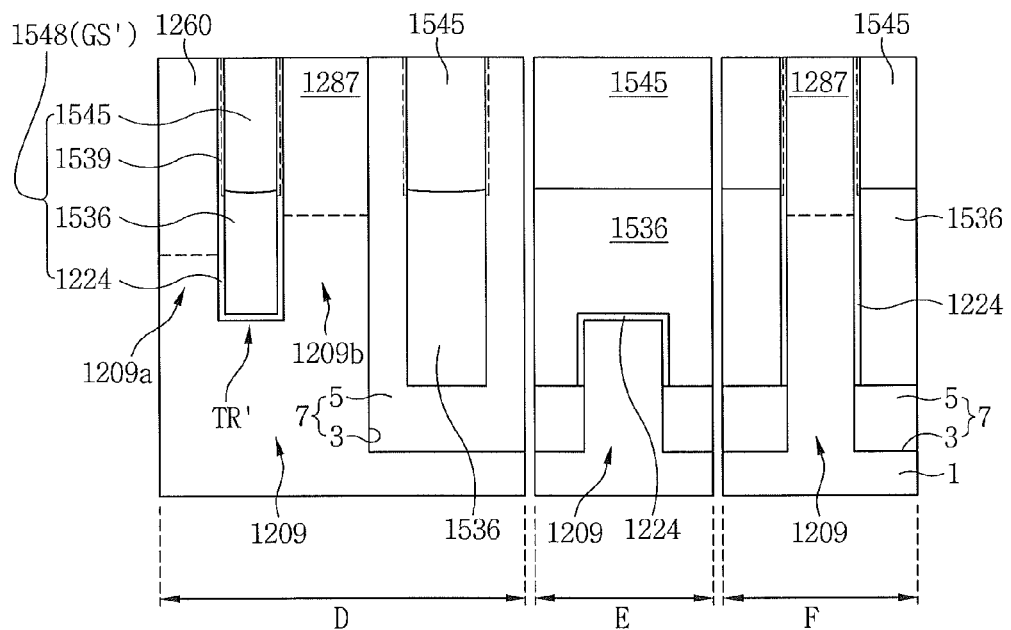

Referring to FIGS. 38, 39, and 43, the gate structure GS' of FIG. 39 may be a gate structure 1548 (GS') including a gate dielectric 1224', a gate electrode 1536, an insulating metal-containing material layer 1539, and an insulating gate capping pattern 1545.

In some embodiments, the gate electrode 1536 may have a concave top surface having a middle portion that is more depressed than an edge portion thereof. The top surface of the gate structure 1536 may have the edge portion relatively protruding from the middle portion thereof.

Similarly to the gate dielectric 24' of FIG. 5, the gate dielectric 1224' may include a first portion interposed between the gate electrode 1536 and the active region 1209, and a second portion interposed between the gate capping pattern 1545 and the active region 1209.

Similarly to the metal-containing material layer 1239 of FIG. 40B, the metal-containing material layer 1539 may cover the first side S1, the second side S2, and the third side S3 of the second source/drain region 1287. Similarly to the metal-containing material layer 1239 of FIG. 40B, the metal-containing material layer 1539 may 3-dimensionally cover the second source/drain region 1287 and reduce or suppress a leakage current in the transistor TR.

Next, a semiconductor device according to an embodiment of the inventive concept will be described with reference to FIGS. 38, 39, and 44.

Figure 44:
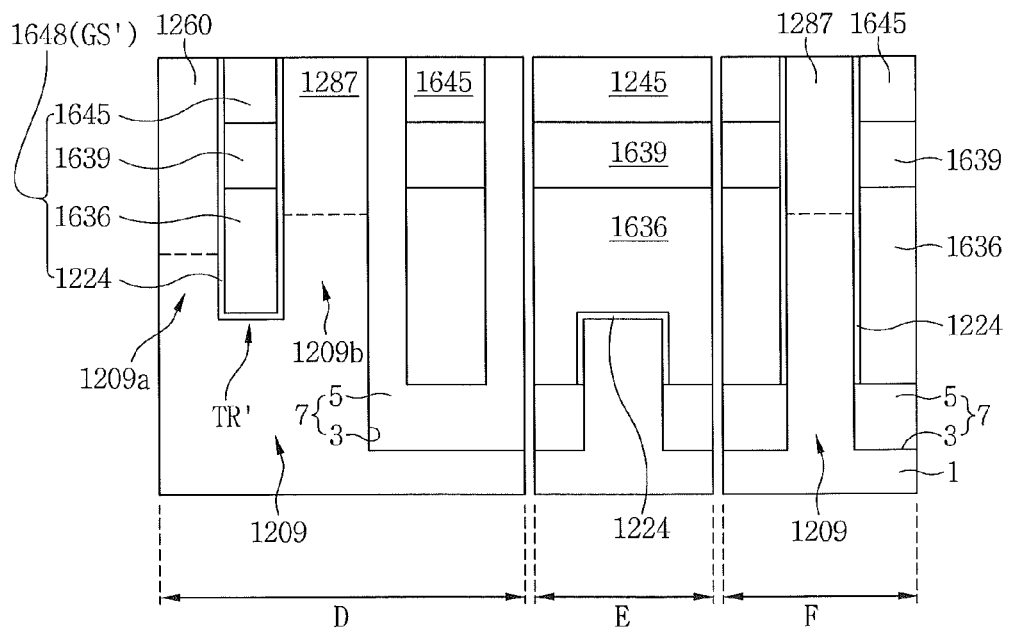

Referring to FIGS. 38, 39, and 44, the gate structure GS' of FIG. 39 may be a gate structure 1648 (GS') including a gate dielectric 1224, a gate electrode 1636, a metal-containing material layer 1639, and a gate capping pattern 1645.

The gate structure 1648 (GS') disposed in the first portion 1218a of the gate trench 1218 may have substantially the same material and structure as the gate structure 448 (GS) disposed in the first portion 18*a* of the gate trench 18 described with reference to FIG. 11.

Within the gate trench 1218, the gate electrode 1636, the metal-containing material layer 1639, and the gate capping pattern 1645 may be sequentially stacked as shown in FIG. 11.

Similarly to the metal-containing material layer 1239 of FIG. 40B, the metal-containing material layer 1639 may 3-dimensionally cover the second source/drain region 1287 and reduce or suppress a leakage current in the transistor TR.

Next, a semiconductor device according to an embodiment of the inventive concept will be described with reference to FIGS. 38, 39, and 45.

Figure 45:
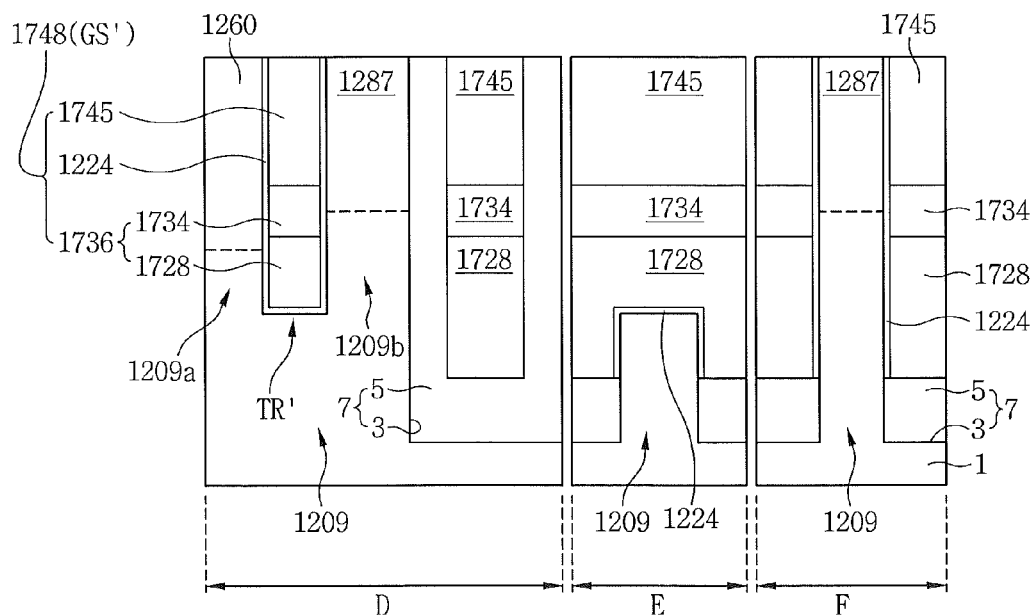

Referring to FIGS. 38, 39, and 45, the gate structure GS' of FIG. 39 may be a gate structure 1748 (GS') including a gate dielectric 1224, a gate electrode 1736, and a gate capping pattern 1745. The gate structure 1748 (GS') may cover the first and second side surfaces 1209*s*_1 and 1209*s*_2 of the active region 1209.

The gate electrode 1736 may be formed of substantially the same material as the gate electrode 536 described with reference to FIG. 12. For example, as shown in FIG. 12, the gate electrode 1736 may include a first conductive pattern 1728 and a second conductive pattern 1734 stacked sequentially.

The second conductive pattern 1734 of the gate electrode 1736 may 3-dimensionally cover the second active pillar 1209*b* of the active region 1209 where the second source/drain region 1287 is formed. The second conductive pattern 1734 may be formed opposite the first, second, and third sides S1, S2, and S3 of the second source/drain region 1287 shown in FIG. 40B.

To reduce or suppress a leakage current in the source/drain region 1287 caused by the second conductive pattern 1734, the second conductive pattern 1734 may be formed of a conductive material having a Fermi energy closer to the conduction band Ec or valance band Ev of the active region 1209 than to the mid-gap energy of the active region 1209.

When the transistor TR' is an NMOS transistor, the second conductive pattern 1734 may be formed of a conductive material having a Fermi energy close to the conduction band Ec of the active region 1209 as described with reference to FIG. 15A.

When the transistor TR' is a PMOS transistor, the second conductive pattern 1734 may be formed of a conductive material having a Fermi energy close to the valance band Ev of the active region 1209 as described with reference to FIG. 15B.

In some embodiments, the gate structure 1748 (GS) may include an insulating metal-containing material layer. The gate structure 1748 including the insulating metal-containing material layer will be described with reference to FIGS. 46A and 46B.

Figure 46A:
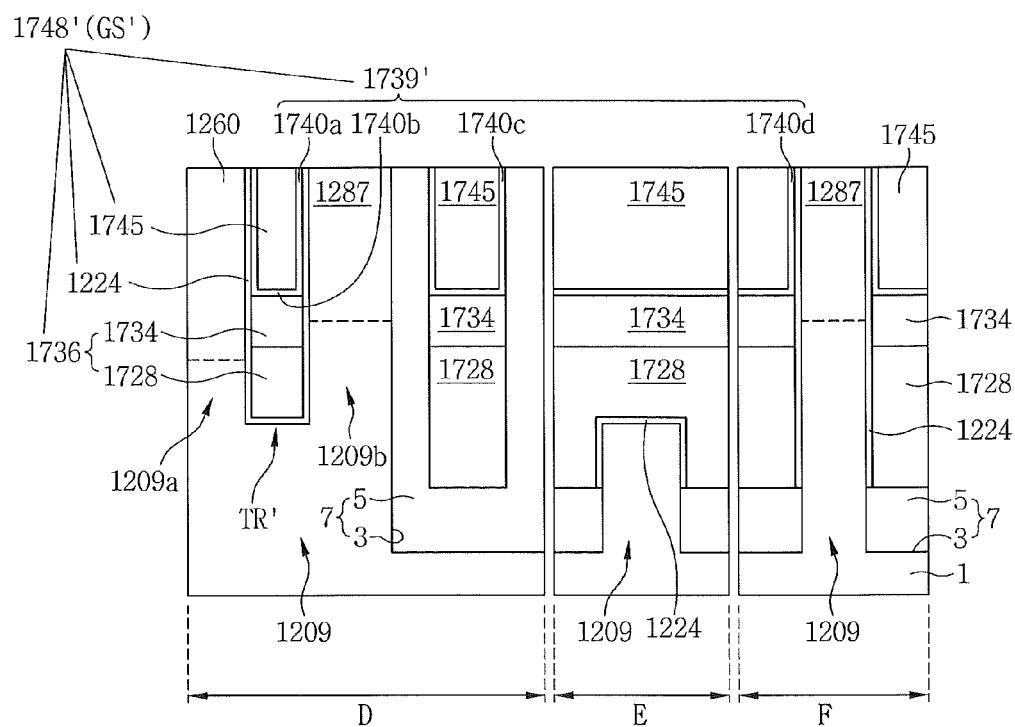

To begin with, referring to FIG. 46A, a gate structure 1748' (GS) including a metal-containing material layer 1739' covering bottom and side surfaces of the gate capping pattern 1745 may be provided.

The metal-containing material layer 1739' may include a first portion 1740*a* interposed between a sidewall of the first portion 1218*a* of the gate trench 1218 disposed across the active region 1209 and the gate capping pattern 1745, a second portion 1740*b* interposed between the gate capping pattern 1745 and the gate electrode 1736, a third portion 1740*c* interposed between the gate capping pattern 1745 and the insulating material pattern 5, and a fourth portion 1740*d* interposed between a side surface of the active region 1209 and the gate capping pattern 1745. The metal-containing material layer 1739' may be formed of substantially the same material as the metal-containing material layer 39 described with reference to FIG. 3.

Figure 46B:
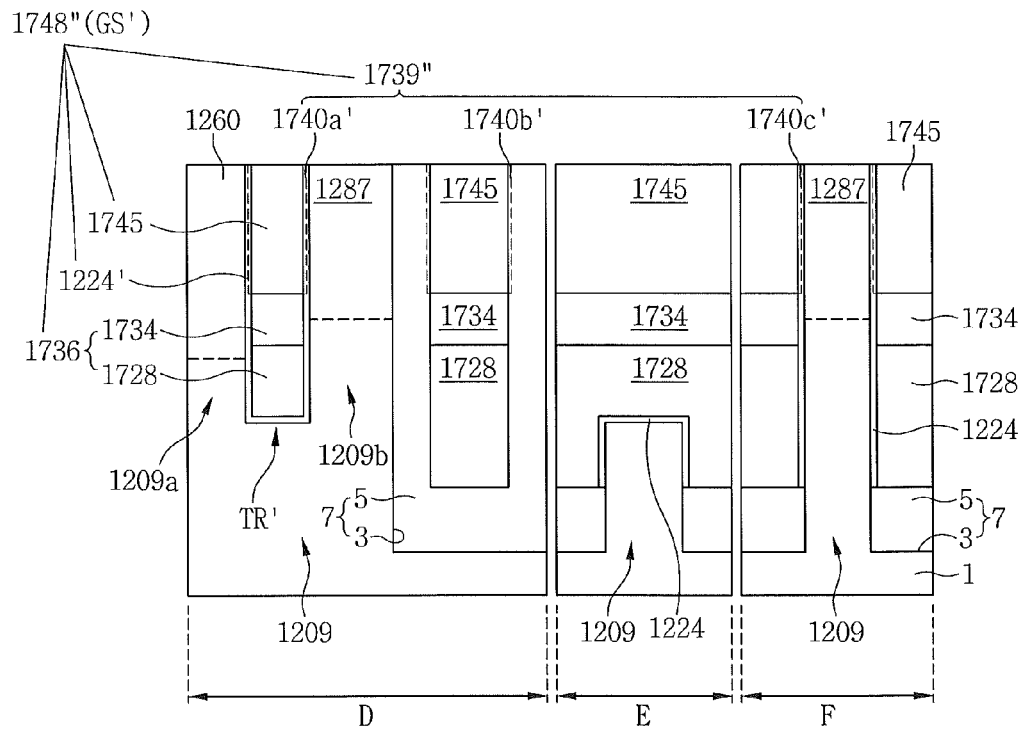

Next, referring to FIG. 46B, a gate structure 1748" (GS) including a metal-containing material layer 1739" formed on a side surface of the gate capping pattern 1745 may be provided. The metal-containing material layer 1739" may include a first portion 1740*a'* formed in a gate dielectric 24' disposed on a sidewall of the first portion 1218*a* of the gate trench 1218 disposed across the active region 1209, a second portion 1740*b'* formed in the insulating material pattern 5 disposed adjacent to or in contact with the side surface of the gate capping pattern 1745, and a third portion 1740*c'* formed in the gate dielectric 24' formed on the side surface of the active region 1209. The metal-containing material layer 1739" may be formed of substantially the same material as the metal-containing material layer 139*a* described with reference to FIG. 5.

Next, a semiconductor device according to an embodiment of the inventive concept will be described with reference to FIGS. 38, 39, and 47.

Figure 47:
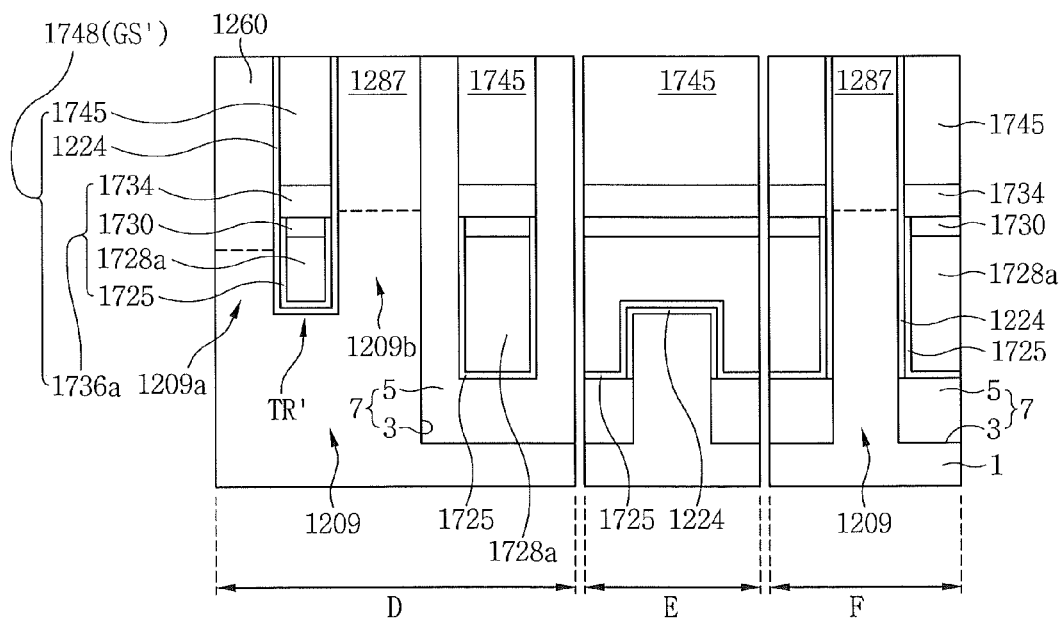

Referring to FIGS. 38, 39, and 47, the gate structure GS' of FIG. 39 may be a gate structure 1748 (GS') including a gate dielectric 1224, a gate electrode 1736*a*, and a gate capping pattern 1845. The gate structure 1748 (GS') may cover the first and second side surfaces 1209*s*_1 and 1209*s*_2 of the active region 1209.

The gate electrode 1736*a* may include a lower barrier conductive pattern 1725, a first conductive pattern 1728*a*, a buffer conductive pattern 1730, and a second conductive pattern 1734. The first conductive pattern 1728*a*, the buffer conductive pattern 1730, and the second conductive pattern 1734 may be stacked sequentially. The lower barrier conductive pattern 1725 may cover bottom and side surfaces of the first conductive pattern 1728*a* and extend onto a side surface of the buffer conductive pattern 1730. The lower barrier conductive pattern 1725 may be disposed at a lower level than the second conductive pattern 1734.

The buffer conductive pattern 1730 may be formed of a conductive material having a lower resistivity than the second conductive pattern 1734 and a higher resistivity than the first conductive pattern 1728*a*. The first conductive pattern 1728*a* may be formed of a conductive material having a lower resistivity than the second conductive pattern 1734. The lower barrier conductive pattern 1725 may be formed of a conductive material having a higher resistivity than the first conductive pattern 1728*a*. For instance, the second conductive pattern 1734 may be formed of poly-Si having the same conductivity type as the first and second source/drain regions 60 and 87, the first conductive pattern 1728 may be formed of a conductive material having a low resistivity, such as tungsten, and the buffer conductive pattern 1730 may be formed of a metal nitride, such as tungsten nitride or titanium nitride. Also, the lower bather conductive pattern 1725 may be formed of a metal nitride, such as tungsten nitride or titanium nitride.

In some embodiments, the gate structure 1748 (GS) may include an insulating metal-containing material layer. The gate structure 1748 including the insulating metal-containing material layer will be described with reference to FIGS. 48A and 48B.

To begin with, referring to FIG. 48A, a gate structure 1748*a'* including a metal-containing material layer 1739*a'* covering bottom and side surfaces of the gate capping pattern 1745 may be provided. The gate structure 1748*a'* (GS') may cover the first and second side surfaces 1209*s*_1 and 1209*s*_2 of the active region 1209.

The metal-containing material layer 1739a' may include a first portion interposed between a sidewall of the first portion 1218a of the gate trench 1218 disposed across the active region 1209 and the gate capping pattern 1745, a second portion interposed between the gate capping pattern 1745 and the gate electrode 1736, a third portion interposed between the gate capping pattern 1745 and the insulating material pattern 5, and a fourth portion interposed between the gate capping pattern 1745 and a side surface of the active region 1209. The metal-containing material layer 1739a' may be formed of substantially the same material as the metal-containing material layer 39 described with reference to FIG. 3. Accordingly, similarly to the metal-containing material layer 1239 of FIG. 40B, the metal-containing material layer 1739a' may 3-dimensionally cover the second source/drain region 1287 and reduce or suppress a leakage current in the transistor TR.

Next, referring to FIG. 48B, a gate structure 1748a" (GS') including a metal-containing material layer 1739a" formed on a side surface of the gate capping pattern 1745 may be provided. The gate structure 1748a" (GS') may cover the first and second side surfaces 1209s_1 and 1209s_2 of the active region 1209.

The metal-containing material layer 1739a" may include a first portion formed in a gate dielectric 24' disposed on a sidewall of the first portion 1218a of the gate trench 1218 disposed across the active region 1209, a second portion formed in the insulating material pattern 5 disposed adjacent to or in contact with a side surface of the gate capping pattern 1745, and a third portion formed in the gate dielectric 24' disposed on a side surface of the active region 1209. The metal-containing material layer 1739a" may include substantially the same material as the metal-containing material layer 139a described with reference to FIG. 5. Similarly to the metal-containing material layer 1239 of FIG. 40B, the metal-containing material layer 1739a" may 3-dimensionally cover the second source/drain region 1287 and reduce or suppress a leakage current in the transistor TR.

Next, a semiconductor device according to an embodiment of the inventive concept will be described with reference to FIGS. 38, 39, and 49.

Figure 49:
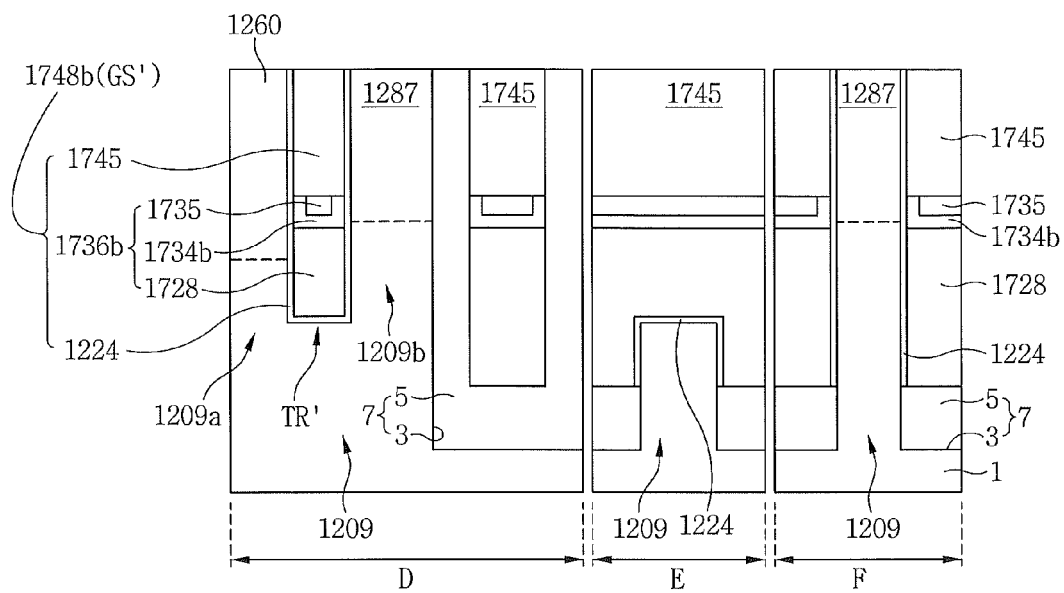

Referring to FIGS. 38, 39, and 49, the gate structure GS' of FIG. 39 may be a gate structure 1748 (GS') including a gate dielectric 1224, a gate electrode 1736b, and a gate capping pattern 1745. The gate structure 1748b (GS') may cover the first and second side surfaces 1209s_1 and 1209s_2 of the active region 1209. The gate electrode 1736 and the gate capping pattern 1745 may be stacked sequentially.

The gate electrode 1736b may include a first conductive pattern 1728, a second conductive pattern 1734b, and an upper subsidiary conductive pattern 1735 stacked sequentially. The second conductive pattern 1734b may have a smaller vertical thickness than the first conductive pattern 1728. The second conductive pattern 1734b may be formed to cover bottom and side surfaces of the upper subsidiary conductive pattern 1735.

The first conductive pattern 1728 may be formed of a conductive material having a Fermi energy $E_{Fm}$ close to a mid-gap energy $E_{midgap}$ of the active region 1209, for example, at least one of TiN, W, a Ti—Al alloy, and WN.

The second conductive pattern 1734b may 3-dimensionally face the source/drain region 1287. Accordingly, to reduce or suppress a leakage current in the source/drain region 1287, the second conductive pattern 1734b horizontally overlapping the source/drain region 1287 may be formed of a conductive material having a Fermi energy closer to the conduction band Ec or valance band Ev of the active region 1209 than to the mid-gap energy $E_{midgap}$ of the active region 1209. When the transistor TR' is an NMOS transistor, the second conductive pattern 1734b may be formed of a conductive material (e.g., a La-containing conductive material or N-type poly-Si) having a Fermi energy $E_{Fn}$ close to a conduction band Ec of the active region 1209 as described with reference to FIG. 15A. When the transistor TR' is a PMOS transistor, the second conductive pattern 1734b may be formed of a conductive material (e.g., a conductive material containing aluminum, tantalum or iridium, or P-type poly-Si) having a Fermi energy $E_{Fp}$ close to the valance band Ev of the active region 9.

The upper subsidiary conductive pattern 1735 may be formed of a conductive material having a lower resistivity than the second conductive pattern 1734b. For example, the second conductive pattern 1734b may be formed of poly-Si, and the upper subsidiary conductive pattern 1735 may include at least one of TiN, W, a Ti—Al alloy, and WN.

In some embodiments, the gate structure 1748b (GS) may include an insulating metal-containing material layer. The gate structure 1748b (GS) including the insulating metal-containing material layer will be described with reference to each of FIGS. 50A and 50B. To begin with, referring to FIG. 50A, a gate structure 1748b' (GS') including a metal-containing material layer 1739b covering bottom and side surfaces of the gate capping pattern 1745 may be provided. The gate structure 1748b (GS') may cover the first and second side surfaces 1209s_1 and 1209s_2 of the active region 1209. The metal-containing material layer 1739b may include a first portion interposed between a sidewall of the first portion 1218a of the gate trench 1218 disposed across the active region 1209 and the gate capping pattern 1745, a second portion interposed between the gate capping pattern 1745 and the gate electrode 1736b, a third portion interposed between the gate capping pattern 1745 and the insulating material pattern 5, and a fourth portion interposed between the gate capping pattern 1745 and a side surface of the active region 1209. The metal-containing material layer 1739b may be formed of substantially the same material as the metal-containing material layer 39 described with reference to FIG. 3. Similarly to the metal-containing material layer 1239 of FIG. 40B, the metal-containing material layer 1739b may 3-dimensionally cover the second source/drain region 1287 and reduce or suppress a leakage current in the transistor TR.

Figure 50A:
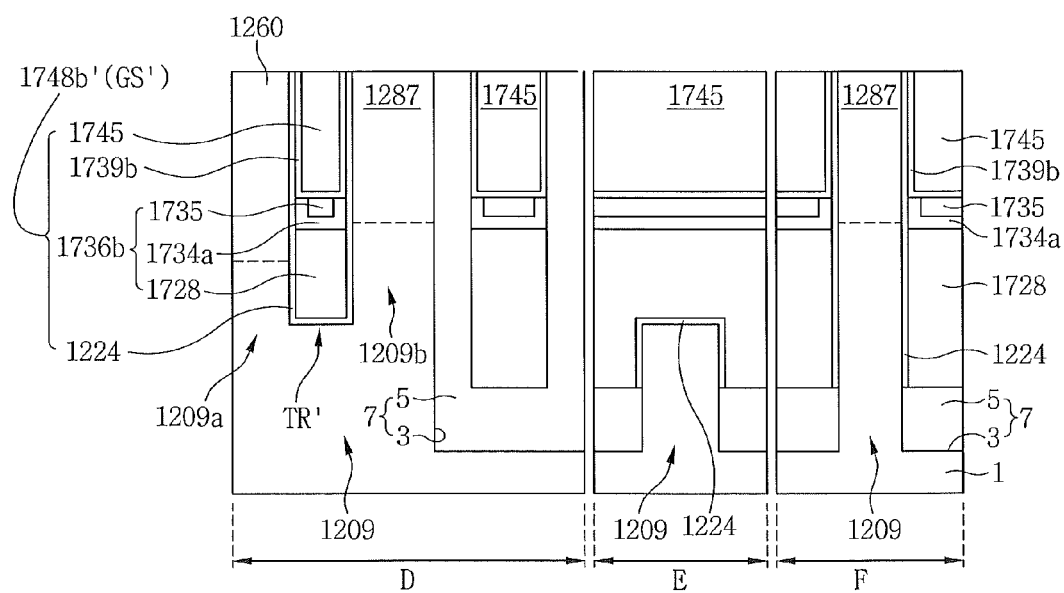
Figure 50B:
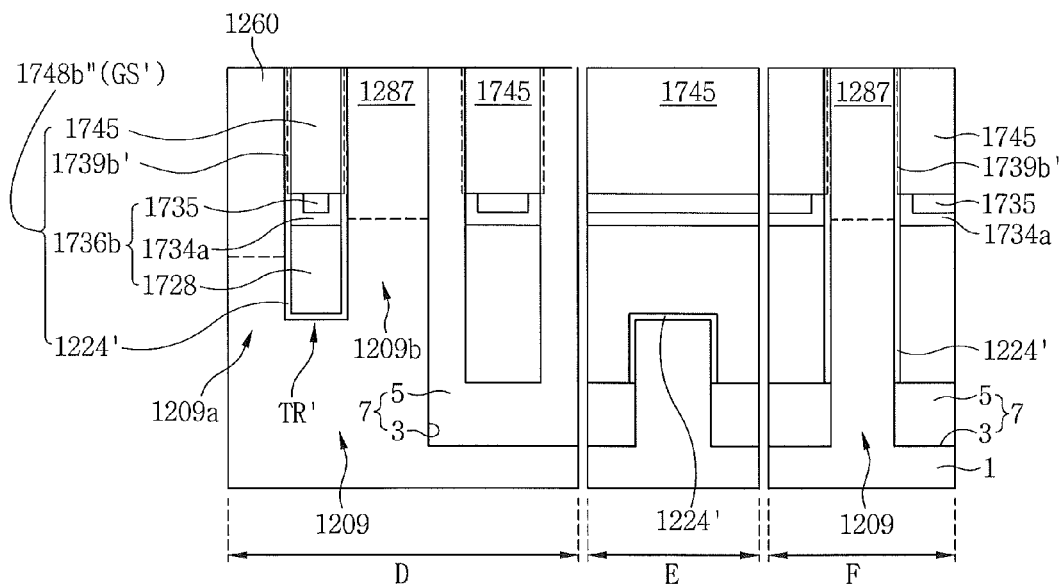

Next, referring to FIG. 50B, a gate structure 1748b" (GS') including a metal-containing material layer 1739b' formed on a side surface of the gate capping pattern 1745 may be provided.

The metal-containing material layer 1739b' may include a first portion formed in a gate dielectric 1224' disposed on a sidewall of the first portion 1218a of the gate trench 1218 disposed across the active region 1209, a second portion formed in the insulating material pattern 5 disposed adjacent to or in contact with a side surface of the gate capping pattern 1745, and a third portion formed in the gate dielectric 1224' disposed on a side surface of the active region 1209. The metal-containing material layer 1739b' may include substantially the same material as the metal-containing material layer 139a described with reference to FIG. 5.

Similarly to the metal-containing material layer 1239 of FIG. 40B, the metal-containing material layer 1739b' may 3-dimensionally cover the second source/drain region 1287 and reduce or suppress a leakage current in the transistor TR.

Next, a semiconductor device according to an embodiment of the inventive concept will be described with reference to FIGS. 38, 39, and 51.

Figure 51:
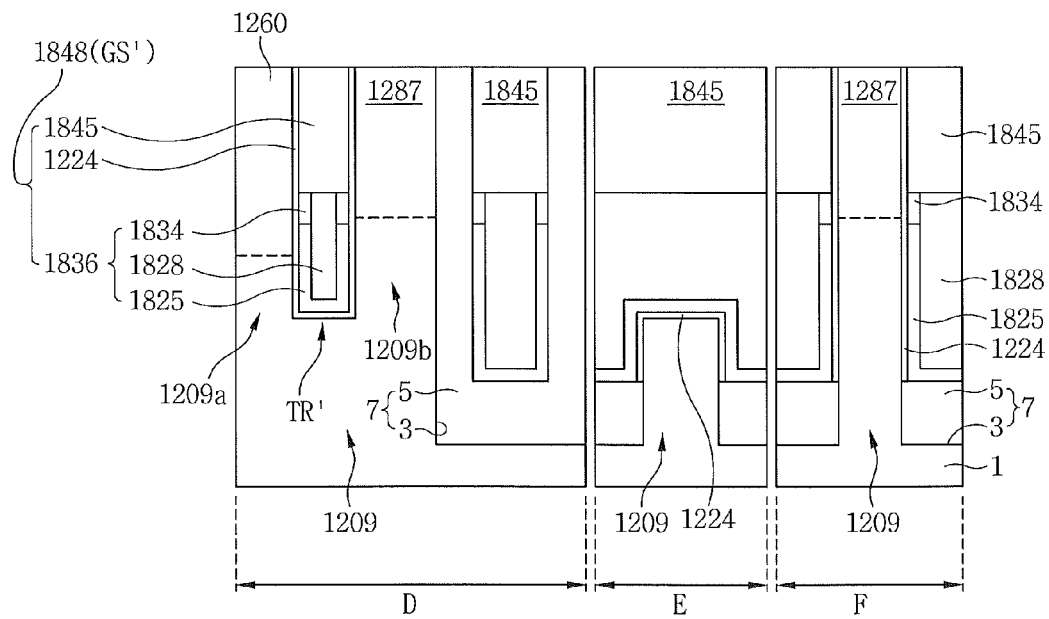

Referring to FIGS. 38, 39, and 51, the gate structure GS' of FIG. 39 may be a gate structure 1848 (GS') including a gate dielectric 1224, a gate electrode 1836, and a gate capping pattern 1845. The gate structure 1848 (GS') may cover the first and second side surfaces 1209s_1 and 1209s_2 of the active region 1209. The gate electrode 1836 and the gate capping pattern 1845 may be stacked sequentially.

The gate electrode 1836 may be disposed at a lower level than a top surface of the active region 1209. The gate dielectric 1224 may include a portion interposed between the gate electrode 1836 and the active region 1209. The gate dielectric 1224 may include a first portion interposed between the gate electrode 1836 and the active region 1209, and a second portion interposed between the gate capping pattern 1845 and the active region 1209.

The gate electrode 1836 may include a first conductive pattern 1828, a second conductive pattern 1834, and a lower barrier conductive pattern 1825. The second conductive pattern 1834 may include a portion interposed between an upper side surface of the first conductive pattern 1828 and the active region 1209, and a portion interposed between an upper side surface of the first conductive pattern 1828 and the insulating pattern 5 disposed in the field region 7. The lower barrier conductive pattern 1825 may cover the bottom surface of the first conductive pattern 1828, extend onto a side surface of the first conductive pattern 1828, and be disposed at a lower level than the second conductive pattern 1834.

As described with reference to FIG. 14, the first conductive pattern 1828 may include a conductive material having a Fermi energy $E_{Fm}$ closer to the mid-gap energy $E_{midgap}$ than to the conduction band or valance band of the active region 1209, for example, any one of TiN, W, a Ti—Al alloy, and WN. The second conductive pattern 1834 may include a different material from the first conductive pattern 1828, for example, a material having a Fermi energy close to an energy band edge of the active region 1209 as described with reference to FIGS. 15A and 15B. The first conductive pattern 1828 may be formed of a conductive material having a lower resistivity than the second conductive pattern 1834. For example, the first conductive pattern 1828 may be formed of poly-Si, and the second conductive pattern 1834 may be formed of at least one of TiN, W, a Ti—Al alloy, and WN.

In some embodiments, the gate structure 1848 (GS) may include an insulating metal-containing material layer. The gate structure 1848 (GS) including the insulating metal-containing material layer will be described with reference to each of FIGS. 52A and 52B.

Figure 52A:
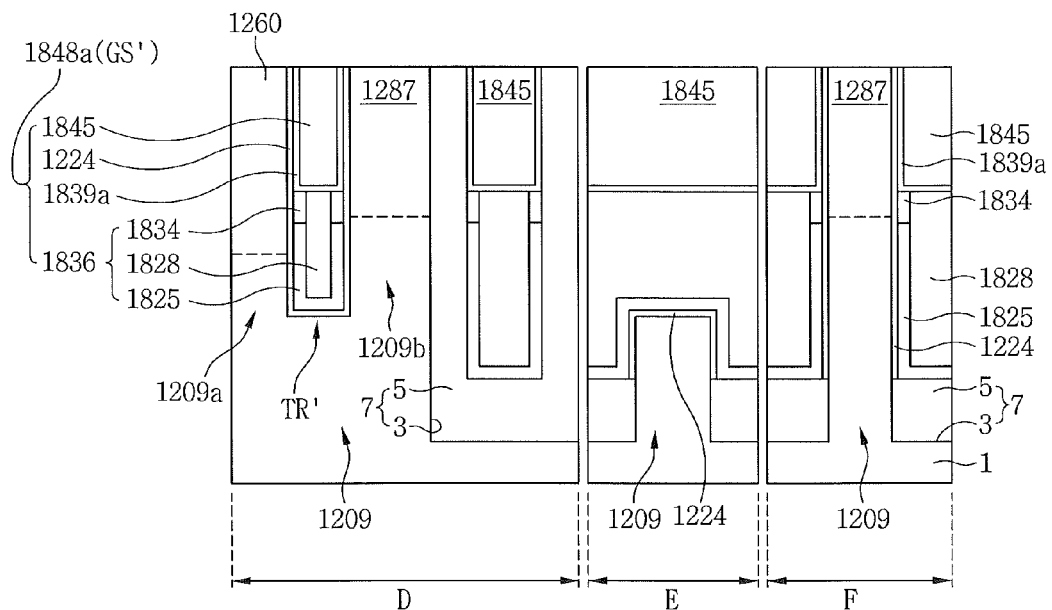

To begin with, referring to FIG. 52A, a gate structure 1848a (GS') including a metal-containing material layer 1839a covering bottom and side surfaces of the gate capping pattern 1845 may be provided. The gate structure 1848a (GS') may cover the first and second side surfaces 1209s_1 and 1209s_2 of the active region 1209. The metal-containing material layer 1839a may include a first portion interposed between a sidewall of the first portion 1218a of the gate trench 1218 disposed across the active region 1209 and the gate capping pattern 1845, a second portion interposed between the gate capping pattern 1845 and the gate electrode 1836, a third portion interposed between the gate capping pattern 1845 and the insulating material pattern 5, and a fourth portion interposed between the gate capping pattern 1845 and a side surface of the active region 1209. The metal-containing material layer 1839a may be formed of substantially the same material as the metal-containing material layer 39 described with reference to FIG. 3.

Figure 52B:
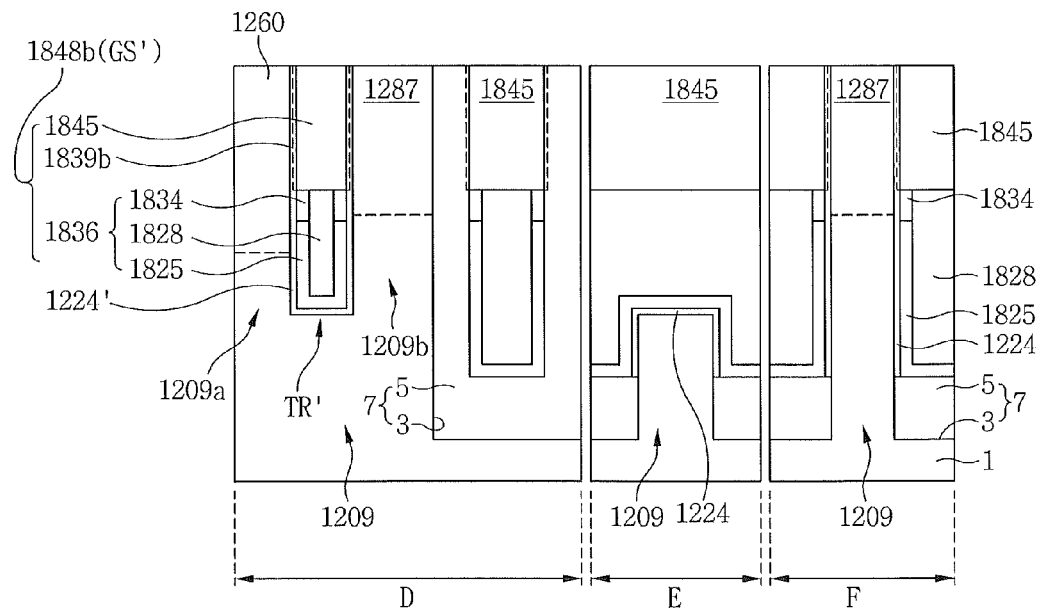

Next, referring to FIG. 52B, a gate structure 1848b (GS') including a metal-containing material layer 1839b formed on a side surface of the gate capping pattern 1845 may be provided.

The metal-containing material layer 1839b may include a first portion formed in a gate dielectric 1224' disposed on a sidewall of the first portion 1218a of the gate trench 1218 disposed across the active region 1209, a second portion formed in the insulating material pattern 5 disposed adjacent to or in contact with a side surface of the gate capping pattern 1845, and a third portion formed in the gate dielectric 1224' disposed on a side surface of the active region 1209. The metal-containing material layer 1839b may include substantially the same material as the metal-containing material layer 139a described with reference to FIG. 5. Next, a semiconductor device according to an embodiment of the inventive concept will be described with reference to FIGS. 38, 39, and 53.

Figure 53:
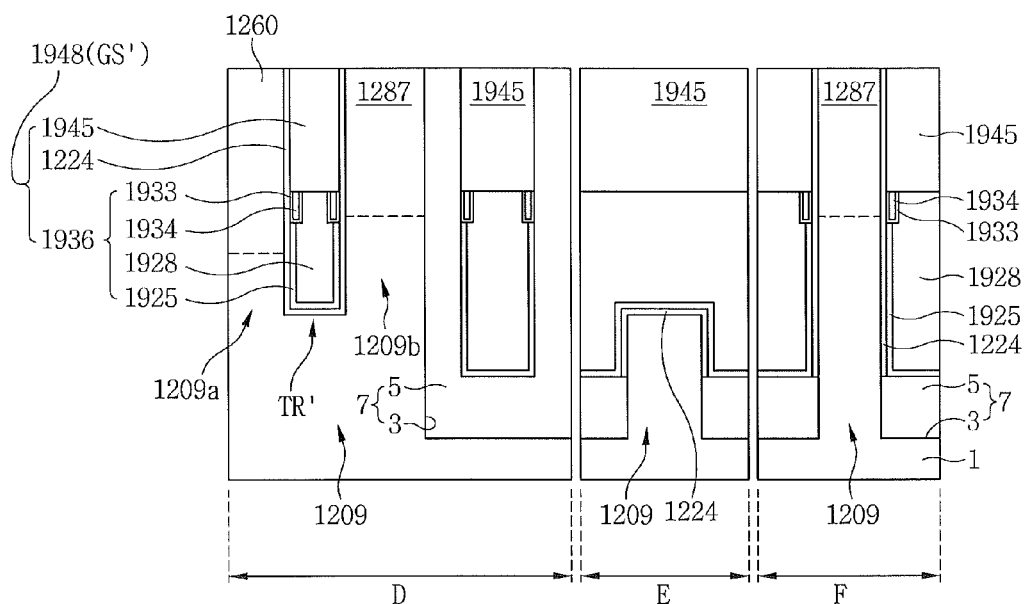

Referring to FIGS. 38, 39, and 53, the gate structure GS' of FIG. 39 may be a gate structure 1948 (GS') including a gate dielectric 1224, a gate electrode 1936, and a gate capping pattern 1945. The gate structure 1948 (GS') may cover the first and second side surfaces 1209s_1 and 1209s_2 of the active region 1209. The gate electrode 1936 and the gate capping pattern 1945 may be stacked sequentially.

The gate electrode 1936 may be disposed at a lower level than a top surface of the active region 1209. The gate dielectric 1224 may include a first portion interposed between the gate electrode 1936 and the active region 1209, and a second portion interposed between the gate capping pattern 1945 and the active region 1209.

The gate electrode 1936 may include a lower barrier conductive pattern 1925, a first conductive pattern 1928, a second conductive pattern 1934, and an upper barrier conductive pattern 1935. The second conductive pattern 1934 may include a portion interposed between an upper side surface of the first conductive pattern 1928 and the active region 1209, and a portion interposed between the upper side surface of the first conductive pattern 1928 and the insulating pattern 5 of the field region 7. The lower barrier conductive pattern 1925 may cover the bottom surface of the first conductive pattern 1928, extend onto a side surface of the first conductive pattern 1928, and be disposed at a lower level than the second conductive pattern 1934. The upper barrier conductive pattern 1934 may include a portion interposed between the second conductive pattern 1934 and the first conductive pattern 1928. The upper barrier conductive pattern 1934 may be formed to cover bottom and side surfaces of the second conductive pattern 1934. The first conductive pattern 1928 may have a greater horizontal width than the second conductive pattern 1934. A portion of the first conductive pattern 1928 disposed at a lower level than the second conductive pattern 1934 may have a greater horizontal width than a portion of the first conductive pattern 1928 disposed at the same level as the second conductive pattern 1934.

As described with reference to FIG. 14, the first conductive pattern 1928 may include a conductive material having a Fermi energy $E_{Fm}$ closer to the mid-gap energy $E_{midgap}$ than the conduction band or valance band of the active region 1209, for example, any one of TiN, W, a Ti—Al alloy, and WN. The second conductive pattern 1934 may include a different material from the first conductive pattern 1928, for example, a material having a Fermi energy close to an energy band edge of the active region 1209 as described with reference to FIGS. 15A and 15B. The first conductive pattern 1928 may be formed of a conductive material having a lower resistivity than the second conductive pattern 1934.

In some embodiments, the gate structure 1948 (GS) may include an insulating metal-containing material layer. The gate structure including the insulating metal-containing material layer will be described with reference to FIGS. 54A and 54B.

Figure 54A:
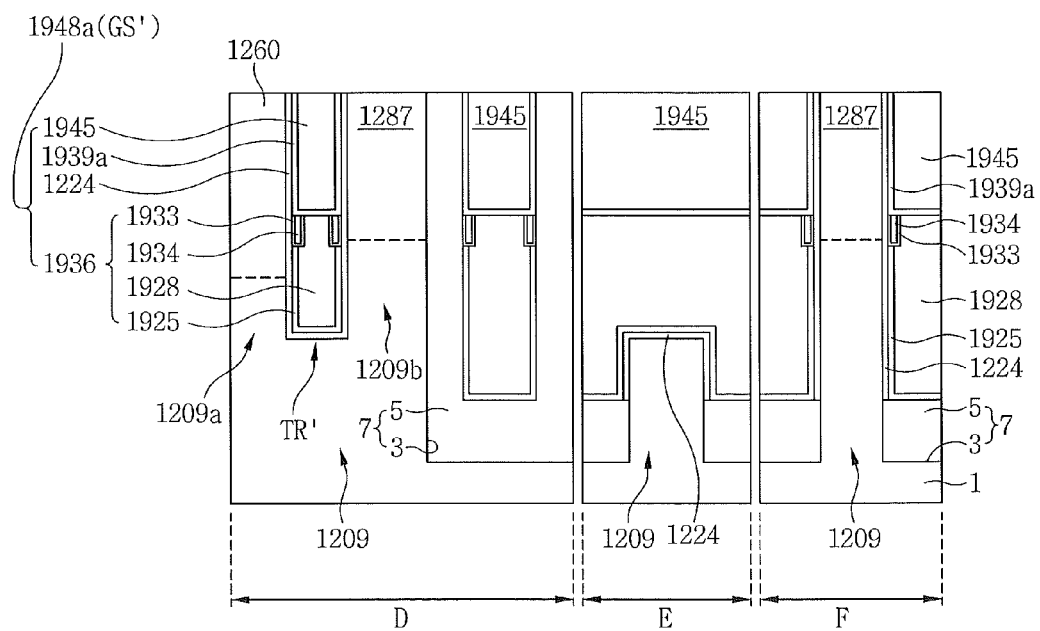

To begin with, referring to FIG. 54A, a gate structure 1948a (GS') including a metal-containing material layer 1939a covering bottom and side surfaces of the gate capping pattern 1945 may be provided. The gate structure 1948a (GS') may cover the first and second side surfaces 1209s_1 and 1209s_2 of the active region 1209. The metal-containing material layer 1939a may include a first portion interposed between a sidewall of the first portion 1218a of the gate trench 1218 disposed across the active region 1209 and the gate capping pattern 1945, a second portion interposed between the gate capping pattern 1945 and the gate electrode 1936, a third portion interposed between the gate capping pattern 1945 and the insulating material pattern 5, and a fourth portion interposed between the gate capping pattern 1945 and a side surface of the active region 1209. The metal-containing material layer 1939a may be formed of substantially the same material as the metal-containing material layer 39 described with reference to FIG. 3.

Figure 54B:
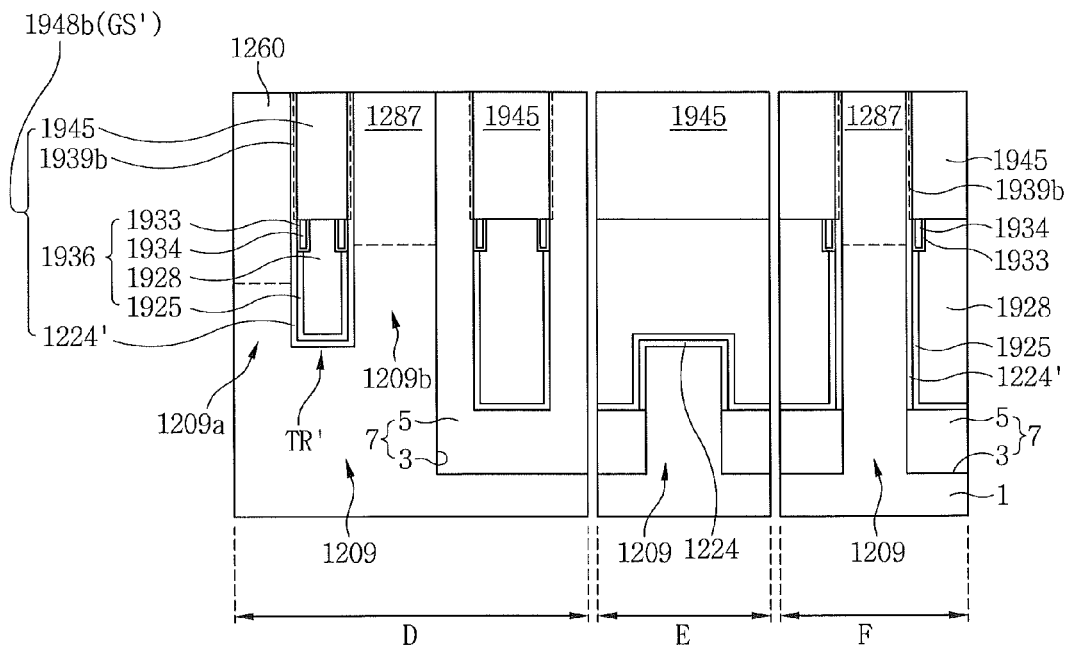

Next, referring to FIG. 54B, a gate structure 1948b (GS') including a metal-containing material layer 1939b formed on a side surface of the gate capping pattern 1945 may be provided.

The metal-containing material layer 1939b may include a first portion formed in a gate dielectric 1224' disposed on a sidewall of the first portion 1218a of the gate trench 1218 disposed across the active region 1209, a second portion formed in the insulating material pattern 5 disposed adjacent to or in contact with a side surface of the gate capping pattern 1945, and a third portion formed in the gate dielectric 1224' disposed on a side surface of the active region 1209. The metal-containing material layer 1939b may include substantially the same material as the metal-containing material layer 139a described with reference to FIG. 5.

Next, a semiconductor device according to an embodiment of the inventive concept will be described with reference to FIGS. 38, 39, and 55.

Figure 55:
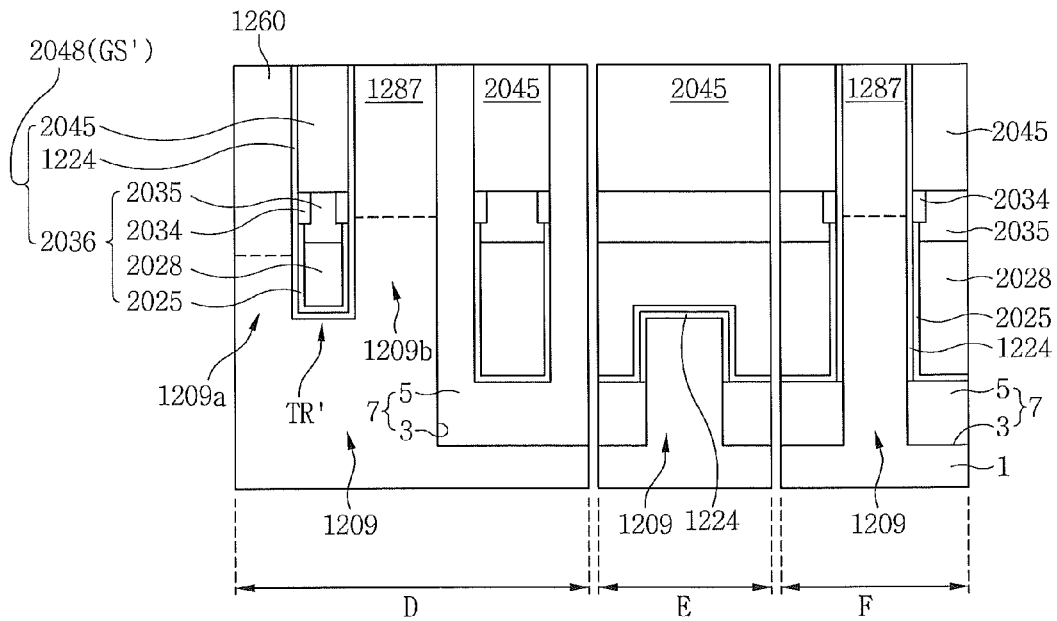

Referring to FIGS. 38, 39, and 55, the gate structure GS' of FIG. 39 may be a gate structure 2048 (GS') including a gate dielectric 1224, a gate electrode 2036, and a gate capping pattern 2045. The gate structure 2048 (GS') may cover the first and second side surfaces 1209s_1 and 1209s_2 of the active region 1209.

The gate electrode 2036 may include a lower barrier conductive pattern 2025, a first conductive pattern 2028, a second conductive pattern 2034, and an upper subsidiary conductive pattern 2035.

The lower barrier conductive pattern 2025 may be conformally formed on the gate dielectric 1224, and the first conductive pattern 2028 may be formed on the lower barrier conductive pattern 2025 and partially fill the gate trench 2018. The upper subsidiary conductive pattern 2035 may be formed on the first conductive pattern 2028. The upper subsidiary conductive pattern 2035 may be formed on the first conductive pattern 2028 and in contact with the first conductive pattern 2028. The second conductive pattern 2034 may be formed on a partial side surface of the upper subsidiary conductive pattern 2035. The second conductive pattern 2034 may be disposed at a higher level than the first conductive pattern 2028 and spaced apart from the first conductive pattern 2028. The second conductive pattern 2034 may be disposed at a higher level than the lower barrier conductive pattern 2025. A portion of the upper subsidiary conductive pattern 2035 disposed at a lower level than the second conductive pattern 2034 may have a greater width than a portion of the upper subsidiary conductive pattern 2035 disposed at the same level as the second conductive pattern 2034.

As described with reference to FIG. 14, the first conductive pattern 2028 may be formed of a metal having a Fermi energy close to a mid-gap energy $E_{midgap}$ of the active region 9 and a lower resistivity than the lower barrier conductive pattern 2025.

The second conductive pattern 2034 may be formed of a different material from the first conductive pattern 2028, for example, a conductive material having a Fermi energy close to an energy band edge of the active region 1209 as described with reference to FIGS. 15A and 15B. The upper subsidiary conductive pattern 2035 may be formed of a metal having a lower resistivity than the second conductive pattern 2034 to improve current drivability of the transistor TR.

In some embodiments, the gate structure 2048 (GS) may include an insulating metal-containing material layer. The gate structure 2048 (GS) including the insulating metal-containing material layer will now be described with reference to FIGS. 56A and 56B.

Figure 56A:
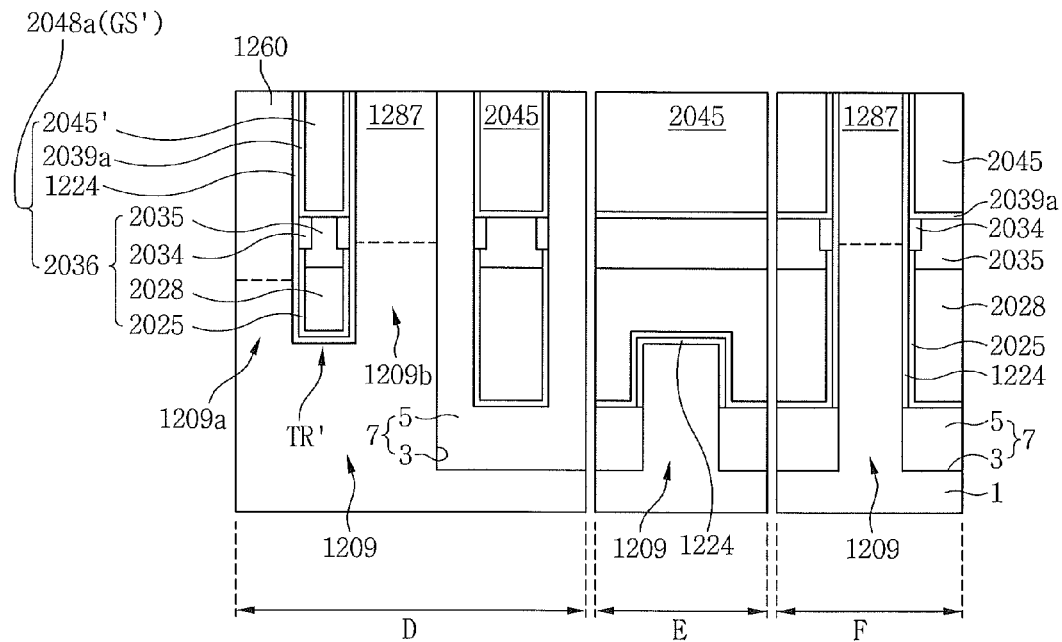

To being with, referring to FIG. 56A, a gate structure 2048 (GS') including a metal-containing material layer 2039a covering bottom and side surfaces of the gate capping pattern 2045 may be provided. The gate structure 2048a (GS) may cover the first and second side surfaces 1209s_1 and 1209s_2 of the active region 1209. The metal-containing material layer 2039a may include a first portion interposed between a sidewall of the first portion 1218a of the gate trench 1218 formed across the active region 1209 and the gate capping pattern 2045, a second portion interposed between the gate capping pattern 2045 and the gate electrode 2036, a third portion interposed between the gate capping pattern 2045 and the insulating material pattern 5, and a fourth portion interposed between the gate capping pattern 2045 and a side surface of the active region 1209. The metal-containing material layer 2039a may be formed of substantially the same material as the metal-containing material layer 39 described with reference to FIG. 3.

Figure 56B:
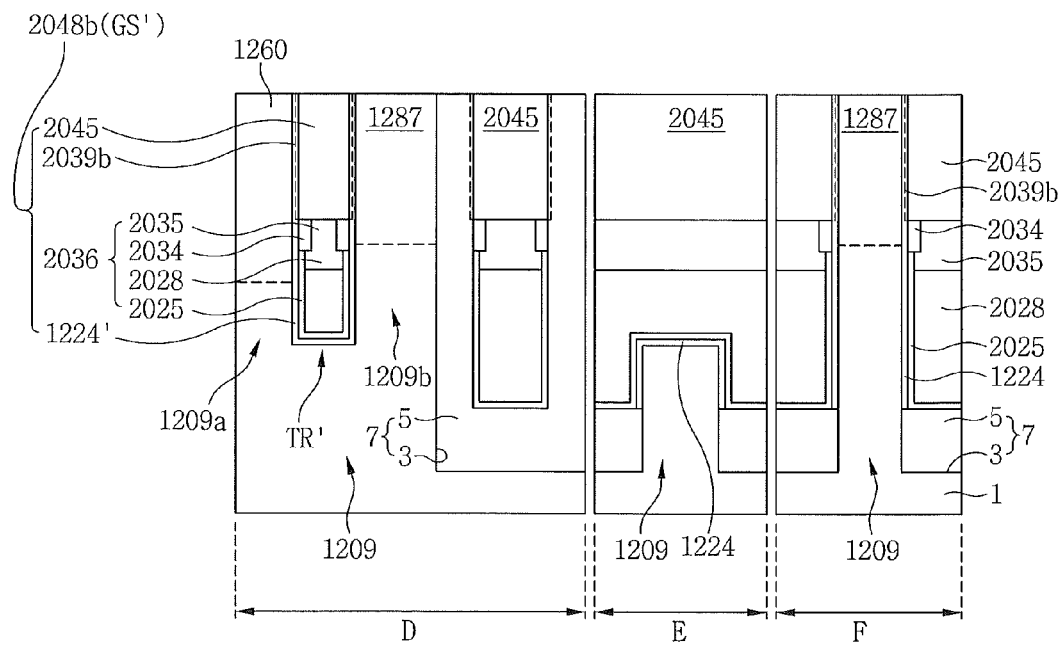

Next, referring to FIG. 56B, a gate structure 2048b (GS') including a metal-containing material layer 2039b formed on a side surface of the gate capping pattern 2045 may be provided.

The metal-containing material layer 2039b may include a first portion formed in a gate dielectric 1224' disposed on a side surface of the first portion 1218a of the gate trench 1218 formed across the active region 1209, a second portion formed in the insulating material pattern 5 disposed adjacent to or in contact with a side surface of the gate capping pattern 2045, and a third portion formed in the gate dielectric 1224' disposed on a side surface of the active region 1209. The metal-containing material layer 2039b may include substantially the same material as the metal-containing material layer 139a described with reference to FIG. 5.

Next, a semiconductor device according to an embodiment of the inventive concept will be described with reference to FIGS. 38, 39, and 57.

Figure 57:
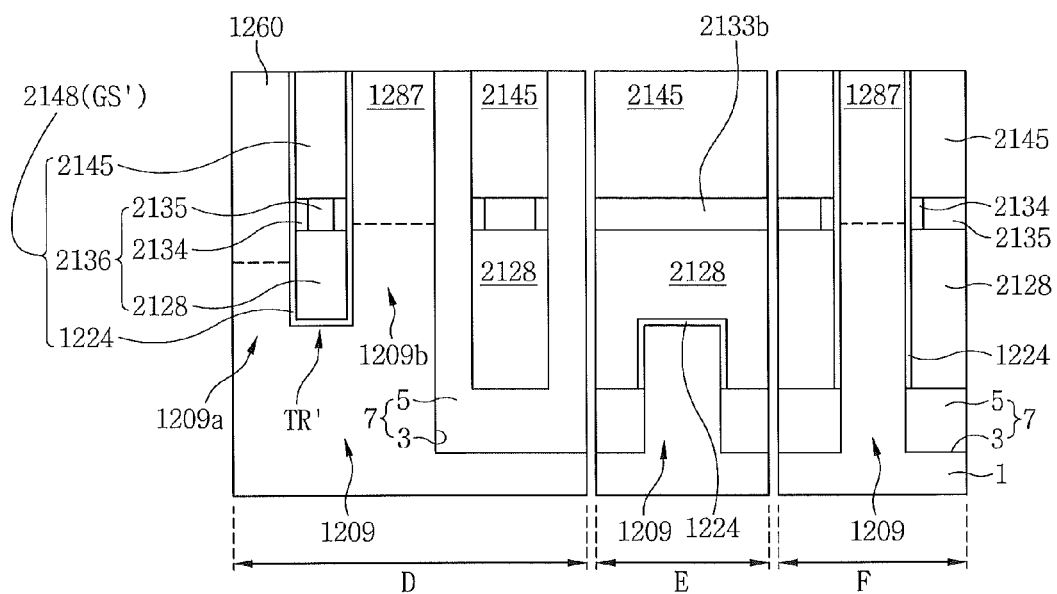

Referring to FIGS. 38, 39, and 57, the gate structure GS' of FIG. 30 may be a gate structure 2148 (GS') including a gate dielectric 1224, a gate electrode 2136, and a gate capping pattern 2145. The gate structure 2148 (GS') may cover the first and second side surfaces 1209s_1 and 1209s_2 of the active region 1209. The gate electrode 2136 and the gate capping pattern 2145 may be stacked sequentially.

The gate electrode 2136 may include a first conductive pattern 2128, a second conductive pattern 2134, and an upper subsidiary conductive pattern 2135. The first conductive pattern 2128 and the upper subsidiary conductive pattern 2135 may be stacked sequentially. The upper subsidiary conductive pattern 2135 may have a smaller width than the first conductive pattern 2128. The second conductive pattern 2134 may be formed at a higher level than the first conductive pattern 2128 on a side surface of the upper subsidiary conductive pattern 2135. The second conductive pattern 2134 may be interposed between the upper subsidiary conductive pattern 2135 and the gate dielectric 1224.

As described with reference to FIG. 22, the first conductive pattern 2128 may be formed of a conductive material having a Fermi energy $E_{Fm}$ close to a mid-gap energy $E_{midgap}$ of the active region 1209, for example, at least one of TiN, W, a Ti—Al alloy, and WN.

The second conductive pattern 2134 may 3-dimensionally face the source/drain region 2087. Accordingly, to reduce or suppress a leakage current in the source/drain region 1287, the second conductive pattern 2134 horizontally overlapping the source/drain region 1287 may be formed of a conductive material having a Fermi energy closer to the conduction band Ec or valance band Ev of the active region 1209 than to the mid-gap energy $E_{midgap}$ of the active region 1209. The upper subsidiary conductive pattern 2135 may be formed of a conductive material having a lower resistivity than the second conductive pattern 2134.

Figure 58A:
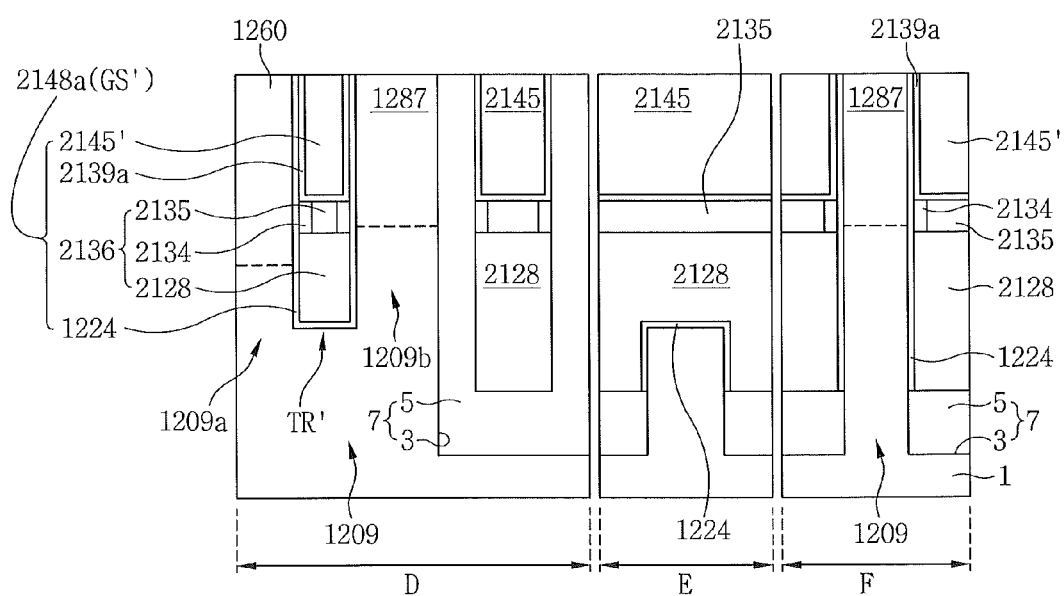
Figure 58B:
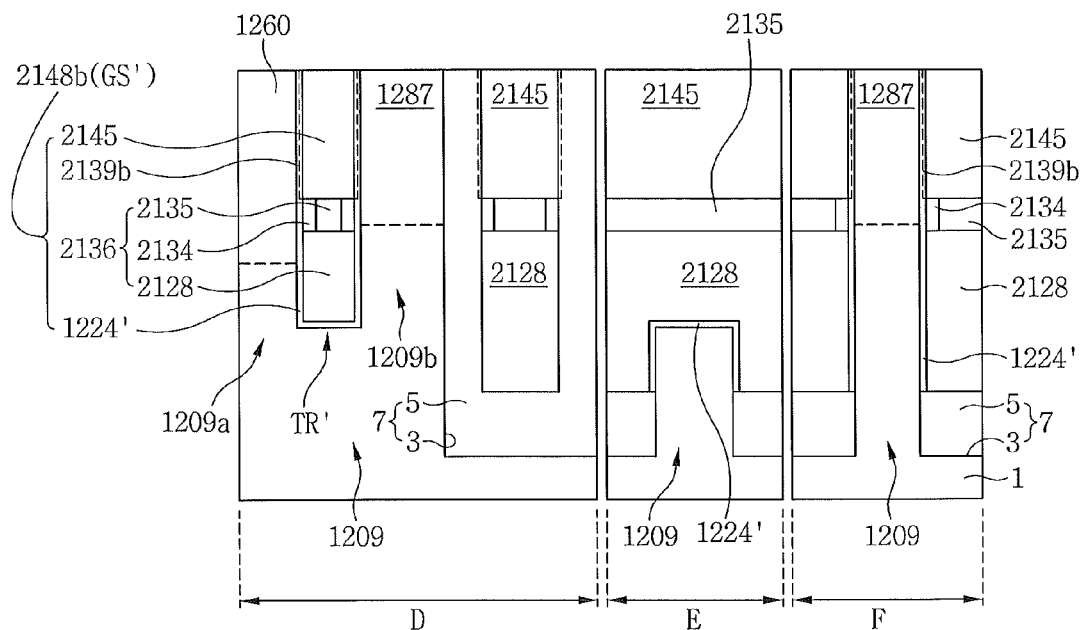

In some embodiments, the gate structure 2148 (GS) may include an insulating metal-containing material layer. For instance, as shown in FIG. 58A, a gate structure 2148a (GS') including a metal-containing material layer 2139a covering bottom and side surfaces of the gate capping pattern 2145 may be provided. In another case, as shown in FIG. 58B, a gate structure 2148b (GS') including a metal-containing material layer 2139b formed in the gate dielectric 1224 disposed on a side surface of the gate capping pattern 2145 and also formed in the insulating material pattern 5 disposed adjacent to the side surface of the gate capping pattern 2145 may be provided. Next, a semiconductor device according to an embodiment of the inventive concept will be described with reference to FIGS. 38, 39, and 59.

Figure 59:
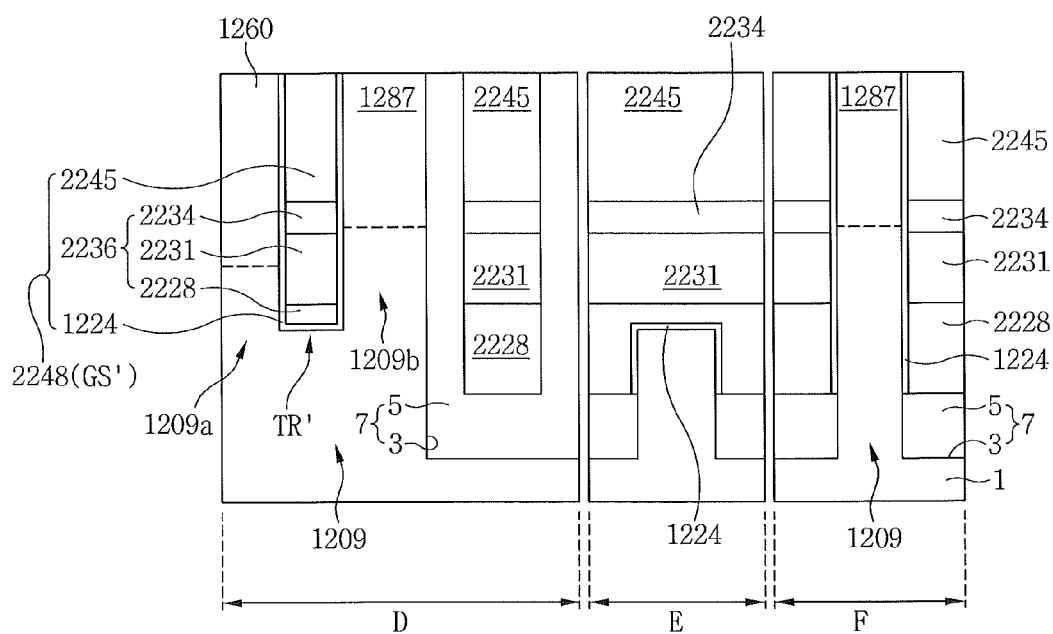

Referring to FIGS. 38, 39, and 59, the gate structure GS' of FIG. 39 may be a gate structure 2248 (GS') including a gate dielectric 1224, a gate electrode 2236, and a gate capping pattern 2245. The gate structure 2248, (GS') may cover the first and second side surfaces 1209s_1 and 1209s_2 of the active region 1209. The gate electrode 2236 and the gate capping pattern 2245 may be stacked sequentially.

The gate electrode 2236 may be formed of substantially the same material as the gate electrode 1036 described with reference to FIG. 32. The gate electrode 2236 may include a lower conductive pattern 2228, a first conductive pattern 2231, and a second conductive pattern 2234, which may be stacked sequentially in the same manner as the lower conductive pattern 1028, the first conductive pattern 1031 and the second conductive pattern 1034 described with reference to FIG. 32. As described with reference to FIG. 32, in the gate electrode 2236, the lower conductive pattern 2228 may be formed of a conductive material, which may be dominant over a threshold voltage of the transistor TR, the first conductive pattern 2231 may be formed of a conductive material having a low resistivity to reduce a resistance of a gate electrode of the turned-on transistor TR, and the second conductive pattern 2234 3-dimensionally disposed across the source/drain region 1287 may be formed of a conductive material for reducing or suppressing a leakage current in the turned-off transistor TR.

Figure 60A:
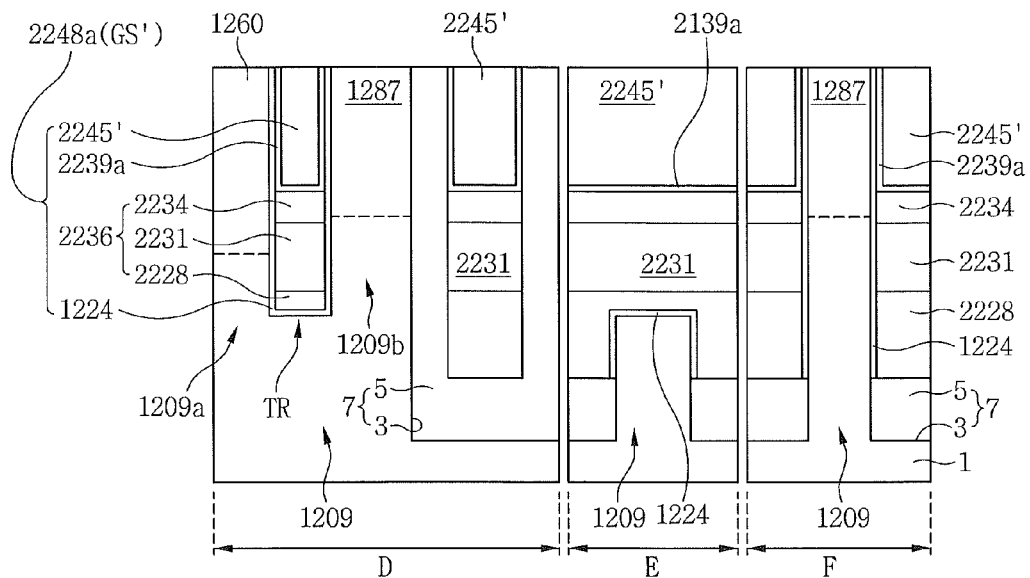
Figure 60B:
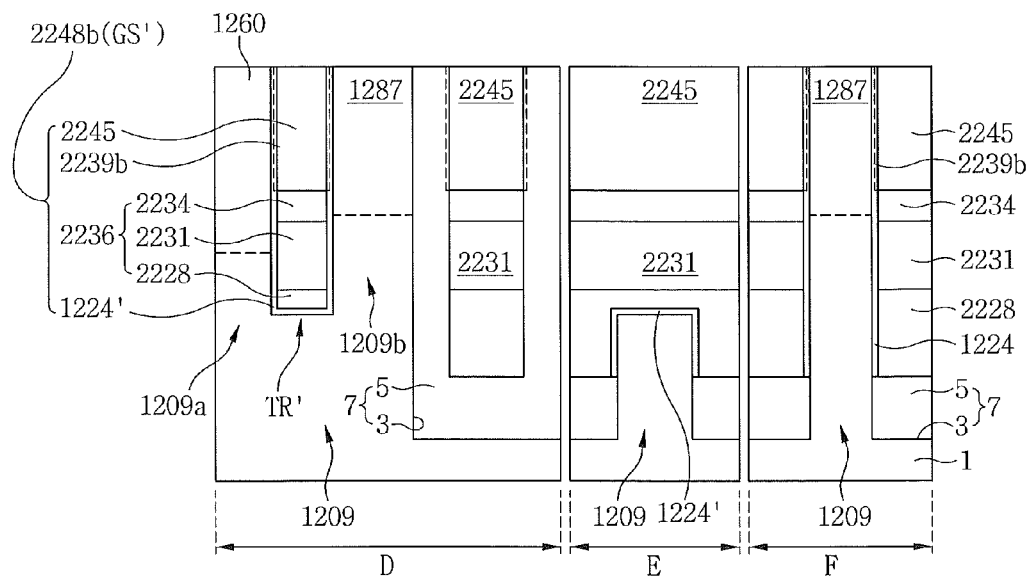

In some embodiments, the gate structure 2248 (GS) may include an insulating metal-containing material layer. For example, as shown in FIG. 60A, a gate structure 2248a (GS') including a metal-containing material layer 2239a covering bottom and side surfaces of the gate capping pattern 2245 may be provided. In another case, as shown in FIG. 60B, a gate structure 2248b (GS') including a metal-containing material layer 2239b formed in the gate dielectric 1224 disposed on a side surface of the gate capping pattern 2245 and also formed in the insulating material pattern 5 disposed adjacent to the side surface of the gate capping pattern 2245 may be provided.

Next, a semiconductor device according to an embodiment of the inventive concept will be described with reference to FIGS. 38, 39, and 61.

Figure 61:
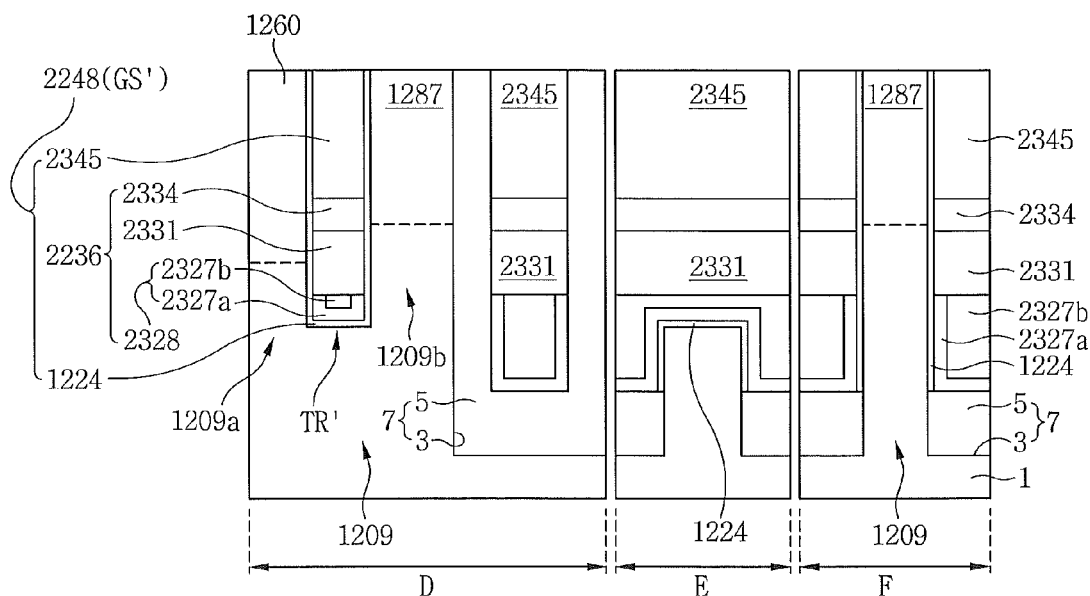

Referring to FIGS. 38, 39, and 61, the gate structure GS' of FIG. 39 may be a gate structure 2348 (GS') including a gate dielectric 1224, a gate electrode 2336, and a gate capping pattern 2345. The gate structure 2348 (GS') may cover the first and second side surfaces 1209s_1 and 1209s_2 of the active region 1209. The gate electrode 2336 and the gate capping pattern 2345 may be stacked sequentially.

The gate electrode 2336 may include a lower conductive pattern 2328, a first conductive pattern 2331, and a second conductive pattern 2334 stacked sequentially. The gate electrode 2336 may be formed of substantially the same material as the gate electrode 1136 described with reference to FIG. 36.

The lower conductive pattern 2328 may include a first lower conductive pattern 2327a and a second lower conductive pattern 2327b. The first lower conductive pattern 2327a may be conformally formed on the gate dielectric 1224, and the second lower conductive pattern 2327b may be formed on the first lower conductive pattern 2327a. The first lower conductive pattern 2327a may be formed to cover bottom and side surfaces of the second lower conductive pattern 2327b. The lower conductive pattern 2328 may be formed of substantially the same material as the lower conductive pattern 1128 described with reference to FIG. 36.

Figure 62A:
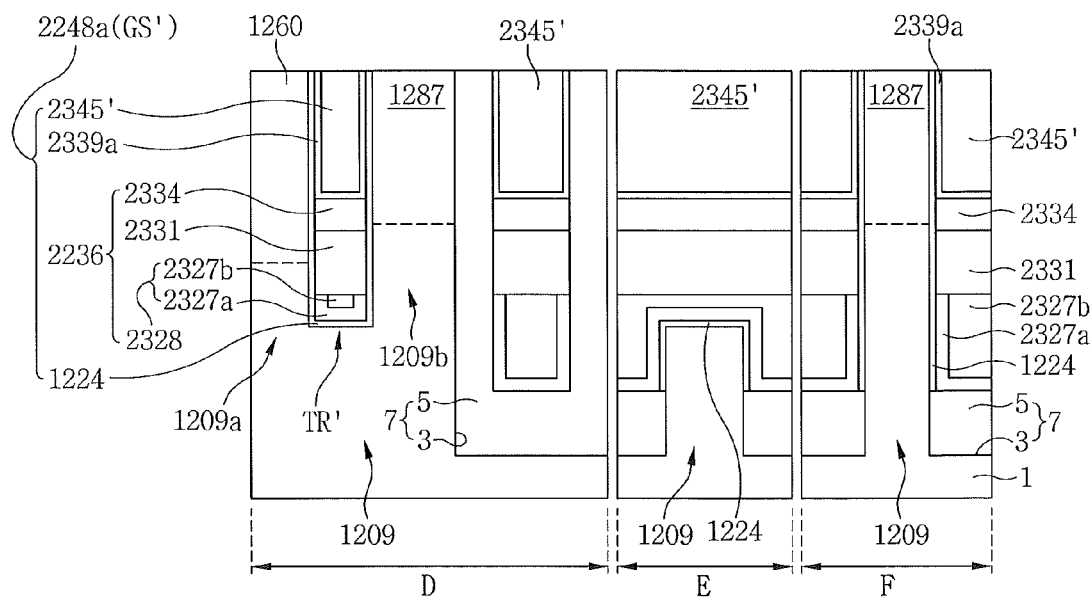
Figure 62B:
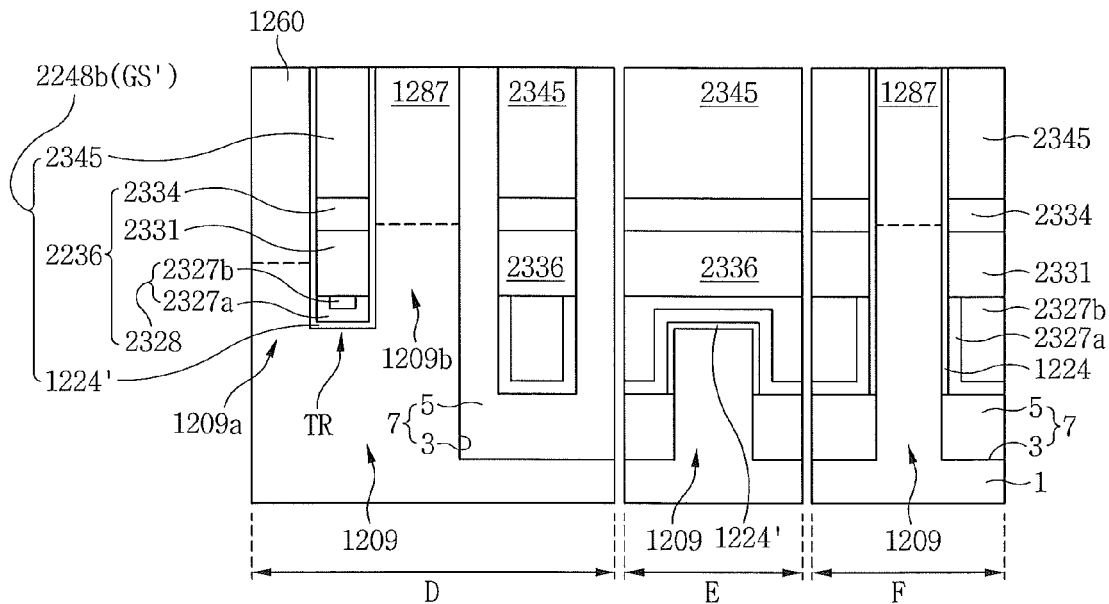

In some embodiments, the gate structure 2348 (GS) may include an insulating metal-containing material layer. As shown in FIG. 62A, a gate structure 2348a (GS') including a metal-containing material layer 2339a covering bottom and side surfaces of the gate capping pattern 2345 may be provided. In another case, as shown in FIG. 62B, a gate structure 2348b (GS') including a metal-containing material layer 2339b formed in the gate dielectric 1224 disposed on a side surface of the gate capping pattern 2345 and also formed in the insulating material pattern 5 disposed adjacent to the side surface of the gate capping pattern 2345 may be provided.

Figure 63:
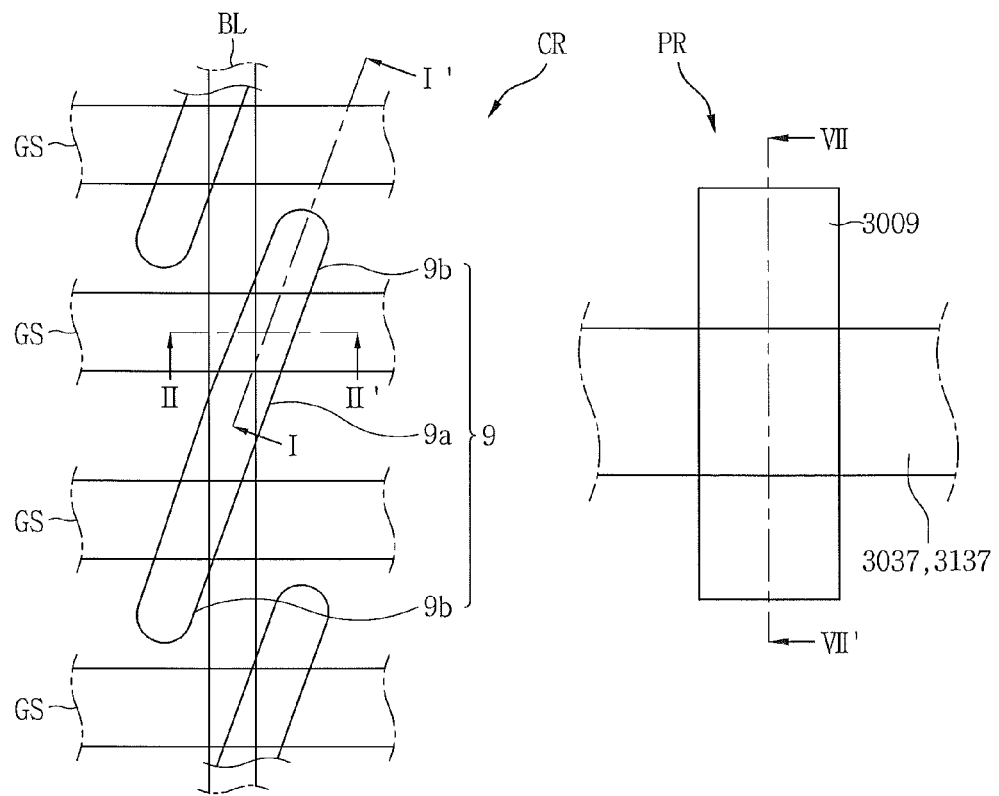
FIG. 63 is a plan view of a semiconductor device according to an embodiment of the inventive concept.
Figure 64:
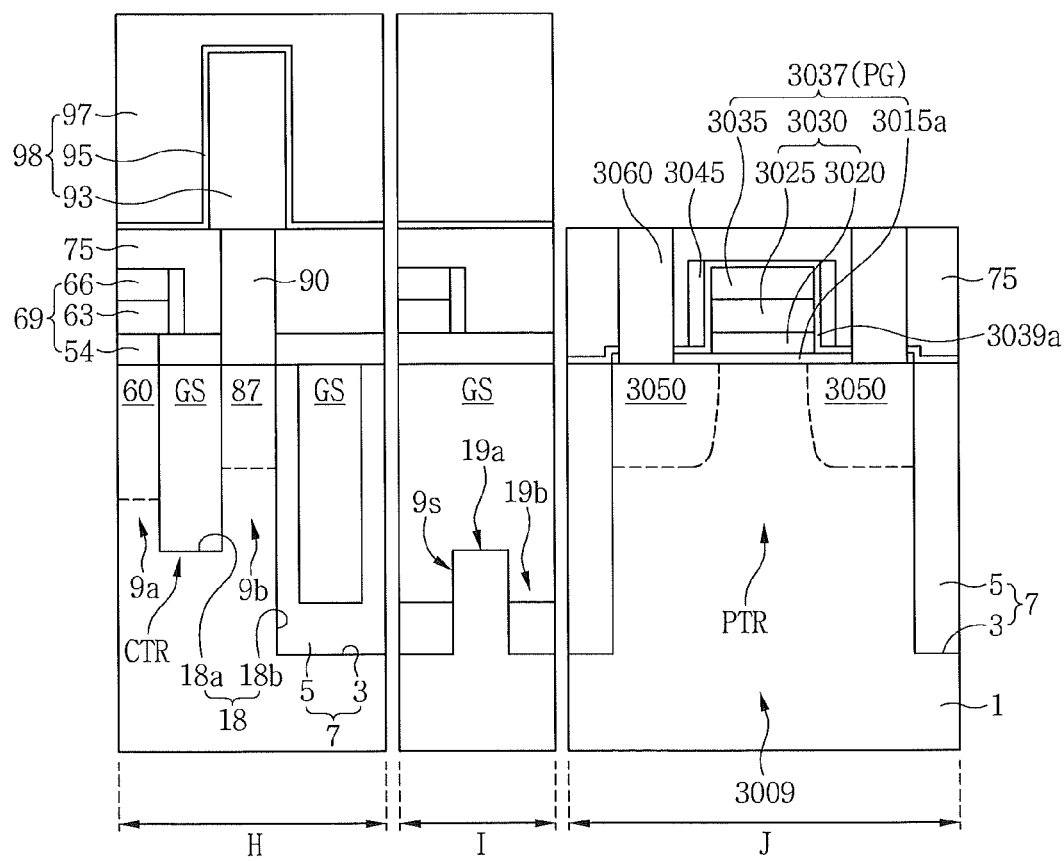
FIGS. 64 through 72 are cross-sectional views of semiconductor devices according to an embodiment of the inventive concept.

Next, a semiconductor device according to an embodiment of the inventive concept will be described with reference to FIGS. 63 and 64. FIG. 63 is a plan view of a semiconductor device according to an embodiment of the inventive concept, and FIG. 64 is a cross-sectional view of the semiconductor device shown in FIG. 63. In FIG. 64, portion "H" denotes a section taken along line I-I' of FIG. 63, portion "I" denotes a section taken along line II-II' of FIG. 63, and portion "J" denotes a section taken along line VII-VII' of FIG. 63.

Referring to FIGS. 63 and 64, a substrate 1 having a cell array region CR and a peripheral circuit region PR may be prepared. A field region 7 defining a cell active region 9 of the cell array region CR and a peripheral active region 3009 of the peripheral circuit region PR may be formed. The field region 7 may include a field trench 3 and an insulating material pattern 5 filling the field trench 3.

In the cell array region CR, a cell gate trench 18 described with reference to FIG. 2 may be formed. The cell gate trench 18 may run across the cell active region 9 and extend into the field region 7.

Figure 65:
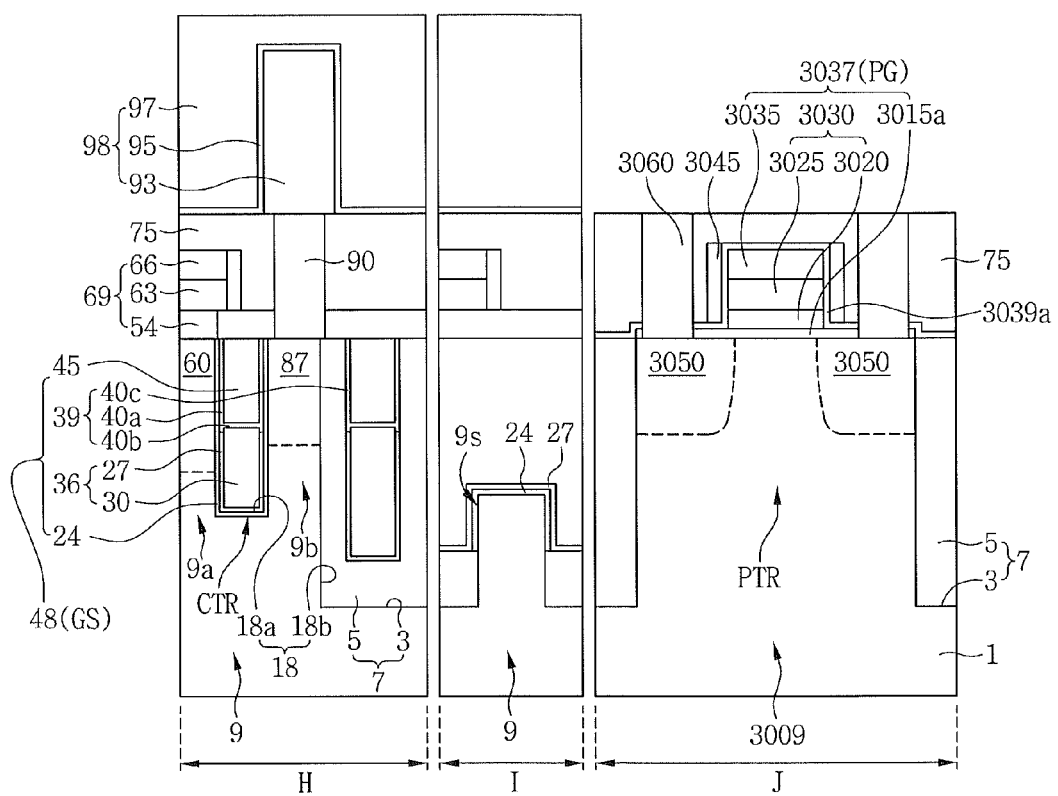

A gate structure GS may be formed to fill the cell gate trench 18. The gate structure GS may be any one of the gate structures GS described with reference to FIGS. 1 through 37B. For instance, as shown in FIG. 65, the gate structure GS may be the gate structure (refer to 48 of FIG. 3, GS) including the metal-containing material layer 39. Meanwhile, the gate structure GS formed in the cell array region CR may be any one of the gate structures GS' described with reference to FIGS. 38 through 62B.

Cell source/drain regions 60 and 87 may be formed on both sides of the gate structure GS in the active region 9.

Accordingly, a cell transistor CTR including the cell gate structure GS and the cell source/drain regions 60 and 87 may be formed in the cell array region CR.

The bit line structure 69 and the capacitor structure 98 described with reference to FIG. 2 may be formed on the cell transistor CTR of the cell array region CR.

The bit line structure 69 may include a bit line 63 and a bit line capping pattern 66, which may be stacked sequentially, and a bit line contact structure 54 disposed between the bit line 63 and the first source/drain region 60.

A peripheral gate structure 3037 including a peripheral gate dielectric 3015, a peripheral gate electrode 3030, and an insulating peripheral gate capping pattern 3035, which are stacked sequentially, may be formed on the peripheral active region 3009. The peripheral gate capping pattern 3035 may be formed of an insulating material, such as silicon oxide and/or silicon nitride.

Peripheral source/drain regions 3150 may be formed on both sides of the peripheral gate structure 3037 in the peripheral active region 3009.

A peripheral transistor PTR including the peripheral gate structure 3037 and the peripheral source/drain regions 3050 may be formed in the peripheral circuit region PR.

The peripheral gate electrode 3030 may include a multiple layer. For example, the peripheral gate electrode 3030 may include a lower peripheral gate electrode 3015 and an upper peripheral gate electrode 3025 stacked sequentially.

In some embodiments, the lower peripheral gate electrode 3015 may be formed of substantially the same material as the bit line contact structure 69 of the cell array region CR. For instance, the bit line plug 54 and the lower peripheral gate electrode 3015 may be formed of poly-Si.

In some embodiments, the upper peripheral gate electrode 3025 and the bit line 63 may be formed of the same material to the same thickness. For example, the upper peripheral gate electrode 3025 and the bit line 63 may be formed to the same thickness in a direction vertical to the substrate 1. The upper peripheral gate electrode 3025 and the bit line 63 may include any one of a metal nitride (e.g., TiN or WN), a metal-semiconductor compound (e.g., tungsten silicide), and a metal (e.g., W).

A peripheral gate spacer 3045 may be formed on a side surface of the peripheral gate structure 3037. The peripheral gate spacer 3045 may be formed of an insulating material, such as silicon nitride or silicon oxide.

A peripheral metal-containing material layer 3039a may be formed on side surfaces of the peripheral gate electrode 3030 and the peripheral gate capping pattern 3035 and extend onto the peripheral active region 3009 disposed on both sides of the gate electrode 3030.

In some embodiments, the peripheral metal-containing material layer 3039a may be formed of the same material as the metal-containing material layer 39a described with reference to FIG. 3. The peripheral metal-containing material layer 3039a may be a dipole layer. The peripheral metal-containing material layer 3039a may include a portion that may be formed on the peripheral source/drain regions 3050 disposed on both sides of the peripheral gate electrode 3030 and extend onto a side surface of the peripheral gate electrode 3030. The peripheral metal-containing material layer 3039a may cover side surfaces of the peripheral gate electrode 3030 and the peripheral gate capping pattern 3035 and cover the peripheral gate dielectric 3015 formed on the peripheral active region 3009 disposed on both sides of the peripheral gate electrode 3030.

Figure 66:
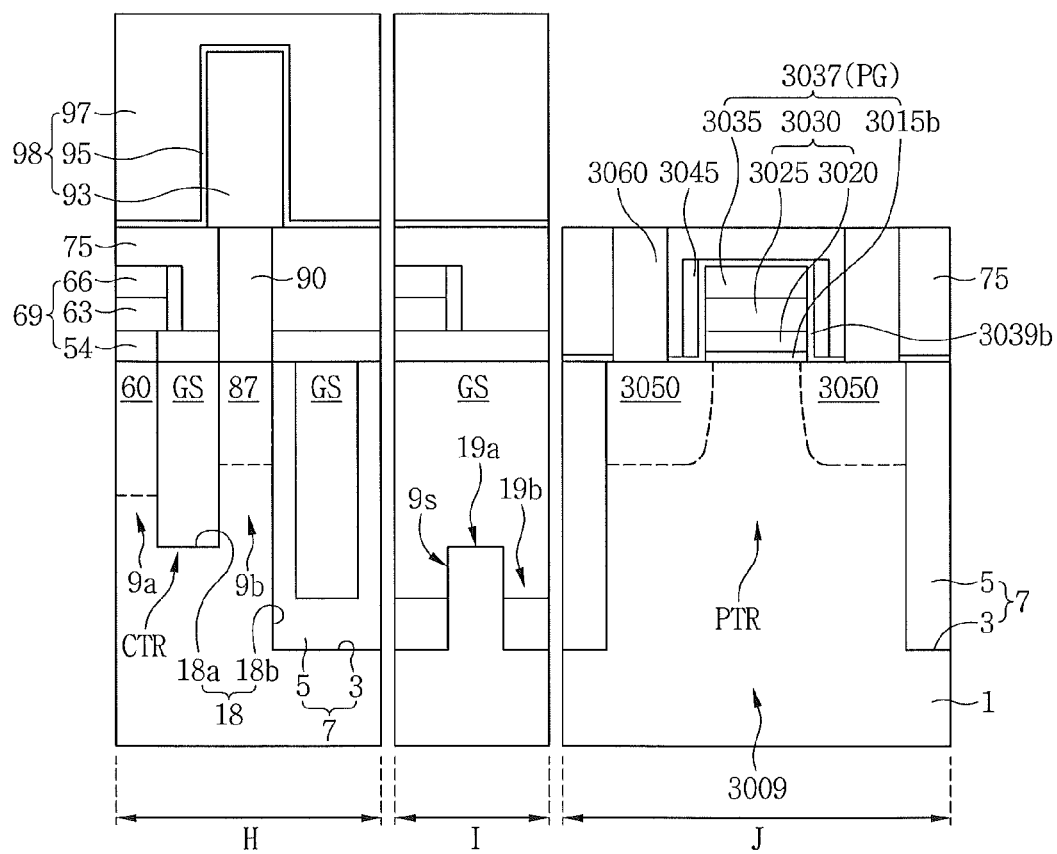

In another embodiment, as shown in FIG. 66, a peripheral gate dielectric 3015b may be defined under the gate electrode 3030. Also, a peripheral metal-containing material layer 3039b may cover side surfaces of the peripheral gate electrode 3030 and the peripheral gate capping pattern 3035 and extend onto the peripheral active region 3009 disposed on both sides of the peripheral gate electrode 3030.

The peripheral metal-containing material layer 3039a may be interposed between the peripheral gate structure 3037 and the peripheral gate spacer 3045 and interposed between the peripheral gate spacer 3045 and the peripheral source/drain regions 3150.

When the peripheral transistor PTR is an NMOS transistor, the peripheral metal-containing material layer 3039a may include a dielectric material containing an N-type metal. For instance, when the peripheral transistor PTR is the NMOS transistor, the metal-containing material layer 3039a may include a metal (e.g., lanthanum or magnesium) having a Fermi energy close to the valance band or conduction band of the peripheral active region 3009 and be formed of a dielectric material capable of forming a dipole. For example, the metal-containing material layer 3039a may include a dipole layer containing at least one of LaO, MgO, LaON, and MgON.

When the peripheral transistor PTR is a PMOS transistor, the metal-containing material layer 3039a may include a P-type metal (e.g., aluminum, tantalum, or iridium) having a Fermi energy close to the conduction band or valance band of the peripheral active region 3009 and be formed of a dielectric material capable of forming a dipole. For example, the metal-containing material layer 3039 may include a dipole layer containing one of AlO, AlON, TaO, TaON, IrO, and IrON. An interlayer insulating layer 75 may be formed on a substrate having the peripheral transistor PTR and the cell bit line structure 69.

A peripheral plug 3060 may be formed through the interlayer insulating layer 75 and electrically connected to the peripheral source/drain regions 3150.

The peripheral plug 3060 may be formed of the same material as the cell contact structure 90, which may penetrate the interlayer insulating layer 75 and be electrically connected to the second source/drain region 87 of the cell transistor CTR. For instance, the peripheral plug 3060 and the cell contact structure 90 may be formed of poly-Si.

Figure 67:
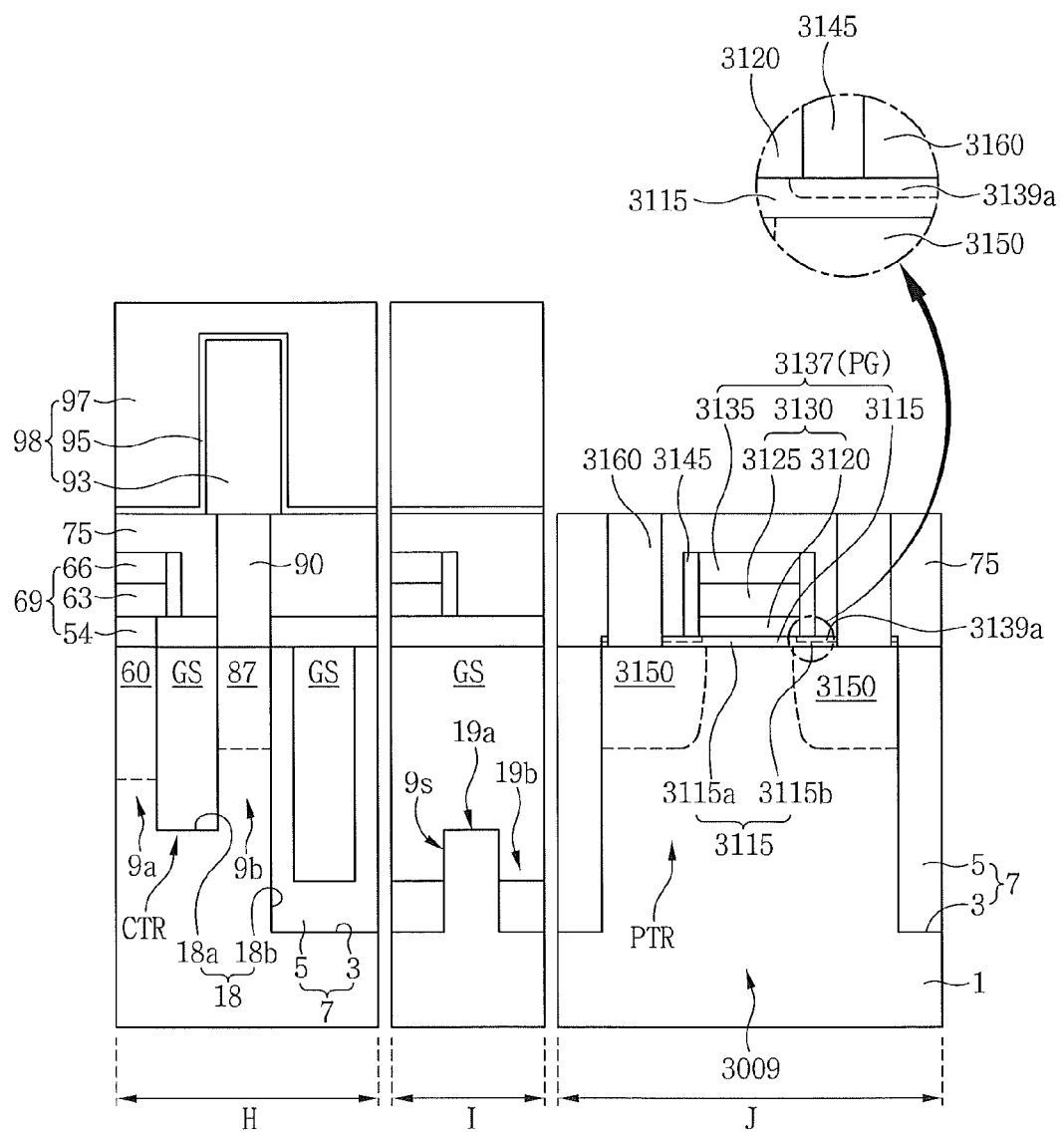

Next, a semiconductor device according to an embodiment of the inventive concept will be described with reference to FIG. 67. FIG. 67 is a cross-sectional view of a semiconductor device according to an embodiment of the inventive concept. In FIG. 67, portion "H" denotes a section taken along line I-I' of FIG. 63, portion "I" denotes a section taken along line II-II' of FIG. 63, and portion "J" denotes a section taken along line VII-VII' of FIG. 63.

Referring to FIGS. 63 and 67, a substrate 1 having a cell array region CR and a peripheral circuit region PR may be prepared. A field region 7 defining a cell active region 9 of the cell array region CR and a peripheral active region 3009 of the peripheral circuit region PR may be formed. The field region 7 may include a field trench 3 and an insulating material pattern 5 filling the field trench 3. A cell gate trench 18 described with reference to FIG. 2 may be formed in the cell array region CR. The cell gate trench 18 may run across the cell active region 9 and extend into the field region 7. A gate structure GS may be formed to fill the cell gate trench 18. The gate structure GS may be any one of the gate structures GS described with reference to FIGS. 1 through 37B. Meanwhile, the gate structure GS formed in the cell array region CR may be any one of the gate structures GS' described with reference to FIGS. 38 through 62B. Cell source/drain regions 60 and 87 may be formed on both sides of the gate structure GS in the active region 9. Accordingly, a cell transistor CTR including the cell gate structure GS and the cell source/drain regions 60 and 87 may be formed in the cell array region CR. The bit line structure 69 and the capacitor structure 98 described with reference to FIG. 2 may be formed on the cell transistor CTR of the cell array region CR. The bit line structure 69 may include a bit line 63 and a bit line capping pattern 66, which are stacked sequentially, and a bit line contact structure 54 disposed between the bit line 63 and the first source/drain region 60.

A peripheral gate structure 3137 including a peripheral gate dielectric 3115, a peripheral gate electrode 3130, and an insulating peripheral gate capping pattern 3135, which are stacked sequentially, may be formed on the peripheral active region 3009. The peripheral gate capping pattern 3135 may be formed of an insulating material, such as silicon oxide and/or silicon nitride. The peripheral gate dielectric 3115 may be formed to cover the peripheral active region 3009. Peripheral source/drain regions 3150 may be formed in the peripheral active region 3009 on both sides of the peripheral gate electrode 3130. The peripheral gate dielectric 3115 may include a first portion 3115a vertically overlapping the peripheral gate electrode 3130 and a second portion 3115b disposed on the source/drain regions 3150 on both sides of the gate electrode 3130.

A peripheral transistor PTR including the peripheral gate structure 3137 and the peripheral source/drain regions 3150 may be formed in the peripheral circuit region PR. The peripheral gate electrode 3130 may include a lower peripheral gate electrode 3115 and an upper peripheral gate electrode 3125 stacked sequentially.

A peripheral gate spacer 3145 may be formed on a side surface of the peripheral gate structure 3137. The peripheral gate spacer 3145 may be formed of an insulating material, such as silicon nitride or silicon oxide.

An insulating peripheral metal-containing material layer 3139a may be formed in the second portion 3115b of the gate dielectric 3115 disposed on both sides of the peripheral gate electrode 3130. A portion of the metal-containing material layer 3139a may be disposed under the peripheral gate spacer 3145 and under the peripheral gate electrode 3130. The peripheral metal-containing material layer 3139a may have a portion vertically overlapping a portion of the peripheral gate electrode 3130. The peripheral metal-containing material layer 3139a may include a different material from the peripheral gate dielectric 3115.

Figure 68:
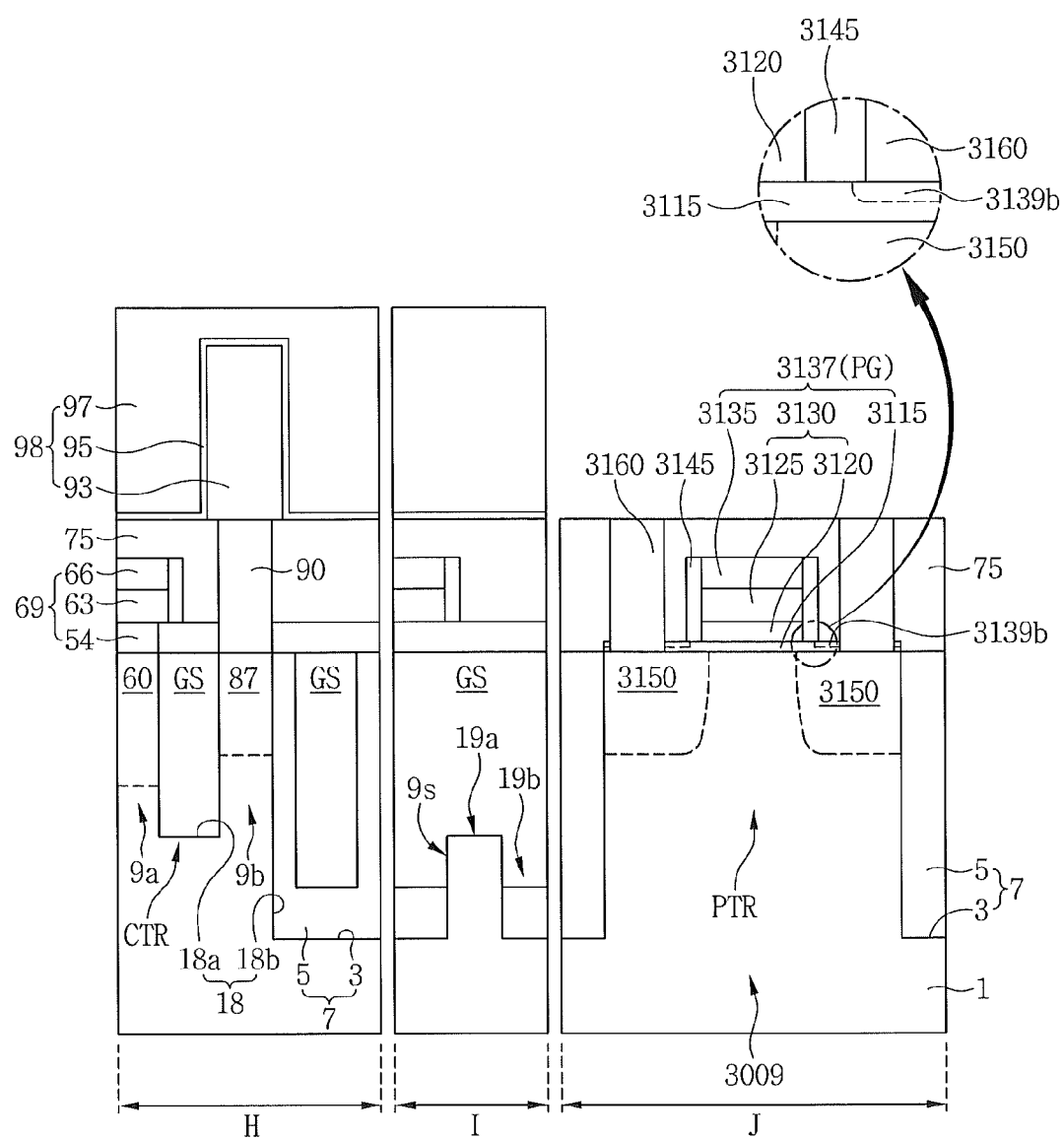

In another embodiment, as shown in FIG. 68, a peripheral metal-containing material layer 3139b formed in the gate dielectric 3115 may be formed in the second portion 3115b of the gate dielectric 3115 on both sides of the peripheral gate electrode 3130 and spaced apart from the peripheral gate electrode 3130. The peripheral metal-containing material layer 3139b may have a portion vertically overlapping a portion of the peripheral gate spacer 3145.

When the peripheral transistor PTR is an NMOS transistor, the peripheral metal-containing material layer 3139a may include a dielectric material containing an N-type metal. For example, when the peripheral transistor PTR is an NMOS transistor, the metal-containing material layer 3139a may include a metal (e.g., lanthanum or magnesium) having a Fermi energy closer to the conduction band of the peripheral active region 3009 than to the valance band of the peripheral active region 3009 and be formed of a dielectric material capable of forming a dipole. For instance, the metal-containing material layer 3139a may include a dipole layer containing at least one of LaO, MgO, LaON, and MgON.

When the peripheral transistor PTR is a PMOS transistor, the metal-containing material layer 3139a may include a P-type metal (e.g., aluminum, tantalum, or iridium) having a Fermi energy closer to the valance band of the active region 9 than to the conduction band of the peripheral active region 3009 and be formed of a dielectric material capable forming a dipole. For example, the metal-containing material layer 3039 may include a dipole layer containing one of AlO, AlON, TaO, TaON, IrO, and IrON.

An interlayer insulating layer 75 may be formed on the substrate 1 having the peripheral transistor PTR and the cell bit line structure 69. A peripheral plug 3160 may be formed through the interlayer insulating layer 75, the peripheral metal-containing material layer 3139a, and the peripheral gate dielectric 3115 and electrically connected to the peripheral source/drain regions 3150.

The peripheral plug 3160 may be formed of the same material as the cell contact structure 90 formed through the interlayer insulating layer 75 and electrically connected to the second source/drain region 87 of the cell transistor CTR.

Embodiments of the inventive concept are not limited to a case where the peripheral transistor PTR is embodied by a planar transistor. For example, the peripheral transistor PTR may be embodied by a 3-dimensional transistor.

Figure 69:
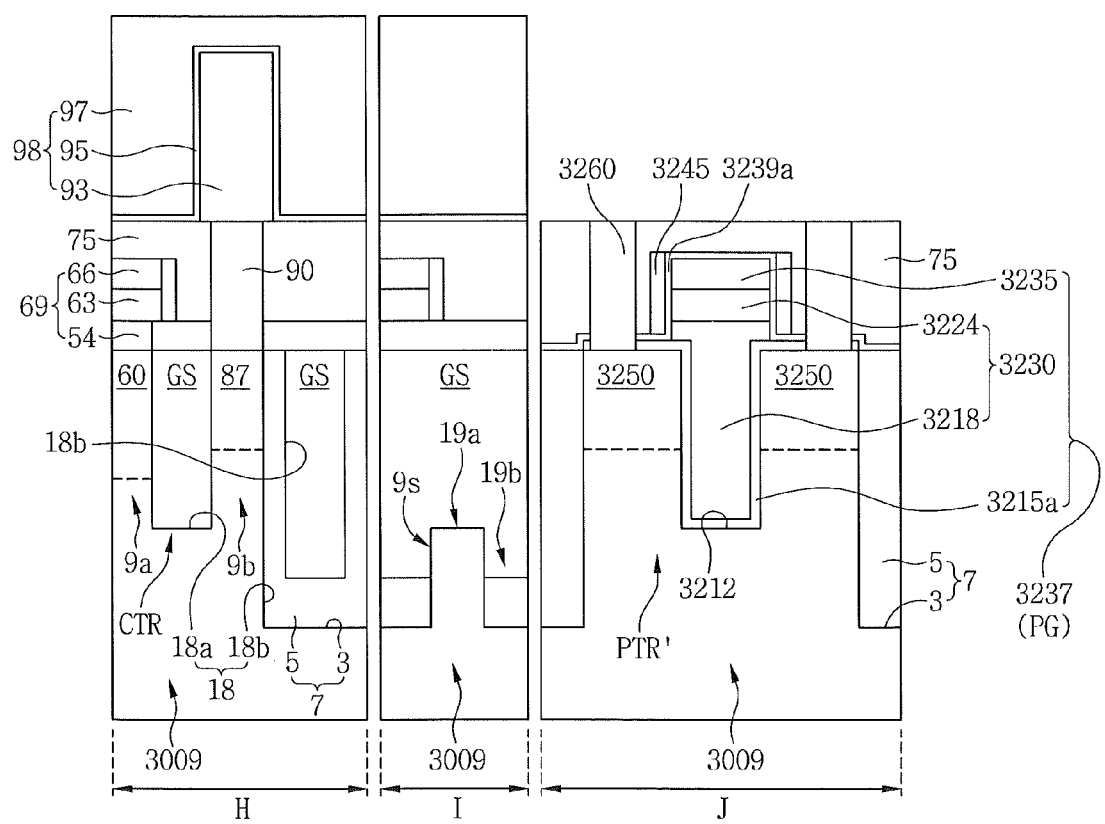

The peripheral transistor PTR' embodied by the 3-dimensional transistor will be described with reference to FIG. 69. In FIG. 69, portion "H" denotes a section taken along line I-I' of FIG. 63, portion "I" denotes a section taken along line II-II' of FIG. 63, and portion "J" denotes a section taken along line VII-VII' of FIG. 63.

Referring to FIGS. 63 and 69, a substrate 1 having a cell array region CR and a peripheral circuit region may be prepared as described with reference to FIG. 64. As shown in FIG. 64, a cell transistor CTR may be formed in the cell array region CR. A peripheral gate trench 3112 may be formed across a peripheral active region 3009 of the peripheral circuit region PR.

A peripheral gate structure 3237 may be formed to fill the peripheral gate trench 2012 and protrude upward from the peripheral active region 3009.

Peripheral source/drain regions 3250 may be formed in the peripheral active region 3009 on both sides of the peripheral gate structure 3237 (PG).

A peripheral transistor PTR' including the peripheral gate structure 3237 and the peripheral source/drain regions 3250 may be formed in the peripheral circuit region PR.

The peripheral gate structure 3237 may include a peripheral gate dielectric 3215, a peripheral gate electrode 3230, and a peripheral gate capping pattern 3235.

The peripheral gate dielectric 3215a may be formed on an inner wall of the peripheral gate trench 3212.

The peripheral gate electrode 3230 may include a portion that may be formed on the peripheral gate dielectric 3215a, fill the peripheral gate trench 3212, and protrude from a top surface of the peripheral active region 3009.

The peripheral gate electrode 3230 may include a lower peripheral gate electrode 3218 and an upper peripheral gate electrode 3224 stacked sequentially. The lower peripheral gate electrode 3118 may be formed of poly-Si, and the upper peripheral gate electrode 3224 may include a metal, such as tungsten or titanium nitride.

A peripheral gate spacer 3245 may be formed on a side surface of a portion of the peripheral gate structure 3237 disposed at a higher level than the peripheral active region 3009.

An insulating peripheral metal-containing material layer 3239a may be formed on the substrate 1 having the peripheral gate structure 3237. The peripheral gate dielectric 3215a may include a first portion disposed under the peripheral gate electrode 3230 and a second portion disposed on the peripheral active region 3009 on both sides of the peripheral gate electrode 3230. The peripheral metal-containing material layer 3239a may cover a side surface of the peripheral gate electrode 3230 and a side surface of the peripheral gate capping pattern 3245, which are disposed at a higher level than the peripheral active region 3009, and cover the second portion of the peripheral gate dielectric 3215 disposed on the peripheral active region 3009 on both sides of the peripheral gate electrode 3230. The peripheral metal-containing material layer 3239a may be conformally formed.

When the peripheral transistor PTR' is an NMOS transistor, the peripheral metal-containing material layer 3239a may be formed of a dielectric material containing an N-type metal. For example, when the peripheral transistor PTR' is the NMOS transistor, the metal-containing material layer 3239 may include a metal (e.g., lanthanum or magnesium) closer to the conduction band of the peripheral active region 3009 than to the valance band of the peripheral active region 3009 and be formed of a dielectric material capable of forming a dipole. For instance, the metal-containing material layer 3239a may include a dipole layer containing at least one of LaO, MgO, LaON, and MgON.

When the peripheral transistor PTR' is an PMOS transistor, the metal-containing material layer 3239a may include a P-type metal (e.g., aluminum, tantalum, or iridium) having a Fermi energy closer to the valance band of the peripheral active region 3009 than to the conduction band of the peripheral active region 3009 and be formed of a dielectric material capable of forming a dipole. For example, the metal-containing material layer 3239a may include a dipole layer containing one of AlO, AlON, TaO, TaON, IrO, and IrON. Meanwhile, as described with reference to FIG. 64, a bit line structure 69 may be formed on the cell transistor CTR in the cell array region CR.

The bit line structure 69 may include a bit line 63 and a bit line capping pattern 66, which are stacked sequentially, and a bit line contact structure 54 interposed between the bit line 63 and the first source/drain region 60.

The upper peripheral gate electrode 3134 of the peripheral gate electrode 3130 may have substantially the same thickness in a direction vertical to the bit line 63 and surface of the substrate 1. The peripheral gate electrode 3134 may be formed of the same conductive material as the bit line 63.

The bit line 63 and the peripheral gate electrode 3134 may include at least one of a metal-semiconductor compound (e.g., tungsten silicide), a metal nitride (e.g., TiN or WN), and a metal (e.g., tungsten).

The peripheral gate capping pattern 3135 and the bit line capping pattern 66 may be formed of the same material and have the same thickness in a direction vertical to the surface of the substrate 1. The peripheral gate capping pattern 3135 and the bit line capping pattern 66 may be formed of an insulating material, such as silicon nitride or silicon oxide.

As described with reference to FIG. 64, an interlayer insulating layer 75 may be formed on the substrate 1 having the peripheral transistor PTR and the cell bit line structure 69. A peripheral plug 3160 may be formed through the interlayer insulating layer 75 and electrically connected to the peripheral source/drain regions 3150.

Figure 70:
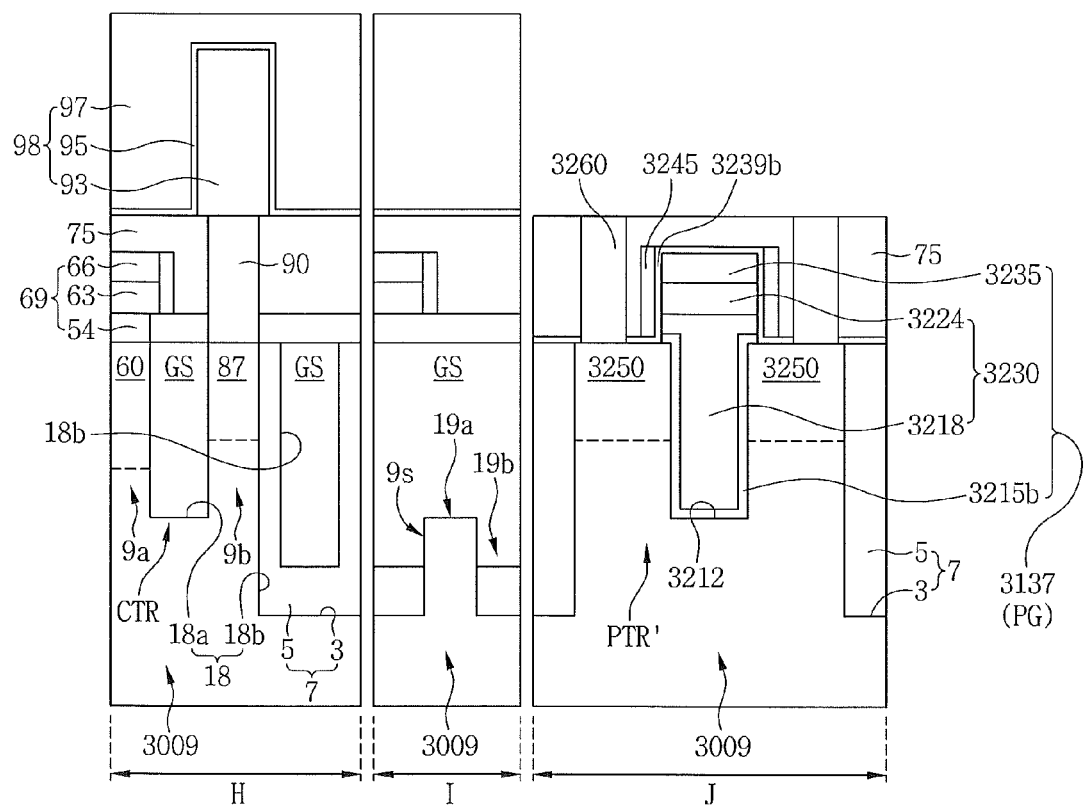

In another embodiment, as shown in FIG. 70, a gate dielectric 3215b may be defined under the peripheral gate electrode 3230. Also, a peripheral metal-containing material layer 3239b may cover a side surface of the peripheral gate electrode 3230 and a side surface of the peripheral gate capping pattern 3245, which are disposed at a higher level than the peripheral active region 3009, and cover the peripheral active region 3009 disposed on both sides of the peripheral gate electrode 3230.

Figure 71:
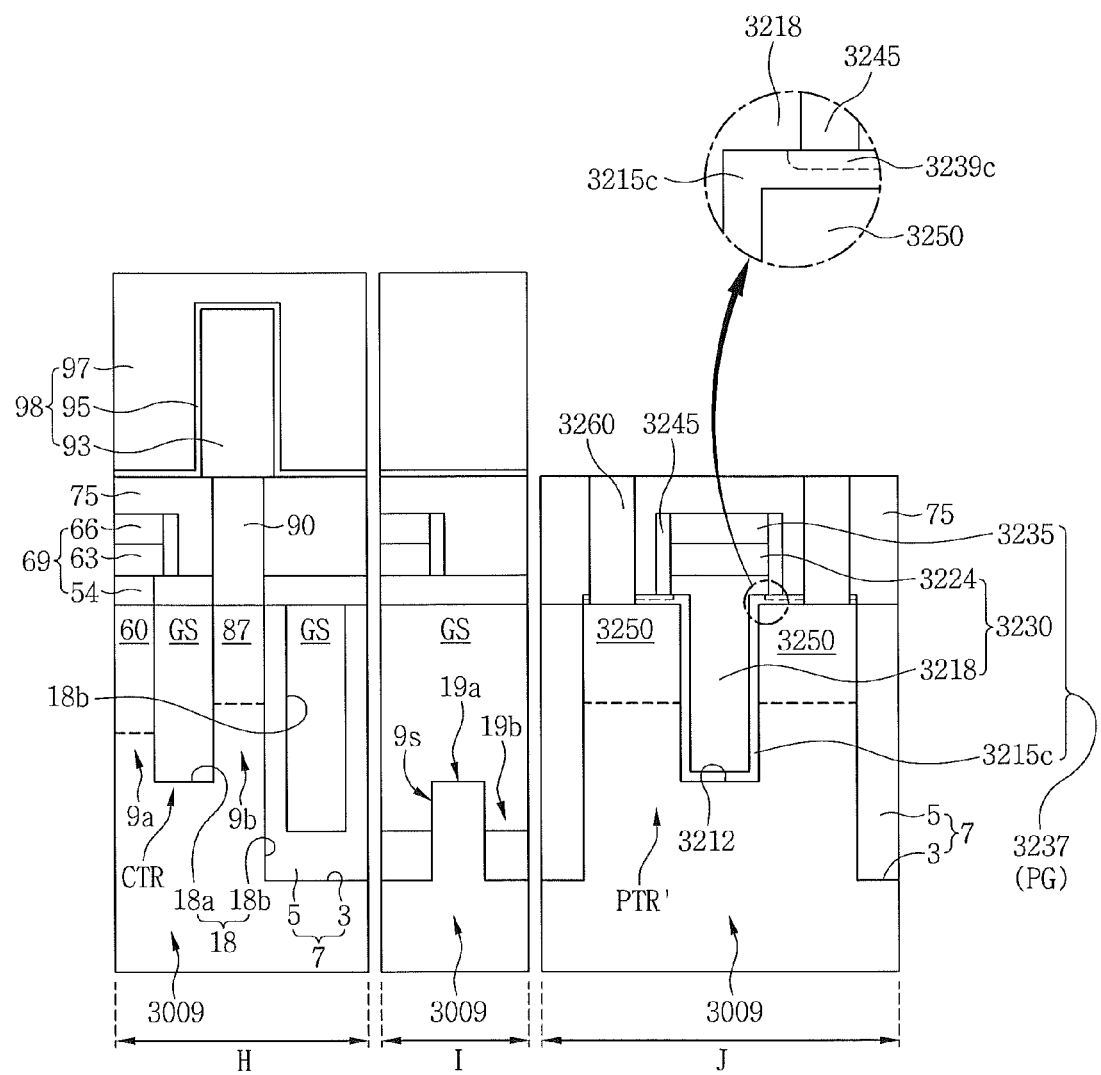

In yet another embodiment, as shown in FIG. 71, a peripheral gate dielectric 3215c may include a first portion disposed under the peripheral gate electrode 3230 and a second portion disposed on the peripheral active region 3009 on both sides of the peripheral gate electrode 3230. The first portion of the peripheral gate electrode 3230 may vertically overlap the peripheral gate electrode 3230. Also, a peripheral metal-containing material layer 3239c may include a portion that may be formed in the second portion of the peripheral gate dielectric 3215 disposed on the peripheral active region 3009 on both sides of the peripheral gate electrode 3230 and vertically overlap the peripheral gate electrode 3230.

Figure 72:
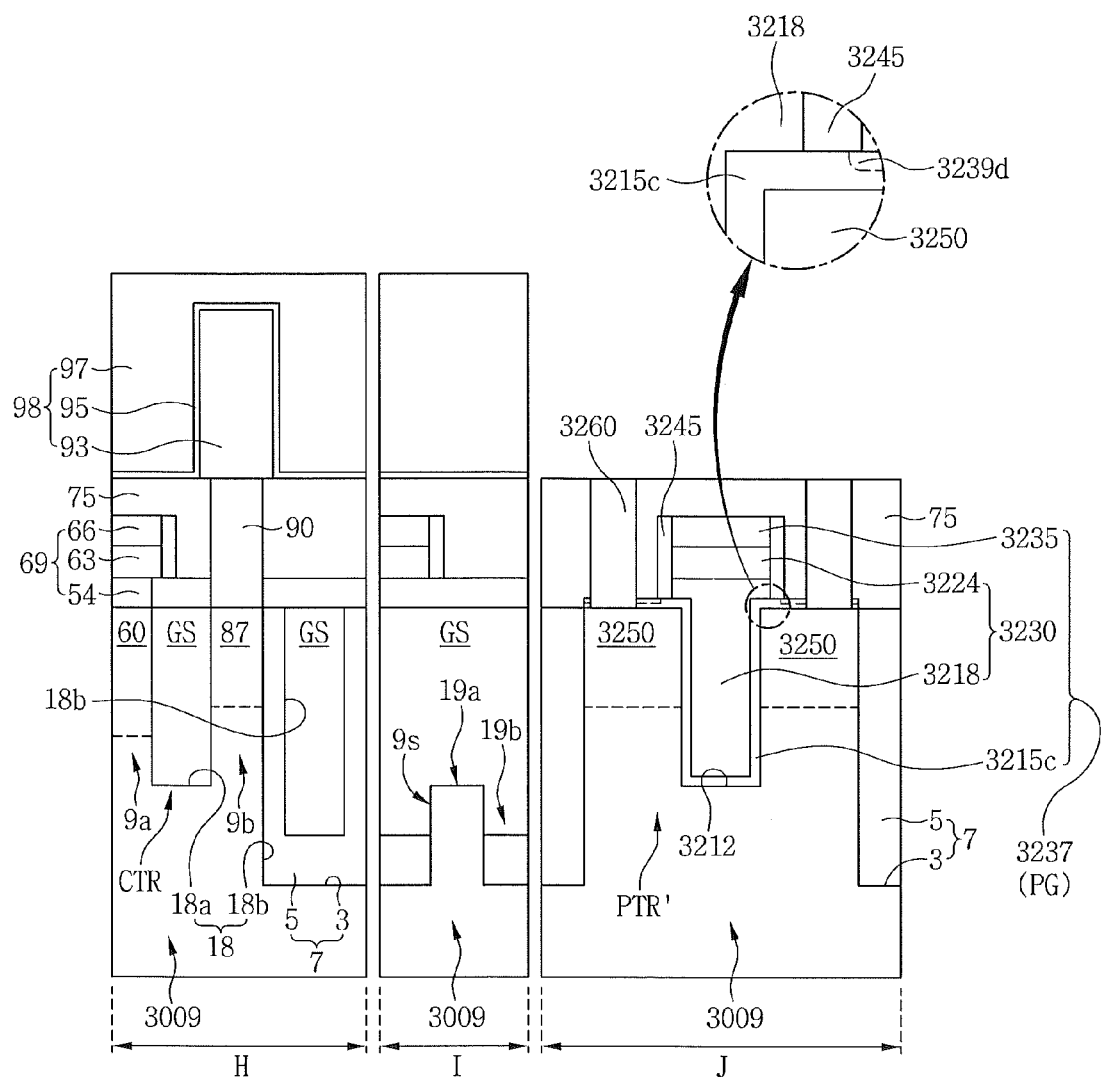

In another embodiment, as shown in FIG. 72, a peripheral metal-containing material layer 3239d may be formed in the second portion of the peripheral gate dielectric 3215 disposed on the peripheral active region 3009 on both sides of the peripheral gate electrode 3230, and spaced apart from the peripheral gate electrode 3230. Methods of fabricating the above-described semiconductor devices will now be described.

To begin with, methods of fabricating the semiconductor devices according to one embodiment of the inventive concept, which are described with reference to FIGS. 1 through 37B, will be described with reference to FIGS. 73A through 83. In FIGS. 73A through 83, a repeat description of the same methods described with reference to FIGS. 1 through 37B will be omitted.

Figure 73A:
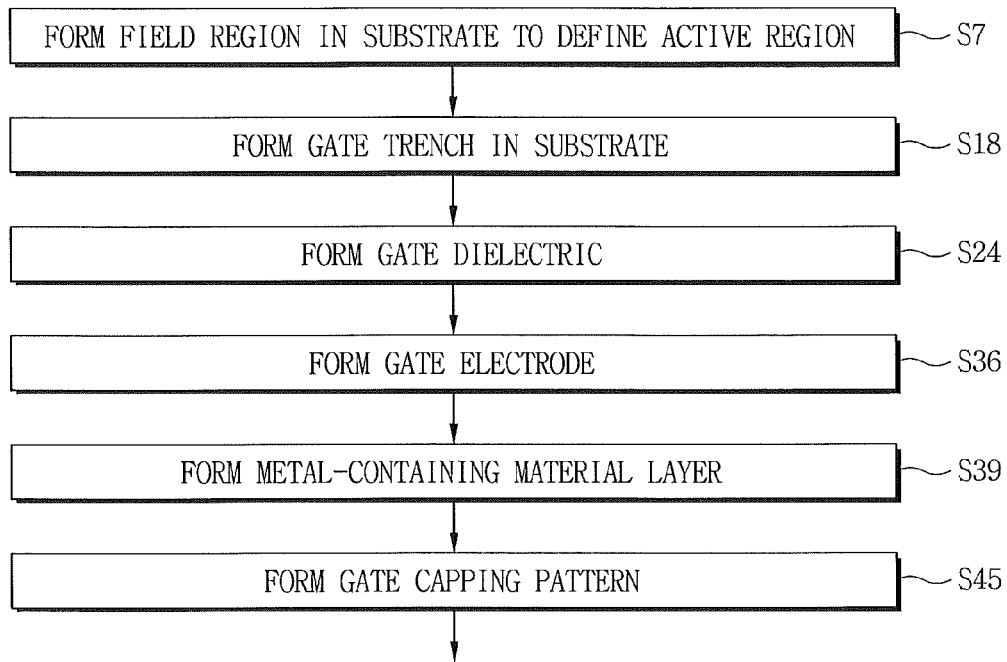
FIGS. 73A through 73C are process flowcharts illustrating a method of fabricating a semiconductor device according to an embodiment of the inventive concept.
Figure 73B:
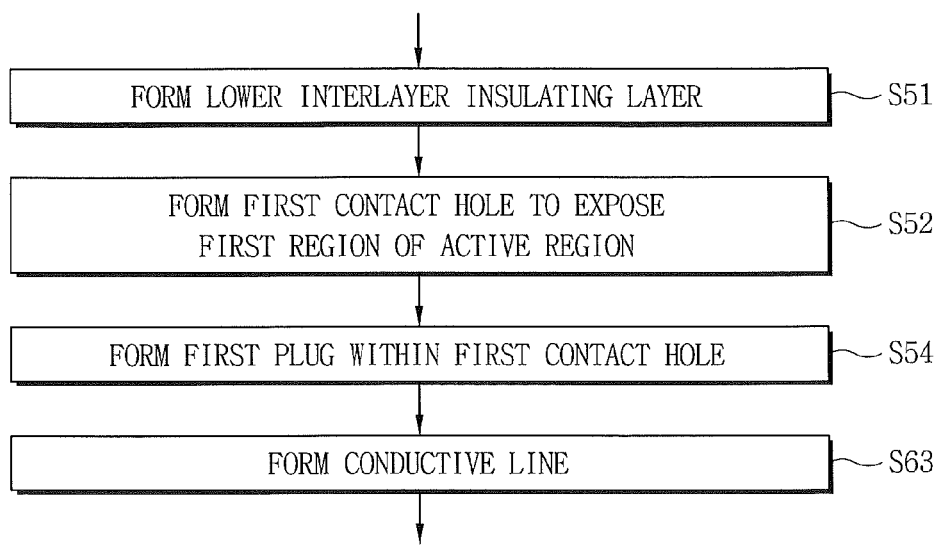
Figure 73C:
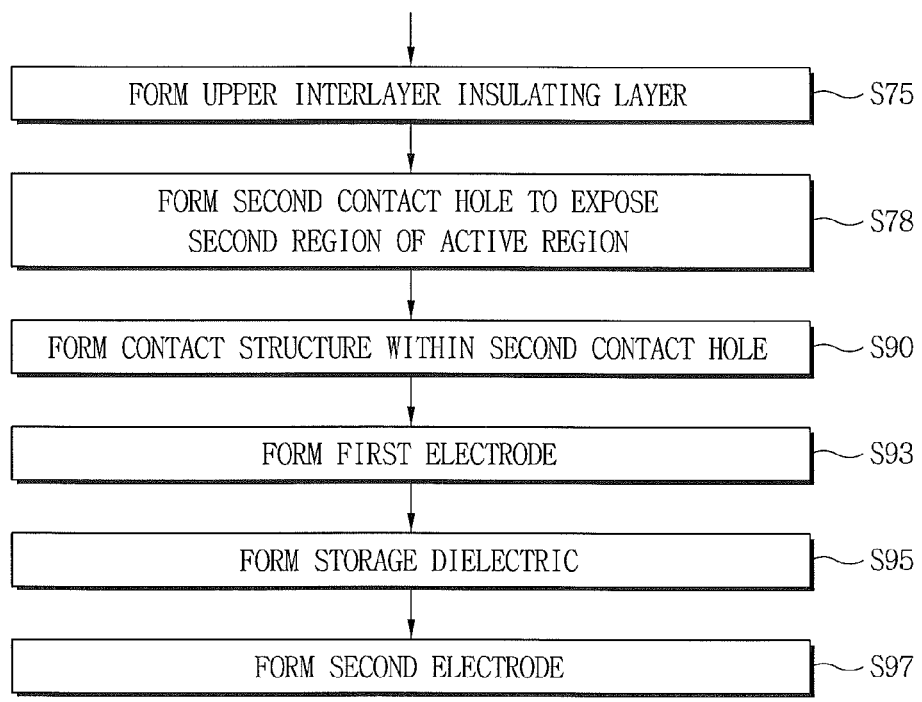
Figure 74A:
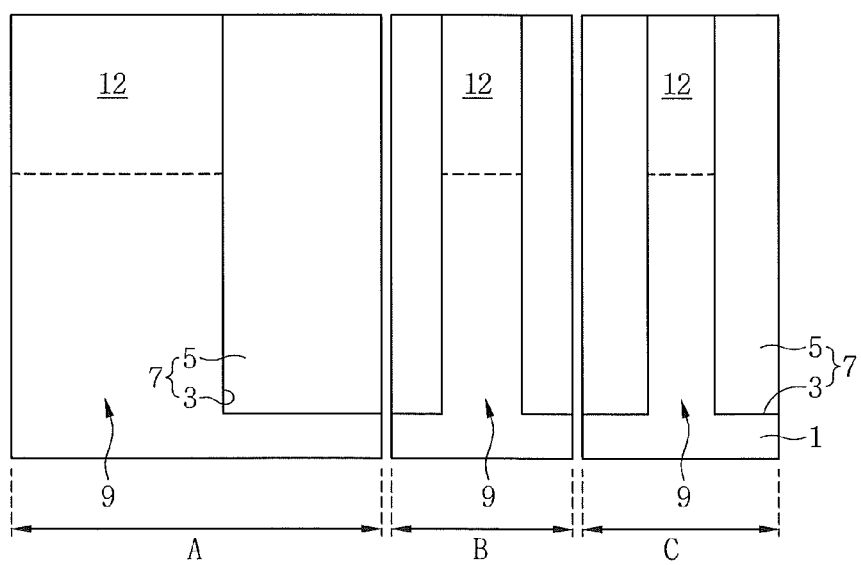
FIGS. 74A through 74O are cross-sectional views illustrating a method of fabricating a semiconductor device according to an embodiment of the inventive concept.

A method of fabricating a semiconductor device according to an embodiment of the inventive concept will be described with reference to FIGS. 1, 73A through 73C, and 74A through 74O. FIGS. 73A through 73C are process flowcharts illustrating a method of fabricating a semiconductor device according to an embodiment of the inventive concept, and FIGS. 74A through 74O are cross-sectional views illustrating a method of fabricating a semiconductor device according to an embodiment of the inventive concept. In FIGS. 74A through 74O, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1, 73A, and 74A, a substrate 1 may be prepared. The substrate 1 may be a semiconductor substrate. The substrate 1 may include a Si-containing semiconductor. For example, the substrate 1 may be a silicon wafer.

A field region 7 defining an active region 9 may be formed in the substrate 1 (operation S7). The field region 7 may be a trench isolation region. For instance, the formation of the field region 7 may include forming a trench 3 in the substrate 1 and forming an insulating material pattern 5 to fill the trench 3.

A source/drain region 12 may be formed in the active region 9. For example, the formation of the source/drain region 12 may include implanting impurities into the active region 1 using an ion implantation process. The source/drain region 12 may have an opposite conductivity type to the active region 9. For instance, when the active region 9 has a first conductivity type, the source/drain region 12 may have a second conductivity type different from the first conductivity type. For example, the active region 9 may have a P conductivity type, and the source/drain region 12 may have an N conductivity type. For instance, the source/drain region 12 may be formed by implanting a Group V element, such as phosphorus or arsenic, into the active region 9.

The source/drain region 12 may be formed after forming the field region 7. In another case, the source/drain region 12 may be formed before forming the field region 7.

Figure 74B:
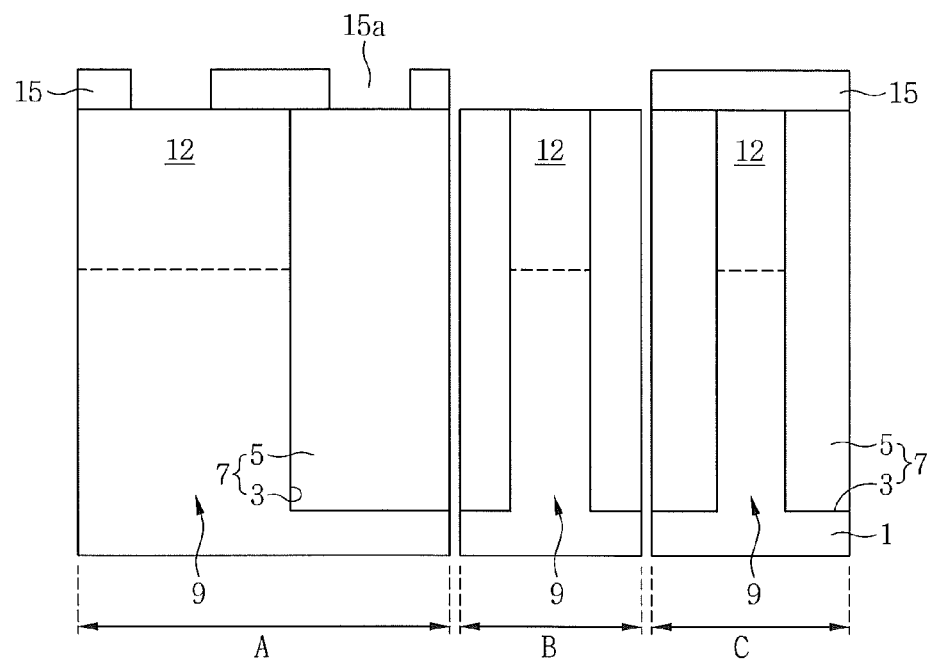

Referring to FIGS. 1 and 74B, a mask pattern 15 may be formed on the substrate 1 having the active region 9 and the field region 7. The mask pattern 15 may include a material having an etch selectivity with respect to the insulating material pattern 7. The mask pattern 15 may have an opening 15a, which may nm across the active region 9 and extend onto the field region 7.

Figure 74C:
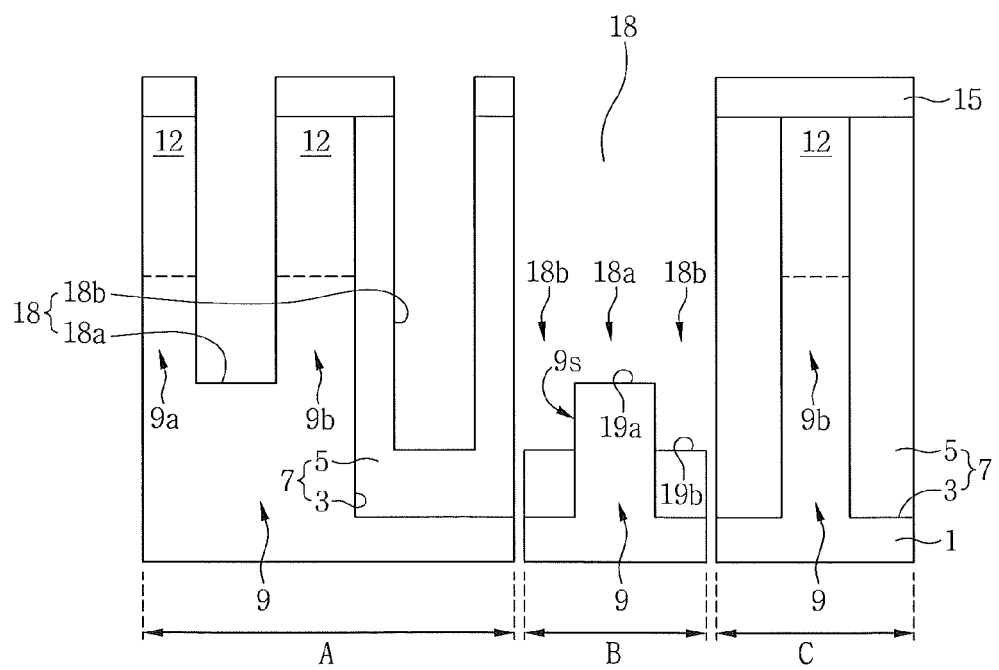

Referring to FIGS. 1, 74A, and 74C, a gate trench 18 may be formed in the substrate 1 (operation S18). The gate trench 18 may include a first portion 18a running across the active region 9, and a second portion 18b disposed in the field region 7. For example, the formation of the gate trench 18 may include partially etching the active region 9 and the field region 7 using the mask pattern 15 as an etch mask. A bottom region 18b of the second portion 18b of the gate trench 18 formed in the active region 9 may be disposed at a lower level than a bottom of the first portion 18a of the gate trench 18 formed in the active region 9. For instance, to form the gate trench 18, when the active region 9 and the field region 7 are partially etched using the mask pattern 15 as an etch mask, the insulating material pattern 5 of the field region 7 may be etched to a greater depth than the active region 9.

One active region 9 may include three pillars divided by a pair of gate structures GS disposed adjacent to each other. For example, one active region 9 may include a first active pillar 9a and second active pillars 9b disposed opposite each other across the first active pillar 9a.

Figure 74D:
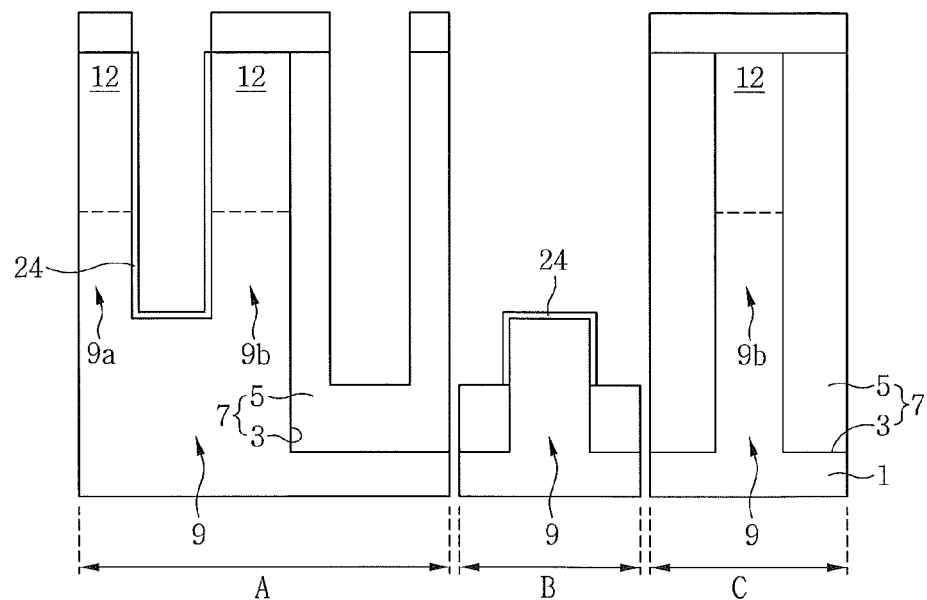

Referring to FIGS. 1, 73A, and 74D, a gate dielectric 24 may be formed (operation S24). The gate dielectric 24 may be formed on the active region 9 exposed by the gate trench 18.

The gate dielectric 24 may be formed on a sidewall of the first portion 18a of the gate trench 18 and also formed on a side surface of the active region 9 exposed due to a step difference between a bottom region 19a of the first portion 18a of the gate trench 18 and a bottom region 19b of the second portion 18b. For example, the formation of the gate dielectric 24 may include forming an oxide on the active region 9 exposed by the gate trench 18 by performing an oxidation process on the substrate 1 having the gate trench 18.

The gate dielectric 24 may include silicon oxide. The gate dielectric 24 may be formed of silicon oxide or nitrogen-doped silicon oxide. The formation of the gate dielectric 24 using the nitrogen-doped silicon oxide may include forming silicon oxide on the active region 9 exposed by the gate trench 18 and implanting nitrogen into the silicon oxide by nitriding the silicon oxide.

Figure 74E:
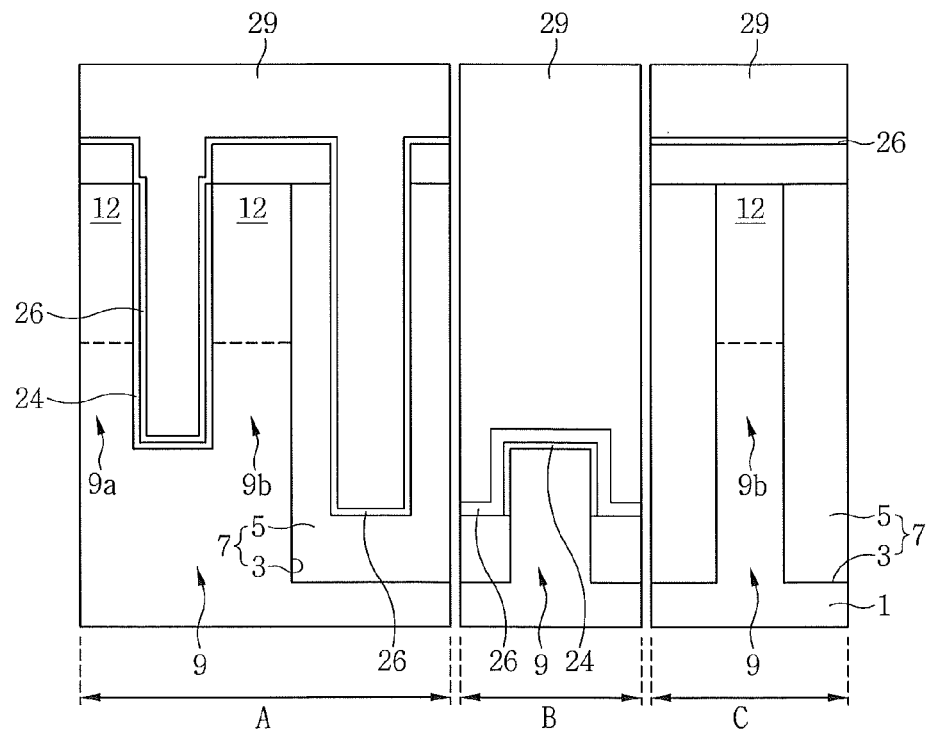
Figure 74F:
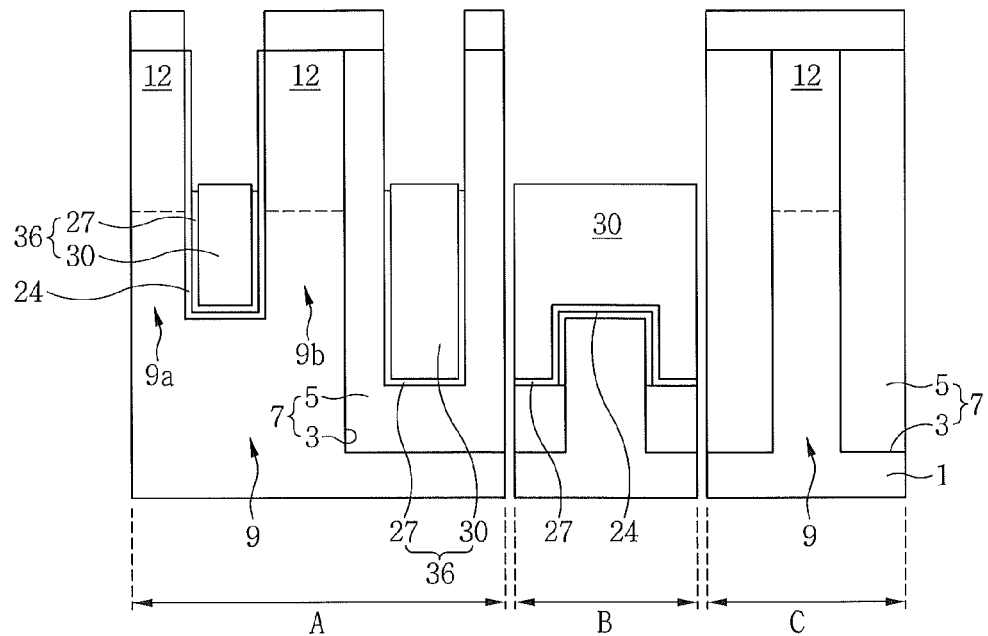

Referring to FIGS. 1 and 74E, a first conductive layer 26 and a second conductive layer 29 may be sequentially formed on a substrate 1 having the gate dielectric 24. The first conductive layer 26 may be conformally formed on the substrate 1 having the gate dielectric 24. The second conductive layer 29 may be formed on the first conductive layer 26 to fill the gate trench 18. The second conductive layer 29 may be formed of a material having a lower resistivity than the first conductive layer 26. For example, the first conductive layer 26 may be formed of a metal nitride (e.g., TiN or WN), and the second conductive layer 29 may be formed of a metal (e.g., W or TiAl) having a lower resistivity than the metal nitride.

Referring to FIGS. 1, 73A, and 73F, a gate electrode 36 may be formed (operation S36). The gate electrode 36 may be formed to partially fill the gate trench 18. The gate electrode 36 may include first and second gate conductive patterns 27 and 30. The formation of the gate electrode 36 may include forming the first and second gate conductive patterns 27 and 30 by partially etching the first and second conductive layers 26 and 29. The first gate conductive pattern 27 may be formed by partially etching the first conductive layer 26, while the second gate conductive pattern 30 may be formed by partially etching the second conductive layer 29.

In some embodiments, the first and second conductive layers 26 and 29 may be partially etched such that a top surface of the first gate conductive pattern 27 is at a lower level than a top surface of the second gate conductive pattern 30. For instance, partial etching of the second conductive layer 29 may be followed by partial etching of the first conductive layer 26.

In some embodiments, after partially etching the first and second conductive layers 26 and 29, the gate dielectric exposed by the partially etched first and second conductive layers may be selectively etched, and the partially etched first conductive layer 26 may be partially etched. As a result, a gate structure 48c shown in FIG. 4C may be formed.

Figure 7:
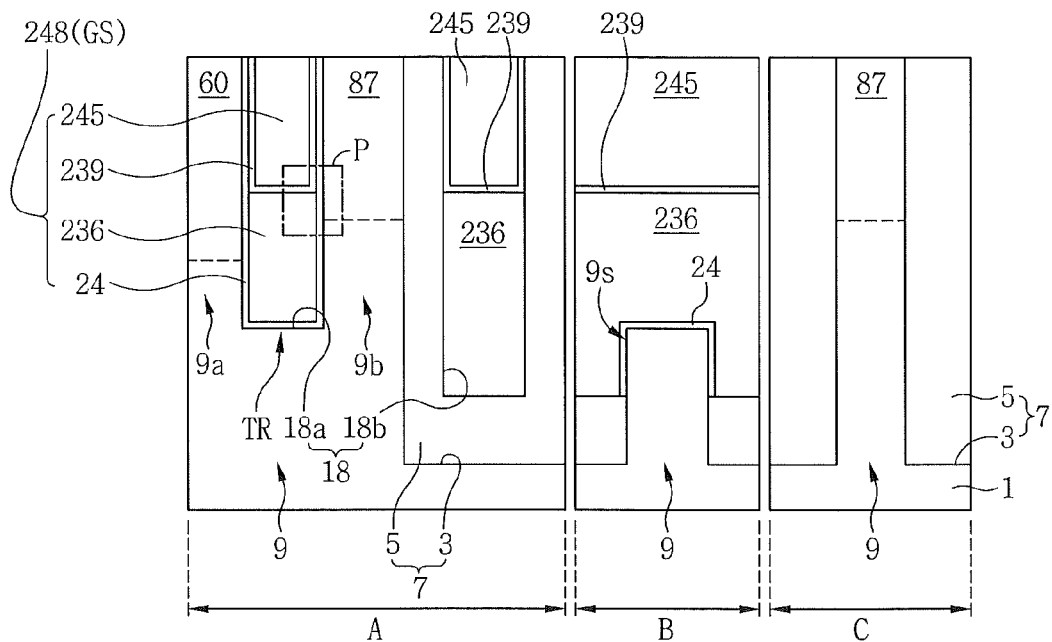
FIG. 7 is a cross-sectional view of a semiconductor device according to an embodiment of the inventive concept.
Figure 8:
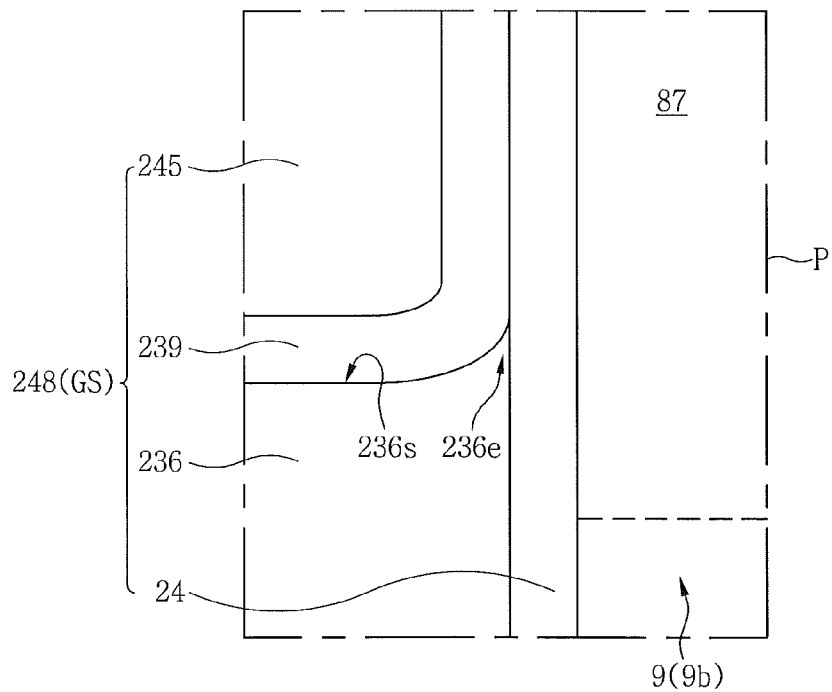
FIG. 8 is a partial enlarged view of a portion of FIG. 7.
Figure 9:
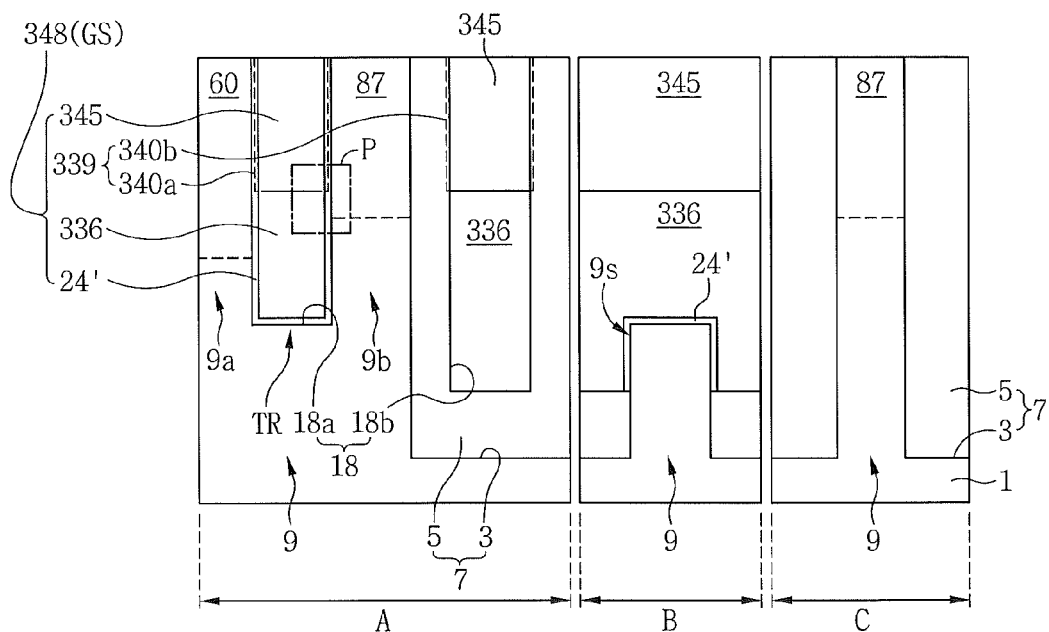
FIG. 9 is a cross-sectional view of a semiconductor device according to an embodiment of the inventive concept.

In some embodiments, a single conductive layer may be formed instead of the first and second conducive layers 26 and 29, and partially etched to form a gate electrode 236 shown in FIGS. 7 and 8.

Figure 74G:
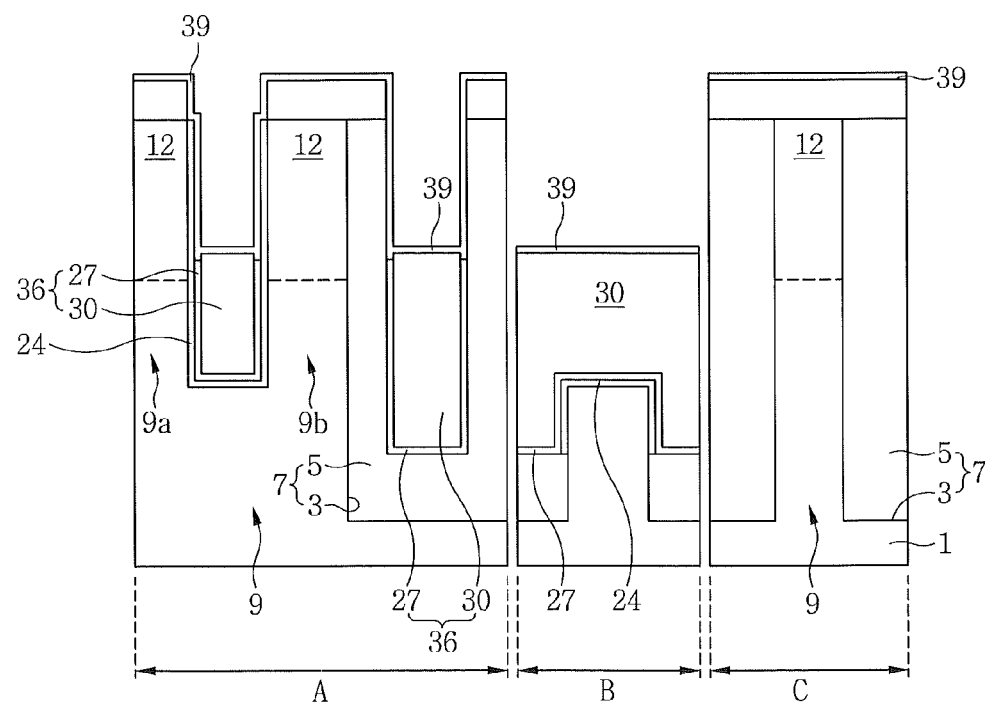

Referring to FIGS. 1, 73A, and 74G, a metal-containing material layer 39 may be formed (operation S39). The metal-containing material layer 39 may be formed on a substrate 1 having the gate electrode 36. The metal-containing material layer 39 may be conformally formed using an atomic layer deposition (ALD) process. The metal-containing material layer 39 may be conformally formed on the substrate 1 having the gate electrode 36.

As described with reference to FIG. 3, the metal-containing material layer 39 may be formed of a dielectric material containing a metal having a Fermi energy close to a level of either one of the valance band and conduction band of the energy band diagram of the active region 9. For example, the metal-containing material layer 39 may include a dipole layer containing at least one of LaO, MgO, LaON, and MgON to improve leakage current characteristics of the NMOS transistor. In another case, the metal-containing material layer 39 may include a dipole layer containing one of AlO, AlON, TaO, TaON, and IrON to improve leakage current characteristics of the PMOS transistor.

Figure 74H:
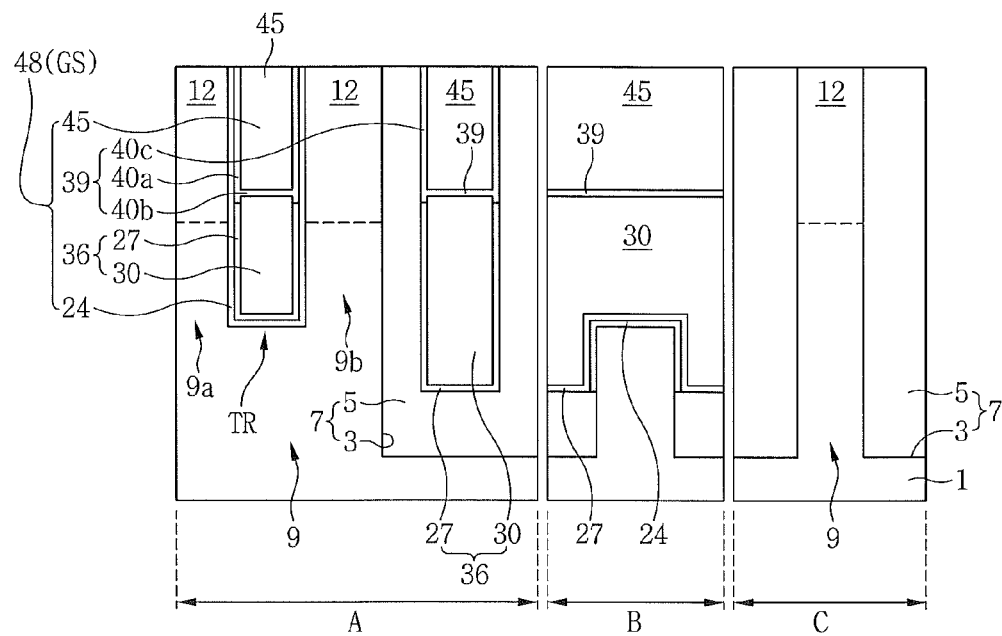

Referring to FIGS. 1, 73A, and 74H, a gate capping pattern 45 may be formed (operation S45). For instance, the formation of the gate capping pattern 45 may include forming a capping insulating layer on the substrate 1 having the metal-containing material layer 39 and planarizing the capping insulating layer. The gate capping pattern 45 may be formed on the metal-containing material layer 39 and within the gate trench 18. The mask pattern 15 may be removed during the planarization of the capping insulating layer. In another case, the mask pattern 15 may be removed by etching after forming the gate capping pattern 45. The metal-containing material layer 39 may remain to cover side and bottom surfaces of the gate capping pattern 45. The gate dielectric 24, the gate electrode 36, the metal-containing material layer 39, and the gate capping pattern 45 may constitute a gate structure 48 (GS).

Figure 74I:
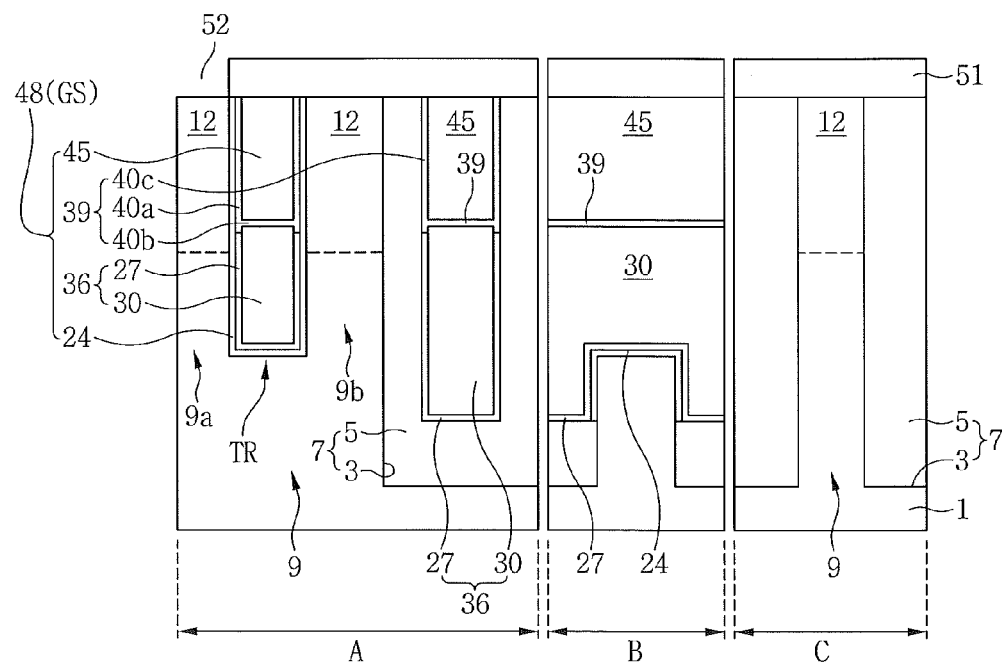

Referring to FIGS. 1, 73B, and 74I, a lower insulating layer 51 may be formed (operation S51). The lower insulating layer 51 may be formed on the substrate 1 having the gate structure 48 (GS). The lower insulating layer 51 may be formed to cover the substrate 1 having the gate structure 48 (GS). The lower insulating layer 51 may be formed of an insulating material, such as silicon oxide or silicon nitride. A first contact hole 52 may be formed to expose a first region 9a of the active region 9 (operation S52). The first region 9a of the active region 9 may be a first active pillar 9a formed by the gate trench 18. The first contact hole 52 may penetrate the lower insulating layer 51 and expose the first region 9a of the active region 9.

Figure 74J:
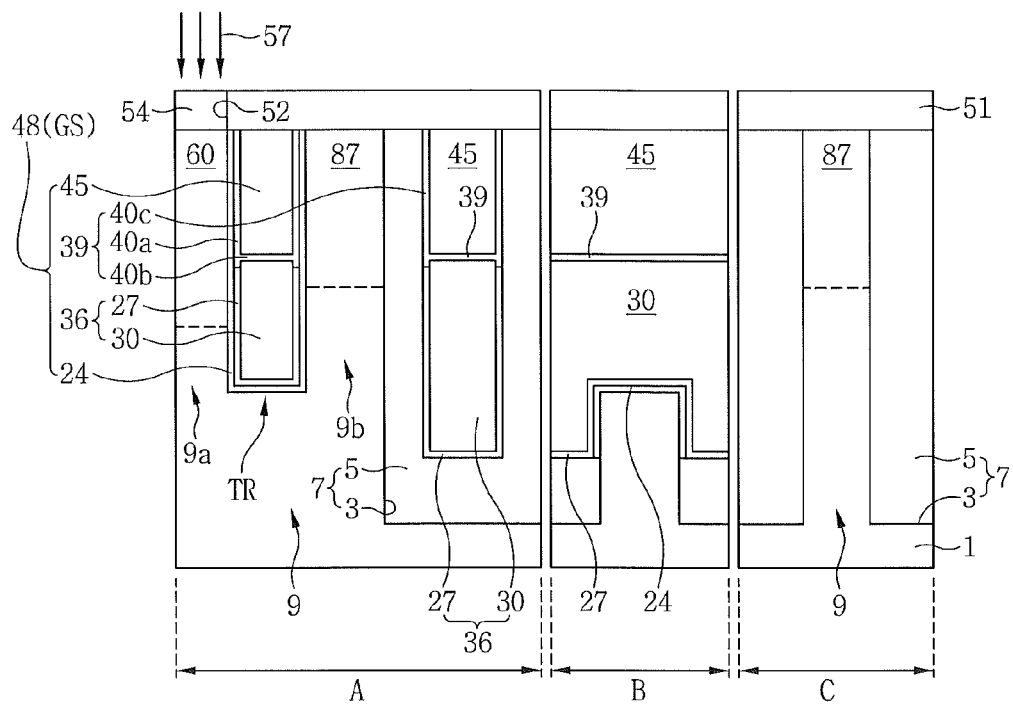

Referring to FIGS. 1, 73B, and 74J, a first source/drain region 60 may be formed in the first region 9a of the active region 9 exposed by the first contact hole 52 (operation S60). Impurities, such as phosphorus or arsenic, may be implanted into the first region 9a of the active region 9 exposed by the first contact hole 52 using a first ion implantation process 57, thereby forming the first source/drain region 60. A bit line contact plug 54 may be formed within the first contact hole 52 (operation S54). The bit line contact plug 54 may be formed of poly-Si having an N conductivity type.

Figure 74K:
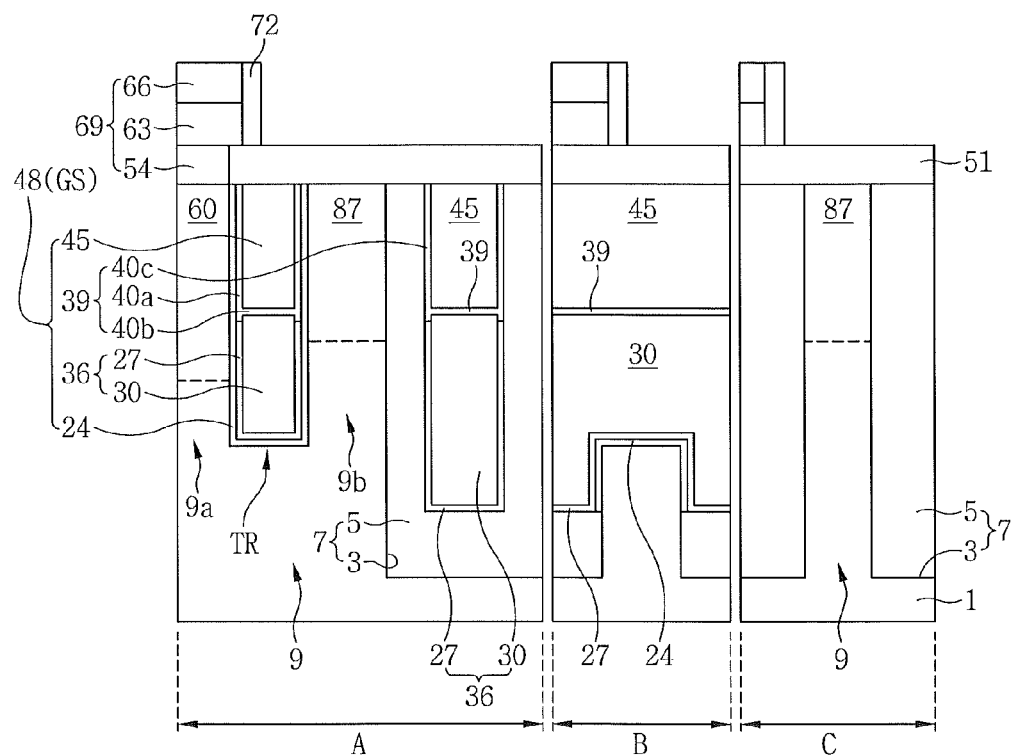

Referring to FIGS. 1, 73B, and 74K, a conductive line 63 may be formed (operation S63). The conductive line 63 may be formed on the lower interlayer insulating layer 51 to cover the bit line contact plug 54. For example, the formation of the conductive line 63 may include forming a conductive layer on the substrate 1 having the bit line contact plug 54, forming a bit line capping pattern 66 on the conductive layer, and etching the conductive layer by performing an etching process using the bit line capping pattern 66 as an etch mask. The conductive line 63 and the bit line capping pattern 66 may be stacked sequentially. The conductive line 63 may be formed of a conductive material containing at least one of poly-Si, a metal nitride, a metal-semiconductor compound, or a metal. For instance, the conductive line 63 may include tungsten. The bit line capping pattern 66 may be formed of an insulating material, such as silicon oxide or silicon nitride.

The conductive line 63 may be a bit line of a memory device, such as a DRAM. The gate electrode 36 may be a word line of a memory device, such as a DRAM.

An insulating spacer layer may be formed on the substrate 1 having the conductive line 63 and the mask pattern 66, and etched using an anisotropic etching process, thereby forming a spacer pattern 72. The spacer pattern 72 may be formed on side surfaces of the sequentially stacked conductive line 63 and the mask pattern 66.

Figure 74L:
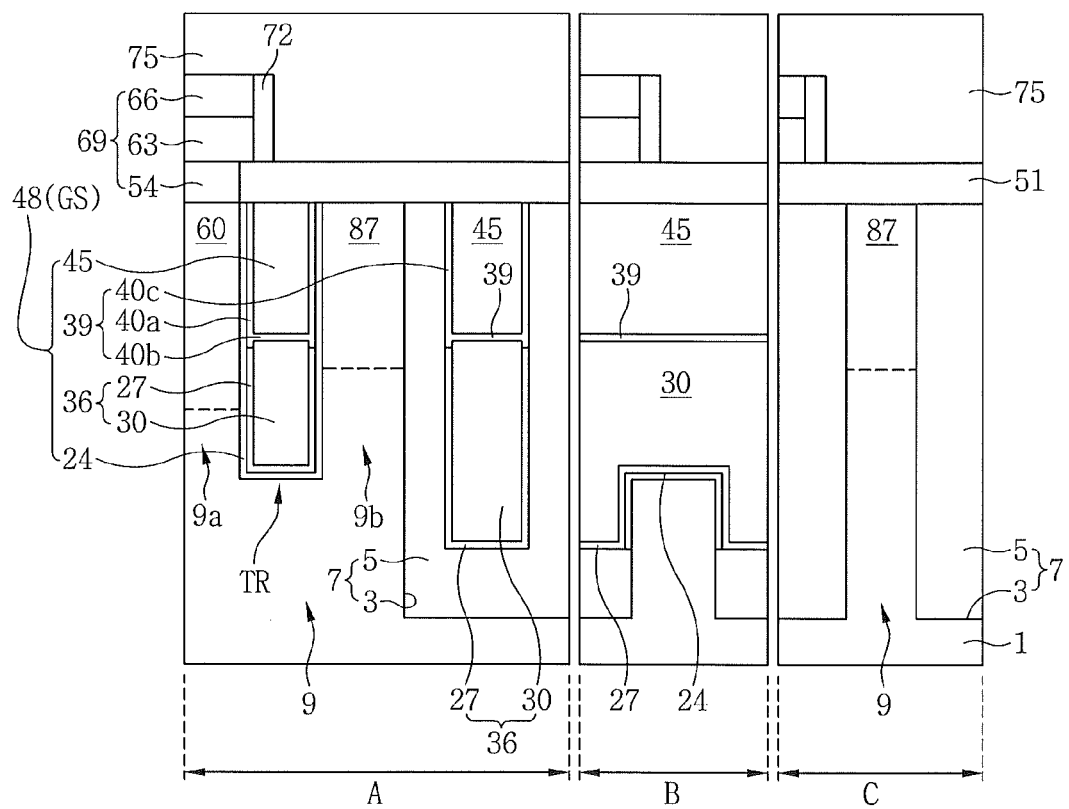

Referring to FIGS. 1, 73C, and 74L, an upper insulating layer 75 may be formed (operation S75). The upper insulating layer 75 may be formed on the substrate 1 having the spacer pattern 72. The upper insulating layer 75 may be formed of silicon oxide.

Figure 74M:
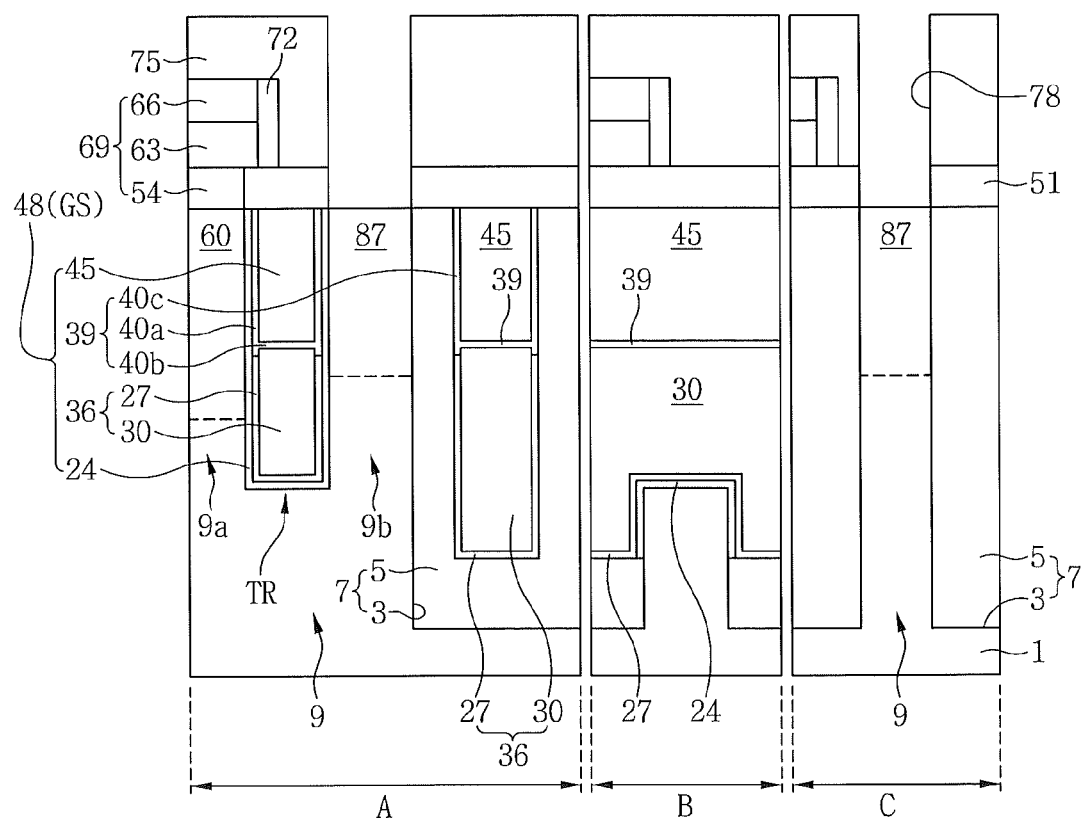

Referring to FIGS. 1, 73C, and 74M, a second contact hole 72 may be formed to expose a second region 9b of the active region 9 (operation S78). The second region 9b of the active region 9 may be a second active pillar 9b formed by the gate trench 18.

The second contact hole 72 may penetrate the upper insulating layer 75 and the lower insulating layer 51 and expose the second region 9b of the active region 9.

In some embodiments, impurities may be implanted into the second region 9b of the active region 9 exposed by the second contact hole 78. Accordingly, a second source/drain region 87 may be defined in the second region 9b of the active region 9 exposed by the second contact hole 78. The second source/drain region 87 may form a shallower junction than the first source/drain region 60.

Figure 74N:
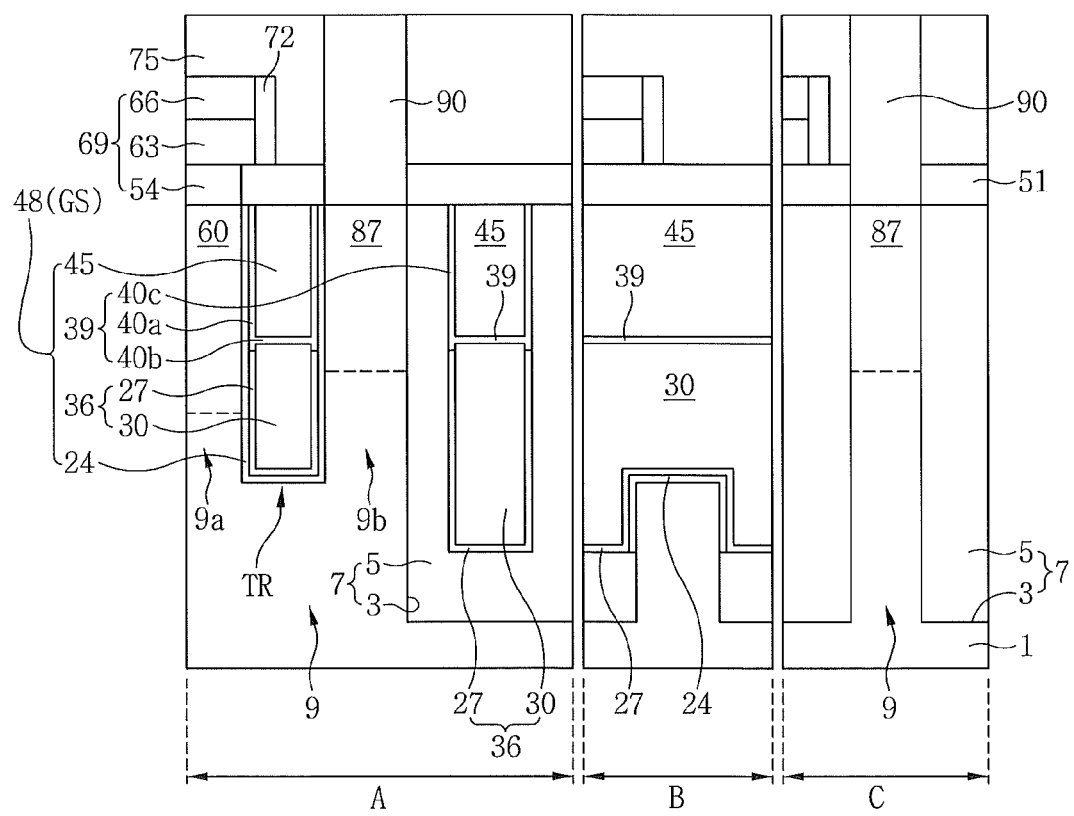
Figure 74O:
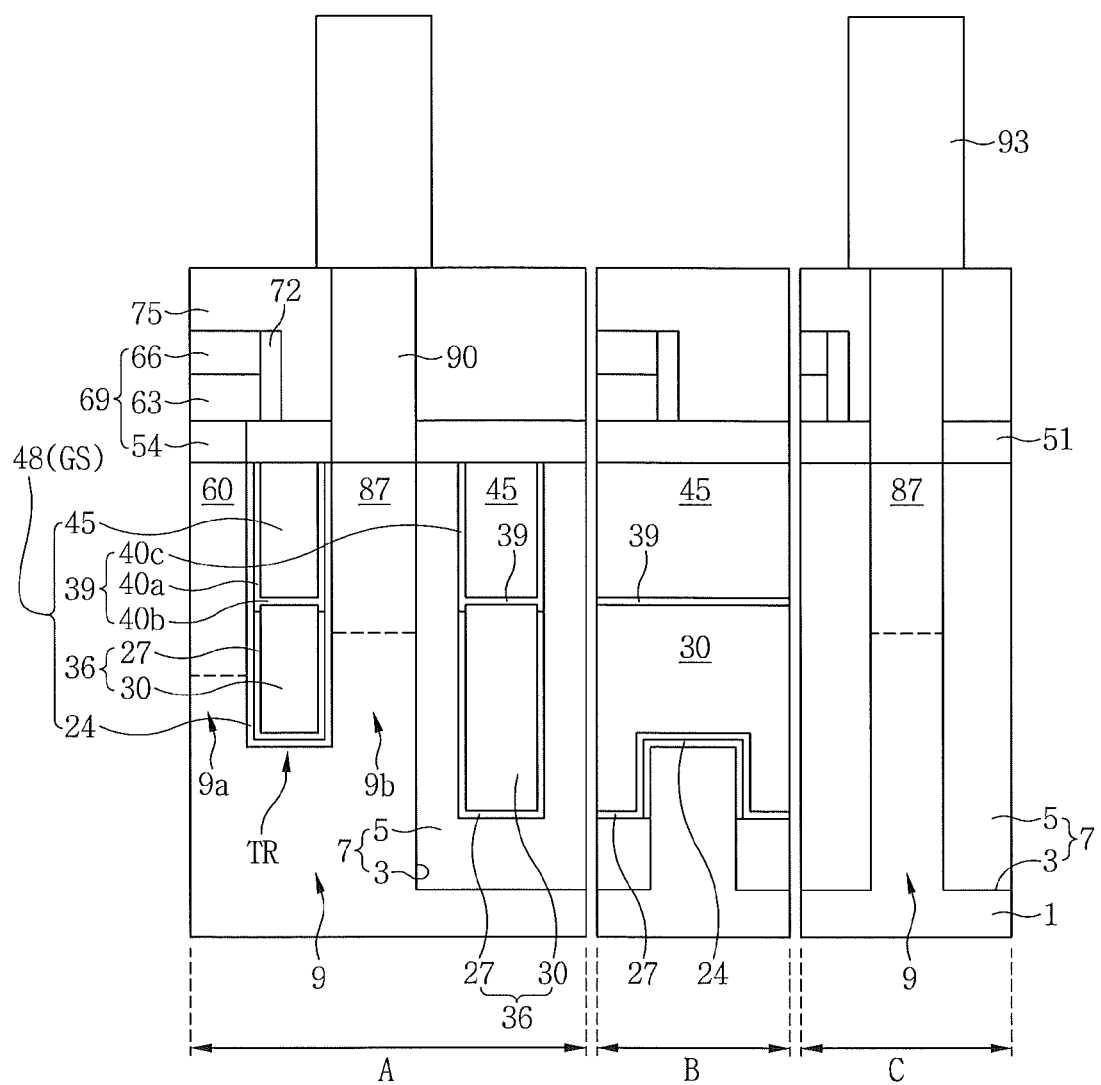

Referring to FIGS. 1, 73c, and 74N, a capacitor contact plug 90 may be formed within the second contact hole 78 (operation S90). The capacitor contact plug 90 may be formed of poly-Si. In the case of an NMOS transistor, the capacitor contact plug 90 may be formed of poly-Si having an N conductivity type. In another case, the contact structure 90 may have a stack structure of poly-Si and a metal.

Referring to FIGS. 1, 73C, and 74O, a first electrode 93 may be formed (operation S93). The first electrode 93 may be formed on the upper insulating layer 75 and electrically connected to the capacitor contact plug 90.

Next, a method of forming a capacitor structure will be described with reference back to FIG. 2.

Referring to FIGS. 1, 2, and 73C, a storage dielectric material 95 may be formed to cover the first electrode 93 (operation S90). A second electrode 97 may be formed on the storage dielectric material 95 (operation S95). The first electrode 93, the storage dielectric material 95, and the second electrode 97 may constitute a capacitor structure 98. The capacitor structure 98 may be a capacitor of a DRAM cell.

Next, a method of fabricating a semiconductor device according to an embodiment of the inventive concept will be described with reference to FIGS. 1, 75, and 76A through 76C. In FIGS. 76A through 77C, portion "A" denotes a section taken along line I-I' of FIG. 1, portion "B" denotes a section taken along line II-II' of FIG. 1, and portion "C" denotes a section taken along line III-III' of FIG. 1.

Figure 75:
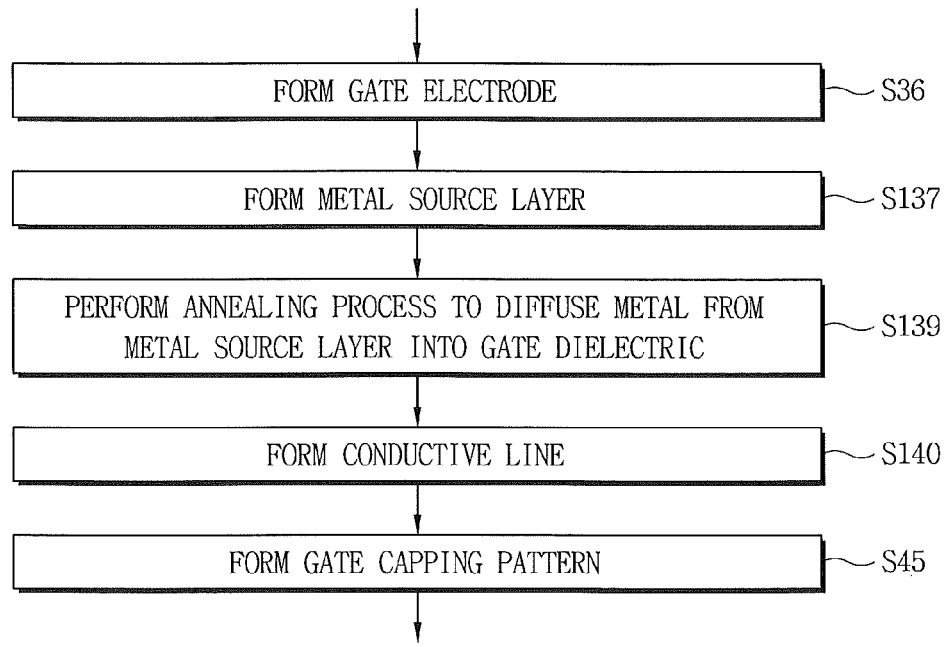
FIG. 75 is a process flowchart illustrating a method of fabricating a semiconductor device according to an embodiment of the inventive concept.
Figure 76A:
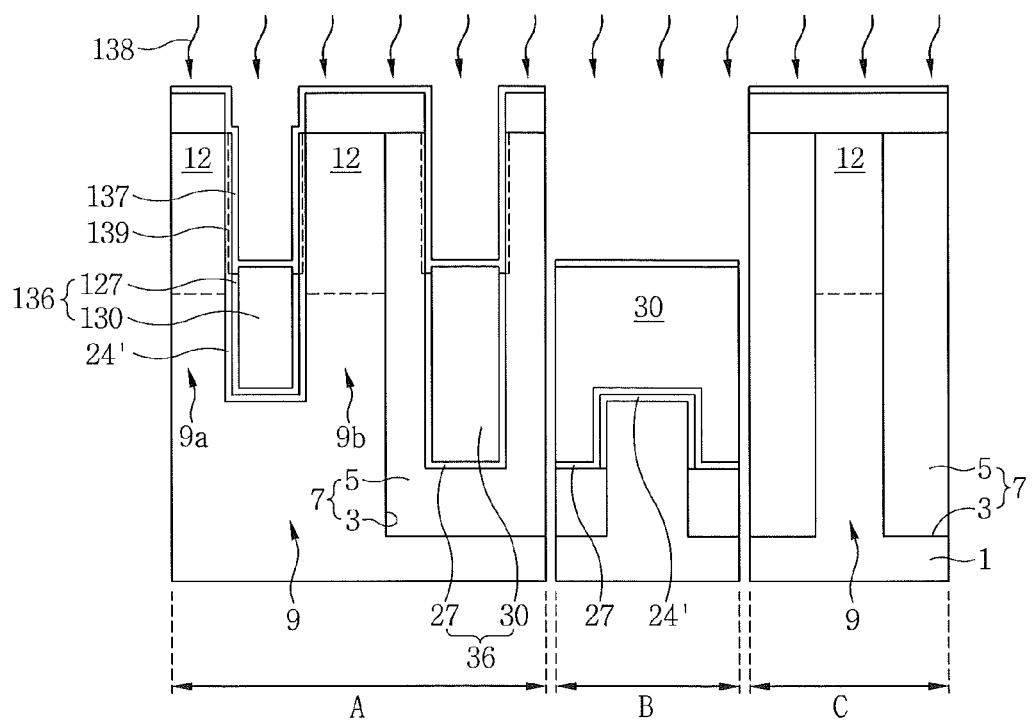
FIGS. 76A through 76C are cross-sectional views illustrating a method of fabricating a semiconductor device according to an embodiment of the inventive concept.

Referring to FIGS. 1, 75, and 76A, a substrate 1 having the gate electrode 36 may be prepared as described with reference to FIG. 74F. In the substrate 1 having the gate electrode 36, a portion of the gate dielectric 24 disposed at a higher level than the gate electrode 36 may be exposed. A metal source layer 137 may be formed (operation S137). the metal source layer 137 may be conformally formed using an atomic layer deposition (ALD) process. The metal source layer 137 may be conformally formed on the substrate 1 having the gate electrode 36. The metal source layer 137 may cover a top surface of the gate electrode 36 and an exposed portion of the gate dielectric 24.

When a transistor to be formed according to an embodiment of the inventive concept is an NMOS transistor, the metal source layer 137 may be formed of a metal having a Fermi energy closer to the conduction band of the active region 9 than to the valance band of the active region 9. For example, the metal source layer 137 may be formed of a material layer containing lanthanum. For instance, the metal source layer 137 may be formed of a lanthanum layer, but the inventive concept is not limited thereto. For example, the metal source layer 137 may be formed of a material layer containing magnesium.

When a transistor to be formed according to an embodiment of the inventive concept is a PMOS transistor, the metal source layer 137 may be formed of a metal having a Fermi energy closer to the valance band of the active region 9 than to the conduction band of the active region 9. For example, the metal source layer 137 may be formed of a metal containing aluminum, tantalum, or iridium.

An annealing process 138 may be performed to diffuse a metal from the metal source layer 137 into the gate dielectric 24 to form a metal-containing material layer 139a (operation S139). The annealing process 138 may be performed in an annealing chamber in a process atmosphere at a temperature of about 800° C. or higher.

During the annealing process 138, a metal may diffuse from a portion of the metal source layer 137 into the gate dielectric 24, and the remaining portion of the metal source layer 137 may not react but remain.

Accordingly, the metal-containing material layer 139*a* may be a layer formed by implanting a metal into the gate dielectric 24. The metal-containing material layer 139*a* may be formed of a dielectric material containing a metal.

Figure 76B:
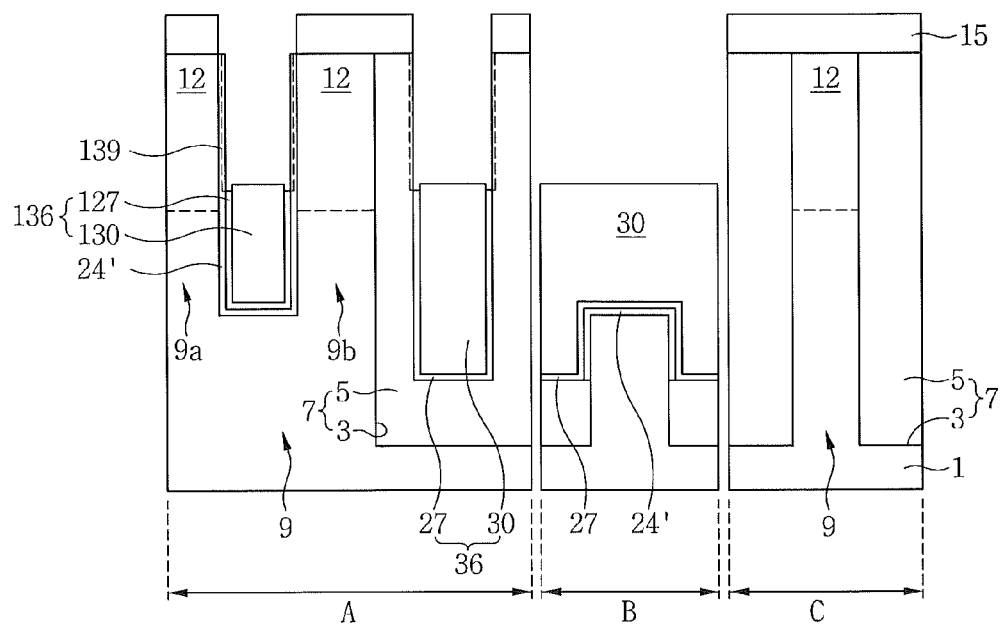

Referring to FIGS. 1, 75, and 76B, an unreacted metal source layer may be removed (operation S140). The unreacted metal source layer 137 may be removed using an etching process. Accordingly, the metal-containing material layer 139*a* may be exposed.

Figure 76C:
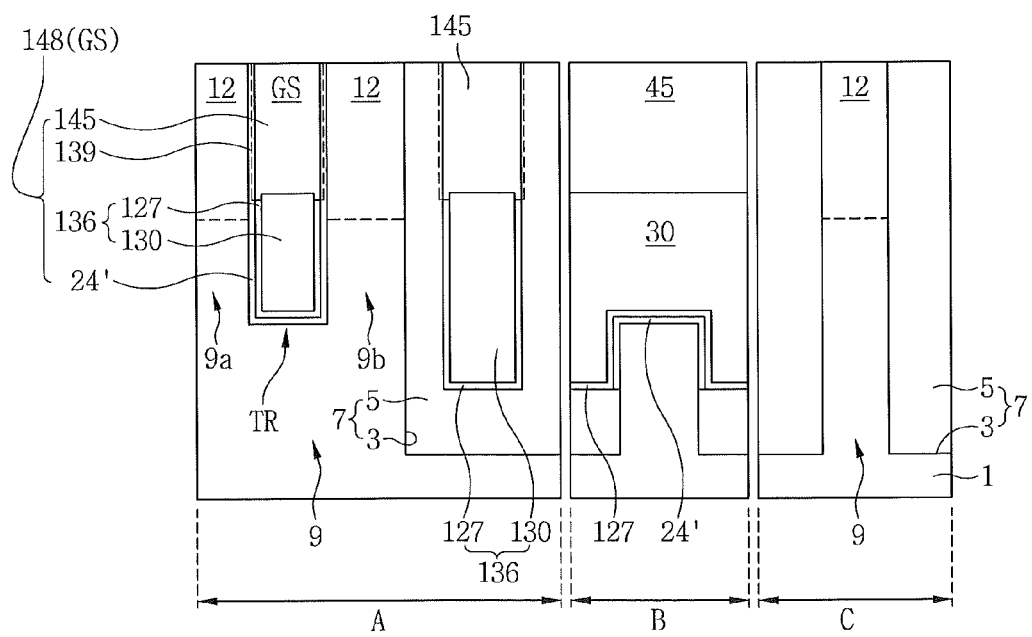

Referring to FIGS. 1, 75, and 76C, a gate capping pattern 145 may be formed (operation S45). The formation of the gate capping pattern 145 may include forming an insulating material layer on the substrate 1 having the metal-containing material layer 139*a* and planarizing the insulating material layer until the active region 9 is exposed.

Next, a method of fabricating a semiconductor device according to an embodiment of the inventive concept will be described with reference to FIGS. 1, 77, and 78A through 78D. In FIGS. 78A through 78D, portion "A" denotes a section taken along line I-I' of FIG. 1, portion "B" denotes a section taken along line II-II' of FIG. 1, and portion "C" denotes a section taken along line III-III' of FIG. 1.

Figure 77:
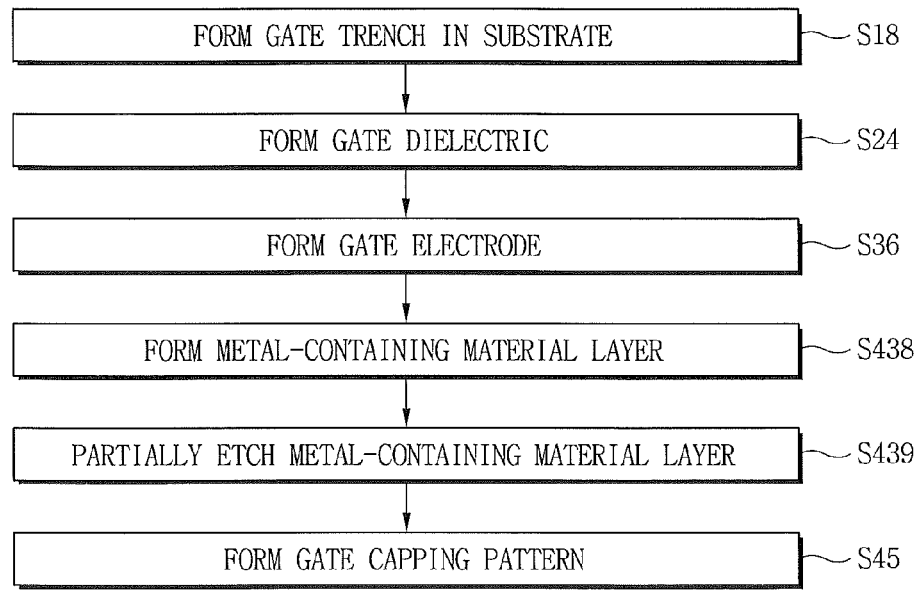
FIG. 77 is a process flowchart illustrating a method of fabricating a semiconductor device according to an embodiment of the inventive concept.
Figure 78A:
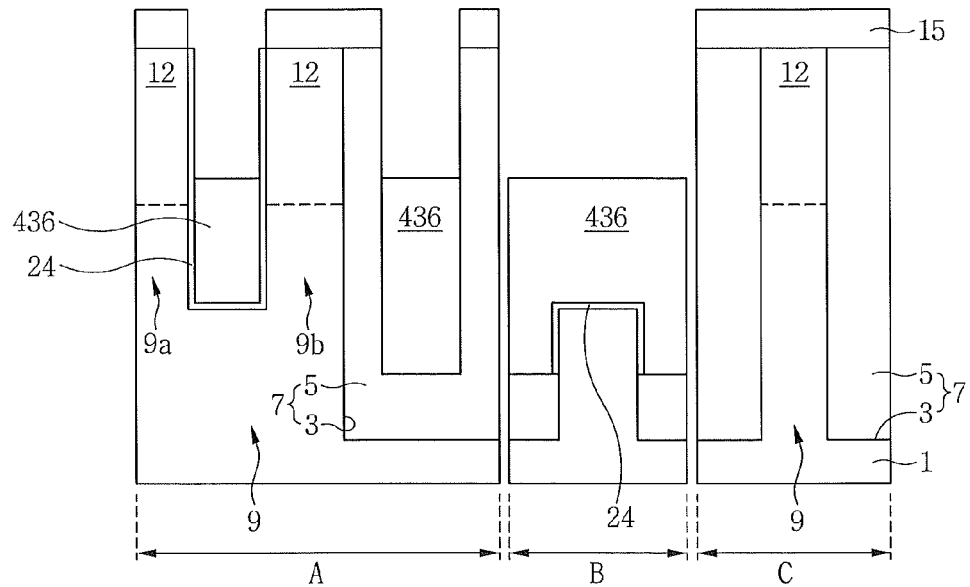
FIGS. 78A through 78D are cross-sectional views illustrating a method of fabricating a semiconductor device according to an embodiment of the inventive concept.

Referring to FIGS. 1, 77, and 78A, the gate trench 18 may be formed in the substrate 1 as described with reference to FIGS. 73A and 74A through 74D (operation S18), and the gate dielectric 24 may be formed (operation S24). A gate electrode 436 may be formed (operation S36). The gate electrode 436 may be formed on the substrate 1 having the gate dielectric 24 to partially fill the gate trench 18. The gate electrode 436 may be formed of a conductive material, for example, at least one of poly-Si, a metal nitride (e.g., TiN or WN), a metal (e.g., W or TiAl), and a metal-semiconductor compound (e.g., WSi).

Figure 78B:
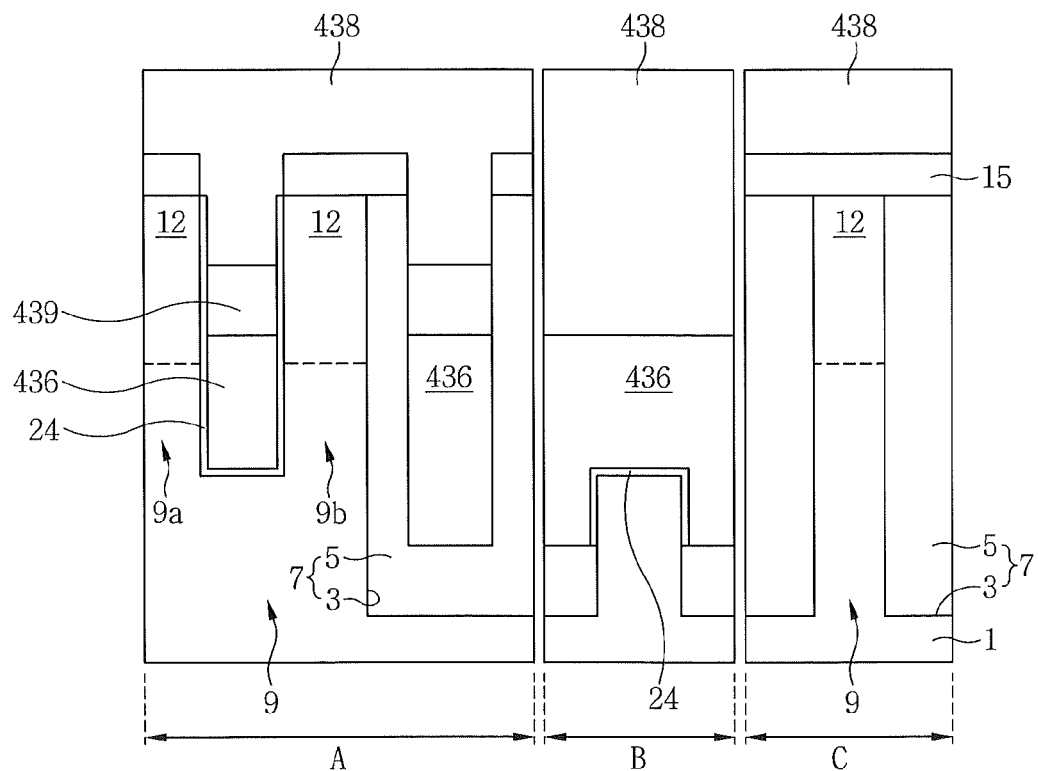

Referring to FIGS. 1, 77, and 78B, a metal-containing material layer 438 may be formed (operation S438). The metal-containing material layer 438 may be formed on the substrate 1 having the gate electrode 436.

The metal-containing material layer 438 may be formed of an insulating material.

When a transistor to be formed according to an embodiment of the inventive concept is an NMOS transistor, the metal-containing material layer 438 may include an N-type metal, such as La or Mg, and be formed of a dielectric material capable of forming a dipole. For example, the metal-containing material layer 438 may include at least one of LaO, MgO, LaON, and MgON.

When a transistor to be formed according to an embodiment of the inventive concept is an NMOS transistor, the metal-containing material layer 438 may include a P-type metal, such as aluminum, tantalum, or iridium, and be formed of a dielectric material capable of forming a dipole. For instance, the metal-containing material layer 438 may include one of AlO, AlON, TaO, TaON, IrO, and IrON.

Figure 78C:
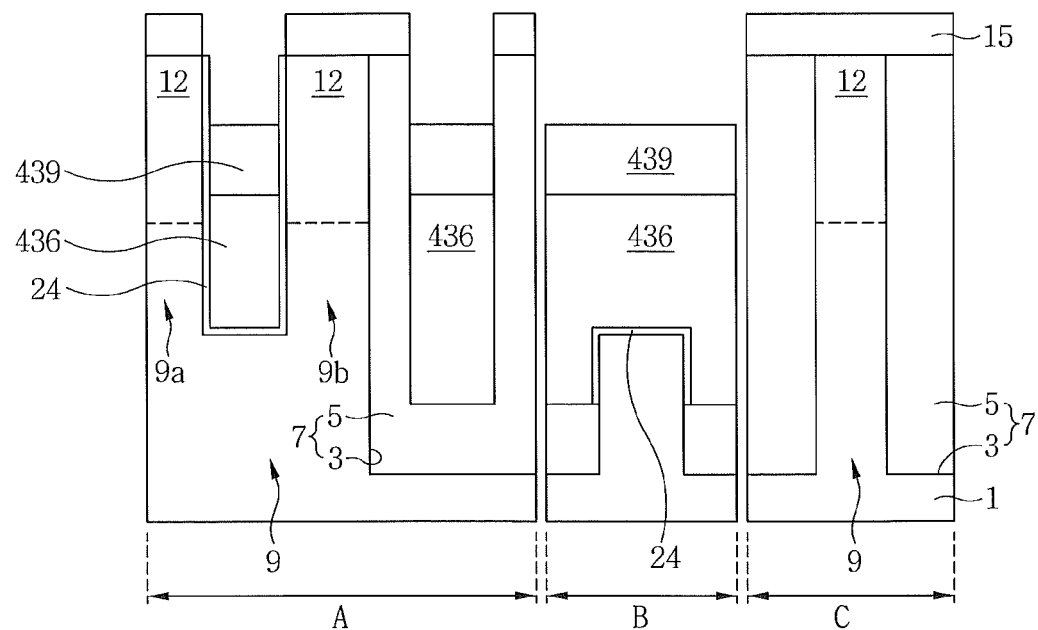

Referring to FIGS. 1, 77, and 78C, the metal-containing material layer 438 may be partially etched and remain within the gate trench 18 (operation S439). A metal-containing material layer 439 remaining within the gate trench 18 may be disposed at a lower level than a top surface of the active region 9.

Figure 78D:
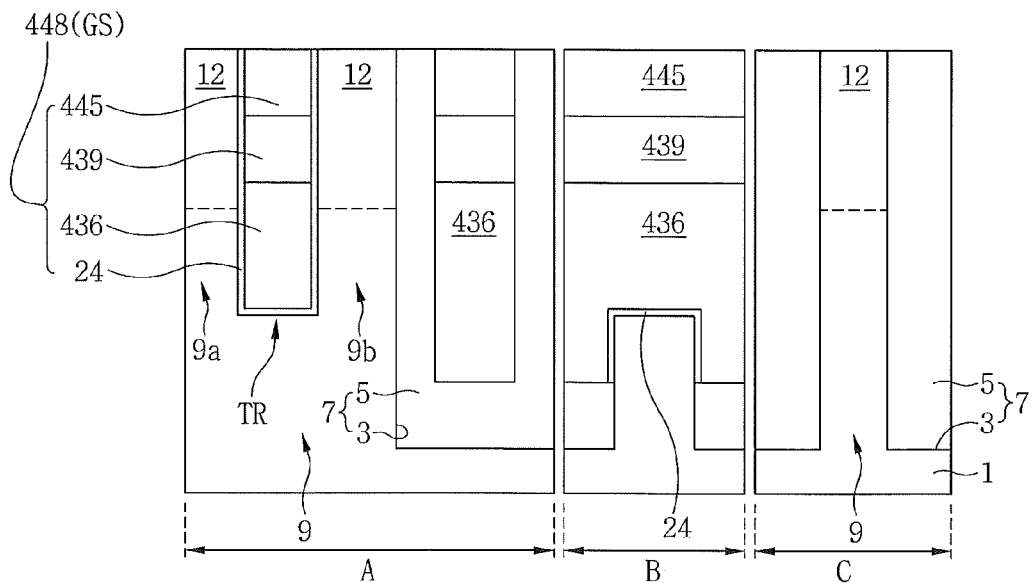

Referring to FIGS. 1, 77, and 78D, a gate capping pattern 445 may be formed (operation S45). The formation of the gate capping pattern 445 may include forming an insulating material layer on the substrate having the metal-containing material layer 439 and planarizing the insulating material layer until the active region 9 is exposed.

Next, a method of fabricating a semiconductor device according to an embodiment of the inventive concept will be described with reference to FIGS. 1, 79, and 80A through 80E. In FIGS. 80A through 80E, portion "A" denotes a section taken along line I-I' of FIG. 1, portion "B" denotes a section taken along line II-II' of FIG. 1, and portion "C" denotes a section taken along line III-III' of FIG. 1.

Figure 79:
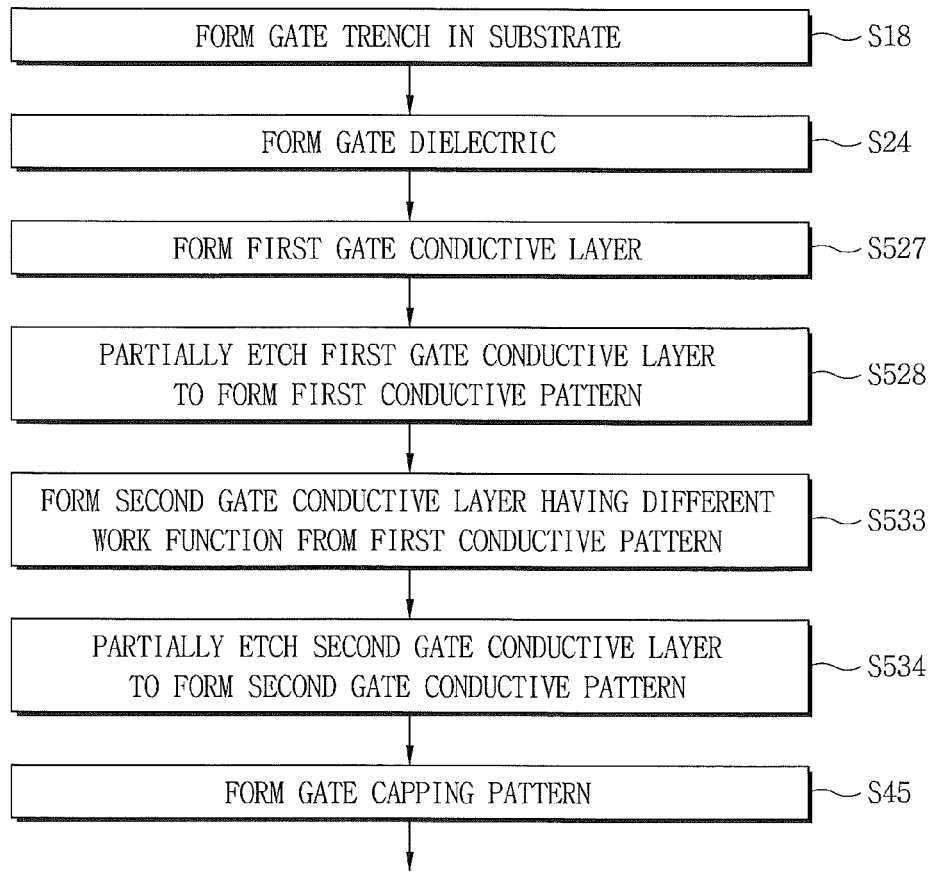
FIG. 79 is a process flowchart illustrating a method of fabricating a semiconductor device according to an embodiment of the inventive concept.
Figure 80A:
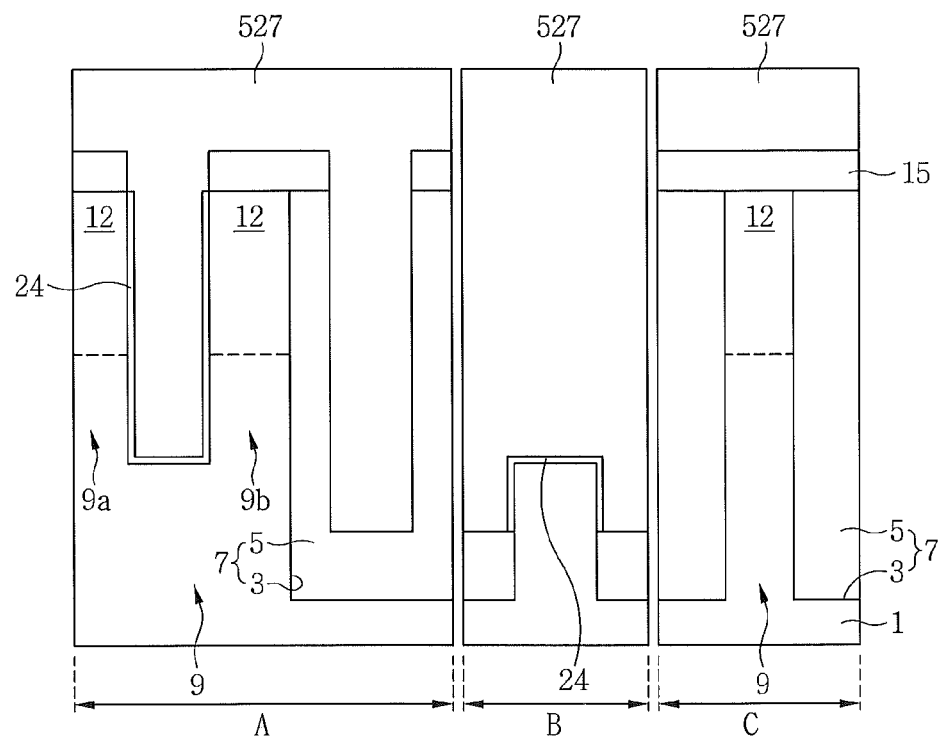
FIGS. 80A through 80E are cross-sectional views illustrating a method of fabricating a semiconductor device according to an embodiment of the inventive concept.

Referring to FIGS. 1, 79, and 80A, as described with reference to FIGS. 73A and 74A through 74D, the gate trench 18 may be formed in the substrate 1 (operation S18), and the gate dielectric 24 may be formed (operation S24). A first gate conductive layer 527 may be formed (operation S527). The first gate conductive layer 527 may be formed on the substrate 1 having the gate dielectric 24.

Figure 80B:
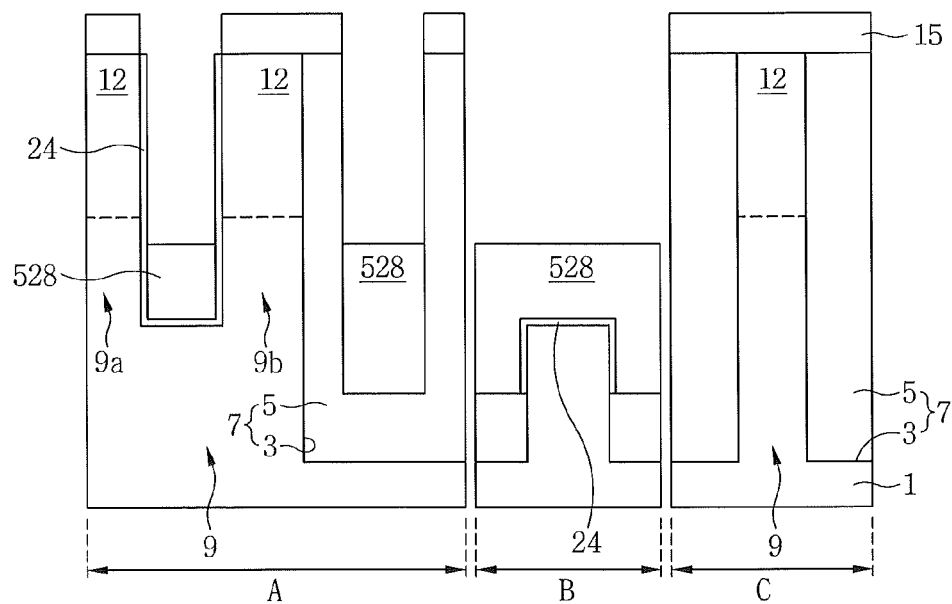

Referring to FIGS. 1, 79, and 80B, the first gate conductive layer 527 may be partially etched to form a first conductive pattern 528 (operation S528).

The first conductive pattern 528 may be formed to partially fill the gate trench 18. The first conductive pattern 528 may be disposed at a lower level than a top surface of the active region 9.

Figure 80C:
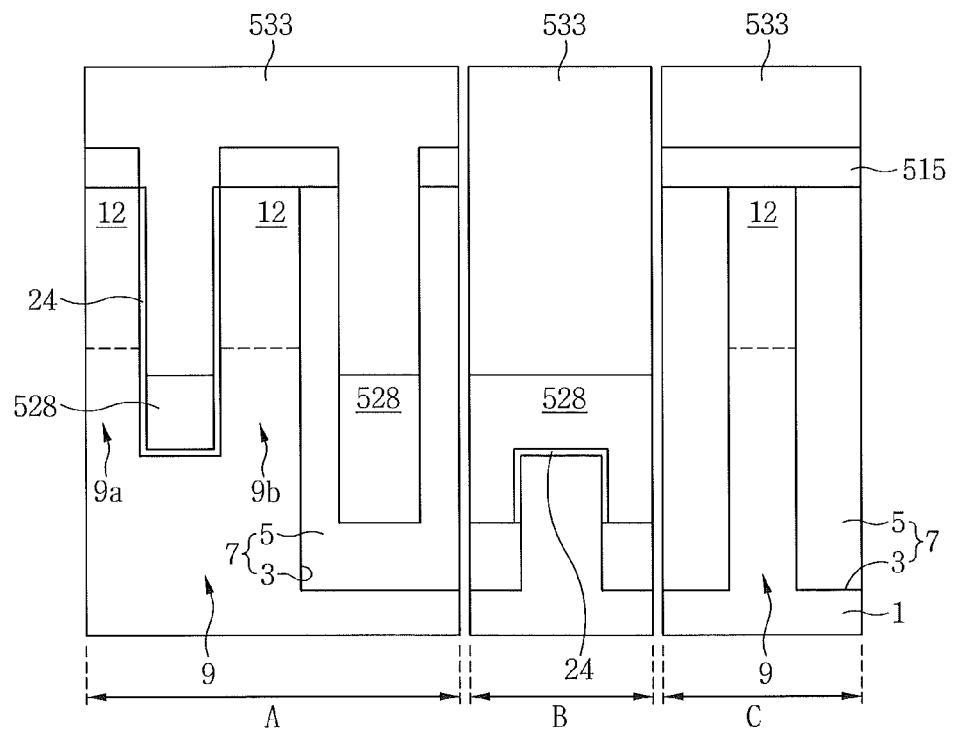

Referring to FIGS. 1, 79, and 80C, a second gate conductive layer 533 having a different work function from the first conductive pattern 528 may be formed (operation S533).

The second gate conductive layer 533 may be formed of a band edge conductive material, and the first conductive pattern 528 may be formed of a mid-gap conductive material. Here, the band edge conductive material may refer to a material having a Fermi energy closer to a valance band or conduction band than the mid-gap energy of the energy band diagram of the active region 9.

Figure 80D:
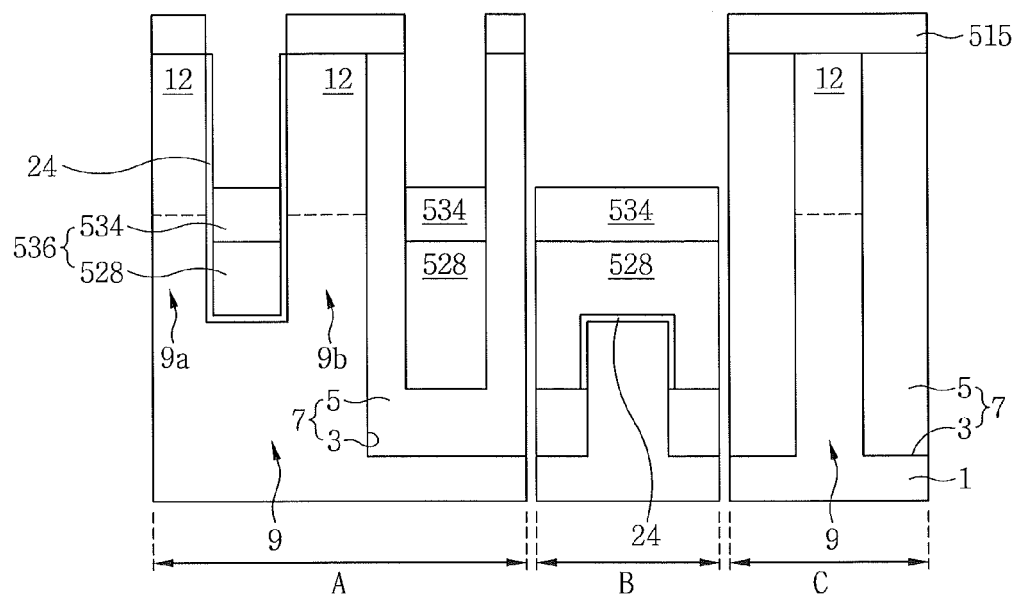

Referring to FIGS. 1, 79, and 80D, the second gate conductive layer 533 may be partially etched to form a second conductive pattern 534 (operation S534). A top surface of the second conductive pattern 534 may horizontally overlap the source/drain region 12.

The second conductive pattern 534 may be disposed at a lower level than a top surface of the active region 9 and formed within the gate trench 18.

Figure 80E:
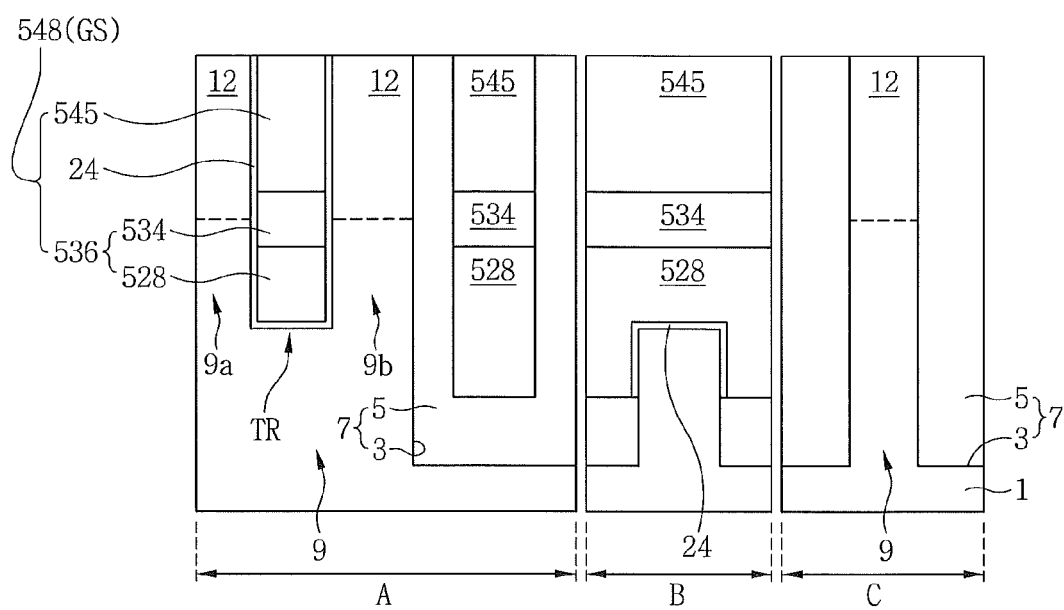

Referring to FIGS. 1, 79, and 80E, a gate capping pattern 545 may be formed (operation S45). The formation of the gate capping pattern 545 may include forming an insulating material layer on a substrate having the second conductive pattern 534 and planarizing the insulating material layer until the active region 9 is exposed.

Next, a method of fabricating a semiconductor device according to an embodiment of the inventive concept will be described with reference to FIGS. 1, 81, and 82A through 82E. In FIGS. 82A through 82E, portion "A" denotes a section taken along line I-I' of FIG. 1, portion "B" denotes a section taken along line II-II' of FIG. 1, and portion "C" denotes a section taken along line III-III' of FIG. 1.

Figure 81:
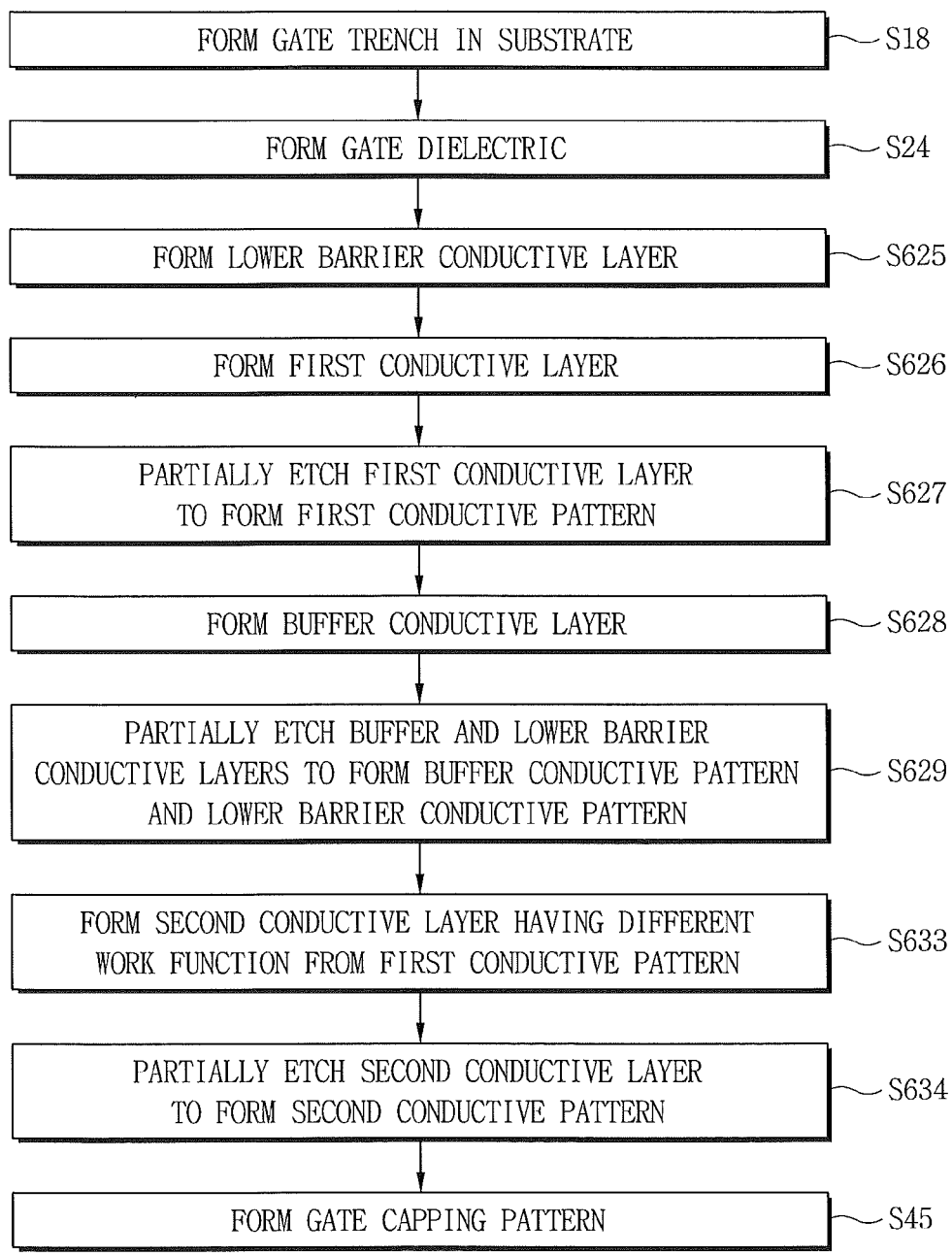
FIG. 81 is a process flowchart illustrating a method of fabricating a semiconductor device according to an embodiment of the inventive concept.
Figure 82A:
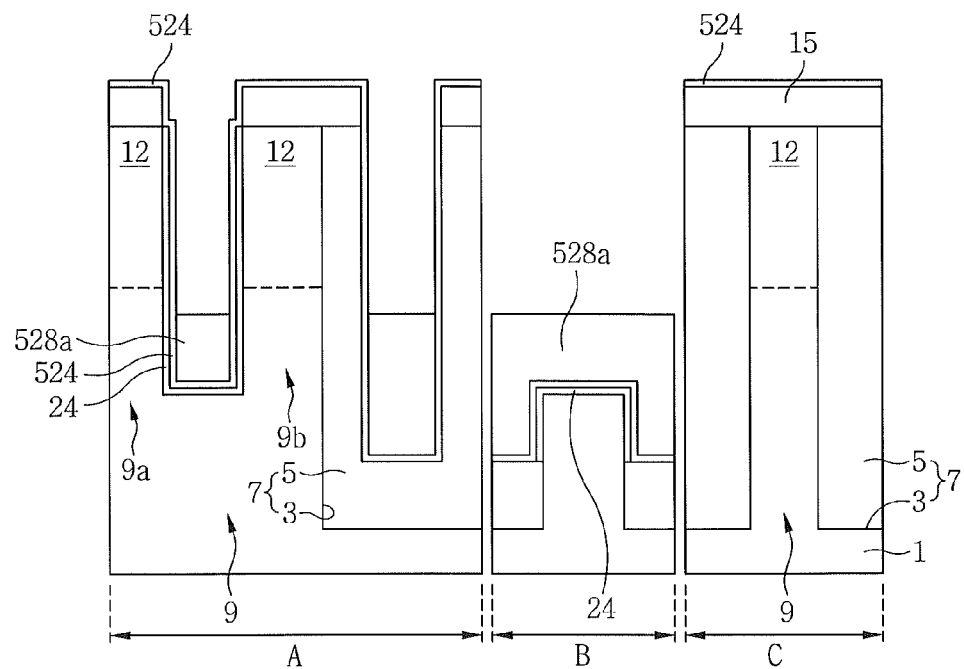
FIGS. 82A through 82E are cross-sectional views illustrating methods of fabricating a semiconductor device according to an embodiment of the inventive concept.

Referring to FIGS. 1, 81, and 82A, as described with reference to FIGS. 74A through 74D, the gate trench 18 may be formed in the substrate 1 (operation S18), and the gate dielectric 24 may be formed (operation S24).

A lower barrier conductive layer 524 may be formed (operation S624). The lower barrier conductive layer 524 may be formed on the substrate 1 having the gate dielectric 24. The lower barrier conductive layer 524 may be a barrier gate conductive layer that may be formed of a metal nitride, such as titanium nitride or tungsten nitride.

A first conductive layer may be formed (operation S626). The first conductive layer may be formed on the substrate 1 having the lower barrier conductive layer 524 to fill the gate trench 18.

The first conductive layer may be formed of a metal having a lower resistivity than the lower barrier conductive layer 524.

For example, the first conductive layer may be formed of a metal, such as W or a Ti—Al alloy.

The first conductive layer may be partially etched, thereby forming a first conductive pattern 528 (operation S627). The first conductive pattern 528 may be formed on the lower barrier conductive layer 524 to partially fill the gate trench 18.

Figure 82B:
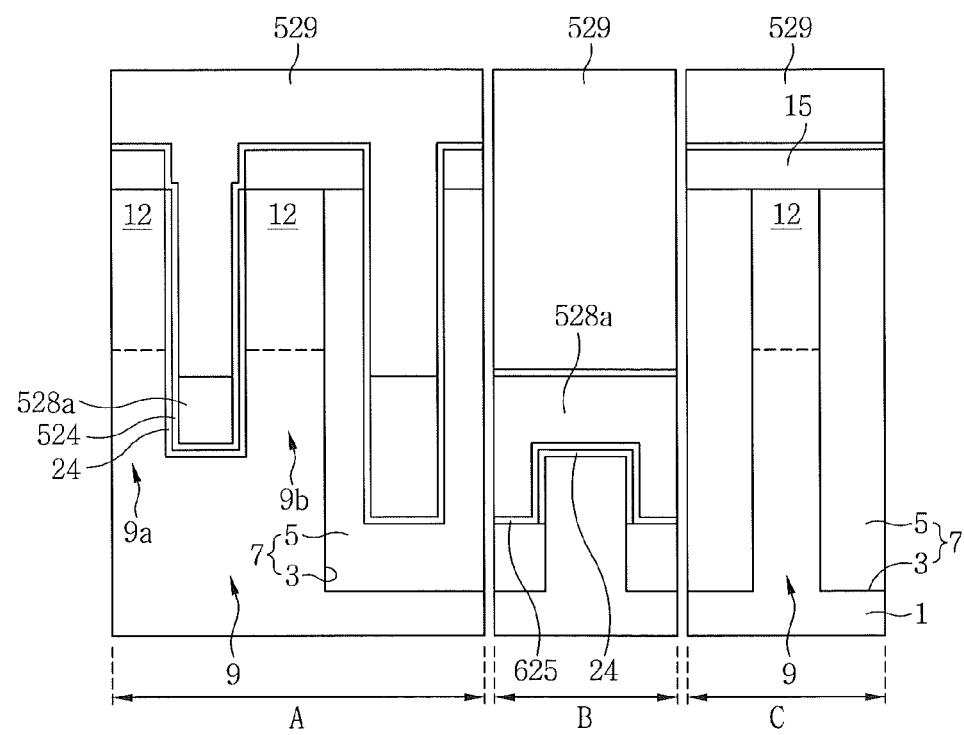

Referring to FIGS. 1, 81, and 82B, a buffer conductive layer 529 may be formed (operation S628). The buffer conductive layer 529 may be formed on the substrate 1 having the first conductive pattern 528.

The buffer conductive layer 528 may be formed on the substrate 1 having the first conductive pattern 528 to form an unfilled portion of the gate trench 18, which is disposed on the first conductive pattern 528.

Figure 82C:
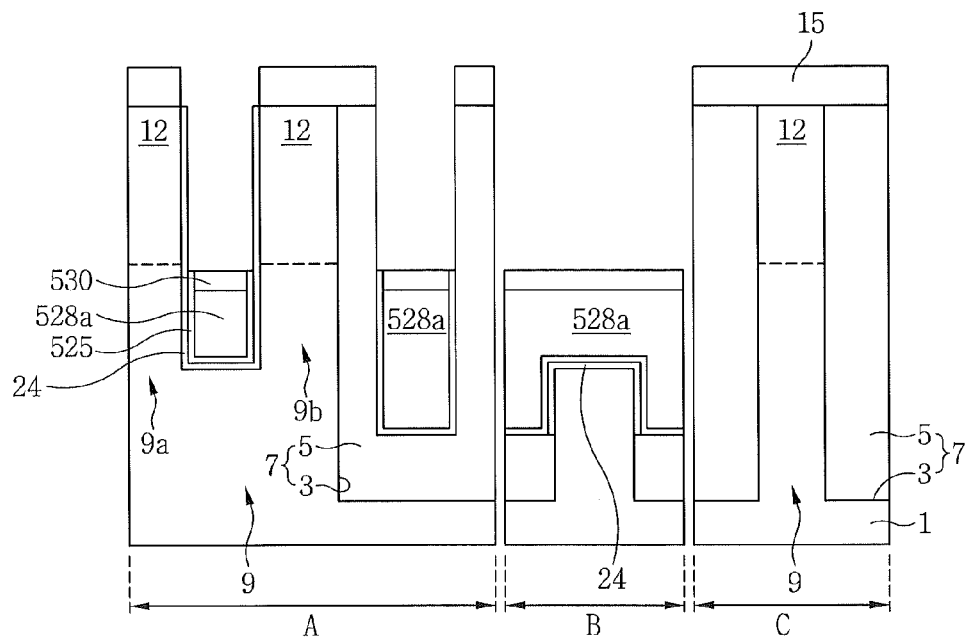

Referring to FIGS. 1, 81, and 82C, the buffer and lower barrier conductive layers 524 and 529 may be partially etched to form a buffer conductive pattern 530 and a lower barrier conductive pattern 525, respectively (operation S629).

In some embodiments, the lower barrier conductive pattern 525 and the buffer conductive pattern 530 may be formed of different material layers. For instance, the lower barrier conductive pattern 525 may be formed of titanium nitride, and the buffer conductive pattern 530 may be formed of tungsten nitride.

The partial etching of the buffer and lower barrier conductive layers 524 and 529 may include partially etching the buffer conductive layer 529 to form the buffer conductive pattern 530 and etching the lower barrier conductive layer 524. In another case, the buffer and lower barrier conductive layers 524 and 529 may be partially etched at the same time.

In another embodiment, the buffer and lower barrier conductive layers 524 and 529 may be formed of the same material. For example, the buffer and lower barrier conductive layers 524 and 529 may be formed of titanium nitride or tungsten nitride. The buffer and lower barrier conductive layers 524 and 529 may be partially etched at the same time.

Figure 82D:
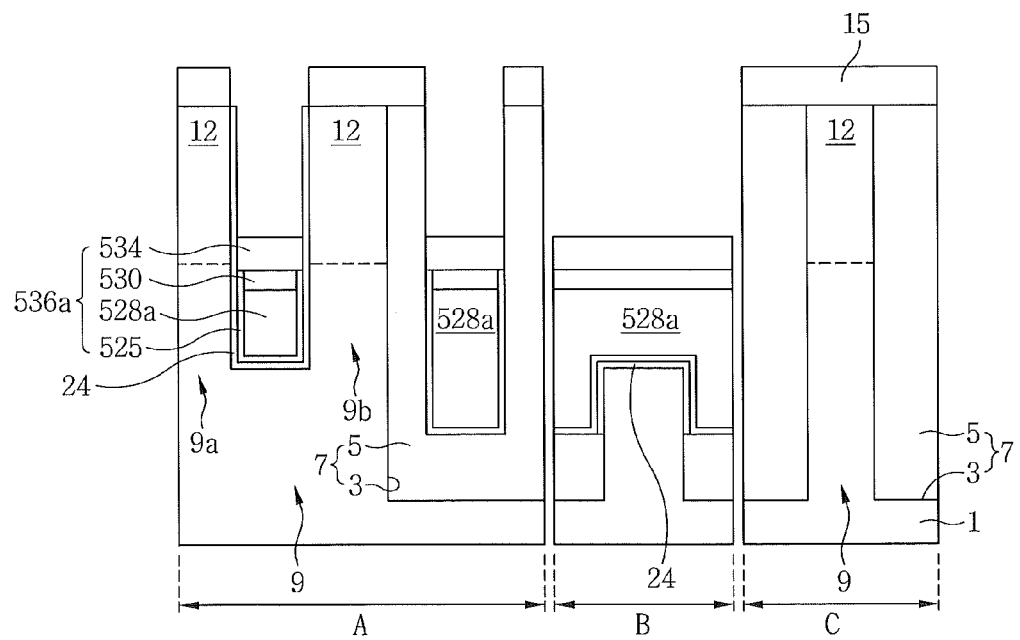

Referring to FIGS. 1, 81, and 82D, a second conductive layer having a different work function from the first conductive pattern 528 may be formed (operation S633). The second conductive layer may be formed to fill a portion of the gate trench 18 disposed on the first conductive pattern 528. The first conductive pattern 528 may be formed of a mid-gap conductive material, while the upper gate conductive layer may be formed of a band edge conductive material.

The second conductive layer may be partially etched to form a second conductive pattern 534 (operation S634).

The lower barrier conductive pattern 525, the first conductive pattern 528, the buffer conductive pattern 530, and the second conductive pattern 534 may constitute a gate electrode 536.

Figure 82E:
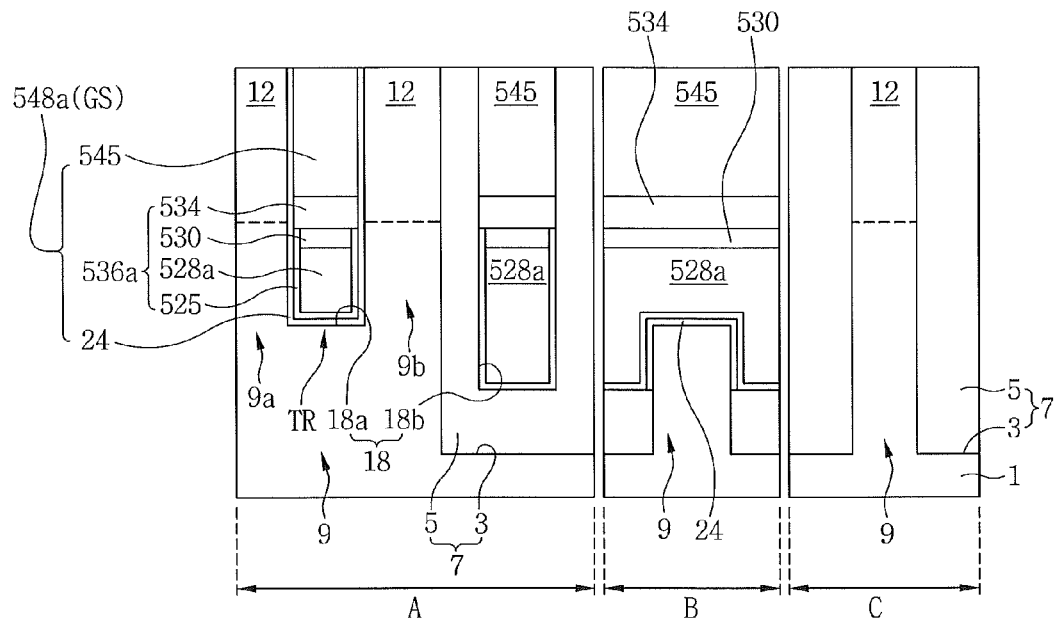

Referring to FIGS. 1, 81, and 82E, an insulating gate capping pattern 545 may be formed (operation S45). The formation of the gate capping pattern 545 may include forming an insulating material layer on the substrate 1 having the second conductive pattern 534 and planarizing the insulating material layer until the active region 9 is exposed. Accordingly, the gate structure 548*a* (GS) described with reference to FIG. 16 may be formed.

Figure 83A:
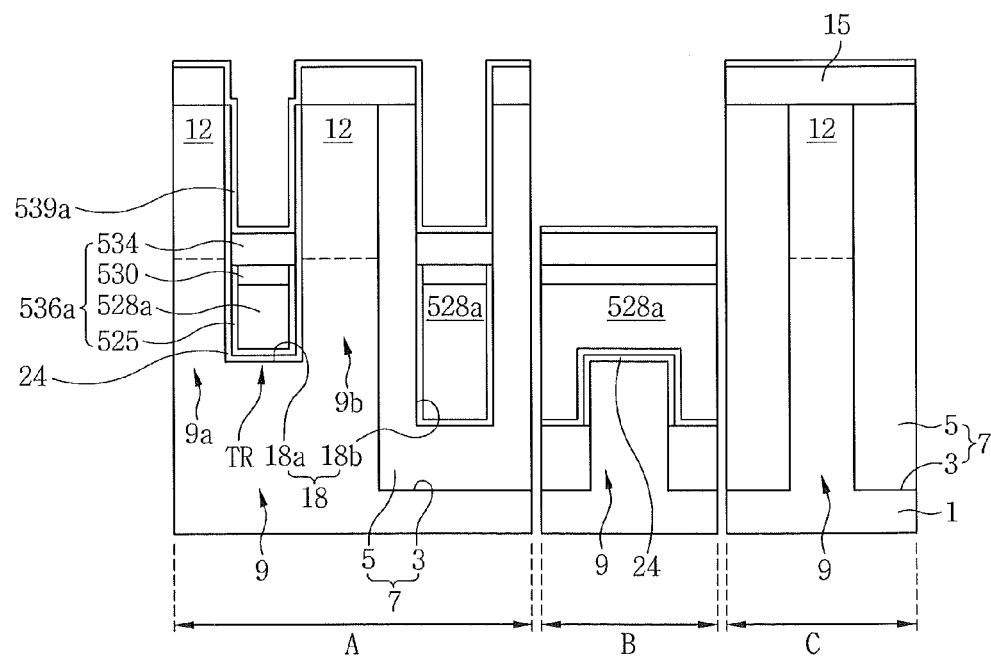
FIGS. 83A and 83B are cross-sectional views illustrating methods of fabricating a semiconductor device according to an embodiment of the inventive concept.
Figure 83B:
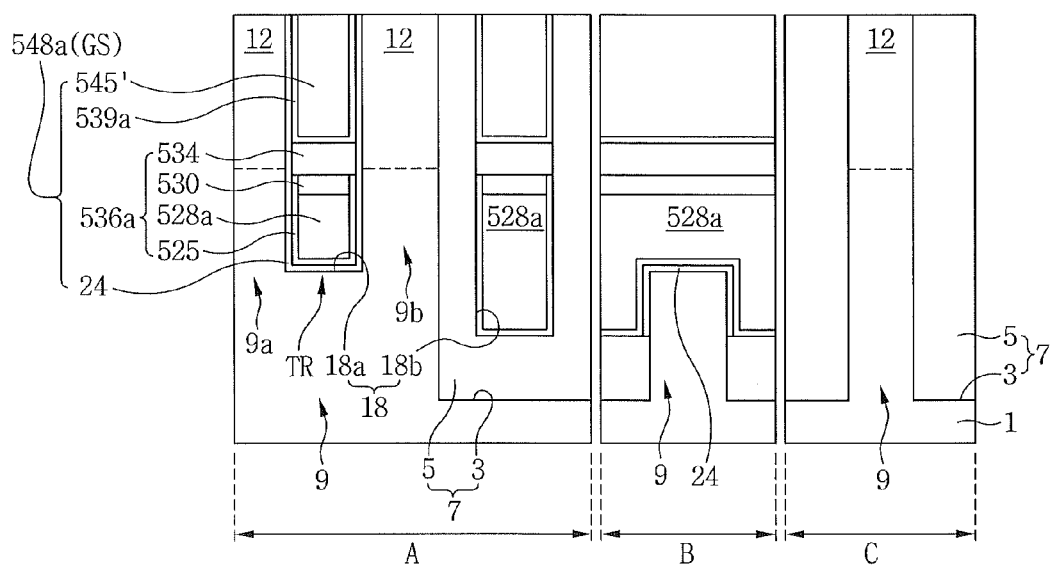

Next, a method of fabricating a semiconductor device according to an embodiment of the inventive concept will be described with reference to FIGS. 1, 83A, and 83B. In FIGS. 83A and 83B, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 83A, a substrate 1 having the gate electrode 536*a* described with reference to FIGS. 82A through 82D may be prepared. A metal-containing material layer 539*a* may be formed on the substrate 1 having the gate electrode 536. The metal-containing material layer 539*a* may be conformally formed on the substrate 1 having the gate electrode 536. The metal-containing material layer 539*a* may be formed using an ALD process.

As described with reference to FIG. 3, the metal-containing material layer 539*a* may be formed of a dielectric material containing a metal having a Fermi energy close to a level of either one of the valance band or conductive band of the energy band diagram of the active region 9.

Figure 84A:
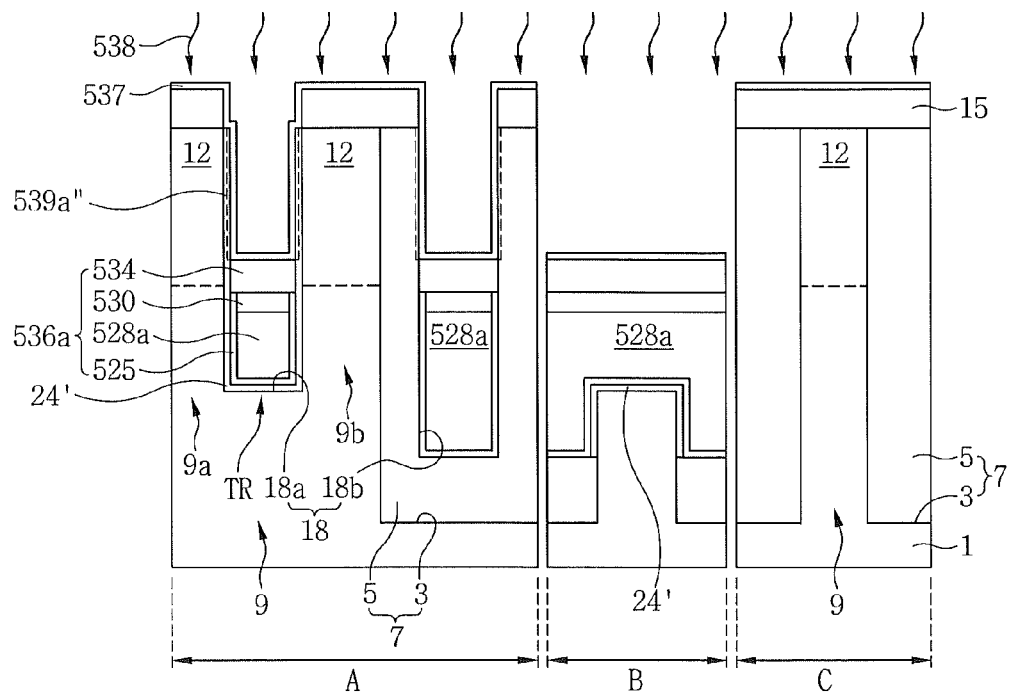
FIGS. 84A and 84B are cross-sectional views illustrating methods of fabricating a semiconductor device according to an embodiment of the inventive concept.
Figure 84B:
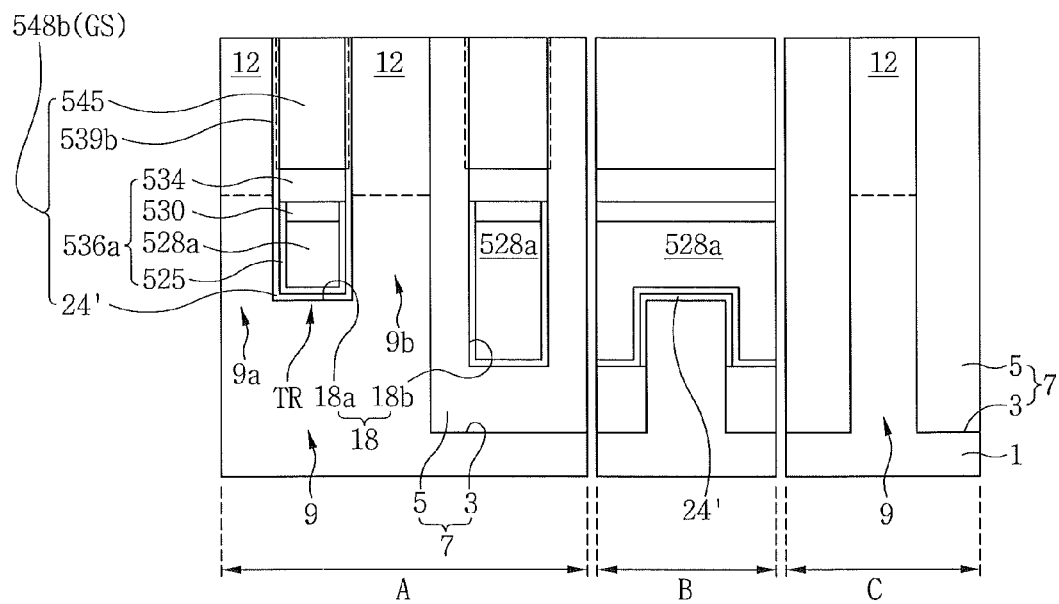

Referring to FIGS. 1 and 83B, an insulating material layer may be formed on the substrate 1 having the metal-containing material layer 539*a* and planarized until the active region 9 is exposed, thereby forming a gate capping pattern 545'. Next, a method of fabricating a semiconductor device according to an embodiment of the inventive concept will be described with reference to FIGS. 1, 84A, and 84B. In FIGS. 84A and 84B, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 84A, a substrate 1 having the gate electrode 536*a* described with reference to FIGS. 82A through 82D may be prepared. A metal source layer 537 may be formed on the substrate 1 having the gate electrode 536*a*. The metal source layer 537 may be conformally formed on the substrate 1 having the gate electrode 536*a*.

An annealing process 539 may be performed on the substrate 1 having the metal source layer 537. Due to the annealing process 538, a metal may diffuse from the metal source layer 537 into the gate dielectric 24. The gate dielectric 24 including the metal may be defined as a metal-containing material layer 539*a*". The annealing process 538 and the metal-containing material layer 539*b* may be substantially the same as the annealing process 138 and the metal-containing material layer 139*a* described with reference to FIG. 76A.

Referring to FIG. 84B, an unreacted metal source layer 537 may be removed as described with reference to FIG. 76B. Subsequently, an insulating material layer may be formed on the substrate 1 having the metal-containing material layer 539*a*" and planarized until the active region 9 is exposed, thereby forming a gate capping pattern 545.

Next, a method of fabricating a semiconductor device according to an embodiment of the inventive concept will be described with reference to FIGS. 1, 85, 86A through 86C. In FIGS. 86A through 86C, portion "A" denotes a section taken along line I-I' of FIG. 1, portion "B" denotes a section taken along line II-II' of FIG. 1, and portion "C" denotes a section taken along line III-III' of FIG. 1.

Figure 85:
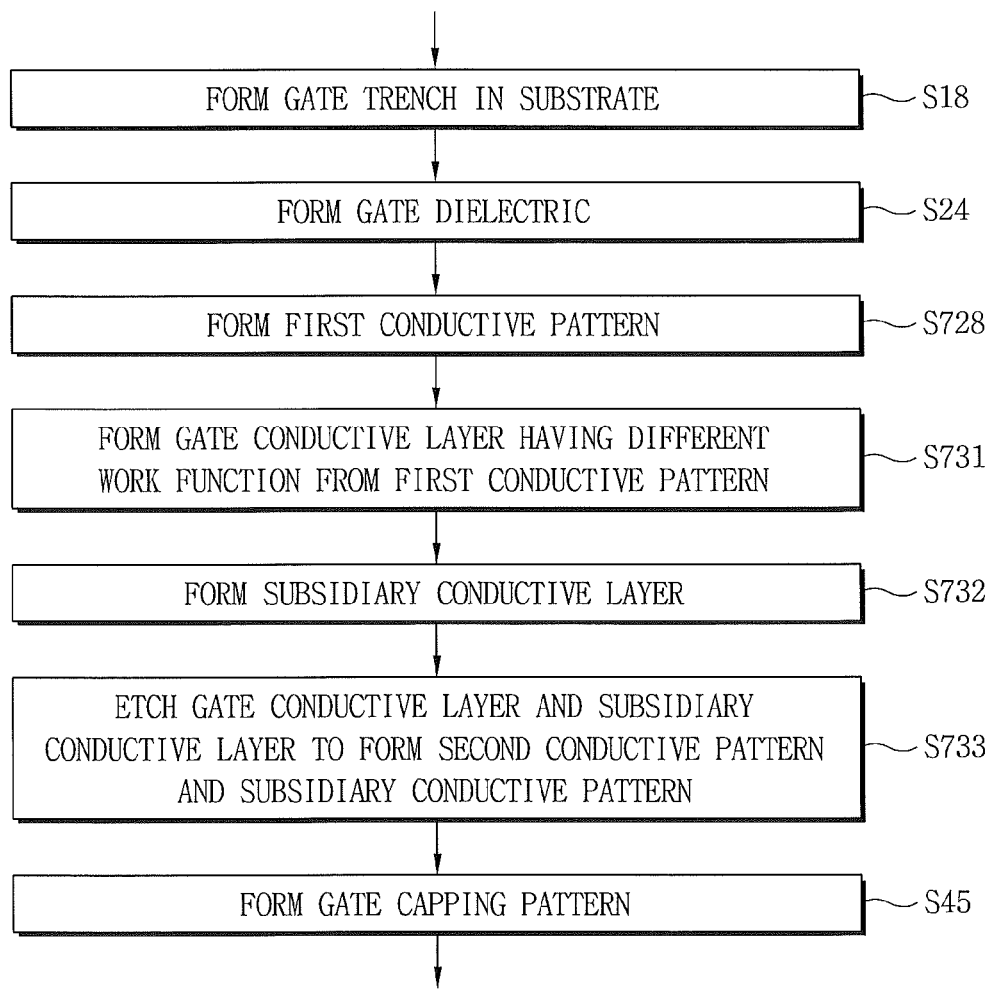
FIG. 85 is a process flowchart illustrating a method of fabricating a semiconductor device according to an embodiment of the inventive concept.
Figure 86A:
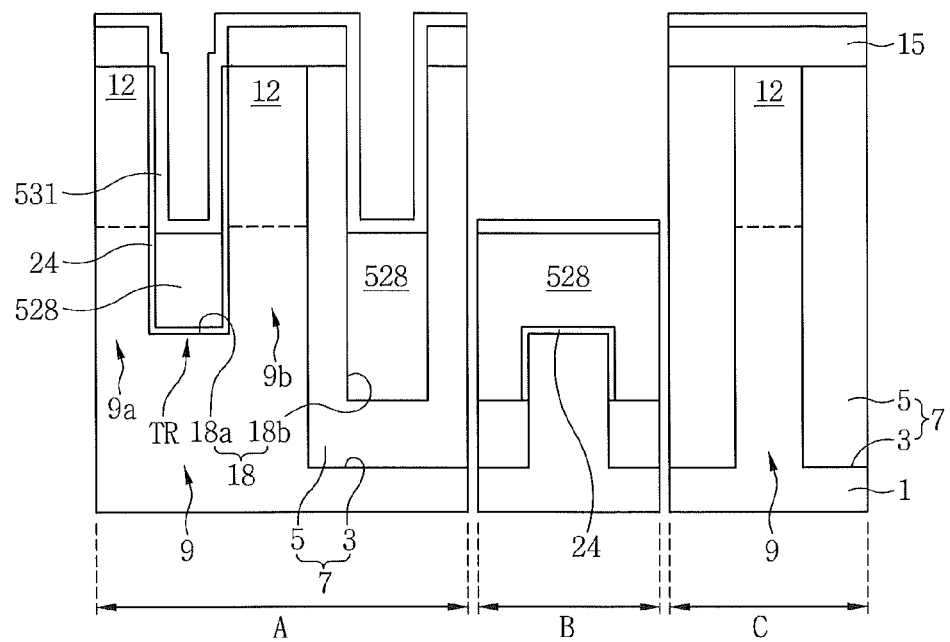
FIGS. 86A through 86C are cross-sectional views illustrating methods of fabricating a semiconductor device according to an embodiment of the inventive concept.
Figure 86B:
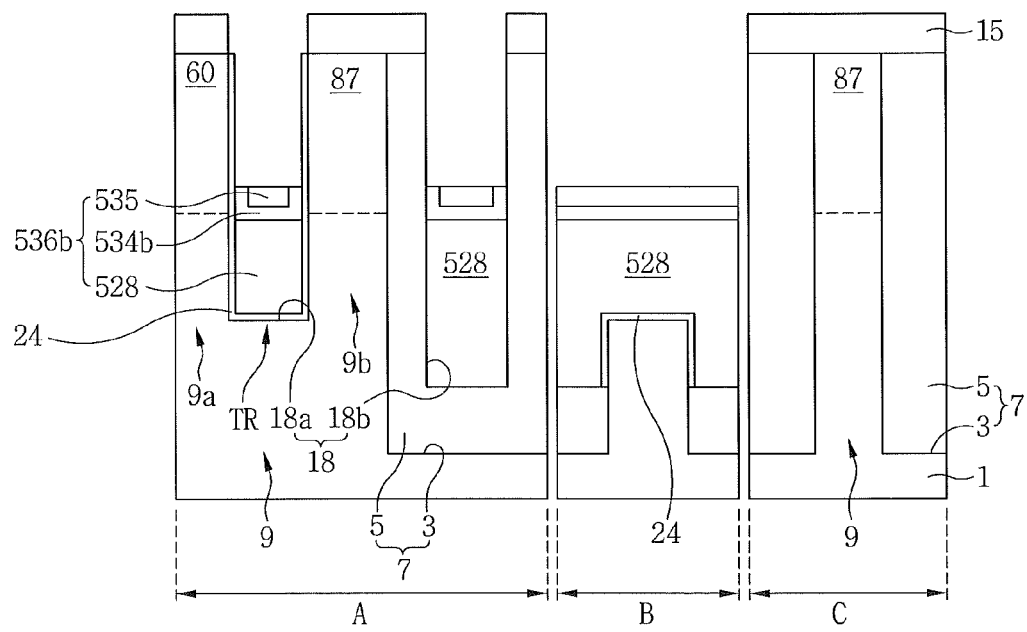
Figure 86C:
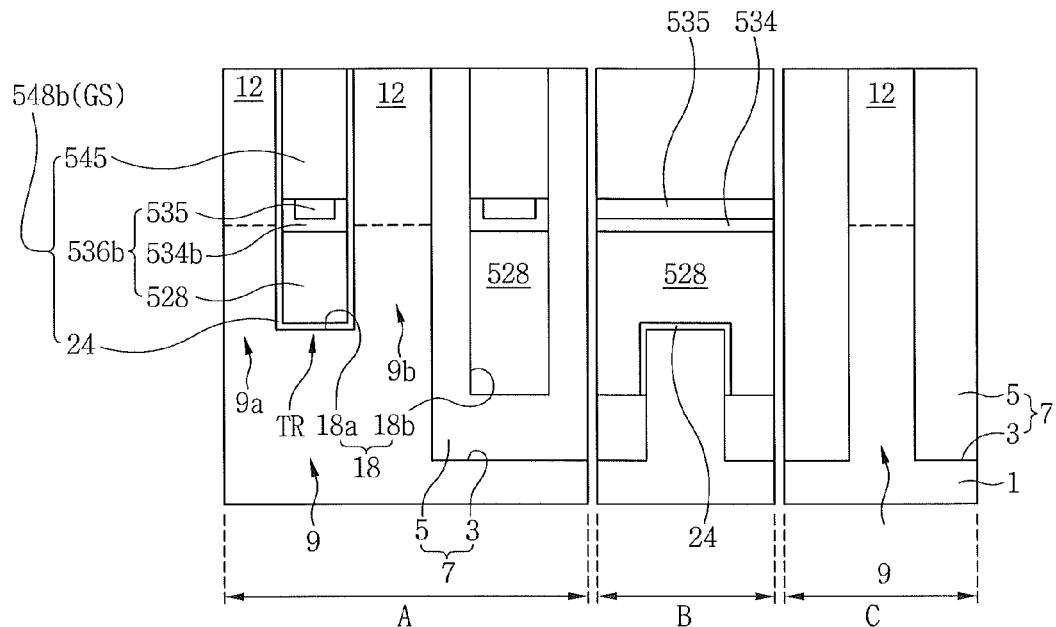

Referring to FIGS. 1, 85, and 86A, as described with reference to FIGS. 73A through 73D, the gate trench 18 may be formed in the substrate 1 (operation S18), and the gate dielectric 24 may be formed (operation S24).

A first conductive pattern 528 may be formed (operation S728). The first conductive pattern 528 may be formed to partially fill the gate trench 18. The first conductive pattern 528 may be formed of a single layer or a double layer. A gate conductive layer 531 having a different work function from the first conductive pattern 528 may be formed (operation S731). The gate conductive layer 531 may be conformally formed on the substrate 1 having the first conductive pattern 528.

Referring to FIGS. 1, 85, and 86B, a subsidiary conductive layer may be formed (operation S732). The subsidiary conductive layer may be formed on the substrate 1 having the gate conductive layer 531. The gate conductive layer 531 and the subsidiary conductive layer may be etched to form a second conductive pattern 534b and a subsidiary conductive pattern 535 (operation S733). The second conductive pattern 534b may be formed to side and bottom surfaces of the subsidiary conductive pattern 535. Accordingly, a gate electrode 536b described with reference to FIG. 18 may be formed.

Referring to FIGS. 1, 85, and 86C, a gate capping pattern 545 may be formed (operation S45). The formation of the gate capping pattern 545 may include forming an insulating material layer on the substrate 1 having the gate electrode 536b and planarizing the insulating material layer until the active region 9 is exposed.

Figure 87:
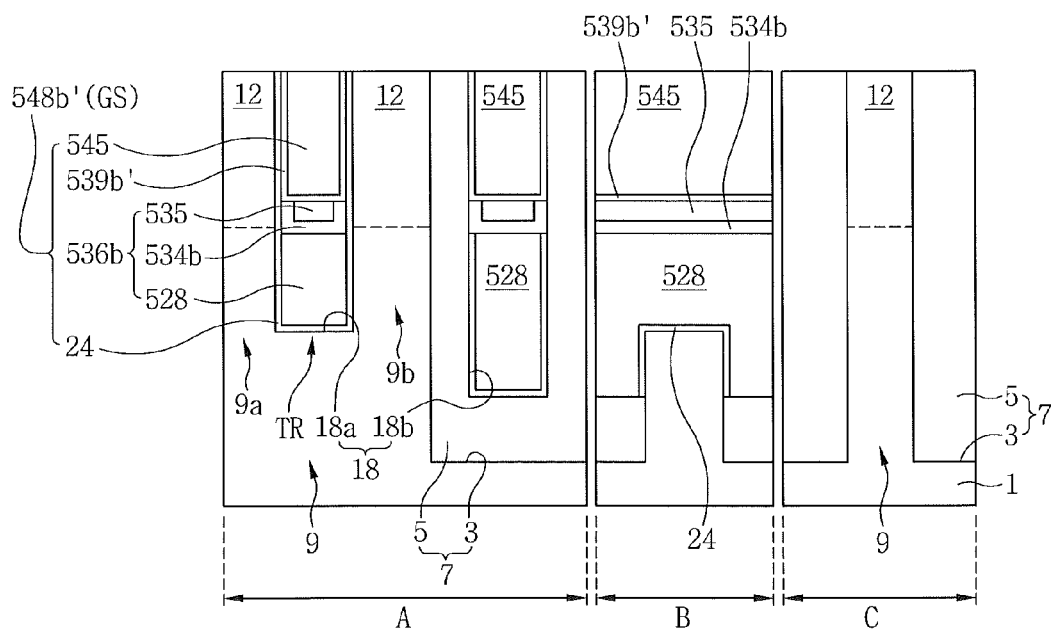
FIGS. 87 and 88 are cross-sectional views respectively illustrating methods of fabricating a semiconductor device according to an embodiment of the inventive concept.

Next, a method of fabricating a semiconductor device according to an embodiment of the inventive concept will be described with reference to FIGS. 1 and 87. In FIG. 87, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 87, a substrate 1 having the gate electrode 536b may be prepared as described with reference to FIGS. 86A and 86B. A metal-containing material layer 539b' may be formed on the substrate 1 having the gate electrode 536b. The metal-containing material layer 539b' may be conformally formed on the substrate 1 having the gate electrode 536b. As described with reference to FIG. 3, the metal-containing material layer 539b may be formed of a metal having a Fermi energy close to either one of the valance band and conduction band of the energy band diagram of the active region 9. An insulating material layer may be formed on the substrate 1 having the metal-containing material layer 539b' and planarized until the active region 9 is exposed, thereby forming a gate capping pattern 545'.

Figure 88:
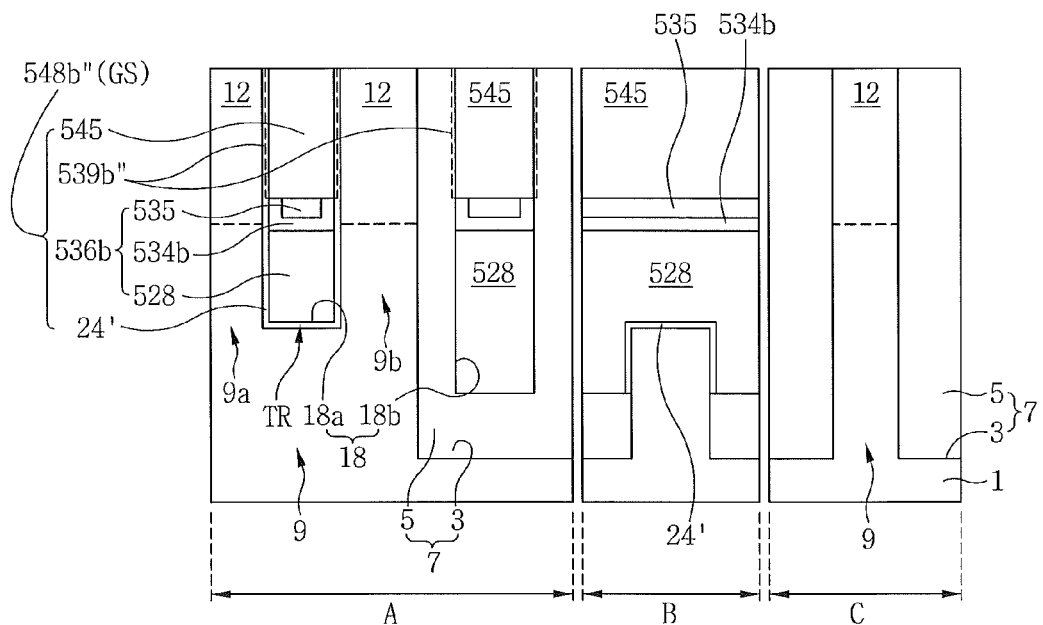

Next, a method of fabricating a semiconductor device according to an embodiment of the inventive concept will be described with reference to FIGS. 1 and 88. In FIG. 88, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 88, a substrate 1 having the gate electrode 536b may be prepared as described with reference to FIGS. 86A and 86B. A metal source layer may be formed on the substrate 1 having the gate electrode 536b. An annealing process may be performed to diffuse a metal from the metal source layer into the gate dielectric 24, thereby forming a metal-containing material layer 539b". The formation of the metal-containing material layer 539b" may be substantially the same as the process of forming the metal-containing material layer 139a described with reference to FIG. 76A. Thereafter, an unreacted metal source layer may be removed. An insulating material layer may be formed on the substrate 1 having the metal-containing material layer 539b" and planarized until the active region 9 is exposed, thereby forming a gate capping pattern 545.

Figure 89A:
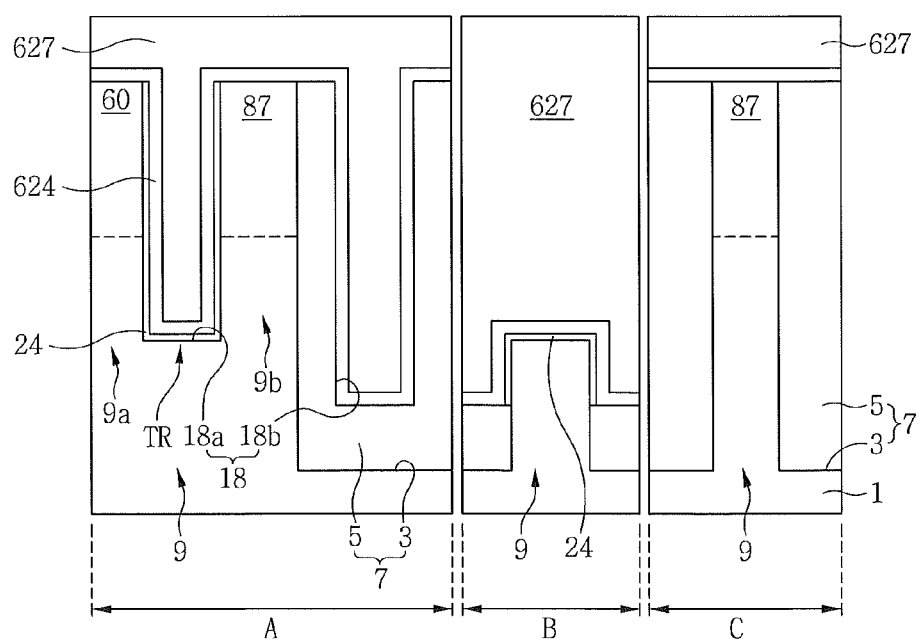
FIGS. 89A through 89E are cross-sectional views illustrating a method of fabricating a semiconductor device according to an embodiment of the inventive concept.
Figure 89B:
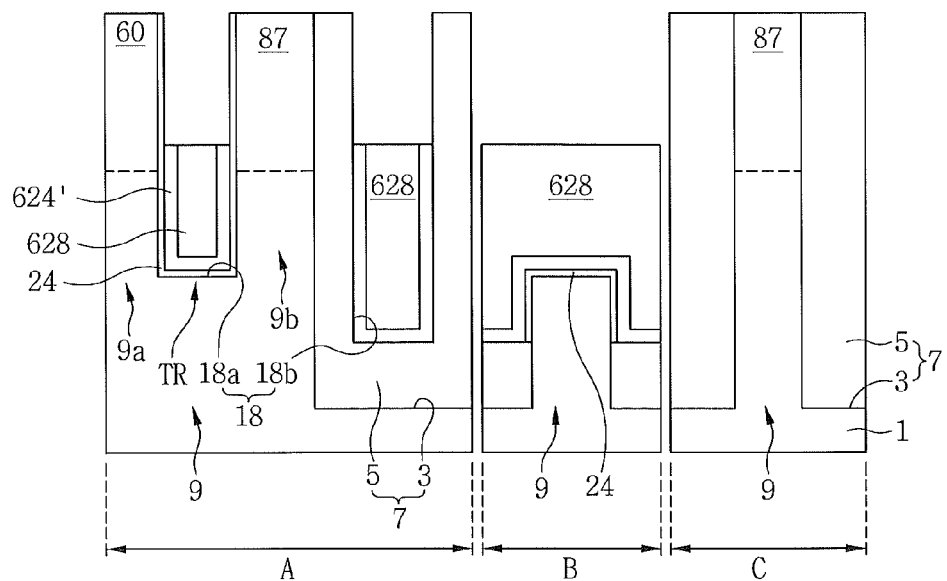
Figure 89C:
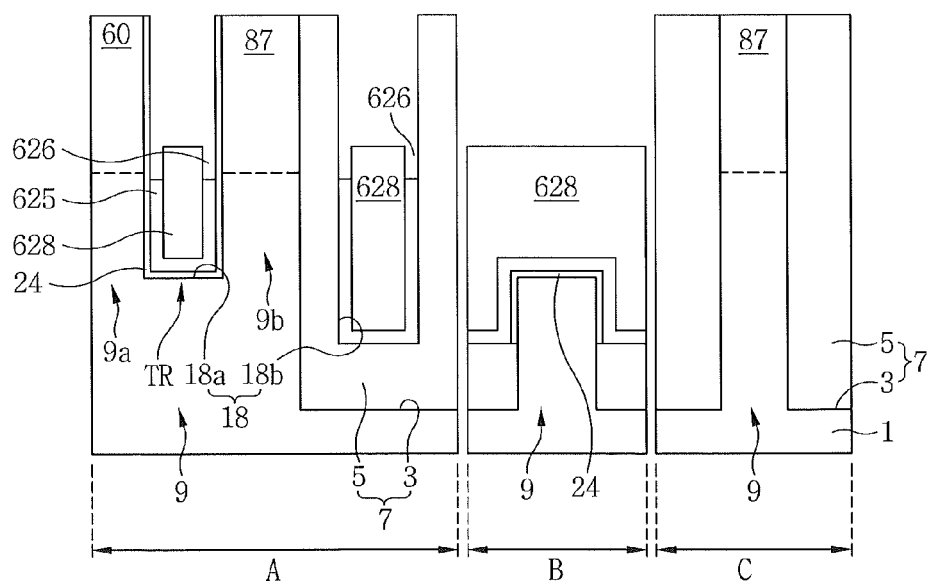

Next, a method of fabricating a semiconductor device according to an embodiment of the inventive concept will be described with reference to FIGS. 1 and 89A through 89E. In FIGS. 89A through 89C, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 89A, as described with reference to FIGS. 74A through 74D, the gate trench 18 may be formed in the substrate 1 (operation S18), and the gate dielectric 24 may be formed. A lower barrier conductive layer 624 may be conformally formed on the substrate having the gate dielectric 24. A gate conductive layer 627 may be formed on the lower barrier conductive layer 624. The lower barrier conductive layer 624 may be formed of a metal nitride, and the gate conductive layer 627 may be formed of a metal (e.g., tungsten) having a Fermi energy corresponding to the mid-gap energy of the energy band diagram of the active region 9 as described with reference to FIG. 14.

Referring to FIGS. 1 and 89B, the lower barrier conductive layer 624 and the gate conductive layer 627 may be etched, thereby forming a preliminary lower barrier conductive pattern 625 and a first conductive pattern 628, respectively. The preliminary lower barrier conductive pattern 624' may cover bottom and side surfaces of the first conductive pattern 628.

Referring to FIGS. 1 and 89C, the preliminary lower barrier conductive pattern 624' may be partially etched to form a lower barrier conductive pattern 625. Accordingly, a top end portion of the first conductive pattern 628 may be disposed at a higher level than the lower barrier conductive pattern 625. The preliminary lower barrier conductive pattern 624' may be partially etched to form a vacant space 626. An upper side surface of the first conductive pattern 628 may be exposed by the vacant space 626.

Figure 89D:
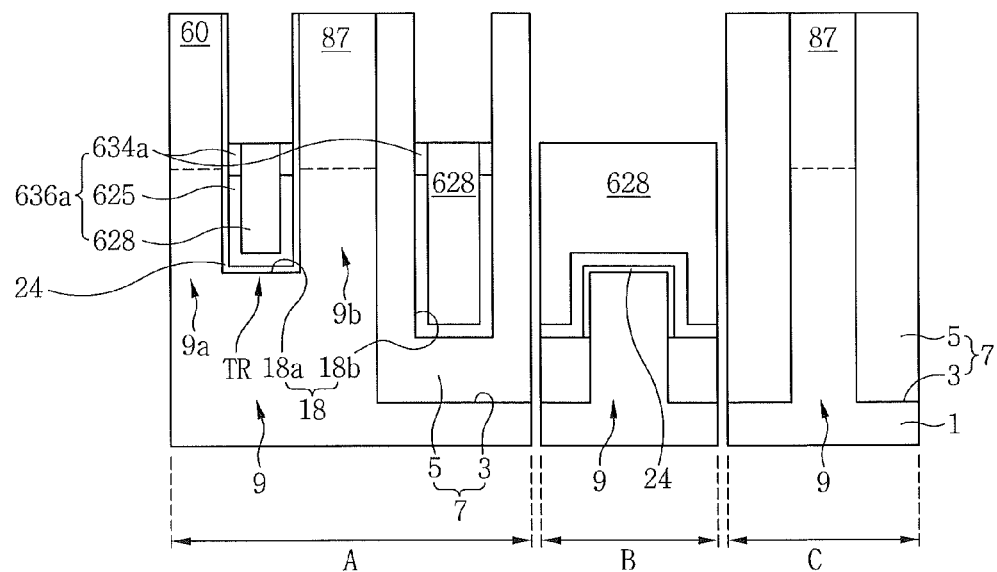

Referring to FIGS. 1 and 89D, a second conductive pattern 634 may be formed to fill the vacant space 626 formed by partially etching the preliminary lower barrier conductive pattern 624'. The formation of the second conductive pattern 634 may include forming an upper gate conductive layer on the substrate 1 having the vacant space 626 and etching the upper gate conductive layer so that the upper gate conductive layer remains within the vacant space 626.

The second conductive pattern 634 may be formed of a material having a Fermi energy close to an energy band edge of the active region 9. For instance, when the transistor TR is an NMOS transistor, the second conductive pattern 634 may be formed of a conductive material (e.g., a La-containing conductive material or N-type poly-Si) having a Fermi energy $E_{Fn}$ close to a conduction band Ec of the active region 9 as described with reference to FIG. 15A. When the transistor TR is a PMOS transistor, the second conductive pattern 634 may be formed of a conductive material (e.g., a conductive material containing aluminum, tantalum or iridium, or P-type poly-Si) having the Fermi energy $E_{Fp}$ close to the valance band Ev of the active region 9 as described with reference to FIG. 15B. Accordingly, a gate electrode 636a described with reference to FIG. 20 may be formed.

In some embodiments, to form a gate electrode 636b shown in FIG. 22, an upper barrier conductive layer may be formed before forming the second conductive pattern 634.

Figure 89E:
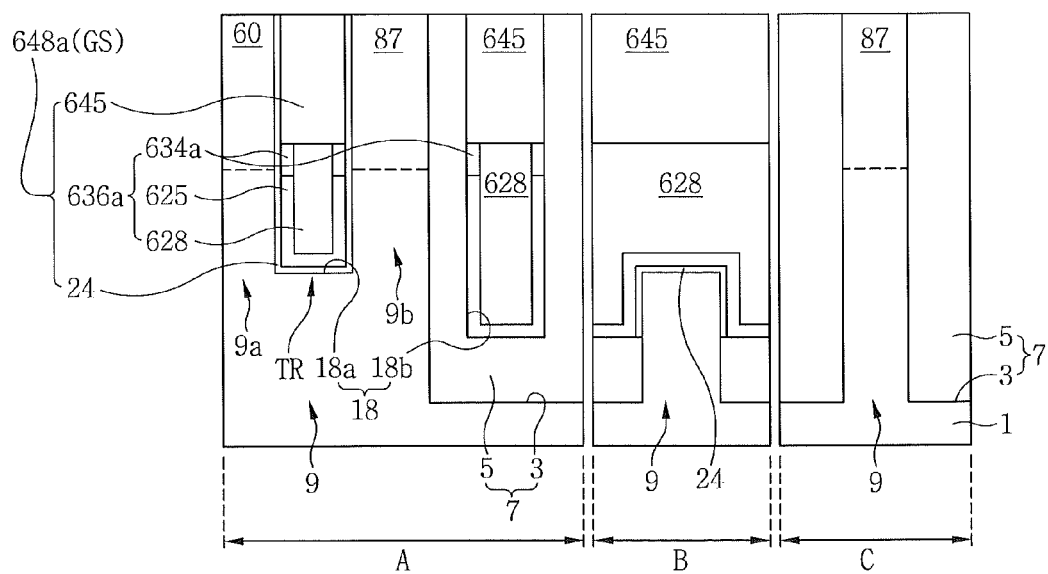

Referring to FIGS. 1 and 89E, an insulating material layer may be formed on the substrate 1 having the second conductive pattern 634, and planarized until the active region 9 is exposed, thereby forming a gate capping pattern 645.

In some embodiments, before forming the gate capping pattern 645, a process of forming a metal-containing material layer may be performed to form gate structures 648a' and 648a" described with reference to FIGS. 21A and 21B. Since the process of forming the metal-containing material layer is described in detail above with reference to FIGS. 74G and 78A, a detailed description thereof will be omitted.

Figure 90A:
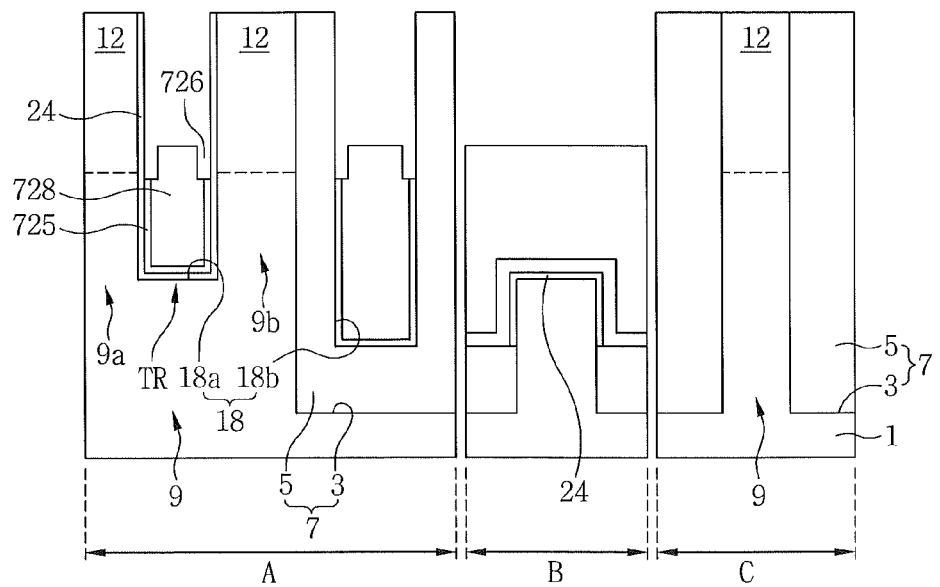
FIGS. 90A and 90B are cross-sectional views illustrating a method of fabricating a semiconductor device according to an embodiment of the inventive concept.
Figure 90B:
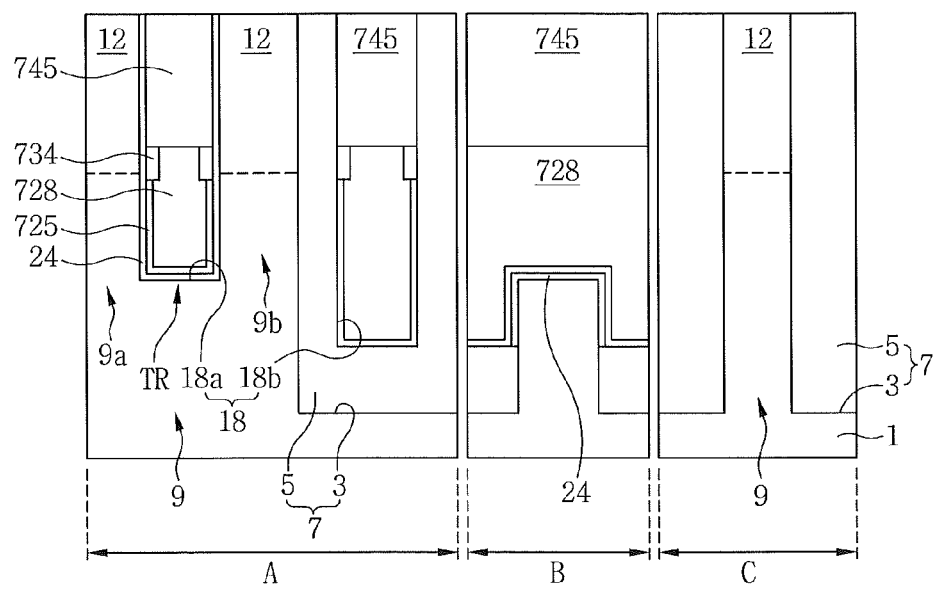

Next, a method of fabricating a semiconductor device according to an embodiment of the inventive concept will be described with reference to FIGS. 1, 90A, and 90B. In FIGS. 90A and 90B, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 90A, as described with reference to FIGS. 74A through 74D, the gate trench 18 may be formed in the substrate 1 (operation S18), and the gate dielectric 24 may be formed. A lower barrier conductive layer may be conformally formed on the substrate having the gate dielectric 24. A gate conductive layer 627 may be formed on the lower barrier conductive layer. The lower barrier conductive layer and the gate conductive layer may be etched to form a lower barrier conductive pattern 725 and a first conductive pattern 728, respectively.

The formation of the lower barrier conductive pattern 725 and the first conductive pattern 728 may include simultaneously etching the lower barrier conductive layer and the gate conductive layer using a primary etching process, and etching the lower barrier conductive layer using a secondary etching process having a higher etch rate with respect to the lower barrier conductive layer than with respect to the gate conductive layer. During the secondary etching process, the lower barrier conductive layer may be etched to etch a portion of the gate conductive layer, thereby forming a vacant space 726. The primary etching process and the secondary etching process may be sequentially performed.

A horizontal width of the vacant space 726 may be greater than a horizontal width or thickness of the lower barrier conductive pattern 725. Accordingly, due to the vacant space 726, the first conductive pattern 728 may have an upper region having a smaller width than a lower region thereof.

A second conductive pattern 734 filling the vacant space 726 may be formed with reference to FIG. 90B. The lower barrier conductive pattern 725, the first conductive pattern 728, and the second conductive pattern 734 may constitute the gate electrode 736a described with reference to FIG. 24.

In some embodiments, to form the gate electrode 736b shown in FIG. 26, an upper barrier conductive layer may be formed before forming the second conductive pattern 734.

An insulating material layer may be formed on the substrate 1 having the second conductive pattern 734 and planarized until the active region 9 is exposed, thereby forming a gate capping pattern 745. Accordingly, a gate structure 748a (GS) described with reference to FIG. 24 may be formed.

In some embodiments, before forming the gate capping pattern 745, a process of forming a metal-containing material layer may be performed to form gate structures 748a' and 748a" described with reference to FIGS. 25A and 25B. Since the process of forming the metal-containing material layer is described in detail above with reference to FIGS. 74G and 78A, a detailed description thereof will be omitted.

Next, a method of fabricating a semiconductor device according to an embodiment of the inventive concept will be described with reference to FIGS. 1, 91, and 92A through 92C. In FIGS. 92A through 92C, portion "A" denotes a section taken along line I-I' of FIG. 1, portion "B" denotes a section taken along line II-II' of FIG. 1, and portion "C" denotes a section taken along line III-III' of FIG. 1.

Figure 91:
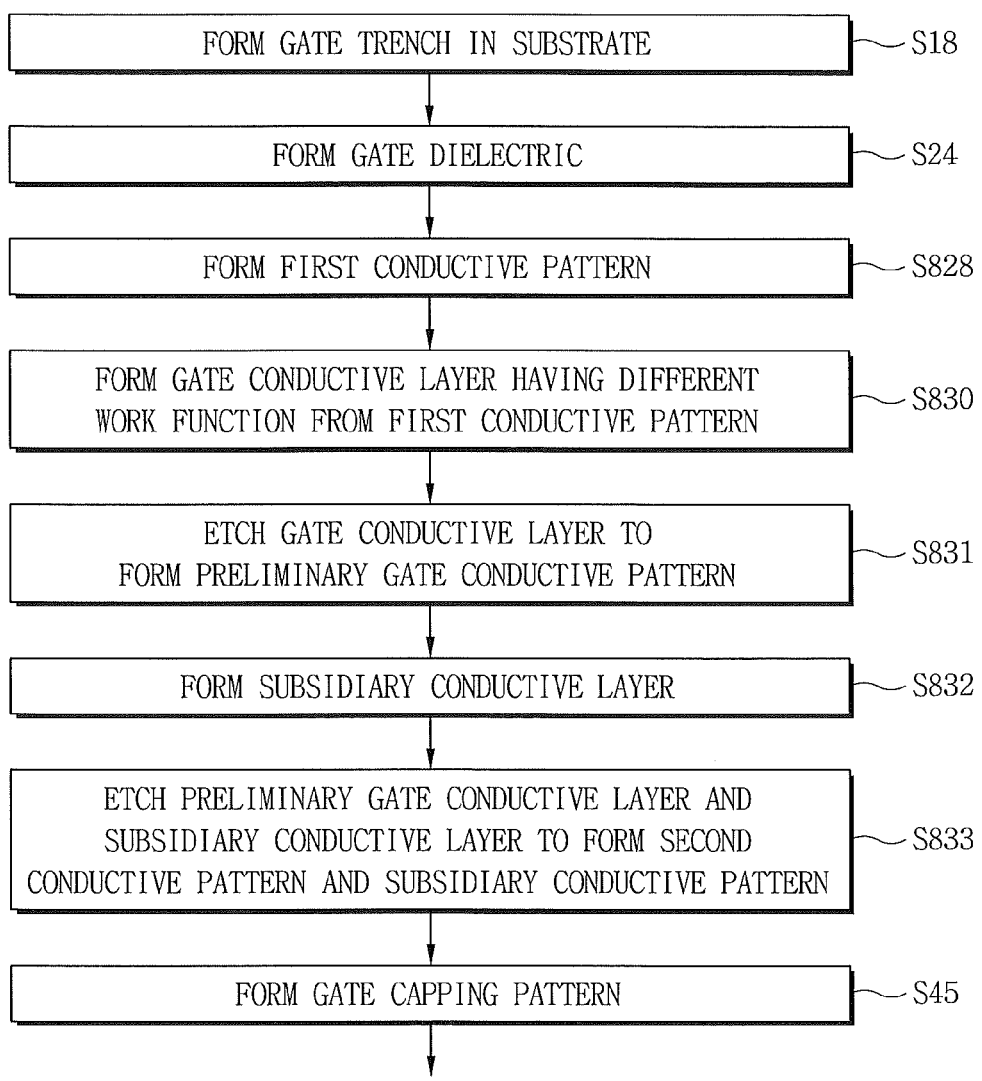
FIG. 91 is a process flowchart illustrating a method of fabricating a semiconductor device according to an embodiment of the inventive concept.
Figure 92A:
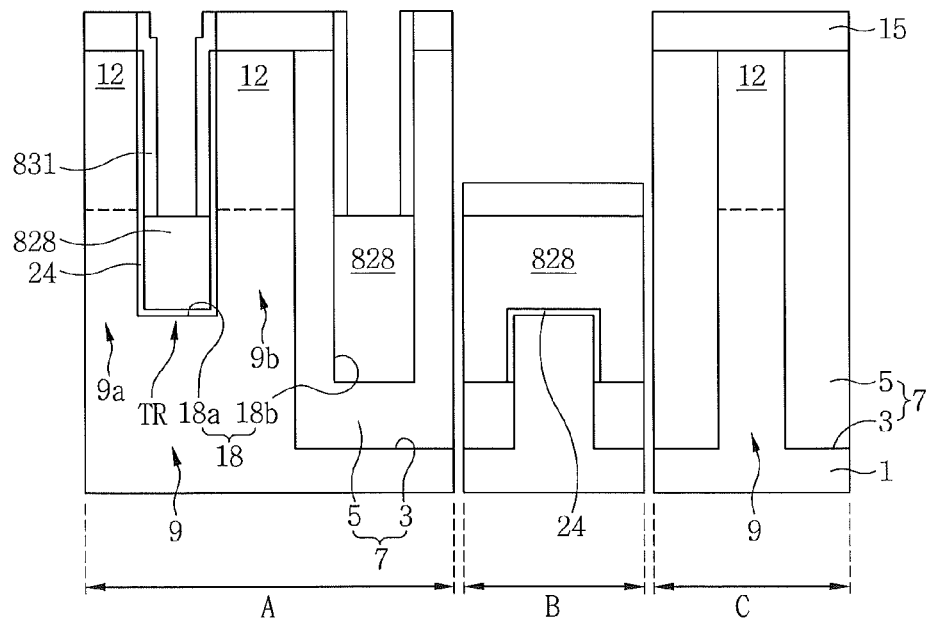
FIGS. 92A through 92C are cross-sectional views illustrating methods of fabricating a semiconductor device according to an embodiment of the inventive concept.
Figure 92B:
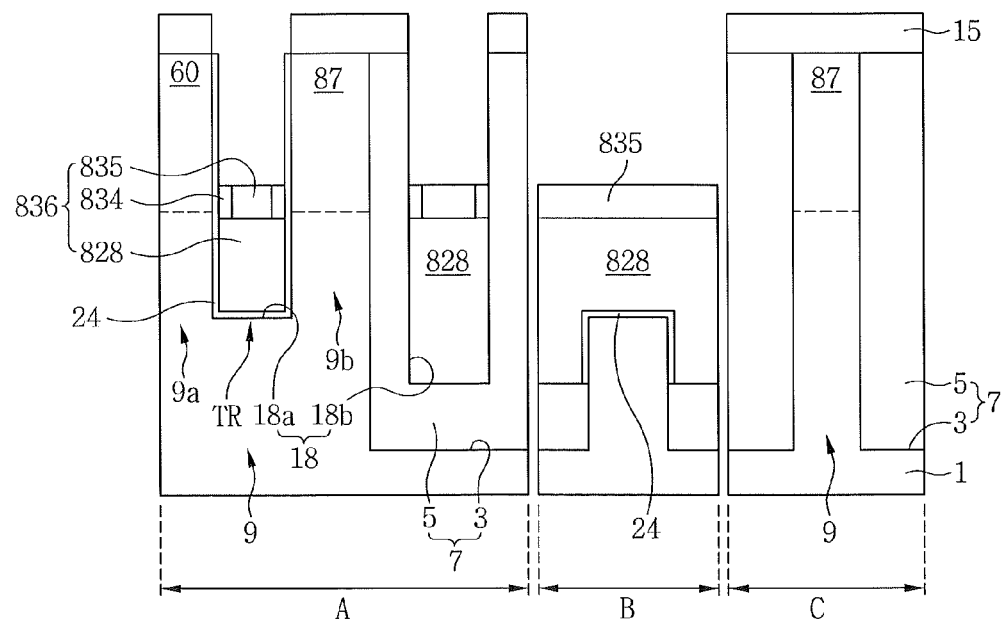
Figure 92C:
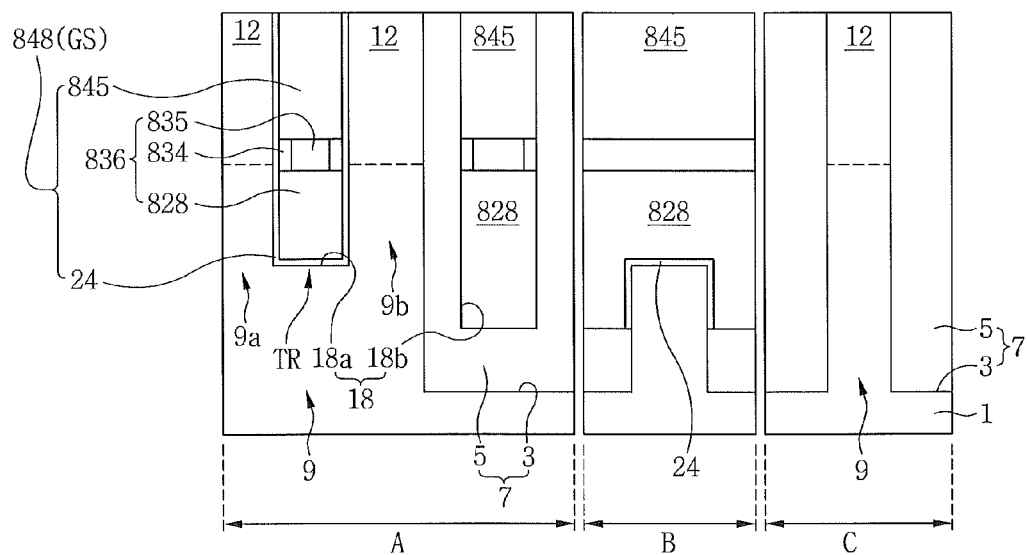

Referring to FIGS. 1, 91, and 92A, as described with reference to FIGS. 74A through 74D, the gate trench 18 may be formed in the substrate 1 (operation S18), and the gate dielectric 24 may be formed (operation S24). A first conductive pattern 828 may be formed (operation S828), and the first conductive pattern 828 may be formed to partially fill the gate trench 18. The first conductive pattern 828 may include a single layer or a multiple layer. A gate conductive layer having a different work function from the first conductive pattern 828 may be formed (operation S830). The gate conductive layer may be etched to form a preliminary gate conductive pattern 831 (operation S831). The preliminary gate conductive pattern 831 may be formed by anisotropically etching the gate conductive layer. Accordingly, the preliminary gate conductive pattern 831 may be formed on a sidewall of the gate trench 18 of the preliminary gate pattern 831.

Referring to FIGS. 1, 91, and 92B, a subsidiary conductive layer may be formed (operation S832). The subsidiary conductive layer may be formed on the substrate 1 having the preliminary gate conductive pattern 831.

The preliminary gate conductive pattern 831 and the subsidiary conductive layer may be etched to form a second conductive pattern 834 and a subsidiary conductive pattern 835 (operation S833). The second conductive pattern 834 may be formed between the subsidiary conductive pattern 835 and the active region 9. Accordingly, a gate electrode 836 described with reference to FIG. 28 may be formed.

Figure 93:
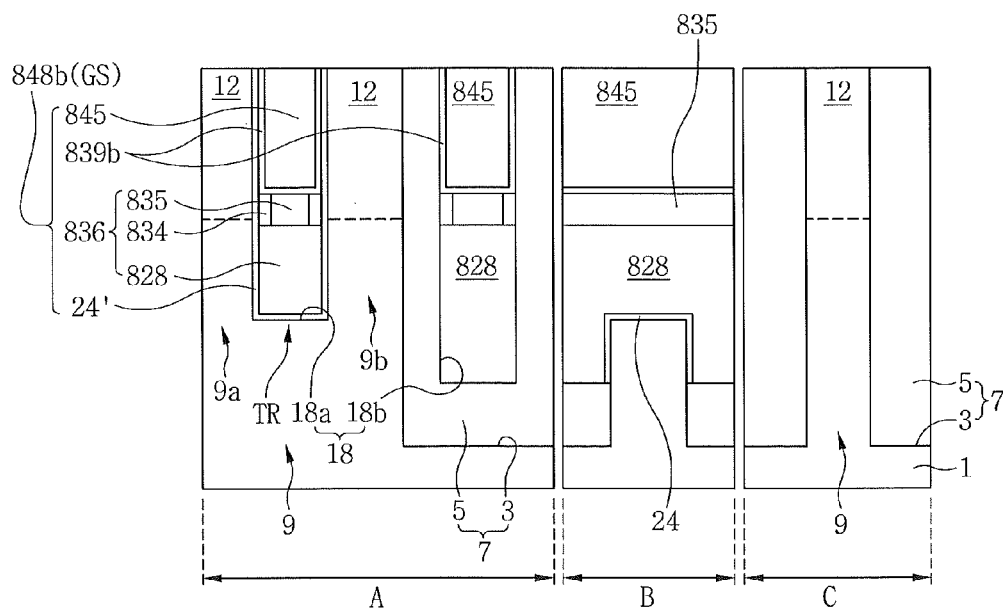
FIGS. 93 and 94 are cross-sectional views respectively illustrating methods of fabricating a semiconductor device according to an embodiment of the inventive concept.

Referring to FIGS. 1, 91, and 92C, a gate capping pattern 845 may be formed (operation S45). The formation of the gate capping pattern 845 may include forming an insulating material layer on the substrate 1 having the gate electrode 836 and planarizing the insulating material layer until the active region 9 is exposed. Next, a method of fabricating a semiconductor device according to an embodiment of the inventive concept will be described with reference to FIGS. 1 and 93. In FIG. 93, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 93, a substrate 1 having the gate electrode 836 may be prepared as described with reference to FIGS. 92A and 92B. A metal-containing material layer 839a may be formed on the substrate 1 having the gate electrode 836. The metal-containing material layer 839a may be conformally formed on the substrate 1 having the gate electrode 836. As described with reference to FIG. 3, the metal-containing material layer 839a may be formed of a dielectric material including a metal having a Fermi energy close to either one of the valance band and conduction band of the energy band diagram of the active region 9.

An insulating material layer may be formed on the substrate 1 having the metal-containing material layer 839a and planarized until the active region 9 is exposed, thereby forming a gate capping pattern 845'.

Figure 94:
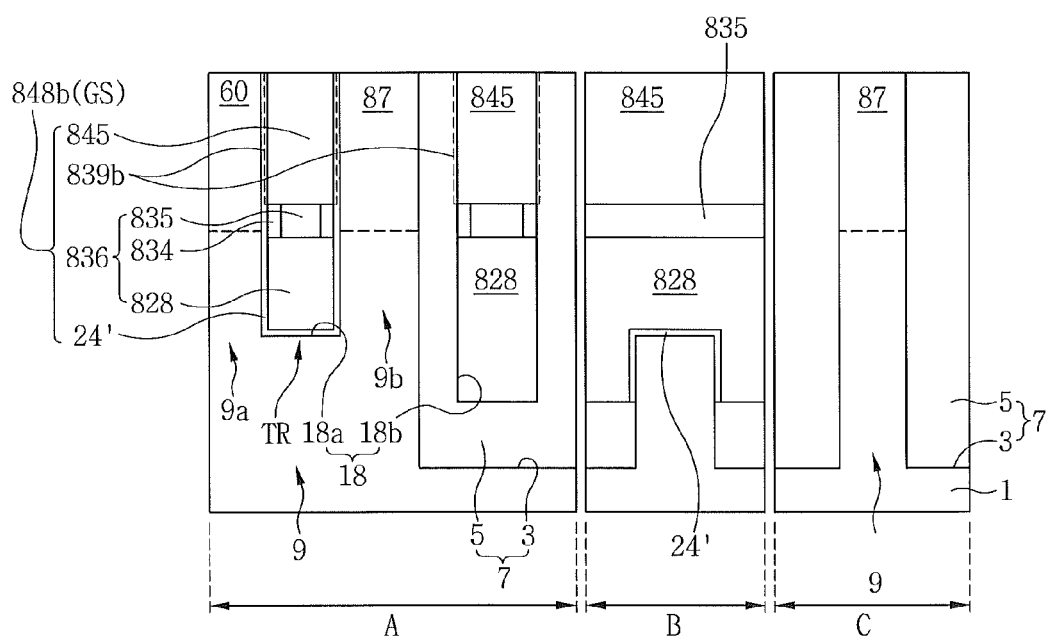

Next, a method of fabricating a semiconductor device according to an embodiment of the inventive concept will be described with reference to FIGS. 1 and 94. In FIG. 94, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 94, a substrate 1 having the gate electrode 836 described with reference to FIGS. 92A and 92B may be prepared.

A metal source layer may be formed on the substrate 1 having the gate electrode 836.

An annealing process may be performed to diffuse a metal from the metal source layer into the gate dielectric 24, thereby forming a metal-containing material layer 839b. A process of forming the metal-containing material layer 839b may be substantially the same as the process of forming the metal-containing material layer 139a described with reference to FIG. 76A.

Thereafter, an unreacted metal source layer may be removed. An insulating material layer may be formed on the substrate 1 having the metal-containing material layer 839b and planarized until the active region 9 is exposed, thereby forming a gate capping pattern 845.

Next, a method of fabricating a semiconductor device according to an embodiment of the inventive concept will be described with reference to FIGS. 1, 95, and 96A through 96F. In FIGS. 96A through 96F, portion "A" denotes a section taken along line I-I' of FIG. 1, portion "B" denotes a section taken along line II-II' of FIG. 1, and portion "C" denotes a section taken along line III-III' of FIG. 1.

Figure 95:
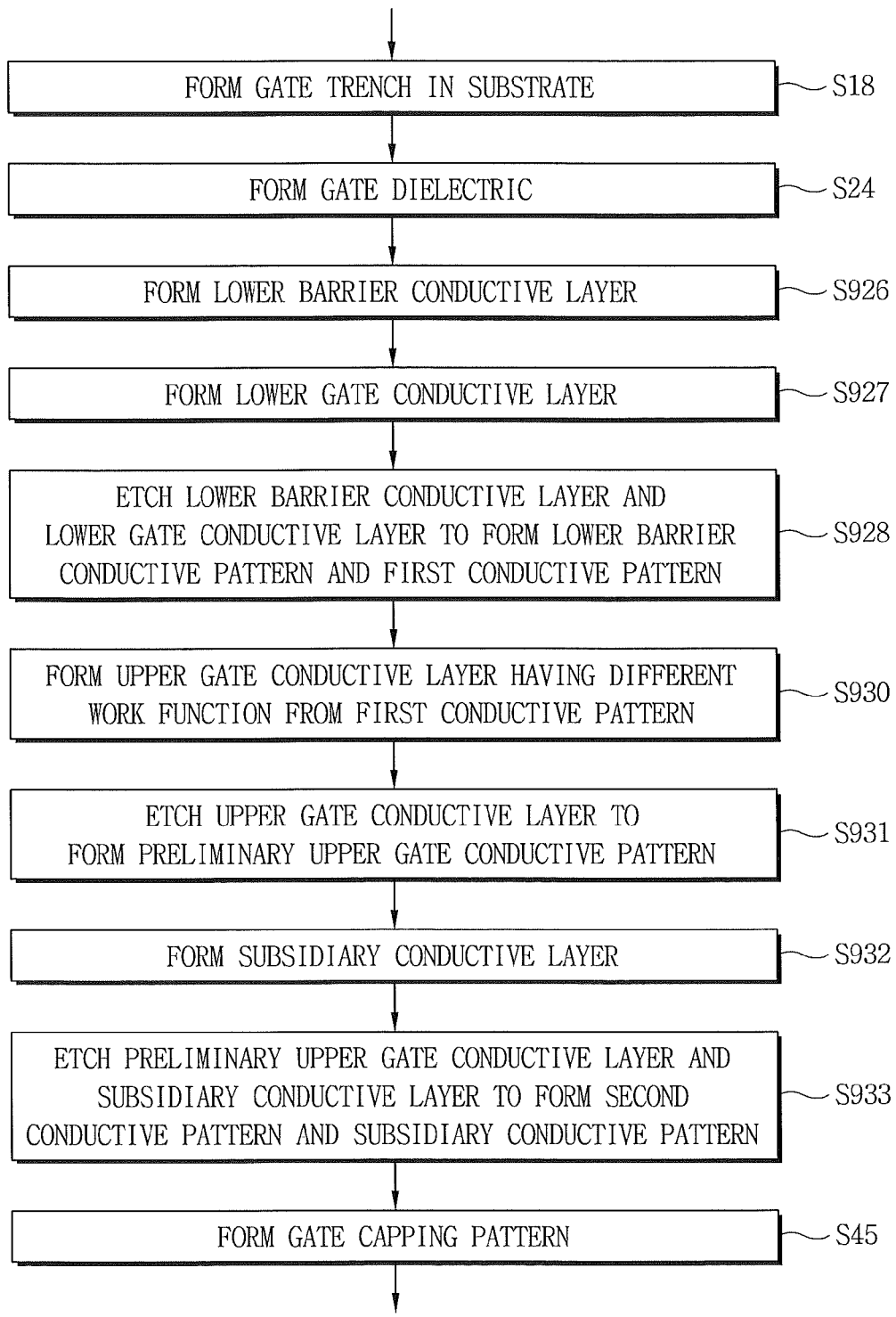
FIG. 95 is a process flowchart illustrating a method of fabricating a semiconductor device according to an embodiment of the inventive concept.
Figure 96A:
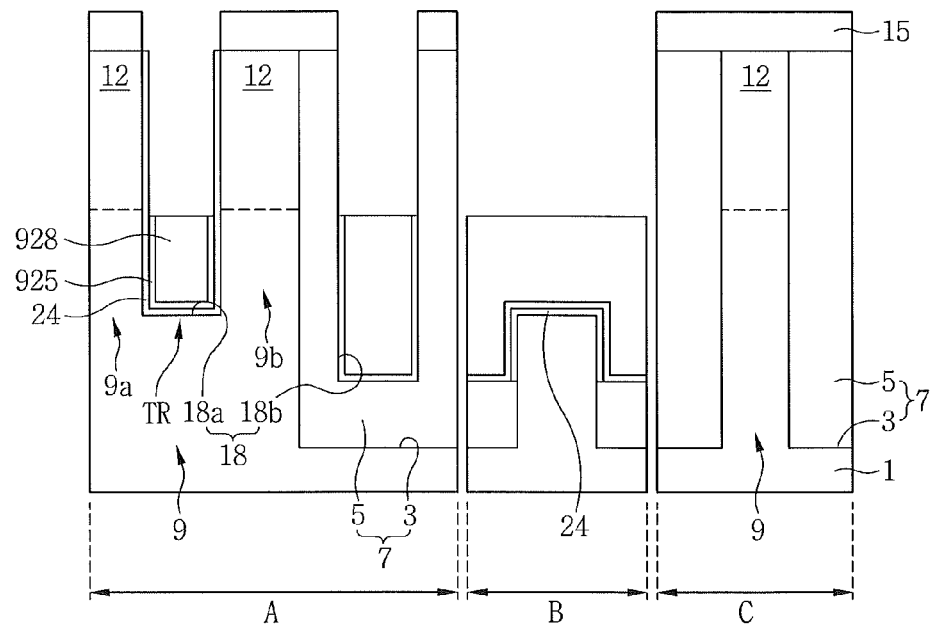
FIGS. 96A through 96F are cross-sectional views illustrating methods of fabricating a semiconductor device according to an embodiment of the inventive concept.

Referring to FIGS. 1, 95, and 96A, as described with reference to FIGS. 74A through 74D, the gate trench 18 may be formed in the substrate 1 (operation S18), and the gate dielectric 24 may be formed (operation S24). A lower barrier conductive layer may be formed (operation S926). The lower barrier conductive layer may be conformally formed on the substrate 1 having the gate dielectric 24.

A lower gate conductive layer may be formed (operation S927). The lower gate conductive layer may be formed on the lower barrier conductive layer to fill the gate trench 18. The lower barrier conductive layer and the lower gate conductive layer may be etched to form a lower barrier conductive pattern 925 and a first conductive pattern 928, respectively (operation S928).

Figure 96B:
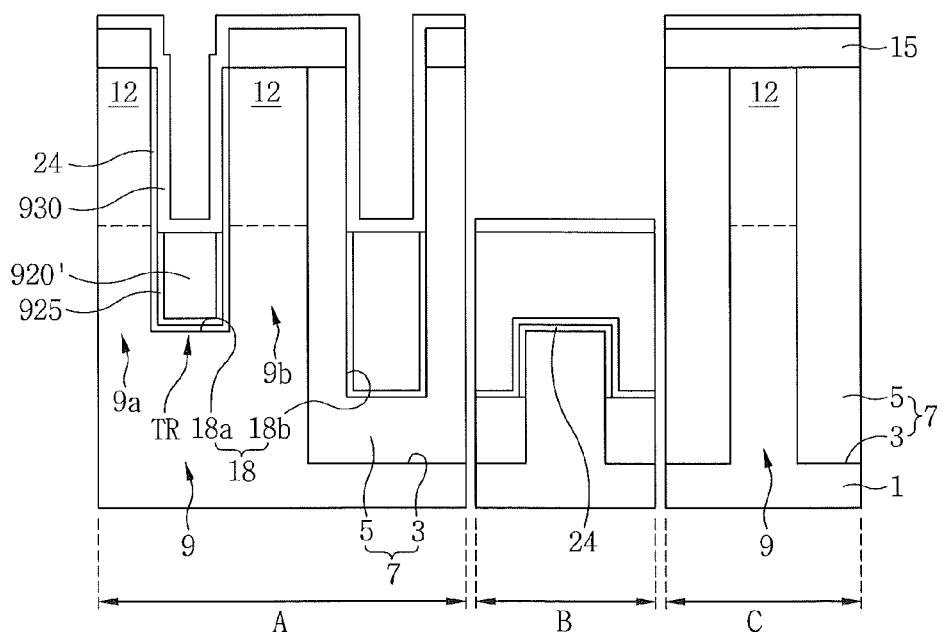

Referring to FIGS. 1, 95, and 96B, an upper gate conductive layer 930 having a different work function from the first conductive pattern 928 may be formed (operation S930). The upper gate conductive layer 930 may be conformally formed on the substrate 1 having the first conductive pattern 928.

Figure 96C:
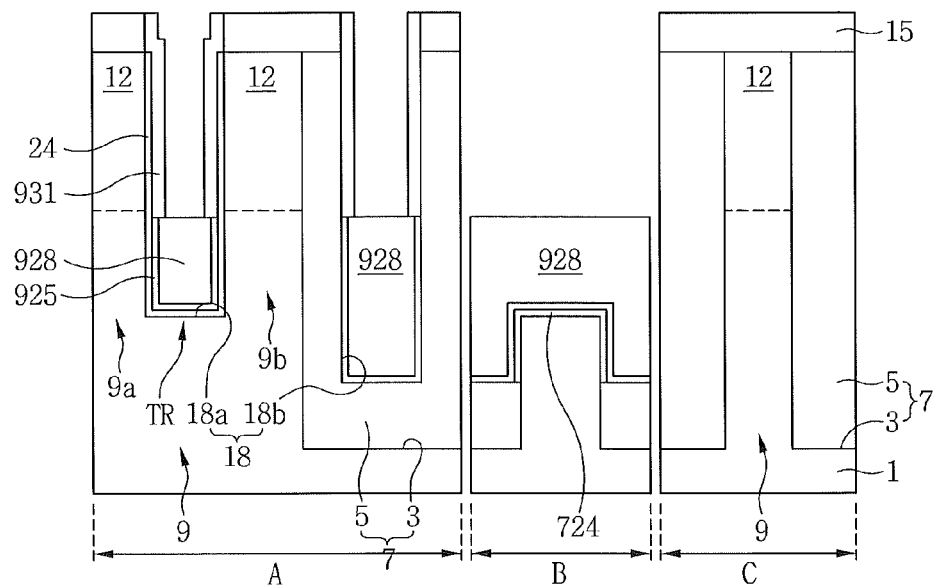

Referring to FIGS. 1, 95, and 96C, the upper gate conductive layer 930 may be etched to form a preliminary upper gate conductive pattern 931 (operation S931). The preliminary upper gate conductive pattern 931 may be formed by anisotropically etching the upper gate conductive layer 930. The upper gate conductive layer 930 may be anisotropically etched to expose a top surface of the first conductive pattern 928. The preliminary upper gate conductive pattern 931 may be formed on a sidewall of the gate trench 18 disposed on the first conductive pattern 928.

Figure 96D:
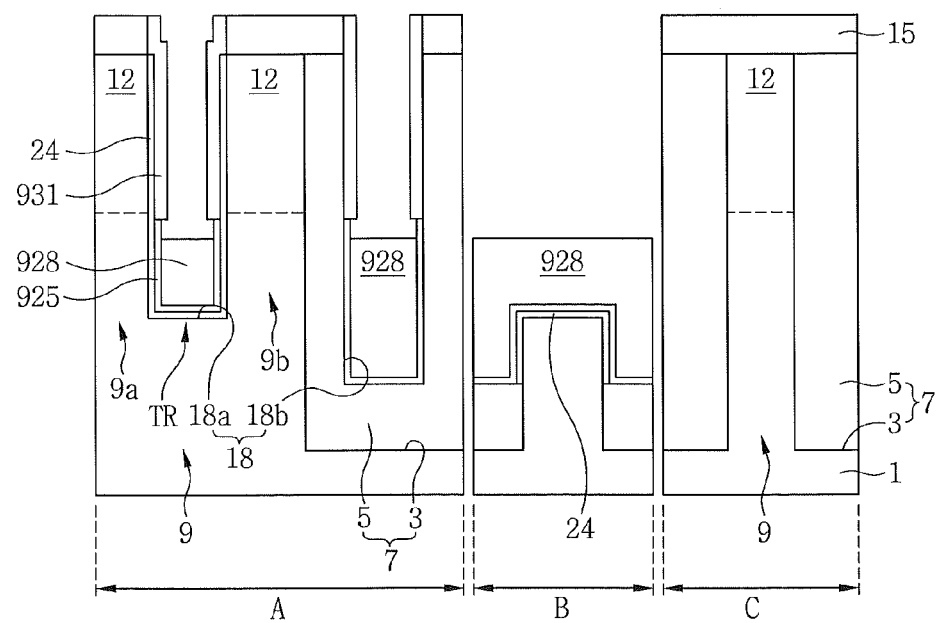

Referring to FIGS. 1 and 96D, the first conductive pattern 928 may be partially etched. The first conductive pattern 928 may be partially etched and spaced apart from the preliminary upper gate conductive pattern 931. The first conductive pattern 928 may be partially etched using an isotropic etching process. Due to the partial etching, a top surface of the first conductive pattern 928 may become lower than a top end portion of the lower barrier conductive pattern 925.

Figure 96E:
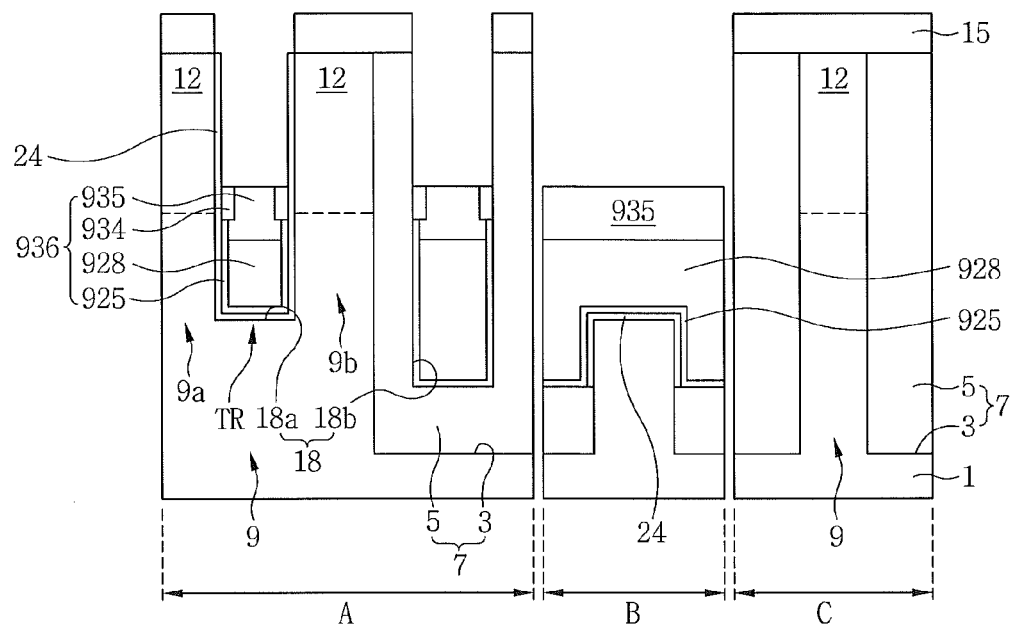

Referring to FIGS. 1, 95, and 96E, a subsidiary conductive layer may be formed (operation S932). The subsidiary conductive layer may be formed to fill a space between the preliminary upper gate conductive pattern 931 and the first conductive pattern 928 spaced apart from each other.

The subsidiary conductive layer and the preliminary upper gate conductive pattern 931 may be etched, thereby forming a subsidiary conductive pattern 935 and a second conductive pattern 934, respectively. Accordingly, a gate electrode 936 described with reference to FIG. 30 may be formed.

Figure 96F:
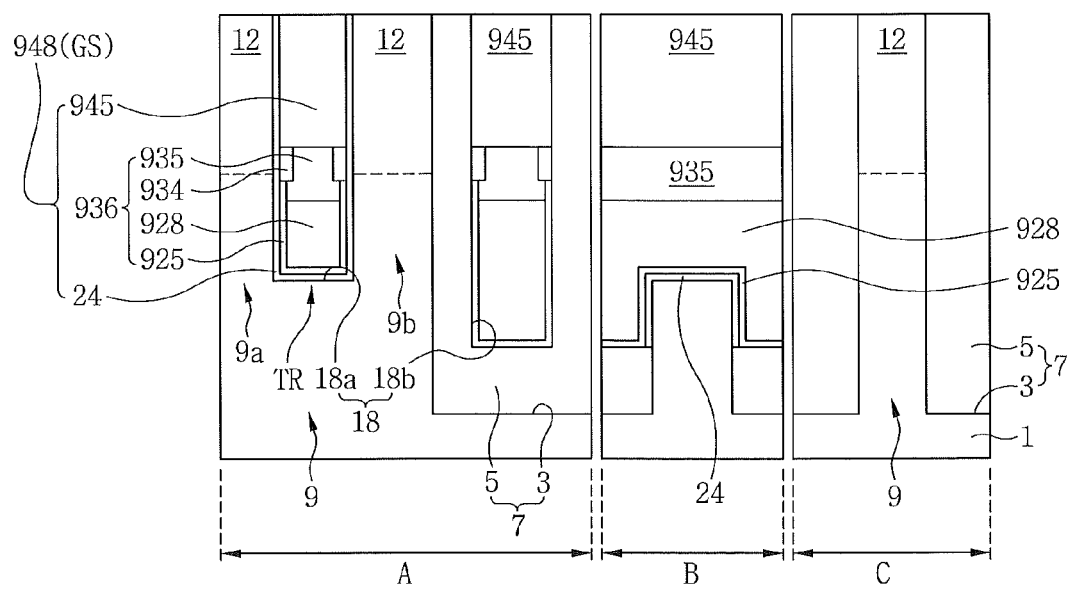

Referring to FIGS. 1, 95, and 96F, a gate capping pattern 945 may be formed (operation S45). The formation of the gate capping pattern 945 may include forming an insulating material layer on the substrate 1 having the gate electrode 936 and planarizing the insulating material layer until the active region 9 is exposed.

Figure 97:
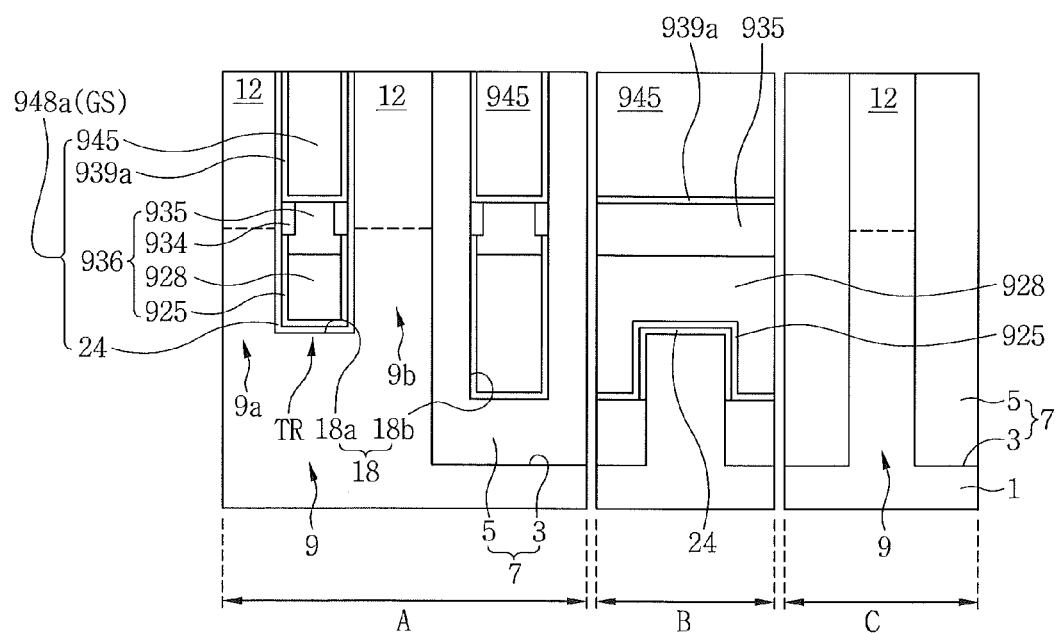
FIGS. 97 and 98 are cross-sectional views respectively illustrating methods of fabricating a semiconductor device according to an embodiment of the inventive concept.

Next, a method of fabricating a semiconductor device according to an embodiment of the inventive concept will be described with reference to FIGS. 1 and 97. In FIG. 97, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 97, a substrate 1 having the gate electrode 936 described with reference to FIGS. 96A through 96E may be prepared. A metal-containing material layer 939a may be formed on the substrate 1 having the gate electrode 936. The metal-containing material layer 939a may be conformally formed on the gate electrode 936. As described with reference to FIG. 3, the metal-containing material layer 939a may be formed of a dielectric material containing a metal having a Fermi energy close to a level of either one of the valance band and conduction band of the energy band diagram of the active region 9. An insulating material layer may be formed on the substrate 1 having the metal-containing material layer 939a and planarized until the active region 9 is exposed, thereby forming a gate capping pattern 945'.

Figure 98:
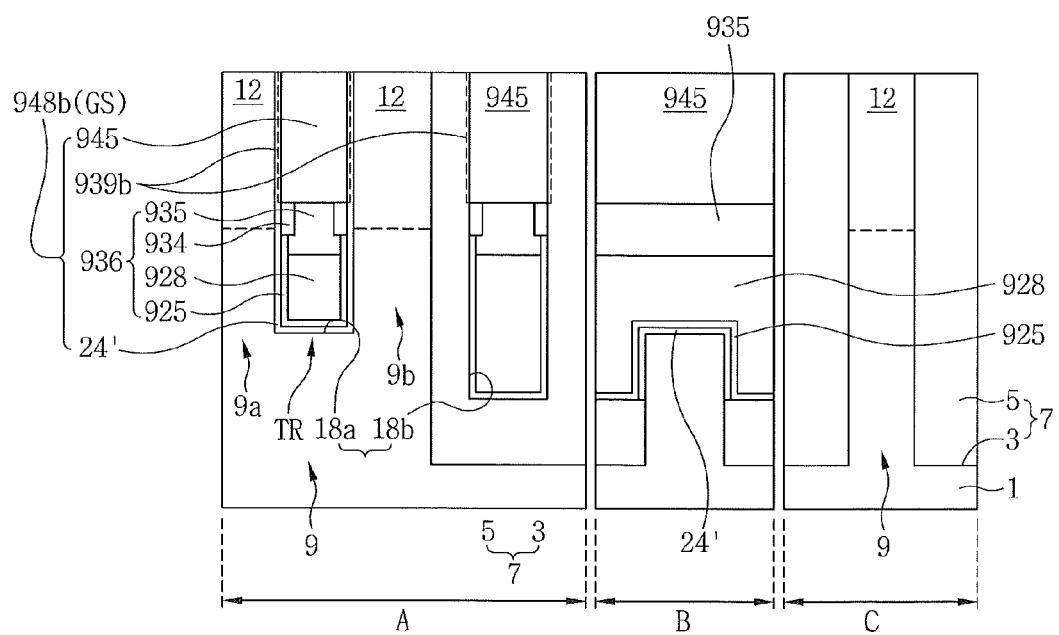

Next, a method of fabricating a semiconductor device according to an embodiment of the inventive concept will be described with reference to FIGS. 1 and 98. In FIG. 98, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 98, a substrate 1 having the gate electrode 936 described with reference to FIGS. 96A through 96E may be prepared. A metal source layer may be formed on the substrate 1 having the gate electrode 936. An annealing process may be performed to diffuse a metal from the metal source layer into the gate dielectric 24, thereby forming a metal-containing material layer 939b. A process of forming the metal-containing material layer 939b may be substantially the same as the process of forming the metal-containing material layer 139a described with reference to FIG. 76A. Thereafter, an unreacted metal source layer may be removed. An insulating material layer may be formed on the substrate 1 having the metal-containing material layer 939b and planarized until the active region 9 is exposed, thereby forming a gate capping pattern 945.

Next, a method of fabricating a semiconductor device according to an embodiment of the inventive concept will be described with reference to FIGS. 1, 99, and 100A through 100D. In FIGS. 100A through 100D, portion "A" denotes a section taken along line I-I' of FIG. 1, portion "B" denotes a section taken along line II-II' of FIG. 1, and portion "C" denotes a section taken along line III-III' of FIG. 1.

Figure 99:
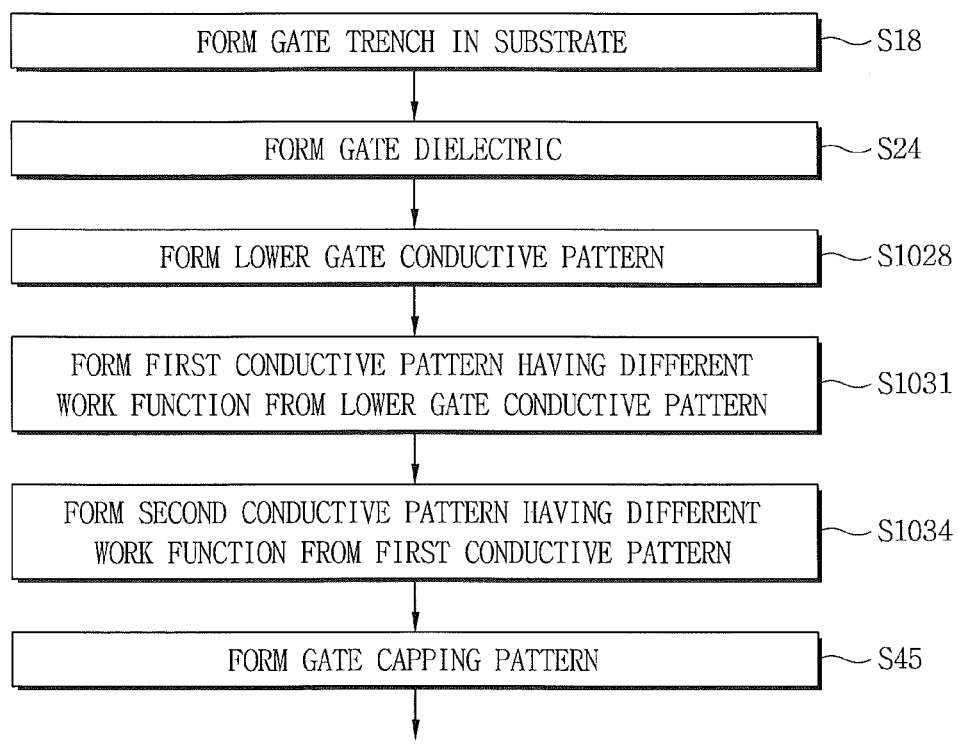
FIG. 99 is a process flowchart illustrating a method of fabricating a semiconductor device according to an embodiment of the inventive concept.
Figure 100A:
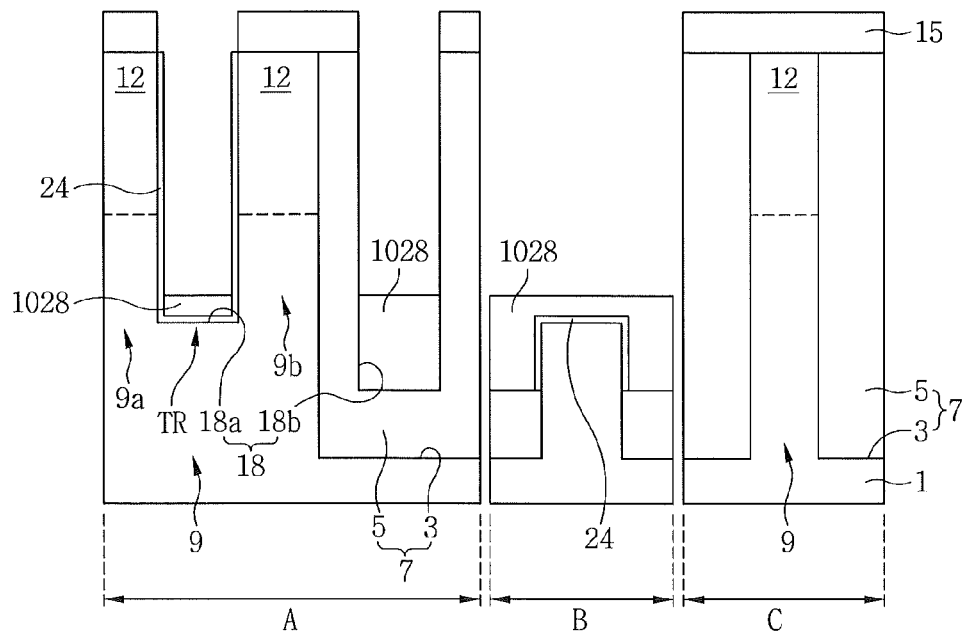
FIGS. 100A through 100D are cross-sectional views illustrating methods of fabricating a semiconductor device according to an embodiment of the inventive concept.

Referring to FIGS. 1, 99, and 100A, as described with reference to FIG. 74A through 74D, the gate trench 18 may be formed in the substrate 1 (operation S18), and the gate dielectric 24 may be formed (operation S24). A lower conductive pattern 1028 may be formed (operation S1028). The formation of the lower conductive pattern 1028 may include forming a gate conductive layer on the substrate 1 having the gate dielectric 24 and partially etching the lower gate conductive layer. The lower conductive pattern 1028 may be formed to partially fill the gate trench 18.

Figure 100B:
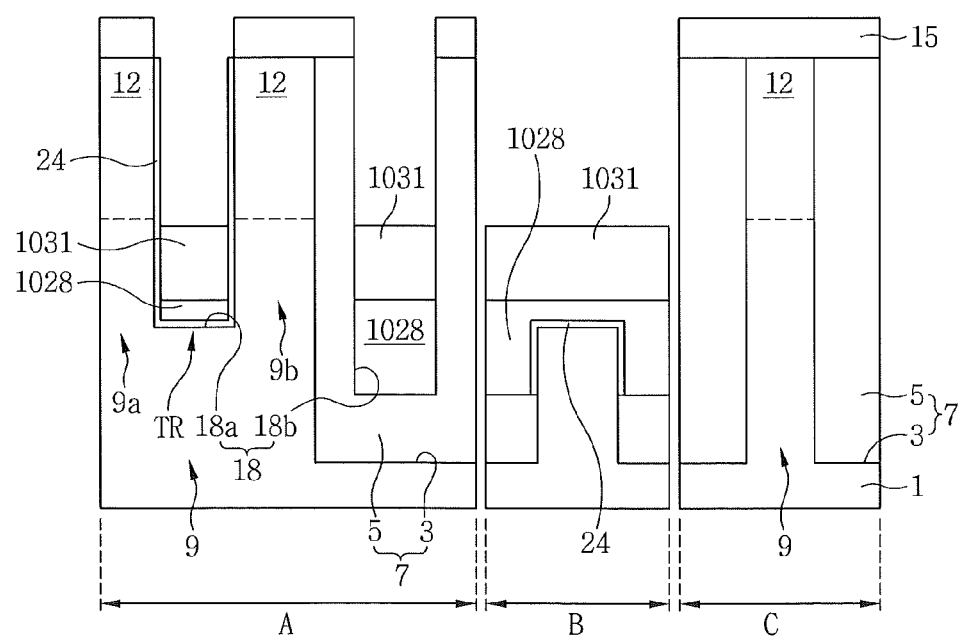

Referring to FIGS. 1, 99, and 100B, a first conductive pattern 1031 having a different work function from the lower conductive pattern 1028 may be formed (operation S1031). For example, the lower conductive pattern 1028 may be formed of poly-Si having the same conductivity type as the active region 9, and the first conductive pattern 1031 may be formed of a metal nitride or a metal.

The first conductive pattern 1031 may be formed on the lower conductive pattern 1028 within the gate trench 18. The formation of the first conductive pattern 1031 may include forming a first gate conductive layer on the substrate 1 having the lower conductive pattern 1028 and partially etching the first gate conductive layer.

Figure 100C:
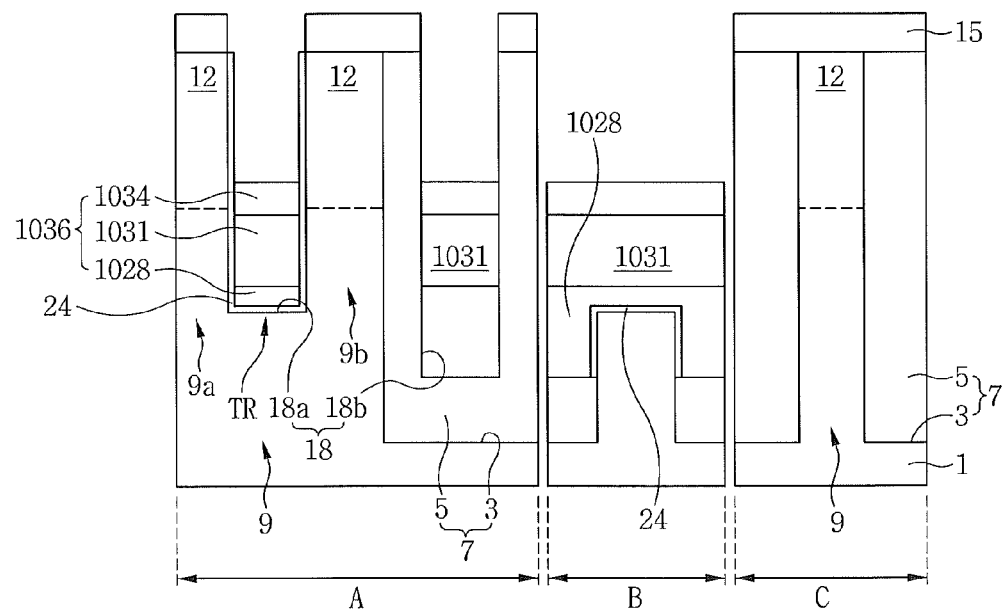
Figure 100D:
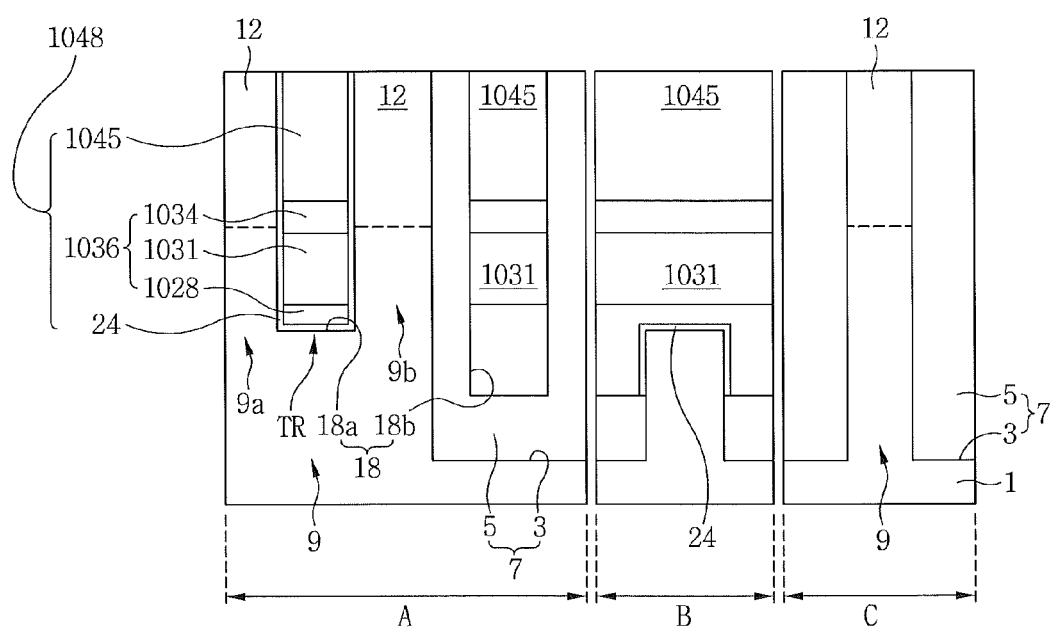

Referring to FIGS. 1, 99, and 100C, a second conductive pattern 1034 having a different work function from the first conductive pattern 1031 may be formed (operation S1034).

Accordingly, a gate electrode 1036 including the lower conductive pattern 1028, the first conductive pattern 1031, and the second conductive pattern 1034 may be formed as described with reference to FIG. 32.

The second conductive pattern 1034 may be formed of poly-Si having the same conductivity type as the source/drain region 12, and the first conductive pattern 1031 may be formed of a metal nitride or a metal. For instance, in the case of an NMOS transistor, the second conductive pattern 1034 may be formed of N-type poly-Si, and the first conductive pattern 1031 may be formed of any one of TiN, W, a Ti—Al alloy, and WN.

The second conductive pattern 1034 may be formed of poly-Si having a different conductivity type from the lower conductive pattern 1028. For example, in the case of the NMOS transistor, the lower conductive pattern 1028 may be formed of P-type poly-Si, and the second conductive pattern 1034 may be formed of N-type poly-Si. The lower conductive pattern 1028 and the first and second conductive patterns 1028, 1031, and 1034 may constitute a gate electrode 1036.

Referring to FIGS. 1, 76, and 77D, a gate capping pattern 1045 may be formed (operation S45). The formation of the gate capping pattern 1045 may include forming an insulating material layer on the substrate 1 having the gate electrode 1036 and planarizing the insulating material layer until the active region 9 is exposed.

Figure 101:
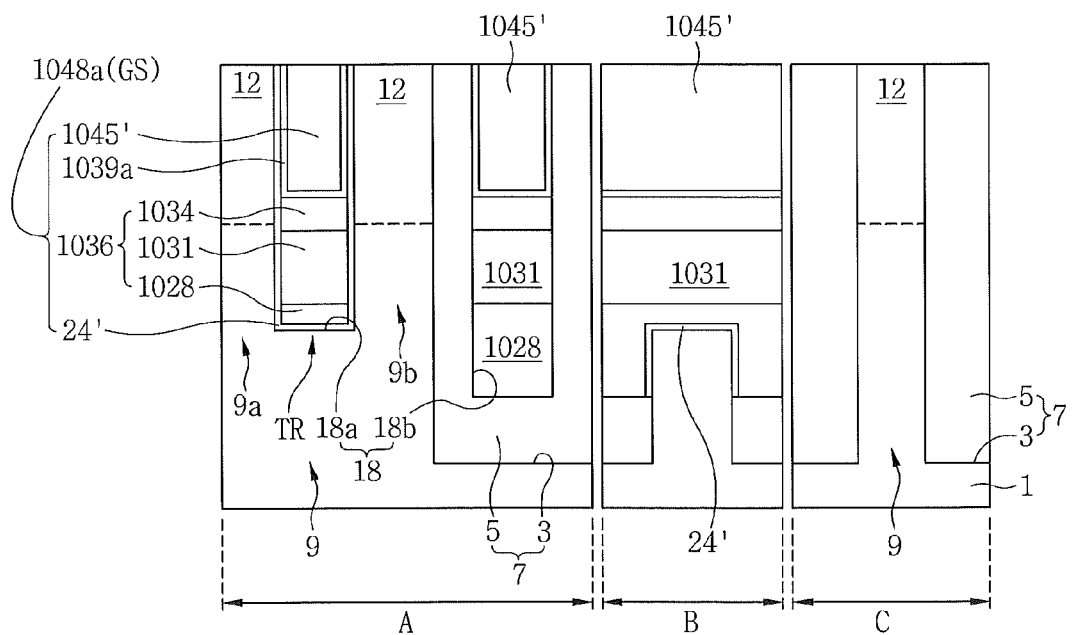
FIGS. 101 and 102 are cross-sectional views respectively illustrating methods of fabricating a semiconductor device according to an embodiment of the inventive concept.

Next, a method of fabricating a semiconductor device according to an embodiment of the inventive concept will be described with reference to FIGS. 1 and 101. In FIG. 101, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 101, a substrate 1 having the gate electrode 1036 may be prepared as described with reference to FIGS. 100A through 100C. A metal-containing material layer 1039*a* may be formed on the substrate 1 having the gate electrode 1036. The metal-containing material layer 1039*a* may be conformally formed on the substrate 1 having the gate electrode 1036. As described with reference to FIG. 3, the metal-containing material layer 1039*a* may be formed of a dielectric material including a metal having a Fermi energy close to either one of the valance band and conduction band of the energy band diagram of the active region 9.

An insulating material layer may be formed on the substrate 1 having the metal-containing material layer 1039*a* and planarized until the active region 9 is exposed, thereby forming a gate capping pattern 1045'.

Figure 102:
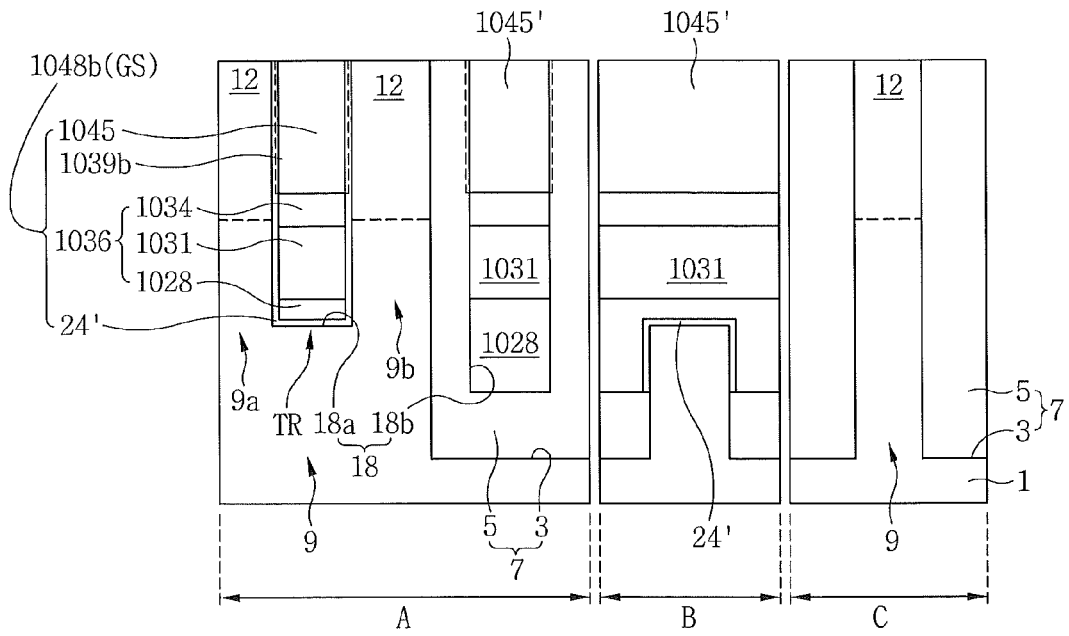

Next, a method of fabricating a semiconductor device according to an embodiment of the inventive concept will be described with reference to FIGS. 1 and 102. In FIG. 102, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 102, a substrate 1 having the gate electrode 1036 may be prepared as described with reference to FIGS. 100A through 100C.

A metal source layer may be formed on the substrate 1 having the gate electrode 1036. An annealing process may be performed to diffuse a metal from the metal source layer into the gate dielectric 24, thereby forming a metal-containing material layer 1039*b*. A process of forming the metal-containing material layer 1039*b* may be substantially the same as the process of forming the metal-containing material layer 139*a* described with reference to FIG. 76A.

Thereafter, an unreacted metal source layer may be removed. An insulating material layer may be formed on the substrate 1 having the metal-containing material layer 1039*b* and planarized until the active region 9 is exposed, thereby forming a gate capping pattern 1045.

Next, a method of fabricating a semiconductor device according to an embodiment of the inventive concept will be described with reference to FIGS. 1, 103, and 104A through 104C. In FIGS. 104A through 104C, portion "A" denotes a section taken along line I-I' of FIG. 1, portion "B" denotes a section taken along line II-II' of FIG. 1, and portion "C" denotes a section taken along line III-III' of FIG. 1.

Figure 103:
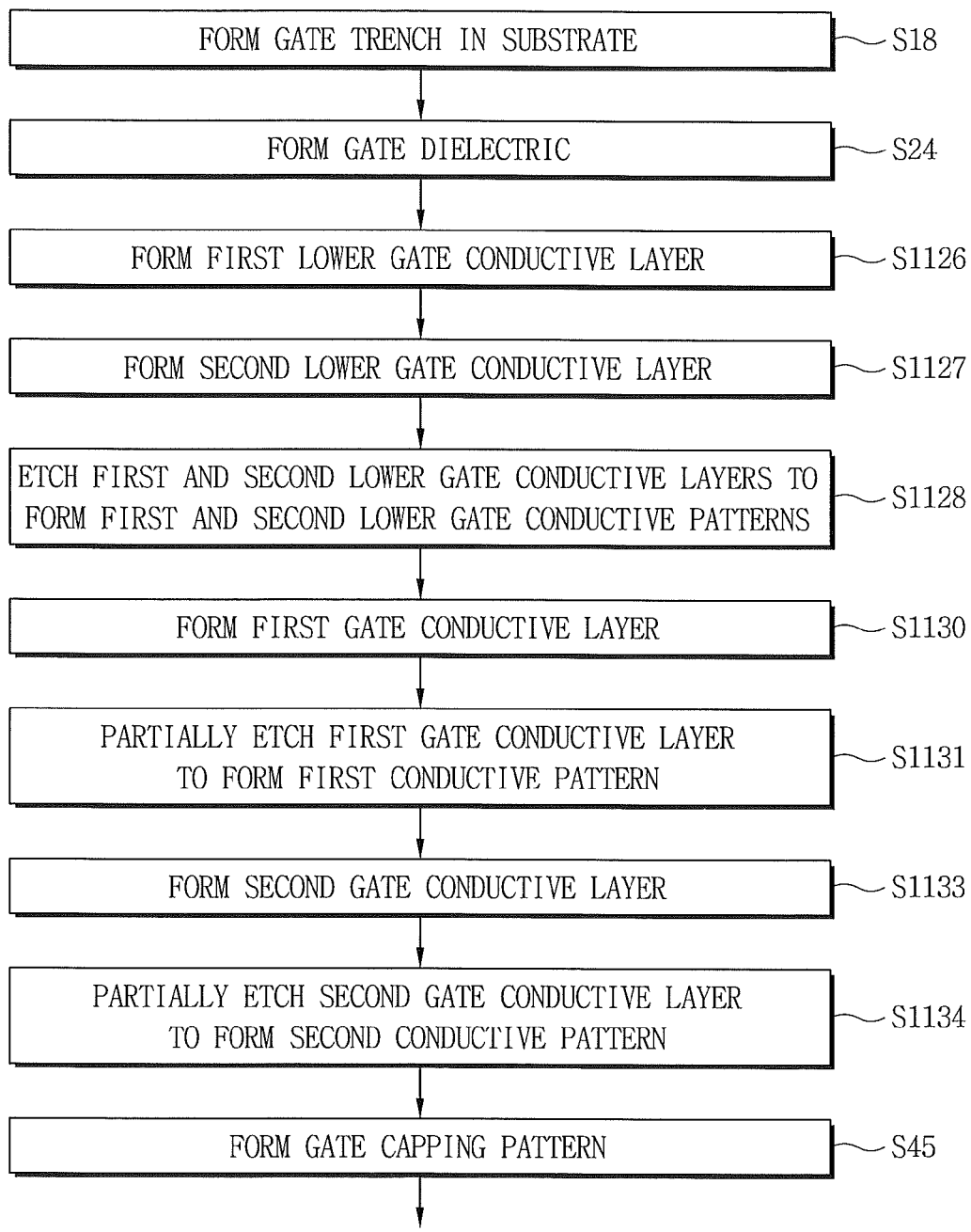
FIG. 103 is a process flowchart illustrating a method of fabricating a semiconductor device according to an embodiment of the inventive concept.
Figure 104A:
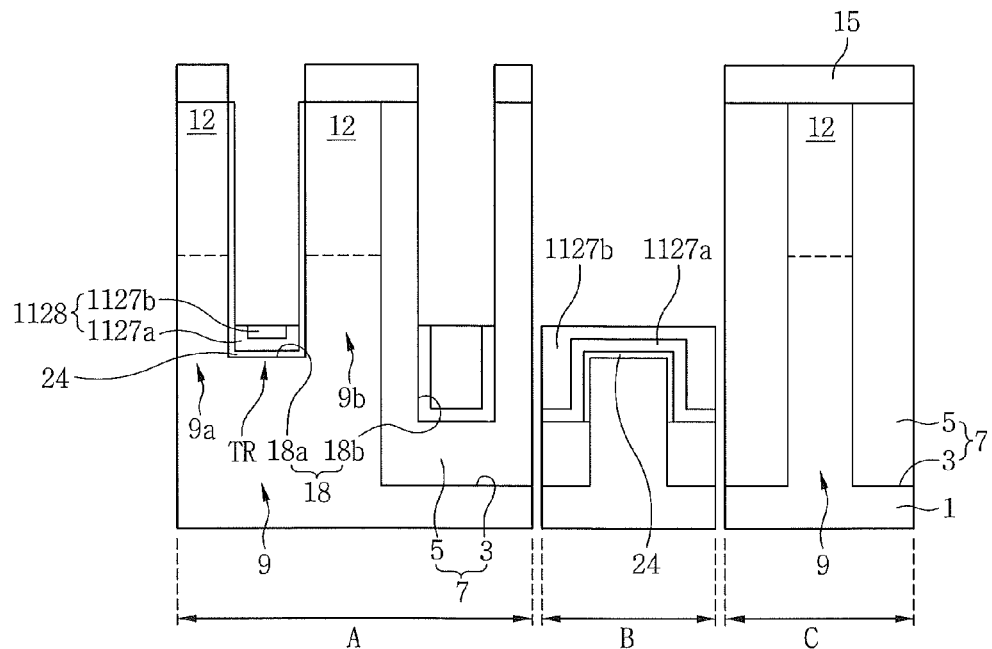
FIGS. 104A through 104C are cross-sectional views illustrating methods of fabricating a semiconductor device according to an embodiment of the inventive concept.
Figure 104B:
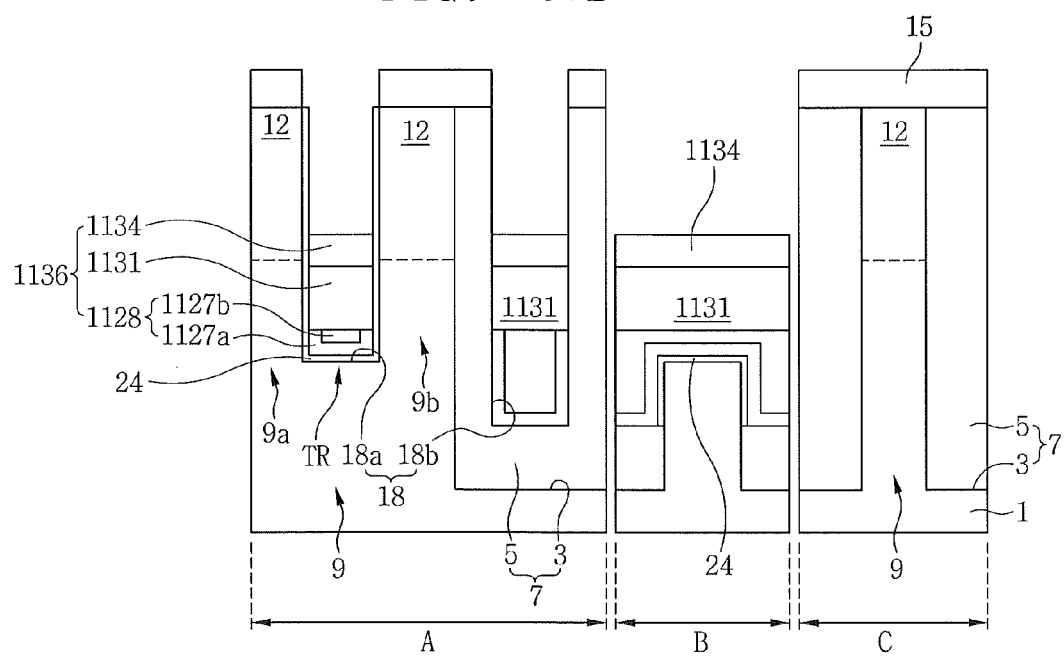
Figure 104C:
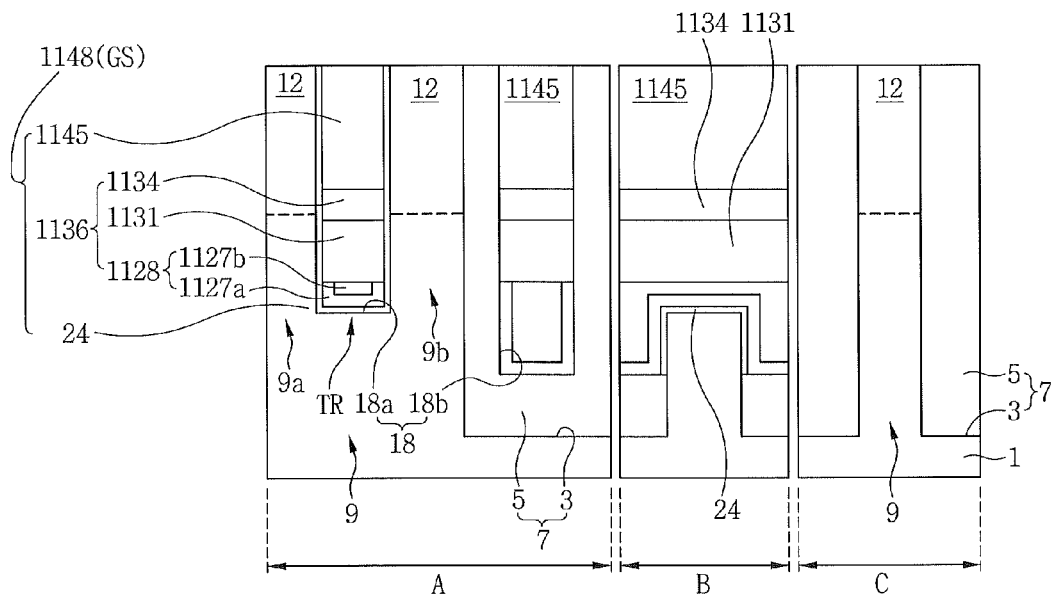

Referring to FIGS. 1, 103, and 104A, as described with reference to FIGS. 74A through 74D, the gate trench 18 may be formed in the substrate 1 (operation S18), and the gate dielectric 24 may be formed (operation S24). A first lower gate conductive layer may be formed (operation S1126). The first lower gate conductive layer may be conformally formed on the substrate 1 having the gate dielectric 24. A second lower gate conductive layer may be formed (operation S1127). The second lower gate conductive layer may be formed on the substrate 1 having the first lower gate conductive layer. The second lower gate conductive layer may be formed of a material having a different work function from the first lower gate conductive layer. The first and second lower gate conductive layers may be etched to form first and second lower conductive patterns 1127*a* and 1127*b*, respectively (operation S1128). The first lower conductive pattern 1127*a* may be formed to cover side and bottom surfaces of the second lower conductive pattern 1127*b*. The first and second lower conductive patterns 1127*a* and 1127*b* may constitute a lower conductive pattern 1128.

Referring to FIGS. 1, 103, and 104B, a first gate conductive layer may be formed (operation S1130). The first gate conductive layer may be formed on the substrate 1 having the lower conductive pattern 1128. The first gate conductive layer may be partially etched to form a first conductive pattern 1131 (operation S1131). The first conductive pattern 1131 may be formed on the lower conductive pattern 1128.

A second gate conductive layer may be formed (operation S1133). The second gate conductive layer may be formed on the substrate 1 having the first conductive pattern 1131. The second gate conductive layer may be partially etched to form a second conductive pattern 1134 (operation S1134). The lower conductive pattern 1128, the first conductive pattern 1131, and the second conductive pattern 1134 may be stacked sequentially. The lower conductive pattern 1128, the first conductive pattern 1131, and the second conductive pattern 1134 may constitute a gate electrode 1136.

Referring to FIGS. 1, 103, and 104C, a gate capping pattern 1145 may be formed (operation S45). The formation of the gate capping pattern 1145 may include forming an insulating material layer on the substrate 1 having the gate electrode 1136 and planarizing the insulating material layer until the active region 9 is exposed.

Figure 105:
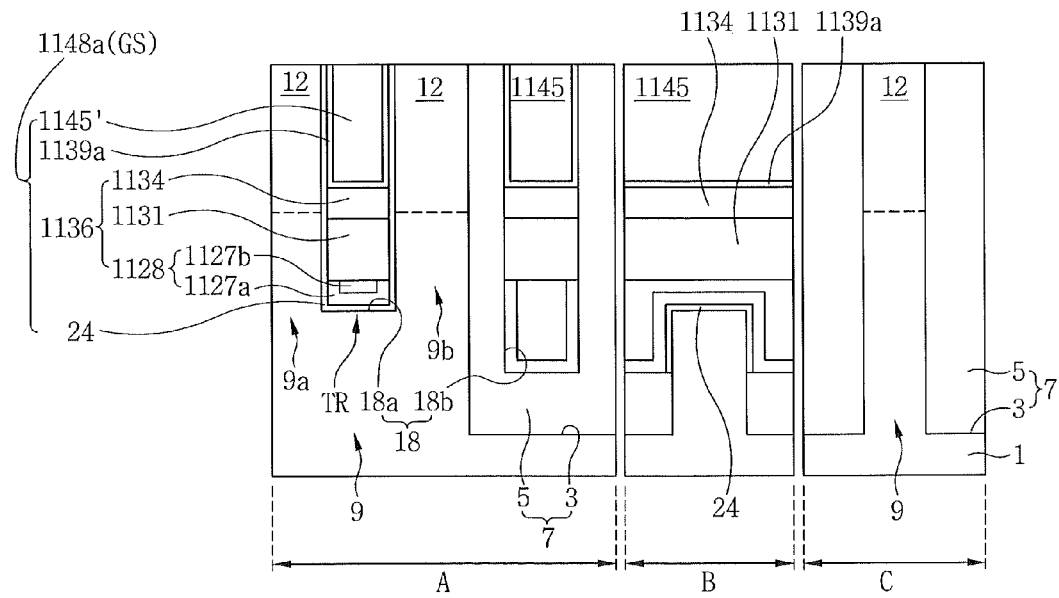
FIGS. 105 and 106 are cross-sectional views respectively illustrating methods of fabricating a semiconductor device according to an embodiment of the inventive concept.

Next, a method of fabricating a semiconductor device according to an embodiment of the inventive concept will be described with reference to FIGS. 1 and 105. In FIG. 105, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 105, a substrate 1 having the gate electrode 1136 described with reference to FIGS. 104A and 104B may be prepared. A metal-containing material layer 1139*a* may be formed on the substrate 1 having the gate electrode 1136. The metal-containing material layer 1139*a* may be conformally formed on the substrate 1 having the gate electrode 1136. The metal-containing material layer 1139a may be formed of a dielectric material containing a metal having a Fermi energy close to either one of a valance band or conduction band of an energy band diagram of the active region 9 as described with reference to FIG. 3.

An insulating material layer may be formed on the substrate 1 having the metal-containing material layer 1139a and planarized until the active region 9 is exposed, thereby forming a gate capping pattern 1145'.

Figure 106:
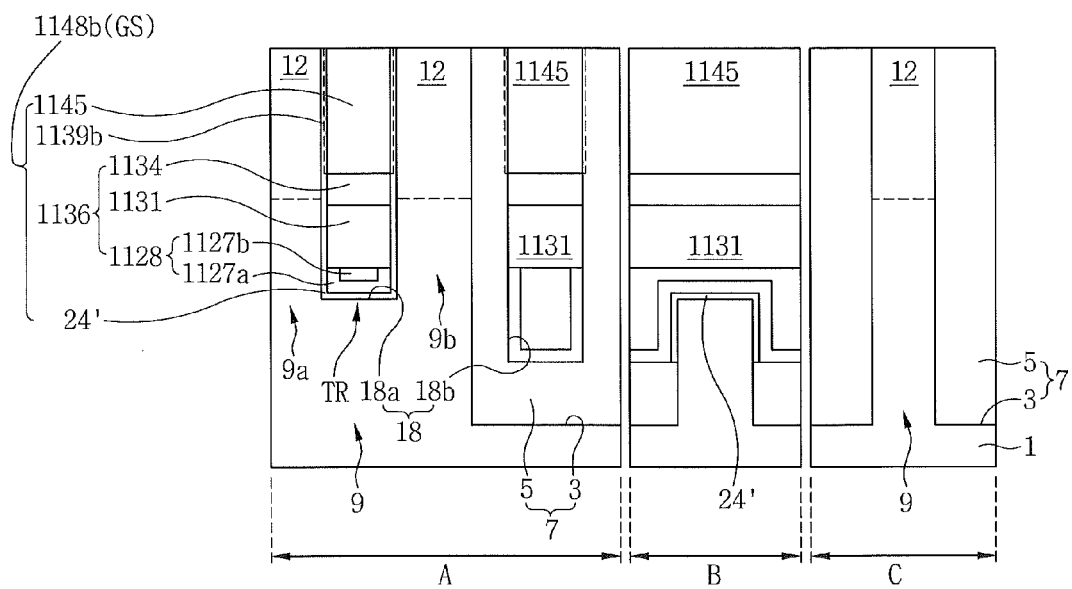

A method of fabricating a semiconductor device according to an embodiment of the inventive concept will be described with reference to FIGS. 1 and 106. In FIG. 106, portion "A" denotes a section taken along line I-I' of FIG. 1, portion "B" denotes a section taken along line II-II' of FIG. 1, and portion "C" denotes a section taken along line III-III' of FIG. 1.

Referring to FIGS. 1 and 106, a substrate 1 having the gate electrode 1136 described with reference to FIGS. 104A and 104B may be prepared. A metal source layer may be formed on the substrate 1 having the gate electrode 1136. A metal contained in the metal source layer may diffuse into the gate dielectric 24 using an annealing process to form a metal-containing material layer 1139b. Thereafter, an unreacted metal source layer may be removed. An insulating material layer may be formed on the substrate 1 having the metal-containing material layer 1139b and planarized until the active region 9 is exposed, thereby forming a gate capping pattern 1145.

Next, a method of fabricating a semiconductor device according to an embodiment of the inventive concept will be described with reference to FIGS. 107, 108A, and 108B.

Figure 107:
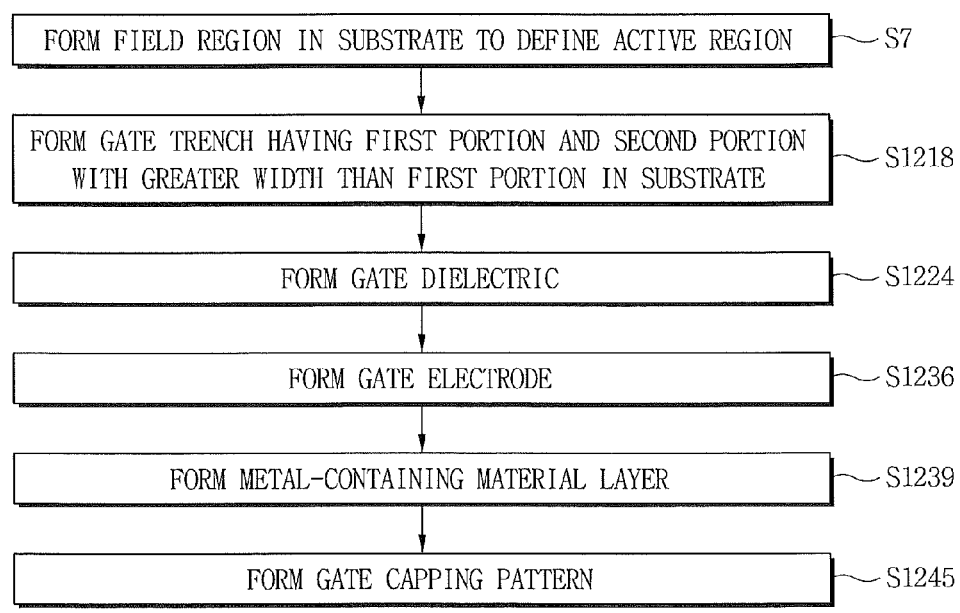
FIG. 107 is a process flowchart illustrating a method of fabricating a semiconductor device according to an embodiment of the inventive concept.
Figure 108A:
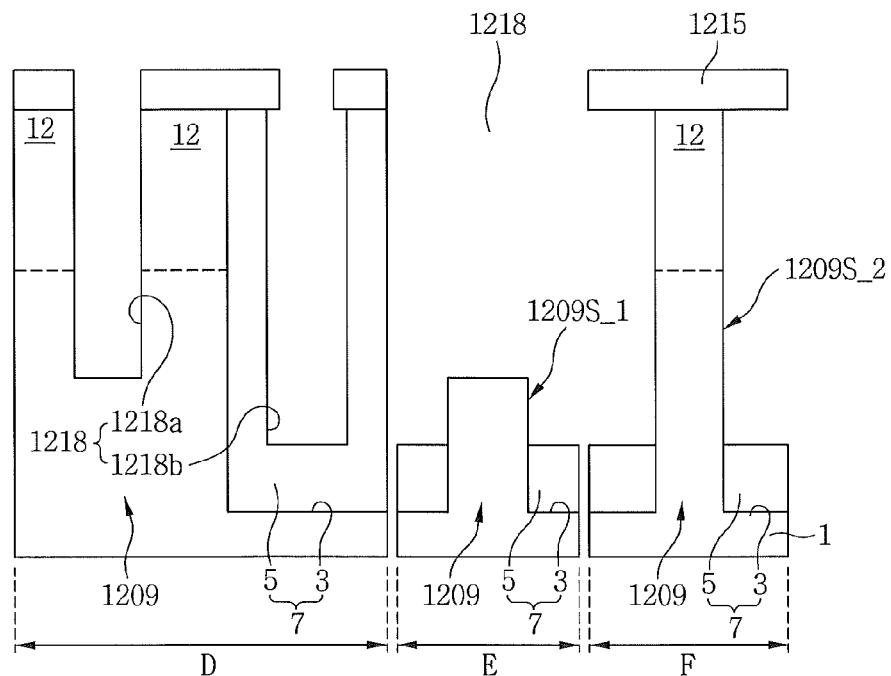
FIGS. 108A and 108B are cross-sectional views illustrating methods of fabricating a semiconductor device according to an embodiment of the inventive concept.
Figure 108B:
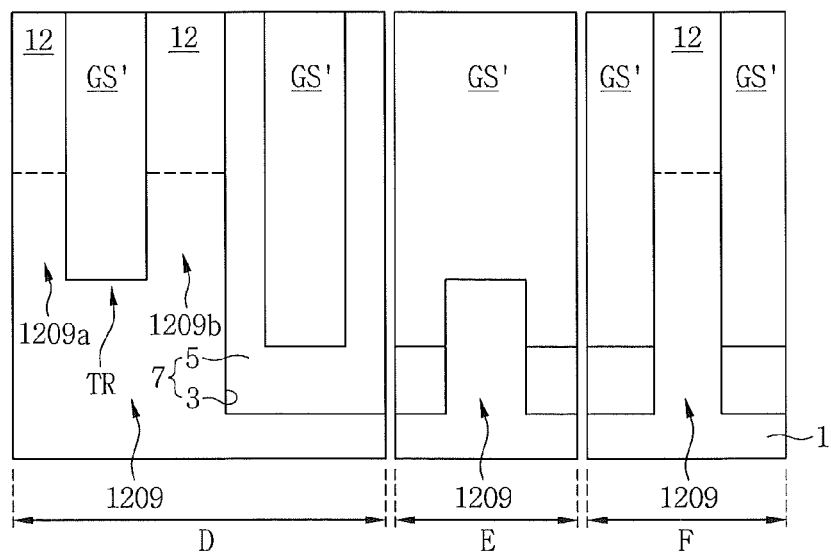

Referring to FIGS. 107 and 108A, as described with reference to FIG. 74A, a field region 7 defining an active region 9 may be formed in a substrate 1 (operation S7).

A mask 1215 may be formed on the substrate 1 having the field region 7. Subsequently, the active region 9 and the field region 7 may be etched using the mask 1215 as an etch mask. As a result, a gate trench 1218 may be formed across the active region 9 and extend into the field region 7 (operation S1218).

The gate trench 1218 may have a first width W1 in the active region 9, and have a second width W2 greater than the first width W1 in the field region 7.

Referring to FIGS. 107 and 108A, a gate dielectric may be formed (operation S1224), a gate electrode structure may be formed (operation S1236), a metal-containing material layer may be formed (operation S1239), and a gate capping pattern may be formed (operation S1245). The gate dielectric, the gate electrode structure, the metal-containing material layer, and the gate capping pattern may constitute a gate structure GS'. The gate dielectric, the gate electrode structure, the metal-containing material layer, and the gate capping pattern may be formed using substantially the same methods of fabricating a semiconductor device described with reference to FIGS. 73A through 106.

Figure 109:
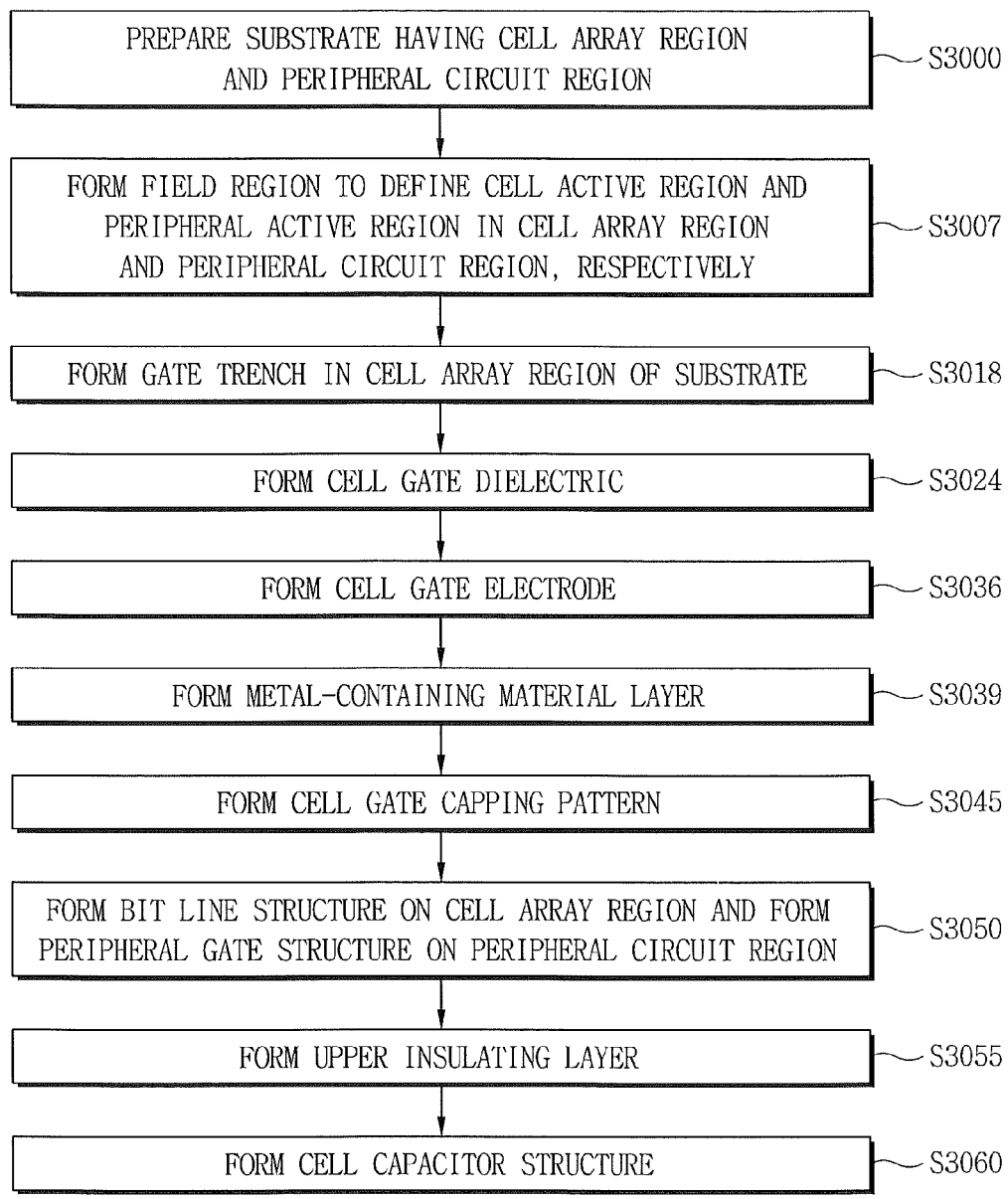
FIG. 109 is a process flowchart illustrating a method of fabricating a semiconductor device according to an embodiment of the inventive concept.

Next, a method of fabricating a semiconductor device according to an embodiment of the inventive concept will be described with reference to FIG. 109. FIG. 109 is a process flowchart illustrating a method of fabricating the semiconductor device described with reference to FIGS. 64 through 72.

Referring to FIGS. 64 and 109, a substrate 1 having a cell array region CR and a peripheral circuit region PR may be prepared (operation S3000).

A field region 7 may be formed to define a cell active region 9 and a peripheral active region 3009 in the cell array region CR and the peripheral circuit region PR, respectively (operation S3007).

A cell transistor CTR may be formed in the cell array region CR. The cell transistor CTR may be formed using the method described with reference to FIGS. 73A through 108B. For example, the formation of the cell transistor CTR may include forming a cell gate trench 18 in the cell array region CR (operation S3018), forming a cell gate dielectric (operation S3024), forming a cell gate electrode (operation S3037), and forming a cell gate capping pattern (operation S3045).

A bit line structure 69 may be formed on the cell transistor CTR of the cell array region CR, and a peripheral gate structure 3037 may be formed on the peripheral circuit region PR (operation S3050)

For example, a lower insulating layer 54 may be formed on the cell array region CR, and a peripheral gate dielectric 3015 may be formed on the peripheral active region 3009. Subsequently, a bit line plug 54 may be formed through the lower insulating layer 54, and a lower conductive layer for forming a lower peripheral gate electrode 3020 may be formed on the peripheral gate dielectric 3015.

Thereafter, an upper conductive layer may be formed on the substrate 1 having the bit line plug 54 and the lower conductive layer. The upper conductive layer may be a layer for forming a bit line 63 and an upper peripheral gate electrode 3025.

A bit line capping pattern 66 and a peripheral gate capping pattern 3035 may be formed on the upper conductive layer. The upper conductive layer may be etched using the bit line capping pattern 66 as an etch mask to form the bit line 63, and the upper and lower conductive layers may be etched using the peripheral gate capping pattern 3035 as an etch mask to form the lower peripheral gate electrode 3020 and upper peripheral gate electrode 3025 stacked sequentially.

A metal-containing material layer 3039 may be formed on the substrate 1 having the peripheral gate structure 3037. A peripheral gate spacer 3045 may be formed on a sidewall of the peripheral gate structure 3037 covered with the metal-containing material layer 3039.

Peripheral source/drain regions 3050 may be formed in the peripheral active region 3009 on both sides of the peripheral gate structure 3037.

An upper insulating layer 75 may be formed on the substrate 1 having the peripheral transistor PTR and the cell bit line structure 69.

A peripheral plug 3060 may be formed through the interlayer insulating layer 75 and electrically connected to the peripheral source/drain regions 3150, and a cell plug 90 may be formed and electrically connected to a source/drain region 87 of the cell transistor CTR.

A cell capacitor structure 98 may be formed on the upper insulating layer 75 (operation S3060).

Meanwhile, the peripheral transistor PTR having a planar shape as shown in FIG. 64 may be embodied by a 3-dimensional transistor PTR' shown in FIG. 69. The peripheral transistor PTR embodied by the 3-dimensional transistor shown in FIG. 69 will now be described.

Referring to FIG. 69, as described with reference to FIG. 64, a substrate 1 having a cell array region CR and a peripheral circuit region PR may be prepared as described with reference to FIG. 64. As shown in FIG. 50, a cell transistor CTR may be formed in the cell array region CR. A lower insulating layer 54 may be formed on the cell array region CR. A peripheral gate trench 3112 may be formed across the peripheral active region 3009 of the peripheral circuit region PR. A peripheral gate structure 3136 may be formed to fill the peripheral gate trench 2012 and protrude upward from the peripheral active region 3009. The peripheral gate structure 3136 may include a peripheral gate dielectric 3115, a peripheral gate electrode 3130, and a peripheral gate capping pattern 3135. The peripheral gate dielectric 3115 may be formed on an inner wall of the peripheral gate trench 2012. The peripheral gate electrode 3115 may include a portion that may be formed on the peripheral gate dielectric 2115, fill the peripheral gate trench 3112, and protrude upward from a top surface of the peripheral active region 3009. The peripheral gate electrode 3115 may include a lower peripheral gate electrode 3118, a middle peripheral gate electrode 3121, and an upper peripheral gate electrode 3124 stacked sequentially. The formation of the lower peripheral gate electrode 3118 may include forming a lower conductive layer and partially etching the lower conductive layer. The lower peripheral gate electrode 3118 may be formed to partially fill the peripheral gate trench 3012. A bit line contact hole may be formed through the lower insulating layer 51 of the cell array region CR A middle conductive layer may be formed on the substrate 1 having the lower peripheral gate electrode 3118. The middle conductive layer may be planarized, thereby forming a bit line plug 54 remaining within the bit line contact hole and forming a planarized middle conductive layer on the peripheral circuit region PR.

An upper conductive layer may be formed on the resultant structure. A bit line capping pattern 66 and a peripheral gate capping pattern 3135 may be formed on the upper conductive layer. The upper conductive layer may be etched using the bit line capping pattern 66 as an etch mask to form a bit line 63, and the upper and middle conductive layers may be etched using the peripheral gate capping pattern 3135 as an etch mask to form the sequentially stacked middle peripheral gate electrode 3121 and the upper peripheral gate electrode 3124.

A metal-containing material layer 3039 may be formed on the substrate 1 having the peripheral gate structure 3136. A peripheral gate spacer 3145 may be formed on a side surface of the peripheral gate structure 3137, which may be covered with the metal-containing material layer 3039 and disposed at a higher level than the active region 3009. Peripheral source/drain regions 3150 may be formed in the peripheral active region 3009 on both sides of the peripheral gate structure 3137.

A semiconductor device according to an embodiment of the inventive concept can include a transistor having a gate structure capable of reducing or suppressing a leakage current. The gate structure can fill a gate trench formed in an active region. Source/drain regions can be formed on both sides of the gate structure in the active region. The gate structure can include a leakage current inhibition pattern disposed opposite the source/drain regions. The leakage current inhibition pattern can be an insulating metal-containing material layer including a metal having a Fermi energy close to a conduction band or valance band of an energy band diagram of the active region. The metal-containing material layer can reduce or suppress a leakage current in the transistor.

Meanwhile, in the gate structure, the gate electrode can include at least two conductive material layers having different work functions. Thus, the leakage current in the transistor can be reduced, and a resistive characteristic of an interconnection including the gate electrode of the transistor can be improved.

Figure 110:
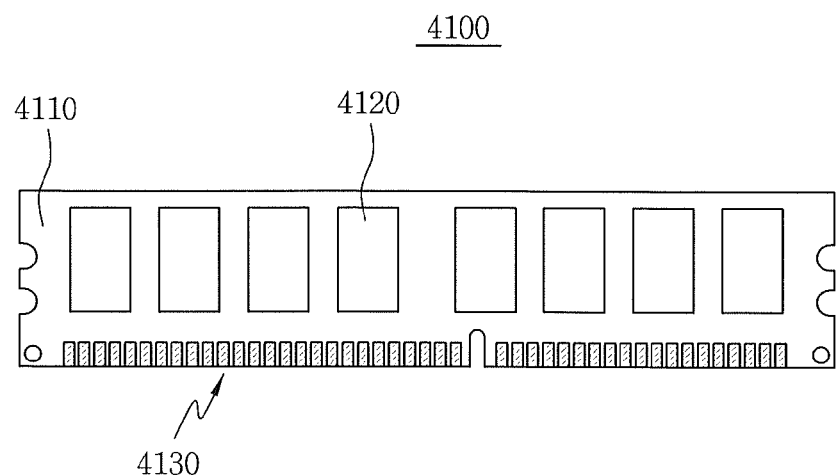
FIG. 110 is a schematic diagram of a memory module including a semiconductor device according to an embodiment of the inventive concept.

FIG. 110 is a schematic diagram of a memory module 4100 including a semiconductor device according to an embodiment of the inventive concept.

Referring to FIG. 110, the memory module 4100 may include a memory module substrate 4110, a plurality of memory devices 4120 disposed on the memory module substrate 4110, and a plurality of terminals 4130.

The memory module substrate 4110 may include a printed circuit board (PCB) or a wafer.

Each of the memory devices 4120 may be any one of the semiconductor devices according to the embodiments of the inventive concept, which are described with reference to FIGS. 1 through 109, or a semiconductor package including the semiconductor devices. The terminals 4130 may include a conductive metal. The terminals 4130 may be electrically connected to the memory devices 4120. Since the memory module 4100 may include a semiconductor device having improved leakage current characteristics, the performance of the memory module 4100 may be enhanced.

Figure 111:
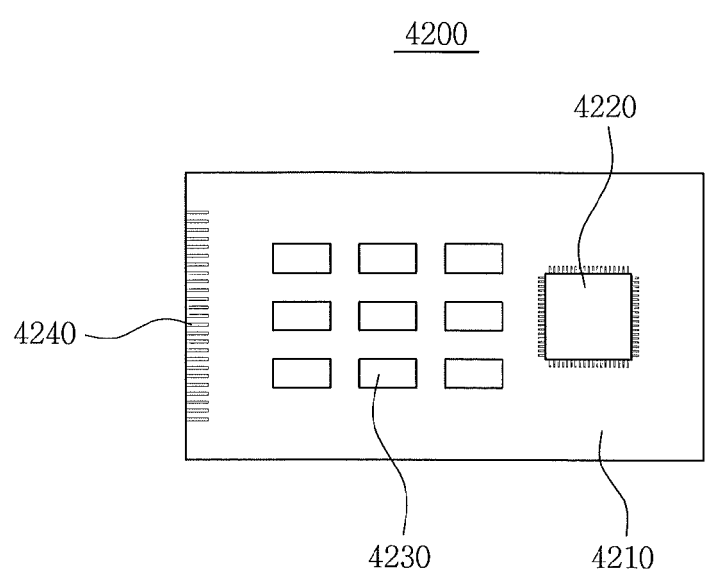
FIG. 111 is a schematic diagram of a semiconductor module including a semiconductor device according to an embodiment of the inventive concept.

FIG. 111 is a schematic diagram of a semiconductor module 4200 including a semiconductor device according to an embodiment of the inventive concept.

Referring to FIG. 111, the semiconductor module 4200 may include a semiconductor device 4230 mounted on a module substrate 4210. The semiconductor device 4230 may be any one of the semiconductor devices according to the embodiments of the inventive concept, which are described with reference to FIGS. 1 through 109, or a semiconductor package including the semiconductor devices.

The module 4200 may further include an MP 4220 mounted on the module substrate 4210. I/O terminals 4240 may be disposed on at least one side of the module substrate 4210.

Figure 112:
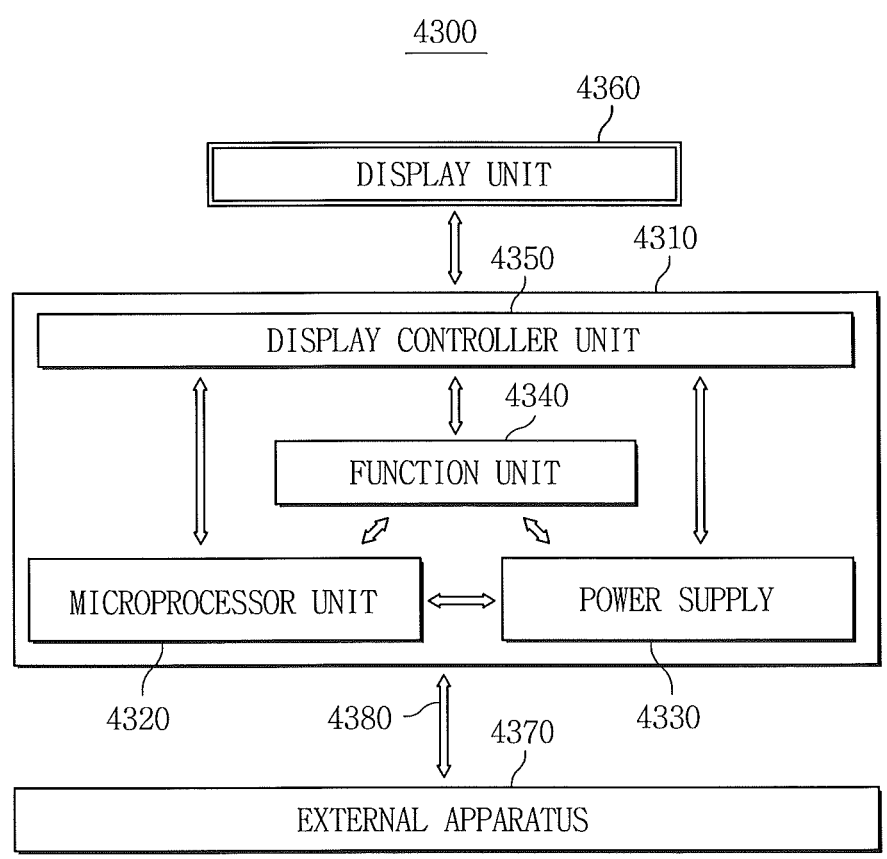
FIG. 112 is a conceptual block diagram of an electronic system including various semiconductor packages according to various embodiments of the inventive concept.

FIG. 112 is a conceptual block diagram of an electronic system 4300 including various semiconductor packages according to various embodiments of the inventive concept.

Referring to FIG. 112, electronic system 4300 may include a body 4310. The body 4310 may include an MP unit 4320, a power unit 4330, a function unit 4340, and/or a display controller unit 4350. The body 4310 may be a system board or mother board having a PCB.

The MP unit 4320, the power unit 4330, the function unit 4340, and the display controller unit 4350 may be mounted on the body 4310.

A display unit 4360 may be disposed on a top surface of the body 4310 or outside the body 4310. For example, the display unit 4360 may be disposed on a surface of the body 4310 and display an image processed by the display controller unit 4350.

The power unit 4330 may receive a predetermined voltage from an external power source, divide the predetermined voltage into various voltage levels, and transmit divided voltages to the MP unit 4320, the function unit 4340, and the display controller unit 4350.

The MP unit 4320 may receive a voltage from the power unit 4330 and control the function unit 4340 and the display unit 4360.

The function unit 4340 may implement various functions of the electronic system 4300. For instance, when the electronic system 4300 is a mobile electronic product, such as a portable phone, the function unit 4340 may include several elements capable of wireless communication functions, such as output of an image to the display unit 4360 or output of a voice to a speaker, by dialing or communication with an external unit 4370. When the function unit 4340 includes a camera, the function unit 4340 may serve as an image processor. In another embodiment, when the electronic system 4300 is connected to a memory card to increase the capacity of the electronic system 4300, the function unit 4340 may be a memory card controller. The function unit 4340 may exchange signals with the external apparatus 4370 through a wired or wireless communication unit 4380.

In addition, when the electronic system 4300 needs a universal serial bus (USB) to expand functions thereof, the function unit 4340 may serve as an interface controller.

A semiconductor device according to an embodiment of the inventive concept may be included in at least one of the MP unit 4320 and the function unit 4340.

Figure 113:
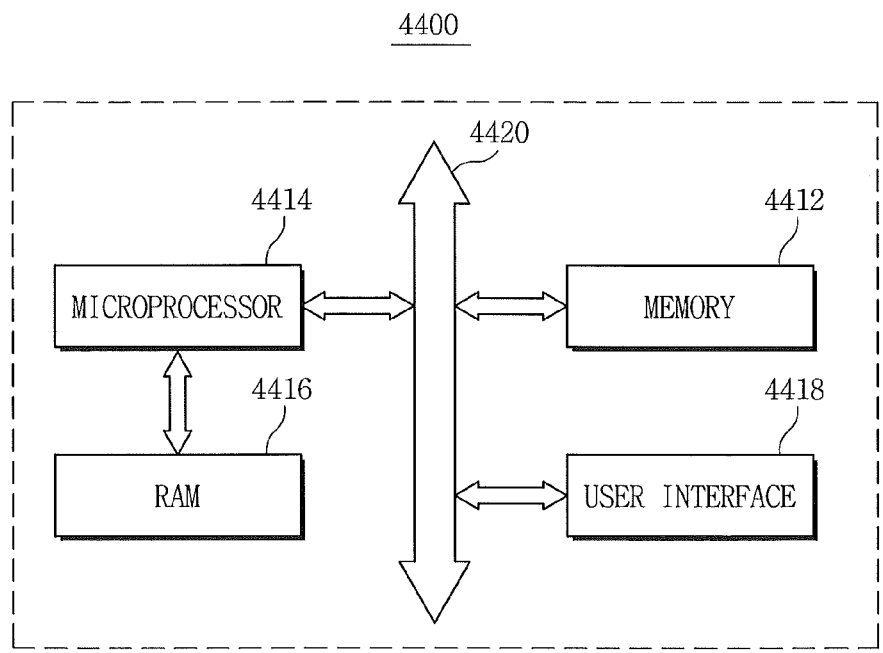
FIG. 113 is a schematic block diagram of another electronic system including a semiconductor device according to an embodiment of the inventive concept.

FIG. 113 is a schematic block diagram of another electronic system 4400 including a semiconductor device according to an embodiment of the inventive concept.

Referring to FIG. 113, the electronic system 4400 may include a semiconductor device according to an embodiment of the inventive concept. The electronic system 4400 may be used to fabricate a mobile device or computer. For example, the electronic system 4400 may include a memory system 4412, an MP 4414, a random access memory (RAM) 4416, and a user interface 4418 configured to communicate data using a bus 4420. The MP 4414 may program and control the electronic system 4400. The RAM 4416 may be used as an operation memory of the MP 4414. The MP 4414, the RAM 4416, and/or other elements may be assembled within a single package. The MP 4414 and/or the RAM 4416 may include a semiconductor device according to an embodiment of the inventive concept.

The user interface 4418 may be used to input data to the electronic system 4400 or output data from the electronic system 4400. The memory system 4412 may store codes for operating the MP 4414, data processed by the MP 4414, or external input data. The memory system 4412 may include a controller and a memory.

Figure 114:
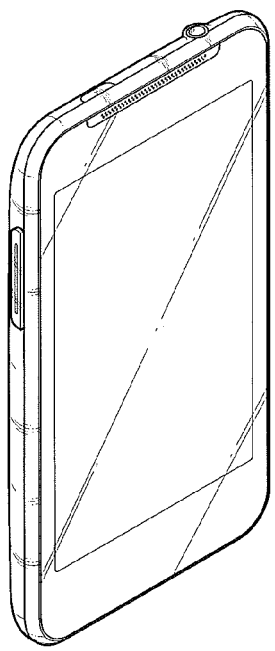
FIG. 114 is a schematic diagram of a mobile wireless phone including a semiconductor device according to an embodiment of the inventive concept.

FIG. 114 is a schematic diagram of a mobile wireless phone 4500 including a semiconductor device according to an embodiment of the inventive concept. The mobile wireless phone 4500 may be interpreted as a tablet personal computer (PC). Furthermore, the semiconductor device according to the embodiment of the inventive concept may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   an active region in a substrate;
   a field region defining the active region;
   a first source/drain region and a second source/drain region in the active region;
   a gate trench in the active region and the field region, the gate trench being between the first and second source/drain regions in the active region; and
   a gate structure within the gate trench,
   wherein the gate structure comprises:
      a gate electrode;
      a gate dielectric between the gate electrode and the active region;
      an insulating gate capping pattern on the gate electrode; and
      an insulating metal-containing material layer between the insulating gate capping pattern and the active region, the insulating metal-containing material layer being at least partially within the gate trench.

2. The device of claim 1, wherein the first source/drain region and the second source/drain region have an N conductivity type, and the insulating metal-containing material layer includes a metal having a Fermi energy closer to a conduction band of an energy band diagram of the active region than to a valance band of the energy band diagram of the active region.

3. The device of claim 2, wherein the insulating metal-containing material layer includes one of lanthanum oxide, lanthanum oxynitride, magnesium oxide and magnesium oxynitride.

4. The device of claim 1, wherein the first source/drain region and the second source/drain region have a P conductivity type, and the insulating metal-containing material layer includes a metal having a Fermi energy closer to a valance band of an energy band diagram of the active region than to a conduction band of the energy band diagram of the active region.

5. The device of claim 4, wherein the insulating metal-containing material layer includes one of aluminum oxide, aluminum oxynitride, tantalum oxide, tantalum oxynitride, iridium oxide and iridium oxynitride.

6. The device of claim 1, wherein the gate dielectric includes silicon oxide or nitrogen-doped silicon oxide, the insulating metal-containing material layer includes a metal different from the gate dielectric, and the metal includes one of lanthanum, magnesium, aluminum, tantalum and iridium.

7. The device of claim 1, wherein the gate dielectric includes a first gate dielectric portion between the active region and the gate electrode and a second gate dielectric portion between the active region and the insulating gate capping pattern.

8. The device of claim 7, wherein the insulating metal-containing material layer is in the second gate dielectric portion.

9. The device of claim 8, wherein the insulating metal-containing material layer includes a portion extending toward the first gate dielectric portion and overlapping with a portion of the gate electrode.

10. The device of claim 7, wherein the insulating metal-containing material layer includes a first portion between the insulating gate capping pattern and the second gate dielectric portion, and a second portion between the insulating gate capping pattern and the gate electrode.

11. The device of claim 1, wherein an edge portion of a surface of the gate electrode protrudes toward the insulating gate capping pattern, and the insulating metal-containing material layer covers the surface of the gate electrode including the edge portion.

12. The device of claim 1, wherein a portion of either one of the first source/drain region and the second source/drain region overlapping with the insulating metal-containing material layer is larger than a portion of one of the first source/drain region and the second source/drain region overlapping with the gate electrode.

13. The device of claim 1, wherein a portion of either one of the first source/drain region and the second source/drain region overlapping with the insulating gate capping pattern is larger than a portion of one of the first source/drain region and the second source/drain region overlapping with the gate electrode.

14. The device of claim 1, wherein the second source/drain region has a shallower junction structure than the first source/drain region.

15. The device of claim 14, further comprising:
a bit line structure electrically connected to the first source/drain region; and
a capacitor structure electrically connected to the second source/drain region.

16. The device of claim 1, wherein the gate trench has smaller width in the active region than in the field region.

17. A semiconductor device comprising:
an active region in a substrate;
a first source/drain region and a second source/drain region in the active region;
a gate trench in the active region between the first source/drain region and the second source/drain region; and
a gate structure within the gate trench,
wherein the gate structure comprises:
  a gate electrode at least partially overlapping with the first and second source/drain regions;
  an insulating metal-containing material layer on the gate electrode and within the gate trench, the insulating metal-containing material layer at least partially overlapping with the first and second source/drain regions; and
  a gate dielectric between the gate electrode and the active region,
  wherein the gate electrode includes a conductive material having a Fermi energy closer to a mid-gap energy of the active region than to a valance band or conduction band of an energy band diagram of the active region and having a first work function, and the insulating metal-containing material layer includes a metal having a second work function less than the first work function.

18. The device of claim 17, wherein the insulating metal-containing material layer includes a dielectric material containing a material different from the gate dielectric.

19. The device of claim 17, wherein the insulating metal-containing material layer includes a dipole layer.

20. The device of claim 17, wherein a portion of either one of the first and second source/drain regions overlapping with the insulating metal-containing material layer is larger than a portion of the one of the first and second source/drain regions overlapping with the gate electrode.

21. A semiconductor device comprising:
a field region in a substrate, the field region defining a cell active region and a peripheral active region;
a first cell source/drain region and a second cell source/drain region in the cell active region;
a cell gate trench in the cell active region between the first cell source/drain region and the second cell source/drain region;
a cell gate structure within the cell gate trench;
a first peripheral source/drain region and a second peripheral source/drain region in the peripheral active region; and
a peripheral gate structure on the peripheral active region,
wherein the peripheral gate structure includes a peripheral gate dielectric and a peripheral gate electrode, and
wherein the cell gate structure comprises:
  a cell gate electrode and an insulating cell gate capping pattern stacked sequentially;
  a cell gate dielectric between the cell gate electrode and the cell active region;
  an insulating metal-containing material layer on the cell gate electrode and within the cell gate trench, the insulating metal-containing material layer overlapping at least partially with the first and second cell source/drain regions and including a metal different from the cell gate dielectric.

22. The device of claim 21, wherein the cell gate electrode includes a conductive material having a Fermi energy closer to a mid-gap energy of the cell active region than to a valance band or conduction band of an energy band diagram of the cell active region, and the metal in the insulating metal-containing material layer has a Fermi energy closer to the valance band or conduction band of the cell active region than to the mid-gap energy of the cell active region.

23. A semiconductor device comprising:
an active region in a substrate;
a first source/drain region, a second source/drain region and a channel region therebetween in the active region;
a gate trench between the first and second source/drain regions, the gate trench having sides defining a trench opening; and
a gate structure within the gate trench,
wherein the gate structure comprises:
  a gate electrode having a first gate electrode portion overlapping with the first and second source/drain regions and a second gate electrode portion overlapping with the channel region;
  a gate dielectric between the gate electrode and the active region;
  an insulating gate capping pattern on the gate electrode, the insulating gate capping pattern being between the trench opening and the gate electrode; and
  a supplemental gate electrode pattern at least partially overlapping with the first and second source/drain regions, and being configured to provide a difference between work functions of the first gate electrode portion and the first and second source/drain regions that is less than a difference between work functions of the second gate electrode portion and the first and second source/drain regions.

24. The device of claim 23, the second gate electrode portion has a Fermi energy closer to a mid-gap energy of an energy band diagram of the active region than to a conduction band or valance band of the active region.

25. The device of claim 23, wherein the supplemental gate electrode pattern comprises an insulating metal-containing material layer.

26. The device of claim 25, wherein the first source/drain region and the second source/drain region comprise an N conductivity type, and the insulating metal-containing material layer comprises a metal having a Fermi energy closer to a conduction band of an energy band diagram of the active region than to a valance band of the energy band diagram of the active region.

27. The device of claim 26, wherein the insulating metal-containing material layer comprises one of lanthanum oxide, lanthanum oxynitride, magnesium oxide and magnesium oxynitride.

28. The device of claim 25, wherein the insulating metal-containing material layer includes a dipole layer.

29. The device of claim 25, wherein the first gate electrode portion includes a conductive pattern overlapping with the first and second source/drain regions and, the conductive pattern has a work function different from that of the second gate electrode portion.

30. The device of claim 29, wherein the first and second source/drain regions comprise an N conductivity type, and the conductive pattern has a Fermi energy closer to a conduction band of an energy band diagram of the active region than to a mid-gap energy of the energy band diagram of the active region.

* * * * *